(12) United States Patent
Nagatomi et al.

(10) Patent No.: US 7,887,718 B2
(45) Date of Patent: Feb. 15, 2011

(54) PHOSPHOR AND MANUFACTURING METHOD THEREFORE, AND LIGHT EMISSION DEVICE USING THE PHOSPHOR

(75) Inventors: Akira Nagatomi, Tokyo (JP); Kenji Sakane, Tokyo (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 572 days.

(21) Appl. No.: 11/885,439

(22) PCT Filed: Mar. 3, 2006

(86) PCT No.: PCT/JP2006/304175

§ 371 (c)(1), (2), (4) Date: Aug. 31, 2007

(87) PCT Pub. No.: WO2006/093298

PCT Pub. Date: Sep. 8, 2006

(65) Prior Publication Data

US 2009/0236963 A1  Sep. 24, 2009

(30) Foreign Application Priority Data

| Mar. 4, 2005 | (JP) | ............................. | 2005-061627 |
| Mar. 16, 2005 | (JP) | ............................. | 2005-075854 |
| Jun. 30, 2005 | (JP) | ............................. | 2005-192691 |

(51) Int. Cl.
*H01L 33/00* (2010.01)
*C09K 11/64* (2006.01)

(52) U.S. Cl. .............................. 252/301.4 F; 313/503; 313/486; 313/487; 257/98; 252/301.36

(58) Field of Classification Search ........... 252/301.4 F, 252/301.36; 313/503, 486, 487; 257/98
See application file for complete search history.

(56) References Cited

U.S. PATENT DOCUMENTS

| 7,524,437 B2 * | 4/2009 | Sakane et al. ......... 252/301.4 F |
| 2009/0236963 A1 * | 9/2009 | Nagatomi et al. ........... 313/483 |

FOREIGN PATENT DOCUMENTS

| JP | A-2002-322474 | 11/2002 |
| JP | A-2002-363554 | 12/2002 |
| JP | A-2003-203504 | 7/2003 |
| JP | A-2003-206481 | 7/2003 |
| JP | A-2005-008794 | 1/2005 |
| JP | 2005-48105 | * 2/2005 |
| JP | A-2005-048105 | 2/2005 |
| WO | WO 2004/029177 A1 | 4/2004 |
| WO | WO 2004/055910 A1 | 7/2004 |

* cited by examiner

*Primary Examiner*—C. Melissa Koslow
(74) *Attorney, Agent, or Firm*—Oliff & Berridge, PLC

(57) ABSTRACT

To provide a phosphor having an emission spectrum with a broad peak in a range from green color to yellow color, having a broad and flat excitation band capable of using lights of broad range from near ultraviolet/ultraviolet to blue lights as excitation lights, and having excellent emission efficiency and luminance. The problem is solved by providing the phosphor expressed by a general composition formula $M_m A_a B_b O_o N_n:Z$ (where element M is one or more kinds of elements having bivalent valency, element A is one or more kinds of elements having tervalent valency, element B is one or more kinds of elements having tetravalent valency, O is oxygen, N is nitrogen, and element Z is one or more kinds of elements acting as the activator), satisfying $4.0 < (a+b)/m < 7.0$, $a/m = 0.5$, $b/a > 2.5$, $n > o$, $n = 2/3m + a + 4/3b - 2/3o$, and having an emission spectrum with a peak wavelength of 500 nm to 650 nm when excited by light in a wavelength range from 300 nm to 500 nm.

32 Claims, 17 Drawing Sheets

PRIOR ART

(A)

(B)

(C)

PHOSPHOR AND MANUFACTURING METHOD THEREFORE, AND LIGHT EMISSION DEVICE USING THE PHOSPHOR

TECHNICAL FIELD OF THE INVENTION

The present invention relates to a phosphor containing nitrogen used for a cathode-ray tube (CRT), a display such as a field emission display (FED) and a plasma display (PDP), and an illumination device such as a fluorescent lamp and a fluorescent display tube, and an illumination device such as a crystal liquid back light and a method of manufacturing therefore, and also to a light emission device such as a white LED illumination in which a phosphor mixture, a phosphor sheet, a semiconductor light emitting element (LED) and this phosphor are combined.

BACKGROUND OF THE INVENTION

At present, a discharge type fluorescent lamp and an incandescent bulb used as the illumination device involve problems that a harmful substance such as mercury is contained, and life span is short. However, in recent years, a high luminescence LED emitting light of near ultraviolet/ultraviolet to blue color has been developed in sequence, and the white LED illumination for the practical application of the next generation has been actively studied and developed, in which the white light is created by mixing the light of the near ultraviolet/ultraviolet to blue color generated from the LED and the light generated from the phosphor having an excitation band in a wavelength region thereof. When the white LED illumination is put to practical use, since efficiency of converting electric energy into light is improved, less heat is generated and it is constituted of the LED and a phosphor, the white LED has advantages of good life span without burn-out of a filament like a conventional incandescent bulb and the harmful substance such as mercury is not contained, and miniaturization of the illumination device is realized, thus realizing an ideal illumination device.

Two systems are proposed as the system of the LED illumination. One of them is a multi-chip type system which creates white color by using three primary color LEDs such as high luminance red LED, green LED, and blue LED, and the other one is one-chip type system which creates white color by combining the high luminance LED emitting light of near ultraviolet/ultraviolet to blue color and the phosphor excited by the light of the near ultraviolet/ultraviolet to blue color emitted from this LED. When these two systems are compared from the viewpoint of illumination, particularly in the one-chip type system, the phosphor having an emission spectrum with a broad peak is used, therefore the emission spectrum can be closer to the spectrum of solar light, and therefore the white light having excellent color rendering properties can be obtained, compared to the multi-chip type system. Further, the one-chip type system has many advantages such as a simplified drive circuit, enabling miniaturization, eliminating an optical waveguide for mixing colors, with no necessity of considering a difference in drive voltage and optical output of each LED, and reducing a cost. Therefore, the one-chip type system, in which the LED and the phosphor are combined, is focused as an illumination of the next generation.

The white LED illumination, in which the high luminance blue LED and the phosphor emitting yellow color by being excited by the blue light generated from the LED are combined, is given as one of the examples of the one chip type white LED illumination. Specifically, for example, the high luminance blue LED and the yellow phosphor $(Y,Gd)_3(Al,Ga)_5O_{12}$:Ce (YAG:Ce),$Tb_3Al_5O_{12}$:Ce, $Ca_3Sc_2Si_3O_{12}$:Ce, and $CaSc_2O_4$:Ce can be combined. In the white LED illumination, white color is obtained by using a complementary relation between the blue emission of the LED and yellow emission of the phosphor, thereby allowing fewer phosphors to be used. Further, the yellow phosphor YAG:Ce used for the white LED illumination has an excitation spectrum with a peak near the wavelength of 460 nm, thereby allowing emission with high efficiency, and has an emission spectrum with a luminance (visibility) peak at about 560 nm, thereby allowing high luminance white LED to be obtained. However, the problem of the white LED illumination is that the emission on the long-wavelength side of visible light range, specifically the emission of red color component is insufficient, and therefore, only slightly bluish white emission can be obtained, and a slightly reddish white emission like an electric bulb can not be obtained, thereby deteriorating in the color rendering properties. However, in recent years, the phosphor having a broad emission spectrum with a peak in the wavelength range from yellow color to red color, and also having a good excitation band in a range from near ultraviolet/ultraviolet to blue color has been developed in sequence. Then, by adding such a phosphor, the color rendering properties are improved.

Also, the white color LED illumination in which white color is obtained by using a mixed state of colors of the lights of the LED emitting the near ultraviolet/ultraviolet color, and the phosphor emitting red color (R), the phosphor emitting green color (G), and the phosphor emitting blue (B) color obtained by being excited by the near ultraviolet/ultraviolet light generated from the LED, is given as another example of the one chip type white LED illumination. A method of obtaining white emission by the lights of the R, G, B, and other colors is capable of obtaining an arbitrary emission color other than white light, depending on the combination and mixed ratio of the R, G, B, and is excellent in color rendering properties, because the white emission is obtained not by the complementary relation of the light but by the relation of mixed state of colors using the R, G, B.

Then, as the phosphor used for such an application, examples are given such as $Y_2O_2S$:Eu, $La_2O_2S$:Eu, $3.5MgO \cdot 0.5MgF_2 \cdot GeO_2$:Mn, $(La,Mn,Sm)_2O_2S \cdot Ga_2O_3$:Eu for the red phosphor, ZnS:Cu,Al,$SrAl_2O_4$:Eu, BAM:Eu,Mn, $Ba_2SiO_4$:Eu for the green phosphor, and BAM:Eu, $Sr_6(PO_4)_3$Cl:Eu, ZnS:Ag, $(Sr,Ca,Ba,Mg)_{10}(PO_4)_6Cl_2$:Eu for the blue phosphor. However, the red phosphor out of the phosphors of three colors has a sharp emission spectrum, while the phosphors of other colors have broad emission spectra, thereby involving the problem that the color rendering properties of the white light obtained is unsatisfactory, and emission characteristic at a high temperature is deteriorated. However, such a problem has also been solved, as described above, by developing in sequence the phosphors containing nitrogen, excellent in temperature characteristic and excitation band characteristic, and emitting from yellow color to red color.

The problem involved in the phosphor emitting yellow color to red color is substantially solved, by developing the phosphor having the emission spectrum with a peak in the wavelength range from yellow color to red color, having a broad emission spectrum, and further having a good excitation band in the wavelength range from the near ultraviolet/ultraviolet to blue color. As the phosphor containing nitrogen as described above, $Ca_2Si_5N_8$:Eu, $Sr_2Si_5N_8$:Eu, $Ba_2Si_6N_8$:Eu, $Ca_x(Al,Si)_{12}(O,N)_{16}$:Eu ($0<x\leqq1.5$), $CaAl_2Si_4N_8$:Eu, $CaAlSiN_3$:Eu and so forth are typically given as examples.

Here, as a necessary factor as a light source for a general illumination such as a white LED as described above, firstly a factor of brightness and secondary a factor of color rendering properties are given as examples. As the first factor of brightness, the brightness (luminance) as the light source and emission efficiency are given as examples, and the LED is largely influenced by the emission efficiency of the used semiconductor element, the emission efficiency of the used phosphor, and the structure of the white LED itself. As the second color rendering property, a value showing reproducibility of the color by the light source is given as an example, and generally an evaluation method of this color rendering property is shown in JISZ8726 (1990). Therefore, the color rendering property will be explained by using the evaluation method of JISZ8726.

According to JISZ8726, the color rendering property of the light source is numerically expressed by an average color rendering index (Ra). This is a value obtained by evaluating a difference between a reference sample for color rendering evaluation illuminated by a sample light source, and a reference sample illuminated by a reference light approximated a natural light, and when there is no difference between them and they are completely the same values, the color rendering index (Ra) is 100. Even if a color temperature of the light source is the same, there is a difference in the way color is observed depending on the color rendering index, and when the color rendering index is low, a dull color or dark color is shown. When the light source has a uniform density of light over an entire region of visible light, this light source has an excellent color rendering property.

The color rendering property is improved by development of the aforementioned new phosphor emitting light from yellow color to red color, and the phosphor with the emission peak wavelength from green color to yellow color poses the next problem.

First, the problem involved in the yellow phosphor YAG:Ce is explained by using FIG. 25. FIG. 25 is a graph showing the emission intensity (relative intensity) taken on the ordinate axis and the wavelength of an excitation light taken on the abscissa axis, and showing an excitation spectrum obtained by measuring an intensity of the light having the wavelength of 559.2 nm emitting light when the YAG:Ce is excited by an excitation light having the wavelength of 300 to 570 nm.

In the white LED illumination obtained by combining the high luminance blue LED and the YAG:Ce phosphor emitting yellow color by being excited by blue color generated from the LED, the YAG:Ce phosphor has a high efficient excitation band for the light having the wavelength of 460 nm generated from the blue LED, and further, has an emission spectrum with a peak at closest to the wavelength of 560 nm in which the luminance (visibility) is highest, thereby allowing a high luminance white LED illumination to be obtained. However, as clarified from FIG. 25, the YAG:Ce phosphor has an emission characteristic of emitting the light having the wavelength of 560 nm or around with high efficiency, when excited by the light having the wavelength of 460 nm. However, since the excitation band is narrow, the emission wavelength of the blue LED is changed due to variation in manufacturing the blue LED when excited by the blue light of the blue LED, then if the emission wavelength is deviated from the range of an optimal excitation band of the YAG:Ce phosphor, disruption of balance between the blue color and yellow color emission intensity occurs. Such a situation involves the problem that color tone of the white light obtained by synthesizing the blue light and the yellow light is changed.

Further, this YAG:Ce phosphor has an excellent emission spectrum in the wavelength range from about 500 to 550 nm of green color component of visible light. Therefore, preferably the YAG:Ce phosphor is used as a green phosphor of the white LED illumination in which the near ultraviolet/ultraviolet LED, the red (R) color emitting phosphor, the green (G) color emitting phosphor, and the blue color (B) emitting phosphor are combined. However, when emitted by the near ultraviolet/ultraviolet light, as shown in FIG. 25, this YAG:Ce phosphor has a low efficient excitation band in the emission wavelength of 380 to 410 nm or around of the near ultraviolet/ultraviolet LED. Therefore, the problem involved therein is that a sufficient emission can not be obtained, and the high luminance white LED illumination can not be obtained.

Next, the problem involved in the green phosphor used in combination with the ultraviolet LED will be explained. As the white LED illumination using the light in a mixed state of the near ultraviolet/ultraviolet emitting LED and the red (R) color emitting phosphor, the green (G) color emitting phosphor, and the blue (B) color emitting phosphor obtained by being excited by the light of the near ultraviolet/ultraviolet light generated from the LED, at present, the green phosphor such as ZnS:Cu,Al, $SrAl_2O_4$:Eu, BAM:Eu,Mn, $Ba_2SiO_4$:Eu are used. Out of such phosphors, the problem is that a sulfide phosphor is significantly deteriorated in emission intensity, when heat is applied thereto, and further has no water-resisting property. In addition, an oxide phosphor does not have a good efficient excitation band in a broad range of the wavelength in the vicinity of the near ultraviolet/ultraviolet. Therefore, the problem involved therein is that when the variation in emission wavelength occurs due to by variation in manufacturing the near ultraviolet/ultraviolet LED, the emission wavelength of the near ultraviolet/ultraviolet LED is deviated from the optimal excitation range, thereby disrupting the balance in emission intensity among the red color, green color, and blue color, resulting in the change of the color tone of the white light.

Therefore, as the green to yellow emitting phosphor by being excited by the light of the near ultraviolet/ultraviolet to blue color also, demand on the new phosphor having a flat high efficient excitation band in the wavelength range from the near ultraviolet/ultraviolet to blue color, and having a broad emission spectrum, and further having an excellent durability against heat and water, and replacing the YAG:Ce phosphor and the ZnS:Cu,Al phosphor is increased. In order to respond to such a demand, the green to yellow emitting phosphor is actively pursued, and in recent years, silicon nitride-based phosphor (for example see patent document 1), a phosphor comprising sialon as a matrix (for example, see patent documents 2, 3, 4), and oxynitride phosphor (for example, see patent documents 5 and 6) are proposed as the green to yellow emitting phosphor.

(Patent document 1) Japanese Patent Laid Open No. 2002-322474 (Patent document 2) Japanese Patent Laid Open No. 2003-203504 (Patent document 3) Japanese Patent Laid Open No. 2003-206481 (Patent document 4) Japanese Patent Laid Open No. 2002-363554 (Patent document 5) WO Publication No. 2004/029177 A1 pamphlet (Patent document 6) WO Publication No. 2004/055910 A1 pamphlet

DISCLOSURE OF THE INVENTION

Problem to be Solved by the Invention

However, although such a phosphor containing nitrogen has an excellent durability against heat and water, has a flat excitation band in the wavelength range from the near ultraviolet/ultraviolet to blue color, and has an emission spectrum with a broad peak, the emission efficiency does not meet a satisfactory level when excited by the excitation light of the near ultraviolet/ultraviolet to blue color, and a sufficient emission intensity and luminance are not obtained. Therefore, although the white LED illumination having an excellent durability can be manufactured, the emission intensity and luminance are insufficient. Therefore, when the one chip type white LED illumination is manufactured by combining the near ultraviolet/ultraviolet LED and the blue LED or the like and the aforementioned phosphor containing nitrogen, the luminance which is a most important factor as the illumination becomes insufficient. In addition, as a demand of a market hereafter, the emission device capable of performing various emissions such as a white color emission having excellent emission efficiency, excellent luminance, and excellent color rendering properties, are considered to be desired.

In view of the aforementioned problems, the present invention is provided, and an object of the present invention is to provide a phosphor having a broad emission spectrum with a peak from green color to yellow color, having a flat excitation band in the range from near ultraviolet/ultraviolet to blue color, and having an excellent emission efficiency and luminance, a manufacturing method thereof, a phosphor mixture using this phosphor, a phosphor sheet, and an emission device such as a white LED illumination using such a phosphor.

Means to Solve the Problem

In order to solve the aforementioned problems, study on the response to the emission device or a light source having an excellent luminance and excellent color rendering properties is pursued. Then, as a result, it is found that the aforementioned problem can be solved by combining the yellow to green phosphor with a broad emission spectrum with a maximum peak (the maximum peak of the emission spectrum is sometimes described as simply a maximum peak hereunder) in a range from 520 nm to 580 nm, and having the excitation band to the light of a broad wavelength from the ultraviolet to the visible light (such as blue light), and the phosphor of other colors.

Namely, by creating the phosphor mixture by combining this green phosphor, the red phosphor similarly having the excitation band to the light with a broad wavelength from the ultraviolet to the visible light (such as a blue light), and having the emission spectrum with a maximum peak in the wavelength range from 590 nm to 680 nm, and/or the blue phosphor having the emission spectrum with a maximum peak in the range from 420 nm to 500 nm, and when this phosphor mixture and various light sources (such as the light source from the ultraviolet light to blue light) are combined, it is found that the emission device capable of causing various light emissions such as the white emission having the excellent emission efficiency, with high luminance, and having excellent color rendering properties can be manufactured.

Therefore, study on the already known green and yellow phosphors having the emission spectrum with a maximum peak in the range from 520 nm to 580 nm and the phosphor described in the patent document 3 are firstly studied on. However, it is found that the already known green and yellow phosphors have low emission efficiency even if the blue LED and the ultraviolet LED are used as the excitation light, thus making it impossible to obtain the light emission with high luminance.

Therefore, in order to solve the aforementioned problems, study on various phosphor compositions containing nitrogen is pursued. Then, as a result, it is found that a new phosphor having a broad flat excitation band in the range from near ultraviolet/ultraviolet to blue color, having an improved emission intensity and luminance in the range from green color to yellow color, and having a broad emission spectrum can be obtained by adjusting the phosphor with a matrix composition having a site where Ce and Eu atoms can be easily and stably replaced. Further, it is found that the phosphor having excellent emission intensity and luminance in the range from yellow color to red color is obtained, when Eu or the like is used as an activator.

Further, the above-described problem can be solved by developing the phosphor mixture obtained by mixing one or more kind of phosphor having the emission spectrum with a maximum peak in the wavelength range from 420 nm to 500 nm and/or one or more kind of red phosphor having the emission spectrum with a maximum peak in the wavelength range form 590 nm to 680 nm, and further the emission device having this phosphor mixture and an emission part for emitting light with the wavelength range from 300 nm to 500 nm.

In order to solve the above-described problems, the present invention takes several aspects as follows.

In a first aspect, a phosphor is provided, which is given as a general composition formula expressed by MmAaBbOoNn:Z, (where element M is one or more kinds of elements having bivalent valency, element A is one or more kinds of elements having tervalent valency, element B is one or more kinds of elements having tetravalent valency, O is oxygen, N is nitrogen, and element Z is the element acting as the activator), satisfying $4.0<(a+b)/m<7.0$, $a/m \geqq 0.5$, $b/a>2.5$, $n>o$, $n=2/3 m+a+4/3b-2/3o$, wherein when being excited by the light with the wavelength range from 300 nm to 500 nm, the phosphor has an emission spectrum with a peak wavelength in a range from 500 nm to 650 nm.

In a second aspect, the phosphor according to the first aspect is provided, satisfying $0.5 \geqq a/m \geqq 2.0$, $3.0<b/m<7.0$, $0<o/m \leqq 4.0$.

In a third aspect, the phosphor according to either of the first aspect or the second aspect is provided, satisfying by $0.8 \leqq a/m \leqq 1.5$, $3.0<b/m<6.0$, $0<o/m \leqq 3.0$.

In a fourth aspect, the phosphor according to any one of the first to third aspects is provided, satisfying $1.1<a/m \leqq 1.5$, $3.5 \leqq b/m \leqq 4.5$, $0<o/m \leqq 1.5$.

In a fifth aspect, the phosphor according to any one of the first to fourth aspects is provided, wherein the element M is one or more kind of element selected from the group consisting of Mg, Ca, Sr, Ba, Zn, and rare earth elements having bivalent valency, the element A is one or more kind of element selected from the group consisting of Al, Ga, In, Tl, Y, Sc, P, As, Sb, and Bi, the element B is one or more kind of element selected from the group consisting of Si, Ge, Sn, Ti, Hf, Mo, W, Cr, Pb, and Zr, and the element Z is one or more kind of element selected from rare earth elements and transitional metal elements.

In a sixth aspect, the phosphor according to any one of the first to fifth aspects is provided, wherein the element M is one or more kind of element selected from the group consisting of Mg, Ca, Sr, Ba, and Zn, the element A is one or more kind of element selected from the group consisting of Al, Ga, and In, the element B is Si and/or Ge, and the element Z is one or more kind of element selected from the group consisting of Eu, Ce, Pr, Tb, and Mn.

In a seventh aspect, the phosphor according to any one of the first to sixth aspects is provided, wherein the element M is Sr, the element A is Al, the element B is Si, and the element Z is Eu and/or Ce.

In an eighth aspect, the phosphor according to any one of the first to seventh aspects is provided, wherein when the general formula is expressed by MmAaBbOoNn:Zz, the value of $z/(m+z)$, which is a molar ratio of the element M to the element Z, is not less than 0.0001 and not more than 0.5.

In a ninth aspect, the phosphor according to any one of the first to eighth aspects is provided, containing Sr of 19.5 to 29.5 wt %, Al of 5.0 to 16.8 wt %, O of 0.5 to 8.1 wt %, N of 26.0 to 32.0 wt %, and Ce of 0 to 3.5 wt %, wherein when the phosphor is irradiated with one or more kind of monochromatic light or continuous light having the wavelength range from 350 nm to 500 nm as an excitation light, a peak wavelength in the emission spectrum is in the range from 500 to 600 nm, and x of chromaticity (x, y) of the emission spectrum is in the range from 0.3000 to 0.4500, and y of the chromaticity (x, y) is in the range from 0.5000 to 0.6000.

In a tenth aspect, the phosphor according to any one of the first to eighth aspects is provided, containing Sr of 19.5 to 29.5 wt %, Al of 5.0 to 16.8 wt %, O of 0.5 to 8.1 wt %, N of 22.6 to 32.0 wt %, and Eu of 0 to 3.5 wt %, wherein when the phosphor is irradiated with one or more kind of monochromatic light or continuous light having the wavelength range from 350 nm to 500 nm as an excitation light, the peak wavelength of the emission spectrum is in the range from 550 to 650 nm, and x of the chromaticity of the emission spectrum (x, y) is in the range from 0.4500 to 0.6000, and y of the chromaticity of the emission spectrum (x, y) is in the range from 0.3500 to 0.5000.

In an eleventh aspect, the phosphor according to the tenth aspect is provided, wherein when the phosphor is irradiated with the monochromatic light having the wavelength range from 350 nm to 500 nm as an excitation light, the relation of $P_H$ and $P_L$ is given satisfying $(P_H-P_L)/P_H \times 100 \leqq 20$, when a peak intensity of a maximum peak in a spectrum of light emission that occurs by absorbing the excitation light that makes it highest is defined as $P_H$, and the peak intensity of the maximum peak in the spectrum of light emission that occurs by absorbing the excitation light that makes it smallest is defined as $P_L$.

In a twelfth aspect, the phosphor according to any one of the first to eleventh aspects is provided, wherein when the value of relative intensity of the maximum peak in the emission spectrum is defined as $P_{25}$ when the phosphor is irradiated with a specified monochromatic light in the wavelength range from 300 nm to 500 nm as the excitation light at 25° C., and the value of the relative intensity of the maximum peak is defined as $P_{200}$ when the phosphor is irradiated with the specified monochromatic light as the excitation light at 200° C., the relation of $P_{25}$ and $P_{200}$ is given satisfying $(P_{25}-P_{200})/P_{25} \times 100 \leqq 35$.

In a thirteenth aspect, the phosphor according to any one of the first to twelfth aspects is provided, containing a primary particle with particle size of 50 µm or less and aggregates in which the primary particle agglutinates, wherein an average particle size (D50) of the powdery phosphor containing the primary particle and the aggregates is 1.0 µm or more and 50.0 µm or less.

In a fourteenth aspect, the phosphor according to any one of the first to thirteenth aspects is provided, containing the primary particle with particle size of 20 µm or less and the aggregates in which the primary particle agglutinates, wherein the average particle size (D50) of the powdery phosphor containing the primary particle and the aggregates is 1.0 µm or more and 20.0 µm or less.

In a fifteenth aspect, a method of manufacturing the phosphor according to any one of the first to fourteenth aspects is provided, wherein by using a crucible composed of nitride as a firing crucible, raw materials are fired at temperature of 1400° C. or more and 2000° C. or less in an atmosphere containing one or more kind of gas selected from nitrogen gas, rare gas, and ammonium gas.

In a sixteenth aspect, the method of manufacturing the phosphor according to the fifteenth aspect is provided, wherein the raw materials are fired by setting pressure inside furnace at 0.001 MPa or more and 0.5 MPa or less.

In a seventeenth aspect, the method of manufacturing the phosphor according to either of the fifteenth or sixteenth aspect is provided, wherein the crucible composed of nitride is a BN crucible.

In an eighteenth aspect, the method of manufacturing the phosphor according to any one of the fifteenth to seventeenth aspects is provided, wherein the raw materials are fired, with 0.1 ml/min or more gas containing one or more kind of gas selected from the nitrogen gas, rare gas, and the ammonium gas flowing inside the furnace.

In a nineteenth aspect, the method of manufacturing the phosphor according to the eighteenth aspect is provided, wherein the gas containing 80% or more of nitrogen gas is used as an atmosphere gas inside said furnace.

In a twentieth aspect, the method of manufacturing the phosphor according to any one of the fifteenth to nineteenth aspect is provided, wherein by using a raw material particle of 10 µm or less, the raw material is fired in a powdery state.

In a twenty-first aspect, a phosphor mixture is provided, including the phosphor described in any one of the first to fourteenth aspects, one or more kind of blue phosphor having the emission spectrum with a maximum peak in the wavelength range from 420 nm to 500 nm, when being excited with said excitation light in the wavelength range from 300 nm to 500 nm, and/or one or more kind of red phosphor having the emission spectrum with a maximum peak in the wavelength range from 590 nm to 680 nm, when being excited with the excitation light in the wavelength range form 300 nm to 500 nm.

In a twenty-second aspect, a phosphor mixture is provided, including the phosphor described in any one of the first to fourteenth aspects, one or more kind of blue phosphor having the emission spectrum with a maximum peak in the wavelength range form 420 nm to 500 nm when being excited by said excitation light in the wavelength range from 300 nm to 420 nm, and one or more kind of read phosphor having the emission spectrum with a maximum peak in the wavelength range from 590 nm to 680 nm, when being excited with the excitation light in the wavelength range from 300 nm to 420 nm.

In a twenty-third aspect, a phosphor mixture is provided, which is the phosphor mixture according to the twenty-first or twenty-second aspect, wherein when emission intensity of each phosphor constituting a mixture at a temperature of 25° C. when being excited by a specified excitation light in the wavelength range from 300 nm to 500 nm is defined as $P_{25}$, and the emission intensity at a temperature of 200° C. when being excited by said specified excitation light is defined as $P_{200}$, $((P_{25}-P_{200})/P_{25}) \times 100 \leqq 30$.

In a twenty-fourth aspect, the phosphor mixture according to the twenty-first or twenty-third aspect is provided, wherein in the emission spectrum under excitation of the excitation light in a range from 300 nm to 420 nm, a correlated color temperature is in a range from 7000K to 2500K, with three or more emission peaks in the wavelength range from 420 nm to 750 nm and with a continuous spectrum without being interrupted in the wavelength range from 420 nm to 780 nm.

In a twenty-fifth aspect, the phosphor mixture according to any one of the twenty-first to twenty-fourth aspects is provided, wherein a red phosphor having the emission spectrum with a peak in the wavelength range from 590 nm to 680 nm is given as a general composition formula expressed by MmAaBbOoNn:Z, (where the element M is one or more kinds of elements selected from the group consisting of Ca, Mg, Sr, Ba, and Zn, the element A is one or more kinds of elements selected from the group consisting of Al, Ga, and In, the element B is one or more kinds of elements selected from the group consisting of Si, Ge, and Sn, and the element Z is one or more kinds of elements selected from rare earth elements and transitional metal elements), satisfying n=2/3m+a+4/3b−2/3o, m=1, a≧0, b≧m, n>0, o≧0).

In a twenty-sixth aspect, the phosphor mixture according to the twenty-fifth aspect is provided, wherein the red phosphor having the emission spectrum with the maximum peak in the wavelength range from 590 nm to 680 nm meets the equation of m=a=b=1, and n=3, having the composition formula expressed by CaAlSiN$_3$:Eu.

In a twenty-seventh aspect, the phosphor mixture according to any of the twenty-first to twenty-sixth aspect is provided, wherein a blue phosphor having the emission spectrum with a maximum peak in the wavelength range from 420 nm to 500 nm is one or more kind of phosphor selected from BAM:Eu(BaMgAl$_{10}$O$_{17}$:Eu), (Sr,Ca,Ba,Mg)$_{10}$(PO$_4$)$_6$Cl$_2$:Eu. In addition, an expression of (Sr,Ca,Ba,Mg) means concluding at least one of Sr, Ca, Ba, or Mg, and this applies to a similar expression.

In a twenty-eighth aspect, the phosphor mixture according to any one of the twenty-first to twenty-seventh aspects is provided, wherein the phosphor mixture is composed of a phosphor having an average particle size (D50) of 1 μm or more and 50 μm or less.

In a twenty-ninth aspect, a phosphor sheet is provided, wherein the phosphor mixture according to any one of the twenty-first to twenty-eighth aspects are dispersed in resin or glass.

In a thirtieth aspect, a light emission device is provided, having the phosphor according to any one of the first to fourteenth aspects and a light emission part for emitting light of a first wavelength, wherein the light of a different wavelength from the first wavelength is emitted from the phosphor, by using a part or an entire part of the light of the first wavelength as an excitation light.

In a thirty-first aspect, the light emission device is provided, having the phosphor mixture according to any one of the twenty-first to twenty-eighth aspects and the light emission part for emitting light of the first wavelength, wherein the light of the different wavelength from the first wavelength is emitted from the phosphor, by using a part or an entire part of the light of the first wavelength as an excitation light.

In a thirty-second aspect, a light emission device is provided, having the phosphor sheet of the twenty-ninth aspect and the light emission part for emitting light of the first wavelength, wherein the light of the different wavelength from the first wavelength is emitted from the phosphor, by using a part or an entire part of the light of the first wavelength as an excitation light.

In a thirty-third aspect, a light emission device according to any one of the thirtieth to thirty-second aspects is provided, wherein the first wavelength is the wavelength of 350 nm to 500 nm.

In a thirty-fourth aspect, the light emission device according to any one of the thirtieth to thirty-third aspects is provided, wherein the correlated color temperature of the light emission device is in a range from 10000K to 2000K.

In a thirty-fifth aspect, the light emission device according to any one of the thirtieth to thirty-fourth aspects is provided, wherein the correlated color temperature of the light emission device is in a range from 7000K to 2500K.

In a thirty-sixth aspect, the light emission device according to any one of the thirtieth to thirty-fifth aspects is provided, wherein an average color rendering index Ra of the light emission device is 80 or more.

In a thirty-seventh aspect, the light emission device according to any one of the thirtieth to thirty-sixth aspects is provided, wherein a special color rendering index R15 of the light emission device is 80 or more.

In a thirty-eighth aspect, the light emission device according to any one of the thirtieth to thirty-seventh aspects is provided, wherein a special color rendering index R9 of the light emission device is 60 or more.

In a thirty-ninth aspect, the light emission device according to any one of the thirtieth to thirty-eighth aspects is provided, wherein the light emission part is a light emitting diode (LED).

In a fortieth aspect, a phosphor given as a general composition formula expressed by MmAaBbOoNn:Z, (where element M is one or more kinds of elements having bivalent valency, element A is one or more kinds of elements having tervalent valency, element B is one or more kinds of elements having tetravalent valency, O is oxygen, N is nitrogen, and element Z is the element acting as the activator), satisfying 4.0<(a+b)/m<7.0, a/m≧0.5, b/a>2.5, n>o, n=2/3 m+a+4/3b−2/3o.

In a forty-first aspect, the phosphor according to the fortieth aspect is provided, satisfying 0.5≦a/m≦1.5, 3.5<b/m<6.5, 0<o/m<4.0.

In a forty-second aspect, the phosphor according to the fortieth or forty-first aspect is provided, satisfying 0.8≦a/m≦1.2, 4.0≦b/m≦6.0, 0<o/m≦3.0.

In a forty-third aspect, the phosphor according to any one of the fortieth to forty-second aspects is provided, wherein the element M is one or more kind of element selected from the group consisting of Mg, Ca, Sr, Ba, Zn and rare earth elements having bivalent valency, the element A is one or more kind of element selected from the group consisting of Al, Ga, In, Ti, Y, Sc, P, As, Sb, and Bi, the element B is one or more kind of element selected from the group consisting of Si, Ge, Sn, Ti, Hf, Mo, W, Cr, Pb, Zr, and the element Z is one or more kind of element selected from the group consisting of rare earth elements and transitional metal elements.

In a forty-forth aspect, the phosphor according to any one of the fortieth to forty-third aspects is provided, wherein the element M is one or more kind of element selected from the group consisting of Mg, Ca, Sr, Ba, Zn, the element A is one or more kind of element selected from the group consisting of Al, Ga, In, the element B is Si and/or Ge, and the element Z is one or more kind of element selected from the group consisting of Eu, Ce, Pr, Tb, and Mn.

In a forty-fifth aspect, the phosphor according to any one of the fortieth to forty-forth aspects is provided, wherein the element M is Sr, the element A is Al, the element B is Si, and the element Z is Eu and/or Ce.

In a forty-sixth aspect, the phosphor according to any one of the fortieth to forty-fifth aspects is provided, wherein when the general formula is expressed by MmAaBbOoNn:Zz, the value of z/(m+z), which is a molar ratio of the element M to the element Z, is 0.0001 or more and 0.5 or less.

In a forty-seventh aspect, the phosphor according to any one of the fortieth to forty-sixth aspects is provided, which is given as formulas expressed by: Sr$_6$Al$_6$Si$_{18}$O$_3$N$_{32}$:Ce, SrAlSi$_3$ON$_5$:Ce, Sr$_3$Al$_3$Si$_9$O$_6$N$_{13}$:Ce, Sr$_6$Al$_6$Si$_{24}$O$_3$N$_{40}$:Ce, Sr$_3$Al$_3$Si$_{12}$O$_3$N$_{19}$:Ce, Sr$_3$Al$_3$Si$_{12}$O$_6$N$_{17}$:Ce, Sr$_6$Al$_6$Si$_{27}$O$_3$N$_{44}$:Ce, Sr$_2$Al$_2$Si$_9$O$_2$N$_{14}$:Ce, Sr$_6$Al$_6$Si$_{27}$O$_{12}$N$_{38}$:Ce, Sr$_2$Al$_2$Si$_{10}$ON$_{16}$:Ce, Sr$_3$Al$_3$Si$_{15}$O$_3$N$_{23}$:Ce, SrAlSi$_5$O$_2$N$_7$:Ce, Sr$_6$Al$_6$Si$_{36}$O$_3$N$_{56}$:Ce, SrAlSi$_6$ON$_9$:Ce, Sr$_3$Al$_3$Si$_{19}$O$_6$N$_{25}$:Ce, Sr$_6$Al$_6$Si$_{18}$O$_3$N$_{32}$:Eu, SrAlSi$_3$ON$_5$:Eu, Sr$_3$Al$_3$Si$_9$O$_6$N$_{13}$:Eu, $Sr_6Al_6Si_{24}O_3N_{40}$:Eu, $Sr_3Al_3Si_{12}O_3N_{19}$:Eu, $Sr_3Al_3Si_{12}O_6N_{17}$:Eu, $Sr_6Al_6Si_{27}O_3N_{44}$:Eu, $Sr_2Al_2Si_9O_2N_{14}$:Eu, $Sr_6Al_6Si_{27}O_{12}N_{38}$:Eu, $Sr_2Al_2Si_{10}ON_{16}$:Eu, $Sr_3Al_3Si_{15}O_3N_{23}$:Eu, $SrAlSi_5O_2N_7$:Eu, $Sr_6Al_6Si_{36}O_3N_{56}$:Eu, $SrAlSi_6ON_9$:Eu, $Sr_3Al_3Si_{19}O_6N_{25}$:Eu.

In a forty-eighth aspect, the phosphor according to any one of fortieth to forty-seventh aspects, containing Sr of 20.0 to 27.0 wt %, Al of 5.0 to 9.0 wt %, Si of 30.0 to 39.0 wt %, O of 0.5 to 6.0 wt %, N of 26.0 to 32.0 wt %, and Ce of 0 to 3.5 wt %, wherein when the phosphor is irradiated with one or more kind of monochromatic light or continuous light having the wavelength range from 350 nm to 500 nm as an excitation light, a peak wavelength in the emission spectrum is in the range from 500 to 600 nm, and x of chromaticity (x, y) of the emission spectrum is in the range from 0.3500 to 0.4500, and y of the chromaticity (x, y) is in the range from 0.5000 to 0.6000.

In a forty-ninth aspect, the phosphor according to any one of the fortieth to forty-seventh aspects is provided, containing Sr of 20.0 to 27.0 wt %, Al of 5.0 to 9.0 wt %, Si of 30.0 to 39.0 wt %, O of 0.5 to 6.0 wt %, N of 26.0 to 32.0 wt %, and Eu of 0 to 3.5 wt %, wherein when the phosphor is irradiated with one or more kind of monochromatic light or continuous light having the wavelength range from 350 nm to 550 nm as an excitation light, the peak wavelength of the emission spectrum is in the range from 550 to 650 nm, and x of the chromaticity of the emission spectrum (x, y) is in the range from 0.4500 to 0.6000, and y of the chromaticity of the emission spectrum (x, y) is in the range from 0.3500 to 0.5000.

In a fiftieth aspect, the phosphor according to the forty-ninth aspect is provided, wherein when the phosphor is irradiated with the monochromatic light having the wavelength range from 350 nm to 550 nm as an excitation light, the relation of $P_H$ and $P_L$ is given satisfying $(P_H-P_L)/P_H \leq 0.20$, when a peak intensity of a maximum peak in a spectrum of light emission that occurs by absorbing the excitation light that makes it highest is defined as $P_H$, and the peak intensity of the maximum peak in the spectrum of light emission that occurs by absorbing the excitation light that makes it smallest is defined as $P_L$.

In a fifty-first aspect, the phosphor according to any one of the fortieth to fiftieth aspects is provided, wherein in an X-ray powder diffraction pattern by CoKα ray, when the maximum peak is defined as a, b, and c, respectively, with Bragg angle (2θ) in a range from 28.5° to 29.5°, 35.5° to 36.5°, and 41.0° to 42.0°, and a peak intensity ratio of a to b is defined as I(a/b), and the peak intensity ratio of c to b is defined as I(c/b), the relation of a, b, c is given satisfying 0.20<I(a/b),I(c/b)<1.50.

In a fifty-second aspect, the phosphor according to any one of the fortieth to fifty-first aspects is provided, wherein when the value of relative intensity of the maximum peak in the emission spectrum is defined as $P_{25}$ when the phosphor is irradiated with a specified monochromatic light in the wavelength range from 350 nm to 550 nm as the excitation light at 25° C., and the value of the relative intensity of the maximum peak is defined as $P_{200}$ when the phosphor is irradiated with the specified monochromatic light as the excitation light at 200° C., the relation of $P_{25}$ and $P_{200}$ is given satisfying $(P_{25}-P_{200})/P_{25} \times 100 \leq 35$.

In a fifty-third aspect, the phosphor according to any one of the fortieth to fifty-second aspects is provided, wherein the phosphor is a powdery form.

In a fifty-forty aspect, the phosphor according to the fifty-third aspect is provided, containing a primary particle with particle size of 20 μm or less and aggregates in which the primary particle agglutinates, wherein an average particle size (D50) of the powdery phosphor containing the primary particle and the aggregates is 1.0 μm or more and 20.0 μm or less.

In a fifty-fifth aspect, a phosphor mixture is provided, a phosphor given as a general composition formula expressed by MmAaBbOoNn:Z, (where element M is one or more kinds of elements having bivalent valency, element A is one or more kinds of elements having tervalent valency, element B is one or more kinds of elements having tetravalent valency, O is oxygen, N is nitrogen, and element Z is the element acting as the activator), satisfying 4.0<(a+b)/m<7.0, 0.5≦a/m≦2.0 m 3.0≦b/m≦7.0, 0<o/m≦5.0, n=2/3 m+a+4/3b−2/3o, and included therein are:

a green phosphor having an emission spectrum with a maximum peak in a wavelength range from 520 nm to 580 nm when the phosphor is irradiated with one or more kind of monochromatic light or continuous light in the wavelength range from 300 nm to 420 nm as an excitation light;

one or more kind of blue phosphor having the emission spectrum in a wavelength range from 420 nm to 500 nm when the phosphor is irradiated with the excitation light in a wavelength range from 300 nm to 420 nm; and one or more kind of red phosphor having the emission spectrum in a wavelength range from 590 nm to 680 nm when being excited with the excitation light in the wavelength range from 300 nm to 420 nm.

In a fifty-sixth aspect, the phosphor mixture according to the fifty-fifth aspect is provided, wherein the green phosphor having the emission spectrum with a maximum peak in the wavelength range from 520 nm to 580 nm is expressed by 0.5≦a/m≦2.0, 4.0≦b/m≦6.0, 0<o/m≦3.0.

In a fifty-seventh aspect, the phosphor mixture according to the fifty-fifth aspect or the fifty-sixth aspect is provided, wherein the element M is one or more kind of elements selected from the group consisting of Ca, Mg, Sr, Ba, and Zn;

the element A is one or more kind of elements selected from the group consisting of Al, Ga, and In;

the element B is one or more kind of elements selected from the group consisting of Si, Ge, and Sn; and the element Z is one or more kind of elements selected from rare earth elements and transitional metal elements.

In a fifty-eighth aspect, the phosphor mixture according to any one of the fifty-fifth to fifty-seventh aspects is provided, wherein the element Z is Ce.

In a fifty-ninth aspect, the phosphor mixture is provided, wherein when emission intensity of each phosphor constituting a mixture at a temperature of 25° C. when being excited by a specified excitation light in the wavelength range from 300 nm to 420 nm is defined as $P_{25}$, and the emission intensity at a temperature of 200° C. when being excited by said specified excitation light is defined as $P_{200}$, $((P_{25}-P_{200})/P_{25}) \times 100 \leq 30$.

In a sixtieth aspect, the phosphor mixture according to any one of the fifty-fifth to fifty-ninth aspects is provided, wherein in the emission spectrum under excitation of the excitation light in a range from 300 nm to 420 nm, a correlated color temperature is in a range from 7000K to 2000K, with three or more emission peaks in the wavelength range from 420 nm to 780 nm and with a continuous spectrum without being interrupted in the wavelength range from 420 nm to 780 nm.

In a sixty-first aspect, the phosphor mixture according to any one of the fifty-fifth to sixtieth aspects is provided, wherein a red phosphor having an emission spectrum with a maximum peak in the wavelength range from 590 nm to 680 nm is expressed by a composition formula of MmAaBbOoNn:Z (where the element M is one or more kind of elements selected from the group consisting of Ca, Mg, Sr, Ba, and Zn, the element A is one or more kind of elements selected from the group consisting of Al, Ga, and In, the element B is one or more kind of elements selected from the group consisting of Si, Ge, and Sn, and the element Z is one or more kind of elements selected from rare earth elements and transitional metal elements, satisfying n=2/3m+a+4/3b−2/3o, m=1, a≧0, n≧0, o>0).

In a sixty-second aspect, the phosphor mixture according to any one of the fifty-fifth to sixty-first aspects is provided, wherein a red phosphor having an emission spectrum with a maximum peak in the wavelength range from 590 nm to 680 nm meets the equation of m=a=b=1, and n=3, having a composition formula of $CaAlSiN_3$:Eu.

In a sixty-third aspect, the phosphor mixture according to any one of the fifty-fifth to sixty-second aspects is provided, wherein a blue phosphor having an emission spectrum with a maximum peak in the wavelength range from 420 nm to 500 nm is one or more kind of phosphor selected from BAM:Eu ($BaMgAl_{10}O_{17}$:Eu), $(Sr,Ca,Ba,Mg)_{10}(PO_4)_6Cl_2$:Eu.

In a sixty-forth aspect, the phosphor mixture according to any one of the fifty-fifth to sixty-third aspects is provided, wherein an average particle size (D50) of the powdery phosphor containing the primary particle and the aggregates is 1.0 μm or more and 20.0 μm or less.

In a sixty-fifth aspect, a phosphor is provided, which is given as a general composition formula expressed by MmAaBbOoNn:Z, (where element M is one or more kinds of elements having bivalent valency, element A is one or more kinds of elements having tervalent valency, element B is one or more kinds of elements having tetravalent valency, O is oxygen, N is nitrogen, and element Z is the element acting as the activator), satisfying 4.0<(a+b)/m<7.0, n>o, 1.2<a/m≦2.0, 3.0≦b/m≦4.5, 0<o/m≦1.5, n=2/3 m+a+4/3b−2/3o, and when the phosphor is irradiated with light with a wavelength range form 300 nm to 500 nm, a peak wavelength in an emission spectrum is in a range from 500 nm to 600 nm.

In a sixty-sixth aspect, the phosphor according to the sixty-fifth aspect is provided, wherein
the element M is one or more kind of element selected from the group consisting of Mg, Ca, Sr, Ba, Zn, the element A is one or more kind of element selected from the group consisting of Al, Ga, In, the element B is Si and/or Ge, and the element Z is one or more kind of element selected from the group consisting of Eu, Ce, Pr, Tb, Yb, and Mn.

In a sixty-seventh aspect, the phosphor according to the sixty-fifth or sixty-sixth aspect is provided, wherein the element M is Sr, the element A is Al, the element B is Si, and the element Z is Ce.

In a sixty-eighth aspect, the phosphor according to any one of the sixty-fifth to sixty-seventh aspect is provided, wherein when the general formula is expressed by MmAaBbOoNn:Zz, the value of z/(m+z), which is a molar ratio of the element M to the element Z, is not less than 0.0001 and not more than 0.5.

In a sixty-ninth aspect, the phosphor according to any one of the sixty-fifth to sixty-eighth aspects is provided, wherein when the value of relative intensity of the maximum peak in the emission spectrum is defined as $P_{25}$ when the phosphor is irradiated with a specified monochromatic light in the wavelength range from 300 nm to 500 nm as the excitation light at 25° C., and the value of the relative intensity of the maximum peak is defined as $P_{100}$ when the phosphor is irradiated with the specified monochromatic light as the excitation light at 100° C., the relation of $P_{25}$ and $P_{100}$ is given satisfying $(P_{25}-P_{100})/P_{25} \times 100 \leq 10$.

In a seventieth aspect, the phosphor according to any one of the sixty-fifth to sixty-ninth aspects is provided, containing a primary particle with particle size of 50 μm or less and aggregates in which the primary particle agglutinates, wherein an average particle size (D50) of the powdery phosphor containing the primary particle and the aggregates is 1.0 μm or more and 50.0 μm or less.

ADVANTAGE OF THE INVENTION

The phosphor according to any one of the first to tenth aspects has emission spectra with a broad peak in the range from green color to yellow color, or yellow color to red color, has a broad flat excitation band in the range from the near ultraviolet/ultraviolet to blue color, and has an improved emission intensity and luminance, and also has an excellent durability against heat and water.

The phosphor according to the eleventh aspect has a flat excitation band in the wavelength range from 350 nm to 550 nm. Therefore, even if there is a slight variation in the emission wavelength of the near ultraviolet/ultraviolet LED and the blue LED used as an excitation light of the one chip type white LED, disruption of balance in the emission intensity of each color does not occur, thereby allowing stable manufacture of the white LED illumination of the same color tone. Therefore, the phosphor of the eleventh aspect has a merit not only in quality but also in manufacturing cost.

The phosphor according to the twelfth aspect has a high emission intensity and a high luminance even at a high temperature of 200° C. Therefore, even when coated on an LED chip, which is considered to become high temperature at emitting, the emission intensity and the luminance are not lowered, thereby allowing high luminance one chip type white LED illumination to be obtained. In addition, there is little change in emission characteristics due to heat, and therefore the design of the emission color of the white LED illumination becomes easy.

According to the phosphor of the thirteenth aspect or the fourteenth aspect, the phosphor thus obtained is in a powdery state, thereby allowing the phosphor to be coated on various places as a paste. In addition, the phosphor has a particle size of 1.0 μm to 50.0 μm, and more preferably has a particle size of 1.0 μm to 20.0 μm thereby allowing the coating application density to be increased, to make it possible to obtain a coated film with high emission intensity and luminance.

According to a method of manufacturing the phosphor according to anyone of the fifteenth aspect to twentieth aspect, the phosphor according to any one of the first aspect to twelfth aspect can be manufactured at inexpensive manufacturing cost.

According to the phosphor mixture of any one of the twenty-first aspect to twenty-eighth aspect, when being irradiated with a specified excitation light, the phosphor mixture can efficiently emit light such as a white color with excellent luminance and color rendering properties.

According to the phosphor sheet of the twenty-ninth aspect, by combining this phosphor sheet and various light emission parts, various light emission devices can be easily manufactured.

According to the light emission device of any one of the thirtieth to thirty-ninth aspects, a high efficient emission device having a desired emission color and high emission intensity and luminance can be obtained.

The phosphor according to any one of the fortieth to forty-ninth aspects has emission spectra with a broad peak in the range from green color to yellow color, or yellow color to red color, has a broad flat excitation band in the range from the near ultraviolet/ultraviolet to blue color, and has an improved emission intensity and luminance, and also has an excellent durability against heat and water.

The phosphor according to the fiftieth aspect has a flat excitation band in the wavelength range from 350 nm to 550 nm. Therefore, even if there is a slight variation in the emission wavelength of the near ultraviolet/ultraviolet LED and the blue LED used as an excitation light of the one chip type white LED, disruption of balance in the emission intensity of each color does not occur, thereby allowing stable manufacture of the white LED illumination of the same color tone. Therefore, the phosphor of the eleventh aspect has a merit not only in quality but also in manufacturing cost.

The phosphor according to the fifty-second aspect has a high emission intensity and a high luminance even at a high temperature of 200° C. Therefore, even when coated on an LED chip, which is considered to become high temperature at emitting, the emission intensity and the luminance are not lowered, thereby allowing high luminance one chip type white LED illumination to be obtained. In addition, there is little change in emission characteristics due to heat, and therefore the design of the emission color of the white LED illumination becomes easy.

According to the phosphor of the fifty-third or fifty-forth aspect, the phosphor thus obtained is in a powdery state, thereby allowing the phosphor to be coated on various places as a paste. In addition, the phosphor has a particle size of 1.0 μm to 20.0 μm, thereby allowing the coating application density to be increased, to make it possible to obtain a coated film with high emission intensity and luminance.

According to a method of manufacturing the phosphor of any one of the fifty-fifth to sixty-forth aspects, when being irradiated with a specified excitation light, the phosphor mixture efficiently emits light and emits light such as a white color having excellent luminance and color rendering properties.

The phosphor according to any one of the sixty-fifth to seventieth aspects is a green phosphor that has an excellent initial emission characteristics by having a flat excitation band in a range from the near-ultraviolet/ultraviolet to blue color, and a broad emission spectrum with an emission peak in the vicinity of the wavelength from 500 nm to 600 nm in which the luminance can be earned, and has an excellent heat resistance property and allows almost no deterioration to occur in emission characteristics even under a high temperature environment as compared to an environment of a room temperature (25° C.).

BEST MODE FOR CARRYING OUT THE INVENTION

Preferred embodiments of the present invention will be explained hereunder. However, the present invention is not limited thereto.

A phosphor of the present invention is the phosphor having a matrix composition given by a general formula expressed by MmAaBbOoNn:Z. Here, element M is one or more kind of element selected from the elements having bivalent valency in the phosphor. Element A is one or more kind of element having tervalent valency, element B is one or more kind of element having tetravalent valency, O is oxygen, N is nitrogen, and element Z is the element acting as the activator in the phosphor and one or more kind of element selected from rare earth elements or transitional metal elements.

Further, in the phosphor, $(a+b)/m$ is in a range satisfying $4.0<(a+b)/m<7.0$, $a/m$ is in a range satisfying $a/m \geq 0.5$, $b/a$ is in a range satisfying $b/a>2.5$, oxygen and nitrogen has a relation satisfying $n>o$, and nitrogen is expressed by $n=2/3 m+a+4/3b-2/3o$, and when being excited by light with a wavelength from 300 nm to 500 nm, the phosphor has an emission spectrum with a peak wavelength from 500 nm to 650 nm.

The phosphor of the present invention having the aforementioned characteristics has an emission spectrum with a broad peak in a range from green color to yellow color, or yellow color to red color, and has a flat excitation band in the broad range from near ultraviolet/ultraviolet to blue color (wavelength range from 300 nm to 500 nm), and is capable of obtaining a high efficient emission. Therefore, by mixing the phosphor and the phosphor of suitable other color, and combining the phosphor thus mixed and an emission part such as the near ultraviolet/ultraviolet LED and the blue LED and so forth, a high efficient emission having an excellent color rendering property, a desired emission color and high emission intensity and luminance can be obtained.

The phosphor of the present invention has a stronger emission intensity, high luminance, and a broad peak of the emission spectrum, compared with a silicon nitride-based phosphor (for example see patent document 1) and a sialon-based phosphor (for example, see patent documents 2, 3, and 4), and oxynitride phosphor (for example, see patent documents 5 and 6). Therefore, the white LED illumination with further high luminance can be manufactured.

The phosphor of the present invention has the same constitutional element as the sialon-based phosphor. However, when expressed by the general formula MmAaBbOoNn:Z, the sialon-based phosphor meets the formula of $(a+b)/m>12/1.5=8$. Moreover, as the element M that intrudes into a sialon matrix structure, only the element with small ion radius such as Ca and Y enters therein, and Sr with larger ion radius than Ca and Y does not enter the matrix structure, and therefore the sialon-based phosphor has a composition different from the phosphor of the present invention wherein Sr is indispensable as the element M.

The excitation band has a broad range, and therefore it becomes possible to suppress change in color tone due to variation in emission elements (blue LED), differently from YAG:Ce phosphor. In addition, the phosphor of the present invention has a high efficient excitation band even in the vicinity of the wavelength from 300 nm to 420 nm, which is an emission wavelength of the near ultraviolet/ultraviolet LED. Accordingly, the phosphor of this embodiment can also be used as a green color phosphor of the white LED illumination by combining not only with the blue color emitting LED, but also with the near ultraviolet/ultraviolet emitting LED, using a mixed state of the red color, blue color, and other color phosphors. Particularly, when the phosphor is irradiated with the excitation light of monochromatic color in the wavelength range from 350 nm to 500 nm, the phosphor activated by Eu as an activator has a significantly flat excitation band, wherein the relation is expressed by $(P_H-P_L)/P_H \times 100 \leq 20$, more preferably expressed by $(P_H-P_L)/P_H \times 100 \leq 10$, when the peak intensity of a maximum peak is defined as $P_H$ when the phosphor is irradiated with the excitation light whereby the peak intensity of the maximum peak in the spectrum of the light emission obtained by absorbing the excitation light is made to be largest, and the peak intensity of the maximum peak is defined as $P_L$ when the phosphor is irradiated with the excitation light whereby the peak intensity of the maximum peak in the spectrum of the light emission obtained by absorbing the excitation light is made to be smallest.

The emission wavelength is different depending on the activator, however when the phosphor is activated by Ce as a typical activator, the phosphor having the emission spectrum with a broad peak of a half value width of 100 nm or more in a wavelength range from 470 nm to 750 nm, and when activated by Eu, the phosphor having the emission spectrum with a peak in the range from yellow color to red color can be obtained. Therefore, the phosphor thus activated by Ce can be used by replacing the YAG:Ce phosphor presently used, or the ZnS:Cu,Al phosphors as phosphors capable of overcoming problems thereof. Further, the phosphor activated by Eu can be used for the white LED illumination as a different substance from the red phosphors such as $Ca_2Si_5N_8$:Eu, $Sr_2Si_5N_8$:Eu, $Ba_2Si_5N_8$:Eu, $Ca_x(Al,Si)_{12}(O,N)_{16}$:Eu (However, satisfying $0<x\leq1.5$), $CaAl_2Si_4N_8$:Eu, $CaSiN_2$:Eu, $CaAlSiN_3$:Eu, which have been developed in recent years for improving color rendering properties of the white LED illumination.

In addition, the phosphor of the present invention has an excellent durability against heat and water. Although the conventional ZnS:Cu,Al phosphor having the emission spectrum with a peak in the range from green color to yellow color has no problem in regard to the emission intensity and luminance, problems involved therein are that the ZnS:Cu,Al phosphor has no durability, particularly exhibiting a low degree of water tolerance, and further, the emission intensity and luminance are largely deteriorated at a high temperature. Therefore, when the white LED illumination is manufactured by mixing the ZnS:Cu,Al phosphor and the phosphors of plural colors and by combining with the near ultraviolet/ultraviolet LED, such a white LED illumination has the problem that when used for a long period of time, particularly the emission intensity and luminance of the ZnS:Cu,Al phosphor are deteriorated, resulting in changing in color tone. In addition, when turning on the light of the white LED illumination, the emission intensity and luminance of the ZnS:Cu,Al phosphor are deteriorated due to the heat generated from the emission element, thereby also deteriorating the luminance of the white LED illumination accordingly. As a result, the ZnS:Cu,Al phosphor is required to adjust phosphor mixed powder in consideration of the change in the emission intensity and luminance due to temperature, making it difficult to manufacture the white LED illumination with stable quality. However, the phosphor of this embodiment is the phosphor containing nitrogen, having durability, and strong against change in temperature and moisture in the same way as the silicon nitride phosphor and the sialon-based phosphor, and therefore the white LED illumination having high luminance and excellent durability can be manufactured.

Next, explanation will be given to a case in which the emission with high color rendering properties can be obtained by using the phosphor of this embodiment.

Preferably, the way of looks of the color is the same as in the case of using a reference light. However, the reference light has a white light source having uniform intensity of the light over the whole visible light region. Meanwhile, the existing white LED illumination lacks in uniformity in the intensity of the light. For example, the intensity of the light is high in a certain wavelength region of the visible light, and low in a certain wavelength region. Therefore, in the wavelength region where the intensity of the light is insufficient, color reproducing properties are deteriorated, and the color rendering properties are deteriorated.

After all, in order to obtain the emission with high color rendering properties, the phosphor used for the white LED illumination needs to have an emission spectrum with a broad peak, and the phosphor needs to have a sufficient emission intensity. With the phosphor of the present invention having the aforementioned matrix composition, the phosphor having a high emission intensity and luminance in the range from green color to yellow color, or from yellow color to red color, and having an emission spectrum with a broad peak of not less than 80 nm half value width can be obtained by changing the kind of the constituent element and the kind of the activator.

Detailed reason remains unknown for the fact that the phosphor of the present invention has the emission spectrum with a broad peak in the range from the green color to yellow color and from yellow color to red color, has the flat excitation band in the wavelength range from the near ultraviolet/ultraviolet to blue color, and is capable of emitting light with high efficiency. However, it can be considered as follows.

First, it can be considered that in the general formula MmAaBbOoNn:Z of the phosphor according to the present invention, when the values of m, a, b, o, and n are in the range of $4.0<(a+b)/m<7.0$, $a/m\leq0.5$, $b/a>2.5$, $n>o$, $n=2/3m+a+4/3b-2/3o$, the activator can exist regularly in a crystal structure of the phosphor, an excitation energy used for emitting light can be efficiently transferred, and an emission efficiency is thereby improved.

Further, with the aforementioned structure of the phosphor, it can be considered that chemically stable composition can be obtained, therefore an impurity phase not contributing to emitting light is hardly generated in the phosphor, and the reduction in the emission intensity is thereby suppressed. Namely, it can be considered that when plural impurity phases are generated, a phosphor amount per unit area is reduced, and further the impurity phase thus generated absorbs the excitation light and the light generated from the phosphor, therefore the emission efficiency of the phosphor is deteriorated, and the high emission intensity can not be obtained.

The aforementioned consideration is supported by the fact that when the values of m, a, b, o, and n are in the aforementioned range in an X-ray diffraction measurement for the phosphor after firing, an X-ray diffraction peak due to the impurity phase of an unreacted raw material such as AlN, and $Si_3N_4$, and the X-ray diffraction peak due to the impurity phase different from the phase contributing to emitting light are not confirmed, or even when confirmed, a significantly low diffraction intensity is observed. Meanwhile, when the values of m, a, b, o, and n are outside the aforementioned range, a remarkable X-ray diffraction peak of the phase of the $AlNSi_3N_4$ and the phase different from the phase contributing to emitting light is confirmed. Therefore, it can be considered that the characteristic that the X-ray diffraction peak due to the aforementioned impurity phase is not observed in the X-ray diffraction pattern for the phosphor after firing, shows that the phosphor to be measured has a high emission intensity and a flat excitation band over the range from the near ultraviolet/ultraviolet color to blue color.

In the phosphor of the present invention, the general formula is given as MmAaBbOoNn:Z, where preferably the values of m, a, b, o, and n are given satisfying $4.0<(a+b)/m<7.0$, $a/m\leq0.5$, $b/a>2.5$, $n>o$, $n=2/3m+a+4/3b-2/3o$, further preferably satisfying $0.5\leq a/m\leq2.0$, $3.0<b/m<7.0$, $0<o/m\leq4.0$, and still further preferably $0.8\leq a/m\leq1.5$, $3.0<b/m<6.0$, $0<o/m\leq3.0$. This is because in a case of a/m=0, oxygen and Si contained in the raw material are excessively reacted during firing, resulting in being vitrified, thus making it impossible to obtain excellent emission characteristics and powdery phosphor.

Meanwhile, in a case of $a/m\neq0$, Al is solid-solubilized and a melting point of a generated compound becomes extremely high. Therefore, even when firing is performed, the oxygen and Si are not vitrified, and a powdery phosphor can be obtained after firing. Accordingly, it is preferable to set the value of a/m at 0.5 or more.

Further, in a case of $1.1<a/m$, the emission characteristics under an environment of a high temperature are hardly deteriorated, as compared to a case of the aforementioned range.

Further, even when the emission intensity before increasing the temperature (25° C.) up to 300° C. and the emission intensity after holding for 5.0 minutes at 300° C. and cooling down to a room temperature (25° C.) again, an excellent heat resistance property that the emission intensity after cooling is not deteriorated as compared to a case of before increasing the temperature.

In a case of $a/m \leq 2.0$, a site of the element B to be replaced with the element A is prevented from being excessive, thus making it possible to prevent the emission efficiency from deteriorating due to a variation of manufacturing conditions, and suppress the deterioration of the emission characteristics even when this phosphor is placed under a high temperature environment. Further, with this structure, an unreacted AlN generation can be suppressed, and the deterioration of an initial emission intensity due to this unreacted AlN can be prevented. In addition, if the value of "a" is larger than the value of "b", the firing is suppressed and a powdery phosphor can be easily obtained after firing. Therefore, it is preferable to set the range of b/m in the range of $3.0 \leq b/m \leq 6.0$ which is larger than a/m, and is more preferable to set it in the range of $3.5 \leq b/m \leq 4.5$.

Preferably, the phosphor of the present invention contains oxygen, although satisfying n>o. An appropriate content of the oxygen is changed depending on the molar ratio of Al and Si in the phosphor. However, by optimizing this oxygen content, the initial emission characteristic (25° C.) of the phosphor is improved and also the phosphor, whose emission characteristic is hardly deteriorated even under a high temperature environment as compared to a case of a room temperature (25° C.), can be obtained. This is because even if trying to improve the temperature characteristic, a crystal structure is deviated from the structure suitable for light emission even when the Si site is simply replaced with Al, because the ion radius of the Al is different from that of Si. Further, Si is tetravalent valency while Al is tervalent valency, thus involving a problem that the valency in a crystal becomes unstable. However, when a part of an N site is replaced with O in accordance with an amount of Al for replacing the Si site, the crystal structure suitable for light emission can be obtained and further, the valency of an entire body of a matrix crystal structure can be set to stable zero, and therefore it can be considered that excellent emission characteristics can be exhibited. Here, a preferable range of an amount of oxygen is $0 < o/m \leq 4.0$, and when oxygen content in the phosphor after firing is analyzed, a sufficiently practical phosphor with excellent emission characteristics and suppressing vitrification is realized, provided that the oxygen content is in a range of 0.5 wt % to 8.1 wt % relative to a mass of the phosphor. Further, when the amount of the oxygen is in a range of $0 < o/m \leq 3.0$ and more preferably in a range of $0 < o/m \leq 1.5$, i.e. in a range of 0.5 wt % to 5.0 wt %, the emission intensity is further improved and this is preferable.

The reason for a slightly different value between the value of o calculated by a result of composition analysis, and the value of o calculated by the mixing ratio of the raw material to be used, which are compared with each other, is considered to be that the oxygen initially contained in the raw material and the oxygen stuck to the surface, the oxygen mixed therein by oxidization of the surface of the raw material at measuring, mixing, and baking the raw material, and further the oxygen adsorbed on the surface of the phosphor after baking, are not taken into consideration. In addition, the reason is considered in such a way that when firing is performed in an atmosphere containing nitrogen gas and/or ammonium gas, the raw material is nitrided during firing and deviation occurs in the amount of oxygen and amount of nitrogen.

Further, in the phosphor having the composition expressed by the aforementioned general formula $M_m A_a B_b O_o N_n$:Z, element M is one or more kinds of elements having +bivalent valency, element A is one or more kinds of elements having +tervalent valency, element B is one or more kinds of elements having +tetravalent valency, and nitrogen is one or more kinds of elements having −tervalent valency. Therefore, the values of m, a, b, o, and n are the composition expressed by $n = 2/3\ m + a + 4/3 b - 2/3 o$, and the value obtained by adding the valency of each element becomes zero, and preferably the phosphor thus described serves as a further stable compound. Particularly, in this phosphor, when a/m is in a range of $1.1 < a/m \leq 1.5$, b/m is in a range of $3.5 \leq b/m \leq 4.5$, and o/m is in a range of $0 < o/m \leq 1.5$, the emission characteristics and the heat resistance are further improved and this is preferable structure. In any case, slight deviation in composition from a composition formula showing the composition of the phosphor is allowable.

Meanwhile, preferably the element M is one or more kind of element selected from a group consisting of Mg, Ca, Sr, Ba, Zn, and rare earth elements having bivalent valency, further preferably is one or more kind of element selected from a group consisting of Mg, Ca, Sr, Ba, and Zn, and most preferably is Sr. Further, 90% of Sr is contained as the element M, and a part of the aforementioned other element may be replaced.

Preferably the element A is one or more kind of element selected from a group consisting of Al, Ga, In, Tl, Y, Sc, P, As, Sb, and Bi, further preferably is one or more kind of element selected from a group consisting of Al, Ga, and In, and most preferably is Al. Further, 90% of Al is contained as the element A, and a part of the aforementioned other element may be replaced. In regard to the Al, preferably AlN, which is a nitride, is used as a general thermoelectric material and a structural material, and easily available at an inexpensive cost, and brings small environmental loading, and this is preferable.

Preferably the element B is one or more kind of element selected from a group consisting of Si, Ge, Sn, Ti, Hf, Mo, W, Cr, Pb, and Zr, further preferably is Si and/or Ge, and most preferably is Si. Further, 90% of Si is contained as the element B, and a part of the aforementioned other element may be replaced. In regard to the Si, preferably $Si_3N_4$, which is a nitride, is used as a general thermoelectric material and a structural material, and easily available at an inexpensive cost, and brings small environmental loading, and this is preferable.

The element Z is one or more kind of element selected from the rare earth elements or the transitional elements mixed in the form of replacing a part of the element M in the matrix structure of the phosphor. From the viewpoint of exerting a sufficient color rendering property for various light sources including the white LED illumination using the phosphor of the present invention, it is preferable for the phosphor to have a broad half width value of the peak in the emission spectrum. From this viewpoint, preferably, the element Z is one or more kind of element selected from a group consisting of Eu, Mn, Ce, Tb, Pr, and Yb. Among these elements, when Ce is used as the element Z, the phosphor shows the emission spectrum with broad and high in emission intensity in the range from green color to yellow color, and therefore the element Z is preferable as an activator of each kind of light source including the white LED illumination.

Although a silicon nitride-based phosphor, a sialon-based phosphor, and oxynitride phosphor of patent documents 1 to 6 proposed heretofore emits light from green color to yellow color by activating Ce, the emission intensity is significantly deteriorated compared with a case in which the same matrix is activated by Eu, thus making it impossible to be practically used. However, the present invention provides the phosphor of a proper composition to obtain the emission spectrum with a peak in a broad range and high in emission intensity, and therefore is capable of obtaining the emission intensity of not less than 1.5 times that of the phosphor of each patent document, having the characteristic of sufficiently being put to practical use. Further, when the white LED illumination is manufactured by the near ultraviolet/ultraviolet LED, the phosphor of the present invention has a significantly broad peak in the emission spectrum compared to ZnS:Cu,Al used as a green phosphor, and therefore the white LED illumination improved in efficiency and excellent in color rendering property can be manufactured. Further, a noteworthy point is that even when the matrix is activated by Eu, the emission intensity is not deteriorated, but instead showing the emission spectrum with a peak in a broad range and high in the emission intensity from yellow color to red color.

Moreover, by selecting the element Z, the peak wavelength of light emission performed by the phosphor of this example can be changed, and also by co-activating the different kind of element Z, the peak wavelength can be changed and further by a sensitizing property, the emission intensity and the luminance can be improved.

An amount of the element Z to be added is preferably in the range of not less than 0.0001 and not more than 0.50 in a molar ratio $z/(m+z)$ of the element M and the element Z as an activator, when the general formula of the phosphor of this example is expressed by the general formula MmAaBbOoNn:Zz (satisfying $4.0<(a+b)/m<7.0$, $a/m\leq0.5$, $b/a>2.5$, $n>o$, $n=2/3\ m+a+4/3b-2/3o$). When the molar ratio $z/(m+z)$ of the element M and the element Z is in the aforementioned range, thereby preventing the deterioration in the emission efficiency by concentration quenching generated due to an excessive content of the activator (element Z), and meanwhile, the element contributing emitting light becomes deficient due to too small content of the activator (element Z), and the emission efficiency is thereby prevented from deteriorating. Further, it is preferable to set the value of the $z/(m+z)$ is within the range of not less than 0.001 and not more than 0.30. However, an optimal value of the range of the value of $z/(m+z)$ is slightly fluctuated by the kind of the activator (element Z) and the kind of the element M. Further, by controlling the amount of the activator (element Z) to be added, the peak wavelength of the light emission of the phosphor can be set by shifting, which is useful for adjusting the luminance in the light source thus obtained.

In addition, when Sr was selected as the element M, and Al was selected as the element A, Si was selected as the element B, and EuCe was selected as the element Z, satisfying $4.0<(a+b)/m<7.0$, $0.5\geq a/m\leq2.0$, $3.0<b/m\leq7.0$, $0<o/m\leq4.0$, $n=2/3\ m+a+4/3b-2/3o$, the weight ratio of the element constituting the aforementioned phosphor was obtained, such as Sr of 19.5 wt % to 29.5 wt %, Al of 5.0 wt % to 16.8 wt %, O of 0.5 wt % to 8.1 wt %, N of 22.6 wt % to 32.0 wt %, and Ce of 0.0 to 3.5 wt %. However, error of .+−.1.0 wt % for Sr and Al is estimated and the remaining weights are Si and other elements. Note that from the viewpoint of preventing the deterioration in the emission intensity of the phosphor, the concentration of each element of Fe, Ni, and Co in the phosphor is preferably 100 PPM or less.

When the phosphor is irradiated with one or more kind of monochromatic light or mixed light of the monochromatic light having the wavelength range from 350 nm to 500 nm as an excitation light, the peak wavelength of the emission spectrum became in the range from 550 to 600 nm. At this time, the phosphor exhibited a sufficient emission intensity and exhibited a preferable emission characteristic of having a chromaticity (x, y) of the emission spectrum, with x in the range from 0.3000 to 0.4500, and y in the range from 0.5000 to 0.6000.

In addition, when Sr was selected as the element M, and Al was selected as the element A, Si was selected as the element B, and Eu was selected as the element Z, satisfying $4.0<(a+b)/m<7.0$, $0.5\leq a/m\leq2.0$, $3.0<b/m<7.0$, $0<o/m\leq4.0$, $n=2/3m+a+4/3b-2/3o$, the weight ratio of the element constituting the aforementioned phosphor was obtained, such as Sr of 19.5 wt % to 29.5 wt %, Al of 5.0 wt % to 16.8 wt %, O of 0.5 wt % to 8.1%, N of 22.6 wt % to 32.0 wt %, and Eu of 0.0 to 3.5 wt %. However, error of .+−.1.0 wt % for Sr and Al is estimated and the remaining weights are Si and other elements. Note that from the viewpoint of preventing the deterioration of the emission intensity of the phosphor, the concentration of each element of Fe, Ni, and Co in the phosphor is preferably 100 PPM or less. In addition, when the phosphor is irradiated with one or more kind of monochromatic light or mixed light of the monochromatic light having the wavelength range from 350 nm to 500 nm as an excitation light, the peak wavelength of the emission spectrum became in the range from 550 to 650 nm. At this time, the phosphor exhibited a sufficient emission intensity and exhibited a preferable emission characteristic of having a chromaticity (x, y) of the emission spectrum, with x in the range from 0.4500 to 0.6000, and y in the range from 0.3500 to 0.5000.

When a powder X-ray diffraction pattern measurement by CoKα ray is performed for the phosphor according to the present invention, the following characteristic is observed.

A product phase contained in the phosphor of this example has characteristic peaks in a brag angle (2θ) range of 12.5 to 13.5°, 17.0 to 18.0°, 21.0 to 22.0°, 22.5 to 23.5°, 26.5 to 27.5°, 28.5 to 29.5°, 34.0 to 35.0°, 35.5 to 36.5°, 36.5 to 37.5°, 41.0 to 42.0°, 42.0 to 43.0°, 56.5 to 57.5°, and 66.0 to 67.0°. From this diffraction pattern, it appears that the phosphor has a main production phase with a crystal system of a rhombic crystal or a monoclinic crystal. The crystal system with a sialon as a matrix is generally a hexagonal crystal, and therefore the phosphor according to the present invention is considered to be the crystal system different from a publicly known phosphor with sialon as the matrix.

Next, the temperature characteristic of the phosphor of this example will be explained. In some cases, the phosphor is used not only as the white LED illumination, but under high temperature environment. Accordingly, when the phosphor whose emission intensity is deteriorated in association with an increase of the temperature, and whose emission characteristic is deteriorated in association with thermal deterioration, such a phosphor is not preferable. The phosphor according to the present invention exhibits excellent temperature characteristics and heat resistance, and when the value of relative intensity of the maximum peak in the emission spectrum is defined as $P_{25}$ when the phosphor is irradiated with a specified monochromatic light in the wavelength range from 300 nm to 500 nm as the excitation light at 25° C., and the value of the relative intensity of the maximum peak is defined as $P_{200}$ when the phosphor is irradiated with the specified monochromatic light as the excitation light at 200° C., the relation of $P_{25}$ and $P_{200}$ is given satisfying $(P_{25}-P_{200})/P_{25}\times100\leq35$, thus showing excellent emission characteristics even under a high temperature environment. Further preferably, when the value of the relative intensity of the maximum peak at 100° C. is selected to be $P_{100}$, the relation of $P_{25}$ and $P_{100}$ is expressed by $(P_{25}-P_{100})/P_{25}\times100\leq10.0$.

In addition, when a heat generation temperature of the LED was examined by the inventors of the present invention, it was found that although the temperature was about 50° C. in a small-sized and small current type chip, heat generation occurs up to 80° C. when a large-sized and large current type chip is used to obtain further strong emission. Further, in a case of the white LED, it was found that the heat generated by sealing of the chip by resin and a lead frame structure was accumulated, and the temperature of the resin or the phosphor mixture part became about 100° C. and 200° C. at maximum. Namely, when the relation of $P_{25}$ and $P_{200}$ satisfies $(P_{25}-P_{200})/P_{25} \times 100 \leqq 35$, further preferably $(P_{25}-P_{100})/P_{25} \times 100 \leqq 10.0$, a color shift of the emission due to this heat generation can be suppressed to a level not involving problem as the white LED illumination, even if the heat generation that occurs with lighting the LED, being an emission light source, for a long period of time.

The phosphor according to the present invention has high temperature materials such as nitride and oxynitride with excellent durability generated from AlN and $Si_3N_4$ as a matrix, and therefore a tetrahedral (SiN4) is assembled into a network, thus producing a different structure from the conventional nitride and oxynitride phosphor, and an Al replacement amount of the Si site and an O replacement amount of the N site are optimized. Therefore, an extremely stable structure against heat is realized, thus exhibiting an excellent temperature characteristic. Further, in the phosphor according to the conventional technique, when used once at a high temperature environment, there is a problem that the emission intensity becomes lower than the emission intensity before being used under a high temperature environment even if being returned to a room temperature. However, the phosphor of the present invention can solve this problem.

In addition, since the phosphor of the present invention has excellent temperature characteristics, the phosphor hardly allowing the color shift to occur even when the temperature of the light emission device is increased can be manufactured. The phosphor of the present invention has the emission spectrum with a peak in the range from green color to yellow color, having a broad peak form, and therefore it is preferable as the white LED illumination from the viewpoint of color rendering properties. Further, the excitation band is flat in the broad range of near ultraviolet/ultraviolet to blue green color (wavelength range from 300 to 500 nm). Therefore, the phosphor of this example provides a state close to a maximum emission intensity in any case such as the case of the white LED illumination of a system to obtain white color by utilizing a complementary relation between a blue light emission of the high luminance blue LED (in the vicinity of the wavelength from 420 to 480 nm) proposed as the one chip type white LED illumination and yellow light emission of the phosphor, or the case of the white LED illumination of the system obtaining white color by utilizing the mixed state of colors of the light obtained from the phosphors of R, G, and B, and other colors by combining the LED emitting light of near ultraviolet/ ultraviolet (in the vicinity of the wavelength of 300 to 420 nm), red color (R) emitting phosphor excited by the near ultraviolet/ultraviolet light generated from the LED, green color (G) emitting phosphor, and blue color (B) emitting phosphor. Namely, by combining the emission part emitting light from the near ultraviolet/ultraviolet to blue color and the phosphor, the white light source and the white LED illumination with high output and improved color rendering properties, and further an illumination unit using the same can be obtained.

By forming the phosphor of this example in a powdery state, the phosphor can be easily applied to various light sources including the white LED illumination. Here, when the phosphor is used in a powdery state, preferably the phosphor contains a primary particle with particle size of 50 μm or less and aggregates in which the primary particle agglutinates, wherein the an average particle size (D50) of the powdery phosphor containing the primary particle and the aggregates is not less than 1.0 μm and not more than 50.0 μm and more preferably is not less than 1.0 μm and not more than 20.0 μm. The reason is considered as follows:

when the average particle size is 50 μm or less, it can be easily pulverized thereafter;

since the emission occurs mainly on the surface of a particle in the phosphor powder, a surface area per unit weight of powder can be secured and the deterioration of the luminance is thereby prevented when the average particle size is not more than 50.0 μm and not less than 20.0 μm; and when the powder is formed into a paste, which is then applied on a light emitter element, density of the powder can be increased, thus making it possible to prevent irregular color and deterioration of luminance. Also, according to the study of the present inventors, although detailed reason was unknown, it was found that preferably the average particle size was larger than 1.0 μm from the viewpoint of the emission efficiency of the phosphor powder. As described above, the average particle size of the powder in the phosphor of this example is not less than 1.0 μm and not more than 50 μm, and further preferably is not more than 20 μm. The average particle size (D50) specified here is the value measured by a LS230 (laser diffraction dispersion) by Beckman Coulter, Inc. The value of a specific surface area (BET) is also changed with the change of the particle size, and therefore from this viewpoint, the value of the specific surface area is preferably not less than 0.05 $m^2/g$ and not more than 5.00 $m^2/g$.

Next, in regard to the manufacturing method of the phosphor of this example, manufacture of $Sr_2Al_2Si_9O_2N_{14}$:Ce (wherein Ce/(Sr+Ce)=0.030) will be explained as an example. Note that there is no difference between z/(m+z) and Ce/(Sr+Ce).

Generally, in many cases, the phosphors are manufactured by a solid-phase reaction, and the phosphor of this example can be also obtained by the solid-phase reaction. However, the manufacturing method is not limited thereto. Each raw material of the element M, the element A, the element B may be obtained by the raw material commercially available, such as nitride, oxide, carbonate, hydroxide, and a basic carbonate. However, higher purity is more preferable, and preferably, the raw material of 2N or more, further preferably the raw material of 3N or more is prepared. The particle size of each particle of the raw material is preferably a fine particle, in terms of accelerating the reaction. However, the particle size and a form are changed, depending on the particle size and the form of the phosphor obtained. Therefore, the raw material of the nitride and so forth having an approximate particle size in accordance with the particle size and the form required for the phosphor finally obtained may be prepared. However, preferably the raw material with particle size of 50 μm or less, further preferably 0.1 μm or more and 10.0 μm or less may be used. As the raw material of the element Z also, the commercially available nitride, oxide, carbonate, hydroxide, basic carbonate, or simple metal is preferable. Of course, the higher purity of each raw material is more preferable, and the raw material of 2N or more, and further preferably the raw material of 3N or more are prepared. Particularly, when the carbonate is used as the raw material of the element M, an effect of flux can be obtained without adding a compound composed of the element not contained in the composition element of the phosphor of this embodiment, as flux (reaction accelerator).

When manufacturing $Sr_2Al_2Si_9O_2N_{14}$:Ce (where Ce/(Sr+ Ce)=0.030), for example, preferably $SrCO_3$(3N), AlN(3N), $Si_3N_4$(3N) are respectively prepared as the raw materials of the element M, the element A, the element B, and $CeO_2$(3N) is prepared as the element Z. Then, several points are examined in consideration of a deviation generated between a mixing (charging) composition of raw materials and the composition after firing, and a mixing charging composition, whereby a target composition can be obtained after firing, is obtained. In a raw material mixing step, 0.970 mol of $SrCO_3$, 1.0 mol of AlN, 4.5/3 mol of $Si_3N_4$, and 0.030 mol of $CeO_2$ of the raw materials are weighed and mixed so that a molar ratio of each element is Sr:Al:Si:Ce=0.970:1:4.5:0.030. The carbonate is used as a Sr raw material. This is because when the raw material with low melting point such as carbonate is used, the raw material itself serves as flux to accelerate the reaction and improve the emission characteristic, while an oxide raw material has a high melting point and the effect of flux can not be expected. In addition, when the oxide is used as the raw material, another substance may be added as the flux. However, in this case, it must be careful that the flux becomes impurity, and there is a possibility that the characteristic of the phosphor is deteriorated. Therefore, it must be careful to select the flux. For example, chloride, fluoride, oxide, and nitride are preferable, and $SrF_2$, $BaF_2$, $AlF_3$, $SrCl_2$, $BaCl_2$, $AlCl_3$, $Al_2O_3$, $Ga_2O_3$, $In_2O_3SiO_2$, $GeO_2$, SrO, BaO, $Ga_3N_2$, $Sr_3N_2$, $Ba_3N_2$, GaN, InN, and BN, etc., are taken into consideration.

The weighing and mixing may be performed in an atmospheric air. However, the nitride in each raw material element is easy to be influenced by humidity, and therefore it is convenient to operate in a glove box under an inactive atmosphere where humidity is sufficiently removed. Either of a dry system or a wet system may be used as a mixing system. However, the raw material is decomposed when pure water is used as a solvent of the wet mixing. Therefore, a suitable organic solvent must be selected. A usual device such as a ball mill and a mortar may be used.

The raw material thus completed in mixing is put in a crucible, and retained and fired at 1400° C. or more, preferably 1500° C. or more or 1600° C. or more, further preferably not less than 1700° C. and not more than 2000° C. for more than 30 minutes. If a firing temperature is 1400° C. or more, it is difficult to generate the impurity phase emitting blue light when being excited by ultraviolet rays, and further, the solid-phase reaction is preferably advanced and the phosphor excellent in emission characteristic can be obtained. Moreover, if the firing temperature is 2000° C. or less, preferably 1850° C. or less, excessive sintering and melting can be prevented from occurring. Note that higher firing temperature allows the solid-phase reaction to be rapidly advanced, and a retaining time can thereby be shortened. Meanwhile, even when the firing temperature is low, a target emission characteristic can be obtained by keeping the temperature for a long time. However, longer firing temperature allows a particle growth to be advanced, and a particle form becomes large. Therefore, the firing time may be set in accordance with a target particle size.

As an atmosphere gas to be distributed into a firing furnace, any one of the inactive gas such as rare gas, ammonia, mixed gas of ammonia and nitrogen, or mixed gas of nitrogen and hydrogen may be used. However, when the oxygen is contained in this atmosphere gas, oxidation reaction of a phosphor particle occurs. Therefore, the oxygen contained as the impurity is preferably as little as possible and for example, is preferably 100 PPM or less. Further, when the humidity is contained in the atmosphere gas, in the same way as the oxygen, the oxidation reaction of the phosphor particle occurs during firing. Therefore, the humidity contained as the impurity is preferably as little as possible and for example, is preferably 100 PPM or less. Here, when a single gas is used as the atmosphere gas, nitrogen gas is preferable. Although firing by a single use of the ammonium gas is also possible, the ammonium gas is expensive in terms of cost, and is a corrosive gas, and therefore a special processing is needed in a device and an exhaustion method during a low temperature. Accordingly, when the ammonia is used, the mixed gas of ammonia and nitrogen is prepared and the ammonia is preferably used at a low concentration. For example, when the mixed gas of nitrogen gas and ammonia is used, it is preferable to prepare 80% or more of nitrogen and 20% or less of ammonia. In addition, when the mixed gas of nitrogen and other gas is used, a partial pressure of the nitrogen in the atmosphere gas is decreased when a gas concentration other than nitrogen is increased. Therefore, from the viewpoint of accelerating the nitrogen reaction of the phosphor, the inactive or reduction gas containing 80% or more of nitrogen is preferably used.

In addition, preferably during firing, preferably the aforementioned gas atmosphere flows with a flow rate of 0.1 ml/min, for example. This is because by flowing the atmosphere containing one or more kind of gas selected from the aforementioned nitrogen, inactive gas such as rare gas and ammonium gas, it is prevented that the gas generated from the raw material is filled in the furnace to have influence on the reaction, resulting in the deterioration in the emission characteristic of the phosphor. Particularly, when the carbonate, the hydroxide, and the basic carbonate are used for the raw material, a large amount of gas is generated. Therefore, it is preferable to make the gas flow in a firing furnace and exhaust the gas thus generated.

Meanwhile, in a step of firing phosphor raw materials in manufacturing the phosphor, pressure in the firing furnace is set in a pressurized state so as not to allow the oxygen in the atmospheric air to mix in the furnace. However, when this pressurized state exceeds 1.0 MPa (in the present invention, in-furnace pressure means a pressurized amount from the atmospheric air), a special pressure resistant design is required for designing a furnace facility. Therefore, in consideration of productivity, 1.0 MPa or less of pressurization is preferable. In addition, when this pressurization is increased, sintering between particles is excessively advanced, thus making it difficult to pulverize after firing. Therefore, in-furnace pressure during firing is preferably 1.0 MPa or less, more preferably 0.5 MPa or less, and further preferably 0.001 MPa or more and 0.1 MPa or less.

Note that an $Al_2O_3$ crucible, $Si_3N_4$ crucible, an AlN crucible, a sialon crucible, a C (carbon) crucible, and a BN (boron nitride) crucible or the like which can be used in the aforementioned gas atmosphere may be used as a crucible. However, preferably when the BN crucible is used, intrusion of impurities can be averted.

In this embodiment, preferably the raw material is fired in a state of powder. In a general solid-phase reaction, by dispersion of atoms in contact points of the raw materials, the reaction is promoted. This is taken into consideration, and in many cases, the raw material is formed into a pellet and fired, to accelerate the reaction uniformly over the entire raw material. However, in a case of the raw material of the phosphor of this example, the raw material is fired in a powder state, easy to pulverize after firing, and a primary particle is formed in an ideal spherical shape. Thus, the phosphor raw material of this invention is easy to be treated as a powder. Further, when the carbonate, the hydroxide, and the basic carbonate are used as raw materials, $CO_2$ gas is generated by the decomposition of the raw material during firing. However, the raw material in a powder state would fully come out, and therefore from the viewpoint of not having a negative influence on the emission characteristic, this is a preferable structure.

After completing the firing, an object thus fired is taken out from the crucible, pulverizing means such as the mortar and the ball mill is used to pulverize the raw material to a predetermined average size, and the phosphor of the composition expressed by $Sr_2Al_2Si_9O_2N_{14}$:Ce (where Ce/(Sr+Ce)=0.030) can be manufactured. The phosphor thus obtained is then subjected to cleaning, classifying, and surface treatment, as needed. As a cleaning method, cleaning in an acidic solution using fluorinated acid, hydrochloric acid, sulfuric acid, and nitric acid is preferable, because metal atoms such as Fe adhered to the surface of particles and raw material particles remained in an unreacted state are melted. An amount of Fe, Ni, and Co contained in the obtained phosphor is preferably 100PPM or less.

When other element is used as the element M, the element A, the element B, and the element Z, and when an amount of activation of Ce, which is the activator, is changed, by adjusting a blending amount of each raw material at mixing to a predetermined composition ratio, the phosphor can be manufactured by the same manufacturing method as the aforementioned method.

Next, the phosphor mixture according to the present invention will be explained. The phosphor mixture of the present invention includes the aforementioned green phosphor, one or more kind of blue phosphors having the emission spectrum with a maximum peak in the wavelength range from 420 nm to 500 nm when being excited by the excitation light, being one or more kind of monochromatic light or continuous light having the wavelength range from 300 nm to 500 nm, and/or one or more kind of red phosphors having the emission spectrum with a maximum peak in the wavelength range from 590 nm to 680 nm when being excited by the excitation light, being one or more kind of monochromatic light or continuous light having the wavelength range from 300 nm to 500 nm. The phosphor mixture having this structure has a spectrum with a uniform light density over the whole visible light area, by mixing lights of various wavelengths, which is the phosphor mixture having excellent color rendering properties during emitting light, whereby the emission device particularly excellent in emission efficiency with high luminance can be obtained.

Explanation will be given to the red phosphor having the emission spectrum with a maximum peak in the wavelength range from 590 nm to 680 nm, included in the phosphor mixture of the present invention.

A publicly-known red phosphor having excitation characteristics and emission characteristics can be used for this red phosphor.

First, there is provided the red phosphor performing red color emission with high luminance having the emission spectrum with a maximum peak in the wavelength range from 590 nm to 680 nm, with high efficiency when being irradiated with the light in the wavelength range from 250 nm to 500 nm and further preferably the wavelength range from 300 nm to 500 nm as the excitation light. Further, a half value width of this emission spectrum is preferably 50 nm or more.

As an example of this red phosphor, there is a phosphor which is given by a general composition formula expressed by MmAaBbOoNn:Z, (where the element M is one or more kind of elements selected from the group consisting of Ca, Mg, Sr, Ba, and Zn, the element A is one or more kind of elements selected from the group consisting of Al, Ga, and In, the element B is one or more kind of elements selected from the group consisting of Si, Ge and Sn, and the element Z is one or more kind of elements selected from rare earth elements and transitional metal elements, satisfying n=2/3m+a+4/3b−2/3o, m=1, a≧0, b≧m, n>o, o≧0). For example, the red phosphor such as $(Ca,Sr,Ba)_2Si_5N_8$:Eu disclosed in the patent document 1, and $2.75SrO.Si_3N_4$:Eu disclosed in patent application No. 2004-145718 can be used. Further preferably, from this viewpoint, the red phosphor expressed by the composition formula of $CaAlSiN_3$:Eu is preferable.

Next, explanation will be given to the blue phosphor having the emission spectrum with a maximum peak in the wavelength range from 420 nm to 500 nm, included in the phosphor mixture of the present invention.

A publicly-known blue phosphor having excitation characteristics and emission characteristics as will be explained hereunder can be used for this blue phosphor.

First, there is provided the blue phosphor performing blue color emission with high luminance having the emission spectrum with a maximum peak in the wavelength range from 420 nm to 500 nm, with high efficiency when being irradiated with the light in the wavelength range from 250 nm to 420 nm and further preferably the wavelength range from 300 nm to 420 nm as the excitation light. Further, a half value width of this emission spectrum is preferably 30 nm or more, and further preferably 50 nm or more BAM:Eu($BaMgAl_{10}O_{17}$:Eu), $(Sr,Ca,Ba,Mg)_{10}(PO_4)_6Cl_2$:Eu, or $SrAl_xSi_{6-x}O_{1+x}N_{8-x}$:Eu (0≦x≦2), etc., can be given as an example of the blue phosphor having the excitation characteristics and emission characteristics.

Next, a method of obtaining the phosphor mixture of the present invention will be explained.

The green phosphor, the red phosphor and/or the blue phosphor manufactured by the aforementioned method are mixed, and the phosphor mixture according to the present invention is manufactured. By setting a mixing ratio of each phosphor, the correlated color temperature of the obtained emission spectrum can be set at a desired value between 10000K to 2000K, when this phosphor mixture is irradiated with the excitation light in the wavelength range from 300 nm to 500 nm. Here, from the viewpoint of an illumination light source, the correlated color temperature is preferably set at a desired value between 7000K to 2500K. Specifically, each emission spectrum for a target excitation light of the phosphor of each color is measured, the obtained emission spectrum is synthesized by simulation, and the mixing ratio for obtaining a desired correlated color temperature may be obtained.

Regarding an evaluation method of the emission efficiency of the obtained phosphor mixture, the phosphor mixture is actually applied on the emission element together with resin and the emission efficiency may be compared in a state that the element is allowed to emit light. However, this is not a uniform evaluation, because the variation of efficiency of the light emitting element itself or the variation by an application state is totally evaluated. Therefore, according to the evaluation method of the present invention, when this phosphor mixture is irradiated with the excitation light with the wavelength range from 300 nm to 500 nm and the emission characteristics are measured, the value of luminance (Y) is obtained based on a calculation method in a XYZ color system defined by JISZ8701. In addition, the color rendering properties can also be evaluated similarly by using the evaluation method of JISZ8726. However, the color rendering properties are not so much affected by the variation of the light emitting elements, and therefore the color rendering properties may be evaluated by the emission device incorporating the phosphor mixture of the present invention.

The aforementioned each phosphor has a preferable half value width of 50 nm or more. Therefore, in the emission of this phosphor mixture, emission spectra are overlapped one another, and a so-called broad spectrum, which is continuous without being interrupted in the wavelength range from 420 nm to 750 nm, can be obtained. In addition, each phosphor has the excitation band in the same range, and therefore an adjustment of the mixing ratio is easy.

Further preferably, the emission from the phosphor mixture of the present invention has three or more emission peaks in the wavelength range from 420 nm to 680 nm in the emission spectrum in which the correlated color temperature is 7000K to 2500K, and has a continuous spectrum without interrupting the emission. As a result, the luminance whereby brightness is sensed for human being's vision as an illumination can be earned, and simultaneously the emission has a broad emission spectrum in the wavelength range from 420 nm to 750 nm, thus exhibiting the emission with excellent color rendering properties.

The phosphor mixture of the present invention without deteriorating the emission intensity with the increase of the temperature is preferable, and therefore the phosphors with hardly deteriorated emission characteristics are preferably mixed. Particularly, it is preferable to select the phosphor showing the temperature characteristic that when the value of the emission intensity of the maximum peak of the emission spectrum at a temperature of 25° C. when the phosphor is irradiated with a specified excitation light in the wavelength range from 300 nm to 500 nm is selected to be $P_{25}$, and the value of the emission intensity of the maximum peak of the emission spectrum at a temperature of 200° C. when the phosphor is irradiated with the specified excitation light is selected to be $P_{200}$, $(P_{25}-P_{200})/P_{25} \times 100 \leq 30$. For example, in addition to the phosphor of the present invention, the aforementioned BAM:Eu,$(Sr,Ca,Ba,mg)_{10}(PO_4)_6Cl_2$:Eu,BAM:Eu,Mn,ZnS:Cu,Al,$CaAl_2Si_4 N_8$:Eu,$CaAlSiN_3$:Eu, etc, are given as examples. The temperature characteristics of these phosphors are shown in table 1-1. Note that this can not be said when the aforementioned conditions are satisfied.

element, density of the powder can be increased and irregular color and deterioration of luminance can be prevented.

Meanwhile, it is preferable to form a phosphor sheet, with the phosphor mixture of the present invention dispersed in the resin.

As a material becoming a medium used in manufacturing this phosphor sheet, each kind of resin such as epoxy resin and silicon resin or glass can be taken into consideration. As a use example of this phosphor sheet, a specified emission can be performed by combining this phosphor sheet and a light source whereby a suitable emission occurs. Note that as the excitation light for exciting this phosphor sheet, the light with the wavelength range from 250 nm to 500 nm may be selected, the light source may be selected to be an ultraviolet ray light source using Hg discharge and a light source by laser, in addition to the light emitting elements such as an LED.

By combining the phosphor mixture of the present invention in a powdery state with the emission part for emitting light with the wavelength range from 250 nm to 500 nm and preferably wavelength range from 300 nm to 500 nm, each kind of illumination device and mainly a backlight for a display device can be manufactured.

As the emission part, for example, an LED light emitting element for emitting light in a range from ultraviolet to blue color and a discharge lamp for generating an ultraviolet light can be used. Then, when the phosphor mixture of the present invention is combined with this LED light emitting element, each kind of illumination unit and the backlight for a display device can be manufactured, and when the phosphor mixture of the present invention is combined with this discharge lamp, each kind of fluorescent lamp, the illumination unit, and the backlight for a display device, etc, can be manufactured.

A method of combining the phosphor mixture of the present invention and the emission part may be performed by a publicly-known method. However, in a case of the emission device using the LED in the emission part, the emission device can be manufactured as follows. The emission device using the LED in the emission part will be explained hereunder, with reference to the drawings.

FIGS. 26(A) to (C) are schematic sectional views of a bullet type LED emission device, and FIGS. 27(A) to (E) are schematic sectional views of a reflective type LED emission

TABLE 1-1

| PHOSPHOR | 25° C. (REFERENCE VALUE) | 50° C. | 100° C. | 150° C. | 200° C. |
|---|---|---|---|---|---|
| BAM:Eu | 1.00 | 1.01 | 1.01 | 1.04 | 1.08 |
| $(Sr,Ca,Ba,Mg)_{10}(PC_4)_6Cl_2$:Eu | 1.00 | 0.96 | 0.89 | 0.83 | 0.76 |
| ZnS:Cu,Al | 1.00 | 0.98 | 0.94 | 0.88 | 0.76 |
| $CaAl_2Si_4N_8$:Eu | 1.00 | 0.96 | 0.91 | 0.86 | 0.80 |
| $CaAlSiN_3$:Eu | 1.00 | 0.98 | 0.98 | 0.93 | 0.87 |

When the phosphor mixture of the present invention is used in a powdery state, the average particle size of each mixing phosphor powder is preferably set at 50 μm or less and further preferably set at 20 μm. This is because the emission in the phosphor powder is considered to occur mainly on the surface of a powder particle, and therefore when the average particle size (D50) is 50 μm or less, the surface area per powder unit weight can be secured, and the deterioration of luminance can be prevented. Further, in manufacturing the illumination device using this phosphor mixture, when the powder is formed into a paste, which is then applied on a light emitter device. Note that in each figure, the same signs and numerals are assigned to the corresponding parts, and explanation therefore is omitted in some cases.

First, by using FIG. 26(A), explanation is given to an example of the emission device combined with the phosphor mixture by using the LED in the emission part. In the bullet-type LED emission device, an LED light emitting element 2 is set in a cup-shaped container 5 provided on the tip end of a lead frame 3, and they are molded by a translucent resin 4. In this embodiment, the phosphor mixture or a mixture with the phosphor mixture dispersed in a translucent resin such as silicon and epoxy (described as mixture 1 hereunder) is embedded entirely in the cup-shaped container 5. Also, the mixture 1 may be used in an entire body of a lens or may cover an upper part of the lens.

Next, by using FIG. 26(B), an example of a different emission device will be explained. In this embodiment, the mixture 1 is applied on the cup-shaped container 5 and the upper surface of the LED light emitting element 2.

Next, by using FIG. 26(C), an example of further different emission device will be explained. In this embodiment, the phosphor mixture 1 is set on the upper part of the LED light emitting element 2.

As described above, in the bullet-type LED light emission device explained by using FIGS. 26(A) to (C), a direction of light emission form the LED light emitting element 2 is upward. However, even if the direction of light emission is downward, the emission device can be prepared in the same way. For example, the reflective type LED emission device is constituted in such a manner that a reflective face and a reflective plate are provided in the direction of light emission of the LED light emitting element 2, and the light emitted from this light emitting element 2 is reflected by the reflective face so as to be emitted outside. Therefore, by using FIGS. 27(A) to (E), the emission device in which the reflective type LED emission device and the phosphor mixture of this embodiment are combined, will be explained as an example.

First, by using FIG. 27(A), explanation is given to an example of the emission device in which the reflective type LED emission device is used in the emission part and the reflective type LED emission device is combined with the phosphor mixture of this embodiment. In the reflective type LED emission device, the LED light emitting element 2 is set on one tip end of the lead frame 3, and the light emission from this LED light emitting element 2 occurs so as to be directed downward and reflected by the reflective face 8 and is emitted from upward. In this embodiment, the mixture 1 is applied onto the reflective face 8. Note that a transparent mold material 9 is sometimes filled in a recessed portion formed by the reflective face 8 so as to protect the LED light emitting element 2.

Next, by using FIG. 27(B), an example of a different emission device will be explained. In this embodiment, the mixture 1 is set in a lower part of the LED light emitting element 2.

Next, by using FIG. 27(C), an example of a different emission device will be explained. In this embodiment, the mixture 1 is filled in the recessed portion formed by the reflective face 8.

Next, by using FIG. 27(D), an example of a different emission device will be explained. In this embodiment, the mixture 1 is applied onto the transparent mold material 9 for protecting the LED light emitting element 2.

Next, by using FIG. 27(E), an example of a different emission device will be explained. In this embodiment, the mixture 1 is applied on the surface of the LED light emitting element 2.

The bullet-type LED emission device and the reflective type LED emission device may be appropriately used in accordance with application. However, the reflective type LED emission device has a merit that it can be made thin, a light emission area can be made large, and use efficiency of light can be enhanced, and so forth.

When the emission device as described above is used as a high color rendering illuminating light source, it is necessary to have the emission spectrum excellent in color rendering properties. Therefore, by using the evaluation method of JISZ8726, the color rendering properties of the emission device incorporating the phosphor mixture including the phosphor of the present invention were evaluated. In the evaluation of JISZ8726, when the average color rendering index Ra of this light source is 80 or more, this is an excellent emission device. Then, preferably when a special color rendering index R15, being an index showing a skin color component of Japanese women is 80 or more and further preferably when a special color rendering index R9, being an index showing a red color component is 60 or more, this is an extremely excellent emission device. However, the aforementioned index may not be satisfied, depending on the purpose of use not requiring color rendering properties and a different object.

Therefore, the emission device was manufactured, wherein the phosphor mixture including the phosphor of the present invention was irradiated with the light from the emission part for emitting light in the wavelength range from 300 nm to 500 nm, so as to emit light by this phosphor mixture. Note that as the emission part, the blue LED for emitting light having the wavelength of 460 nm and the ultraviolet LED for emitting light having the wavelength of 405 nm were used. Then, the color rendering properties of the emission spectrum of this emission device was evaluated. As a result, the color rendering properties of the emission device incorporating the phosphor mixture including the phosphor of the present invention shows high color rendering properties of 80 or more of Ra, 80 or more of R15, and further 60 or more of R9 in a correlated color temperature range from 10000K to 2000K, and preferably in a range from 7000K to 2500K, and it is found that this emission device is the light source with high luminance and having extremely excellent color rendering properties.

EXAMPLE

Example 1

Commercially available $SrCO_3$(3N), AlN(3N), $Si_3N_4$(3N), and $CeO_2$(3N) were prepared, and among the raw materials, 0.970 mol of $SrCO_3$, 1.0 mol of AlN, 4.5/3 mol of $Si_3N_4$, and 0.030 mol of $CeO_2$ were weighed and mixed by using a mortar in an atmospheric air. The raw material thus mixed was put in a BN crucible, then temperature is increased to 1800° C. with an in-furnace pressure of 0.05 MPa set at 15° C./min, retained and fired at 1800° C. for three hours, and then cooled from 1800° C. to 200° C. for one hour. Thereafter, the firing sample thus fired was crushed to a proper particle size by using the mortar in the atmospheric air, and the phosphor of the example 1 of the composition formula expressed by $Sr_2Al_2Si_9O_2N_{14}$:Ce (where Ce/(Sr+Ce)=0.030) was obtained. A result of a composition analysis of the powdery phosphor thus obtained is shown in table 1-2, and an SEM photograph of the powdery phosphor (250 times) is shown in FIG. 1.

The result of the composition analysis of the phosphor thus obtained was close to a theoretical value obtained from atomic weight and a molar ratio of a constitutive element. A slight deviation is considered to be caused by a measurement error or impurities mixed in during manufacturing the phosphor. Specific surface area was 0.285 m²/g. Also, as clarified from FIG. 1, the powdery phosphor thus obtained was aggregates in which primary particles of 20 μm or less agglutinates. When the average particle size (D50) was measured by a Laser Doppler measuring method, the D50 was 17.5 μm, and it was found that the value of not less than 1.0 μm and not more than 20.0 μm which is preferable as the phosphor was obtained. The size of the primary particle observed by an SEM diameter was 13.0 μm, which was in a range from 1.0

μm to 20.0 μm preferable as the phosphor, and the specific surface area was in a range from 0.05 m$^2$/g to 5.0 m$^2$/g.

Next, the emission spectrum of the phosphor of the example 1 was measured. This measurement result is shown in table 2, and further described in FIG. 2 and FIG. 3.

FIG. 2 and FIG. 3 are graphs where the emission intensity of the phosphor of the example 1 is taken on the ordinate axis as an relative intensity, and the wavelength of light is taken on the abscissa axis. Here, the emission spectrum is a spectrum of the light released from the phosphor when the phosphor is irradiated with the light or energy of some wavelength. FIG. 2 and FIG. 3 show the spectrum of the light emitted from the phosphor is shown by using a solid line, when the phosphor is irradiated with the monochromatic light having the wavelength of 460 nm as the excitation light, and when the phosphor is irradiated with the monochromatic light having the wavelength of 405 nm as the excitation light in the same way, respectively. Note that the emission spectrum and the excitation spectrum were measured by using a spectrofluorometer FP-6500 by Japanese JASCO International Co., Ltd.

First, by using FIG. 2, the emission spectrum of this phosphor will be explained.

As obvious from the solid line of FIG. 2, the phosphor had the emission spectrum with a broad peak over the broad wavelength region from 470 nm to 750 nm, and the peak wavelength thereof was 559.3 nm. (the emission intensity at this time and the relative intensity of the luminance were set at 100%). In addition, the half value width obtained was 117.2 nm, and the chromaticity (x, y) of the emission spectrum obtained was x=0.4156, and y=0.5434. Powder had a yellow fluorescent color, and a yellow emission color could be visually checked. The phosphor of the example 1 had a peak with extremely broad half value width over the broad wavelength region, and therefore when used as the phosphor for the one chip type white LED illumination, the white LED illumination having excellent color rendering properties can be manufactured, compared with the white LED illumination using the phosphor having a sharp peak. In the case of the phosphor having the sharp peak, the spectrum close to solar light is realized, and therefore several kinds of phosphors are required to be mixed. However, such a phosphor has a broad peak, and therefore the number of the kinds of the phosphors to be mixed can be decreased, and the white LED illumination can be manufactured at a low cost.

Table 2 and the solid line of FIG. 3 show a measurement result of the emission spectrum when the phosphor is irradiated with the monochromatic light having the wavelength of 405 nm as an excitation light. In this case, the phosphor had a broad peak in the broad wavelength range from 470 nm to 750 nm in the excitation wavelength of 405 nm also, and the peak wavelength was 552.3 nm. (in regards to the emission intensity and the luminance, a peak value of the emission spectrum is defined as the relative intensity 100%, when the phosphor of the example 1 is irradiated with the monochromatic light having the wavelength of 460 nm as the excitation light.) In addition, the half value width obtained was 119.5 nm. The chromaticity (x, y) of the emission spectrum was expressed by x=0.3730 and y=0.5377. Note that the yellow emission color could be visually checked.

Next, an excitation spectrum of the phosphor of the example 1 will be explained, by using FIG. 4. FIG. 4 is a graph in which the emission intensity of the phosphor is taken on the ordinate axis, and the wavelength of the excitation light is taken on the abscissa axis. Here, by the excitation spectrum, the phosphor to be measured was excited by using the monochromatic light with various wavelengths as the excitation light, the emission intensity of the light with a fixed wavelength emitted by the phosphor was measured, and the dependency of the emission intensity on the excitation wavelength was measured. In this measurement, the phosphor of the example 1 was irradiated with the monochromatic light with the wavelength from 300 nm to 570 nm, and the dependency of the emission intensity of the light having the wavelength of 559.3 nm emitted by the phosphor, on the excitation wavelength was measured.

The solid line of FIG. 4 shows the excitation spectrum of the phosphor of the example 1. As obvious from the solid line of FIG. 4, it was found that the excitation spectrum of the phosphor of present invention showed the light emission of yellow color with high intensity, by the excitation light of a broad wavelength range from 300 nm or around to 500 nm. Particularly, the phosphor has a particularly excellent excitation band in the vicinity of 460 nm and 405 nm, which are emission wavelengths of the blue LED and the near ultraviolet/ultraviolet LED used as the excitation light for the one chip type white LED illumination at present.

Similarly, in regards to the emission intensity and the luminance of example 2, example 3, comparative example 1, comparative example 2, and comparative example 3 as will be explained hereafter, the peak value of the emission spectrum is defined as the relative intensity 100%, when the phosphor of the example 1 is irradiated with the monochromatic light having the wavelength of 460 nm as the excitation light.

Example 2

In the example 2, the phosphor of the example 2 is manufactured in the same way as the example 1, other than the molar ratio of each element of the example 1 is set at Sr:Al:Si:Ce=0.970:1:5:0.030.

The commercially available SrCO$_3$(3N), AlN(3N), Si$_3$N$_4$ (3N), CeO$_2$(3N) were prepared, and each raw material was measured in 0.970 mol of SrCO$_3$, 1.0 mol of AlN, 5.0/3 mol of Si$_3$N$_4$, and 0.030 mol of CeO$_2$, so that the molar ratio of each element was set at Sr:Al:Si:Ce=0.970:1:5:0.030, and the raw materials thus measured was mixed in the atmosphere by using the mortar. The raw materials thus mixed was put in the crucible, and the temperature was increased to 1800° C. at 15° C./min, with in-furnace pressure of 0.05 MPa, in a nitrogen atmosphere (flow state), and in this condition, the raw materials were retained and fired for 3 hours at 1800° C., then cooled from 1800° C. to 200° C. for 1 hour. Thereafter, a fired sample was pulverized in an atmospheric air to obtain a suitable particle size by using the mortar, and thus the phosphor of the example 2 expressed by the composition formula Sr$_1$Al$_3$Si$_{15}$O$_3$N$_{23}$:Ce (where Ce/(Sr+Ce)=0.030) was obtained. An analysis result of the powdery phosphor thus obtained is shown in table 1-2.

The analysis result of the composition of the phosphor thus obtained was close to the theoretical value obtained from the atomic weight and the molar ratio of the constituent element in the same way as the example 1. The slight deviation is considered to be caused by the measurement error or the impurities mixed in during manufacturing the phosphor. The specific surface area was 0.302 m$^2$/g, or the primary particle size observed by the SEM diameter was about 12.3 μm, and the average particle size (D50) obtained by the laser Doppler measuring method was 16.85 satisfying the range of not less than 1.0 μm and not more than 20.0 μm preferable as the phosphor, and the range of the surface area of not more than 0.05 m$^2$/g and not less than 5.0 m$^2$/g.

Next, the emission spectrum of the phosphor of the example 2 was measured. The measurement result was shown in table 2, and further described in FIG. 2 and FIG. 3.

One dot chain line of FIG. 2 shows the measurement result of the emission spectrum, when the phosphor is irradiated with the monochromatic light having the wavelength of 460 nm as the excitation light. The phosphor has the spectrum with a broad peak in the broad wavelength region from 470 nm to 750 nm, and the peak wavelength was 559.2 nm. In addition, the half value width obtained was 116.4 nm, and the chromaticity (x, y) of the emission spectrum obtained was x=0.4171 and y=0.5427, and a yellow emission color could be visually checked.

The measurement result of the emission spectrum when the phosphor was irradiated with the monochromatic light having the wavelength of 405 nm as the excitation light was shown in table 2 and by using the one dot chain line in FIG. 3. The phosphor of the example 2 has a broad peak over the broad wavelength region from 470 nm to 750 nm in the excitation wavelength of 405 nm also, and the peak wavelength was 552.5 nm. Also, the half value width obtained was 118.0 nm, and the chromaticity (x, y) of the emission spectrum was x=0.3783 and y=0.5389. Note that the yellow fluorescent color could be visually checked.

The one dot chain line of FIG. 4 shows the excitation spectrum of the phosphor of the example 2. In this measurement, the phosphor of the example 2 was irradiated with the monochromatic light with the wavelength from 300 nm to 570 nm, and an excitation dependency of the emission intensity of the light having the wavelength of 559.2 nm emitted by the phosphor was measured. As obvious from the one dot chain line of FIG. 4, the excitation spectrum of the phosphor also, in the same way as the example 1, exhibits the yellow emission with high intensity by the excitation light with the broad wavelength region from 300 nm or around to 500 nm.

The example 2 shows the composition with a large molar ratio of Si and N, compared with that of the example 1, and shows an excellent emission characteristic in the same way as that of the example 1.

Example 3

In the example 3, the phosphor of the example 3 was manufactured in the same way as the example 1, other than replacing Ce with Eu, as the activator, in the phosphor expressed by the composition formula $Sr_2Al_2Si_9O_2N_{14}$:Ce (where Ce/(Sr+Ce)=0.030) of the phosphor of the example 1. The molar ratio of each element was expressed by Sr:Al:Si:Eu=0.970:1:4.5:0.030, and each raw material was measured in 0.970 mol of $SrCO_3$, 1.0 mol of AlN, 4.5/3 mol of $Si_3N_4$, and 0.030/2 mol of $Eu_2O_3$. In the same way as the example 1, the analysis result of the powdery phosphor thus obtained is shown in table 1-2.

The analysis result of the composition of the phosphor thus obtained was close to the theoretical value obtained by a molecular weight and the molar ratio of the constituent element. The specific surface area was 0.291 m²/g, the primary particle size observed by the SEM diameter was about 13.1 μm, and the average particle size (D50) obtained by the Laser Doppler measuring method was 17.27 μm. Thus, in the case of using Eu as the activator, almost the same result as the case of using Ce as the activator could be obtained for the composition, the specific surface area, and the SEM diameter.

Next, the emission spectrum of the phosphor of the example 3 was measured. The measurement result is shown in table 2, and the emission spectra when the phosphor is irradiated with the light of the excitation wavelength Ex 460 nm and Ex 405 nm are further shown in FIG. 2 and FIG. 3, respectively.

Table 2 and two dot-line of FIG. 2 shows the measurement result of the emission spectrum when the phosphor is irradiated with the monochromatic light having the wavelength of 460 nm as the excitation light. It was found from the table 2 and the two dot-line of FIG. 2, that the phosphor at the excitation wavelength Ex 460 nm had a broad peak in the broad wavelength region from 470 nm to 750 nm, and the peak wavelength was 613.8 nm. In addition, the half value width obtained was 115.6 nm, and the chromaticity (x, y) of the emission spectrum obtained was x=0.5573, and y=0.4330. Further, the powder had an orange color and an orange emission color could be visually confirmed.

In addition, table 2 and two dot-chain line of FIG. 3 shows the measurement result of the emission spectrum when the phosphor is irradiated with the monochromatic light having the wavelength of 405 nm as the excitation light. It was found from the table 2 and the two dot-line of FIG. 3, that the phosphor had the broad peak in the broad wavelength range from 470 nm to 750 nm, and the peak wavelength was 607.9 nm. In addition, the half value width obtained was 114.2 nm, and the chromaticity (x, y) of the emission spectrum obtained was x=0.5083, and y=0.4172. Further, an orange emission color could be visually confirmed.

The phosphor of the example 3 has the same matrix as the phosphor of the example 1. However, by replacing the activator Ce with Eu, the peak of the emission spectrum could be shifted (the peak wavelength is shifted from about 560 nm of Ce to about 610 nm of Eu) to the longer wavelength side, while substantially maintaining the emission intensity. In the silicon nitride-based phosphor and the sialon phosphor proposed heretofore, when the activator is replaced, although the peak wavelength is shifted, a problem involved therein is that the emission intensity is drastically decreased. However, the matrix of the example 3 is characterized by showing an excellent emission intensity in either activator Ce or Eu. Further, the phosphor of the example 3, with the peak wavelength being about 610 nm, exhibits an orange emission, and therefore offers promising prospects as the phosphor for the white LED illumination of bulb color. Further, the orange emitting phosphor proposed heretofore, in which the oxynitride and nitride are activated by Eu, does not exceed 100 nm in the half value width of the emission spectrum. However, the phosphor of the example 3 has a significantly broad emission spectrum, with half value width exceeding about 120 nm.

FIG. 5 shows an excitation spectrum of the phosphor of the example 3. Note that FIG. 5 shows the same graph as that of

TABLE 1-2

| | COMPOSITION FORMULA | Sr (wt %) | Al (wt %) | Si (wt %) | O (wt %) | N (wt %) | Ce (wt %) | Eu (wt %) | OTHERS (wt %) | AVERAGE PARTICLE SIZE D50 (μm) | SPECIFIC SURFACE AREA (m²/g) |
|---|---|---|---|---|---|---|---|---|---|---|---|
| EXAMPLE 1 | $Sr_2Al_2Si_9O_2N_{14}$:Ce | 24.8 | 7.07 | 32.2 | 2.25 | 30.5 | 1.23 | | 1.98 | 17.50 | 0.285 |
| EXAMPLE 2 | $Sr_3Al_3Si_{15}O_3N_{23}$:Ce | 23.7 | 6.11 | 33.6 | 2.11 | 30.5 | 1.10 | | 2.88 | 16.85 | 0.302 |
| EXAMPLE 3 | $Sr_2Al_2Si_9O_2N_{14}$:Eu | 24.5 | 7.13 | 32.3 | 1.83 | 28.1 | | 1.32 | 4.82 | 17.27 | 0.291 |

FIG. 4. In this measurement, the phosphor of the example 3 is irradiated with the monochromatic light in the wavelength range from 300 nm to 570 nm, and the dependency of the emission intensity of the light having the wavelength of 613.8 nm emitted by the phosphor on the wavelength of the excitation light was measured. Then, it was found from the excitation spectrum of the phosphor, that this phosphor emitted light of an orange color with high intensity by excited by the excitation light with a broad wavelength range from 300 nm or around to 550 nm. Further, as a result of measuring the emission intensity when the phosphor was irradiated with the excitation light of monochromatic color in the wavelength range from 350 nm to 500 nm, the emission intensity in the excitation wavelength, in which the intensity of the spectrum emitted by absorbing the excitation light having the aforementioned wavelength became largest, was set at $P_H$, and the emission intensity in the excitation wavelength, in which the emission intensity became smallest, was set at $P_L$, satisfying $(P_H-P_L)/P_H \leq 0.10$. Namely, variation in the emission intensity when using the monochromatic light in the wavelength range from 350 nm to 500 nm was 10.0% or less, thereby showing a flat excitation band.

At present, although the yellow phosphor (YAG:Ce) used as the phosphor for the white LED illumination has the excitation band with highest efficiency near the wavelength of 460 nm, it does not have the excitation band with good efficiency over the broad range. Therefore, by dispersion of emission wavelengths due to the dispersion of emission elements on manufacturing the blue LED, the emission wavelength of the blue LED is out of an optimal excitation range of a YAG:Ce based yellow phosphor. This causes a lost of balance in the emission intensity of blue color and yellow color, and the color tone of the white light is changed. Meanwhile, the phosphor of the example 3 has a flat excitation band, and therefore an approximately constant emission intensity is obtained, even when the dispersion of the emission wavelengths of the emission elements occurs. This makes it possible to manufacture the white LED illumination having a stable same color tone, and therefore the phosphor of the example 3 has an advantage in both quality and manufacturing cost.

Comparative Example 1

The phosphor expressed by the composition formula $Sr_2Si_5N_8$:Ce (where Ce/(Sr+Ce)=0.030) was manufactured and defined as a comparative example 1.

The comparative example 1 was manufactured in the following way.

The commercially available samples $Sr_3N_2$(2N), $Si_3N_4$ (3N), $CeO_2$(3N) were prepared as raw materials, and each raw material was measured in 1.94/3 mol of $Sr_3N_2$, 5.0/3 mold $Si_3N_4$, and 0.060 mol of $CeO_2$ were weighed and mixed in a glove box under a nitrogen atmosphere by using the mortar, so that the molar ratio of each element was expressed, satisfying Sr:Si:Ce=1.94:5.0:0.06. As per the manufacturing method as will be described hereunder, the firing temperature was set at 1600° C. Other than the firing temperature which was set at 1600° C., a phosphor sample was manufactured in the same way as the example 1.

Next, in the same way as the example 1, the emission spectrum of the phosphor of the comparative example 1 was measured. The measurement result is shown in table 2 and FIG. 2 and FIG. 3 (long broken line). As clearly shown from the long broken line of FIG. 2 and FIG. 3, the phosphor of the comparative example 1 showed a broad emission spectrum. Also, as shown in the long broken line of FIG. 2, when the phosphor was excited by the light having the wavelength of 460 nm, it showed the emission spectrum with a peak in the wavelength of 557.2 nm, the relative intensity of the emission intensity was 28.5% when the relative intensity of the example 1 was defined as 100%, and the relative intensity of the luminance was 32.6%. In the chromaticity of the emission spectrum (x, y), x=0.3716 and y=0.5080. In addition, as shown by the long broken line of FIG. 3, the phosphor of the comparative example 1 showed the emission spectrum with a peak in the wavelength of 562.0 nm when excited by the light of the excitation wavelength of 405 nm, the relative intensity of the emission intensity was 56.4% when the relative intensity of the example 1 was defined as 100%, and the relative intensity of the luminance was 62.1%. In the chromaticity (x, y) of the emission spectrum, x=0.3901 and y=0.4985. In addition, a green color emission could be visually confirmed.

Comparative Example 2

The phosphor expressed by the composition formula $Sr_{1.5}Al_3Si_9N_{16}$:Ce (where Ce/(Sr+Ce)=0.030) was manufactured and defined as a comparative example 2.

The comparative example 2 was manufactured in the following way.

The commercially available samples $Sr_3N_2$(2N), AlN(3N), $Si_3N_4$(3N), and $CeO_2$(3N) were prepared as raw materials, the molar ratio of each element is expressed by Sr:Al:Si:Ce=1.455:3.0:9.0:0.045, and each raw material was weighed in 1.455/3 mol of $Sr_3N_2$, 3.0 mol of AlN, 9.0/3 mol of $Si_3N_4$, and 0.045 mol of $CeO_2$ and mixed in the glove box by using a mortar under the nitrogen atmosphere. Other than the firing temperature which was set at 1700° C., a phosphor sample was manufactured in the same way as the example 1.

Next, in the same way as the example 1, the emission spectrum of the phosphor of the comparative example 2 was measured. The measurement result is shown by a short broken line in table 2, FIG. 2, and FIG. 3. As clearly shown from the short broken line of FIG. 2 and FIG. 3, the phosphor of the comparative example 2 showed a broad emission spectrum. In addition, as shown by the short broken line of FIG. 2, the emission spectrum with a peak in the wavelength of 560.8 nm was exhibited when the phosphor was excited by the light having the wavelength of 460 nm, the relative intensity of the emission intensity was 16.0% when the relative intensity of the example 1 was set to 100%, and the relative intensity of the luminance was 16.7%. The chromaticity (x, y) of the emission spectrum was x=0.3992, and y=0.5116. Further, as shown in table 2, and by a short broken line in FIG. 2 and FIG. 3, the phosphor of the comparative example 2 showed the emission spectrum with a peak in the wavelength of 527.5 nm when excited by the monochromatic light of 405 nm, and when the relative intensity of the example 1 was set to 100%, the relative intensity of the emission intensity was 20.9%, and the relative intensity of the luminance was 22.2%. The chromaticity (x, y) of the emission spectrum was x=0.3316 and y=0.4958. In addition, the emission of yellow color was visually confirmed when the phosphor was excited by the light of the wavelength of 460 nm, and the emission of green color was confirmed when the phosphor was excited by the light of the wavelength of 405 nm.

Comparative Example 3

The phosphor expressed by the composition formula $SrAl_2SiO_3N_2$:Ce (Where Ce/(Sr+Ce)=0.030) described in the patent document 3 was manufactured and defined as a comparative example 3.

The phosphor of the comparative example 3 was manufactured as follows.

The commercially available samples $SrCO_3$(3N), AlN (3N), $SiO_2$(3N), $CeO_2$(3N) were prepared as the raw materi-

TABLE 2

| | COMPOSITION FORMULA | EXCITATION WAVELENGTH (nm) | EMISSION INTENSITY (%) | LUMINANCE (%) | PEAK WAVELENGTH (nm) | CHROMATICITY x | y |
|---|---|---|---|---|---|---|---|
| EXAMPLE 1 | $Sr_2Al_2Si_9O_2N_{14}$:Ce | 460 | 100.0 | 100.0 | 559.3 | 0.416 | 0.543 |
| EXAMPLE 2 | $Sr_3Al_3Si_{15}O_3N_{23}$:Ce | 460 | 96.3 | 95.7 | 559.2 | 0.417 | 0.543 |
| EXAMPLE 3 | $Sr_2Al_2Si_9O_2N_{14}$:Eu | 460 | 96.9 | 77.2 | 613.8 | 0.557 | 0.433 |
| COMPARATIVE EXAMPLE 1 | $Sr_2Si_5N_8$:Ce | 460 | 28.5 | 32.6 | 557.2 | 0.372 | 0.508 |
| COMPARATIVE EXAMPLE 2 | $Sr_{1.5}Al_3Si_9N_{16}$:Ce | 460 | 16.0 | 16.7 | 560.8 | 0.399 | 0.512 |
| COMPARATIVE EXAMPLE 3 | $SrAl_2SiO_3N_2$:Ce | 460 | MEASUREMENT IMPOSSIBILITY | | | | |
| EXAMPLE 1 | SAME AS ABOVE | 405 | 108.1 | 111.8 | 552.3 | 0.373 | 0.538 |
| EXAMPLE 2 | | 405 | 103.7 | 106.5 | 552.5 | 0.378 | 0.539 |
| EXAMPLE 3 | | 405 | 98.9 | 88.6 | 607.9 | 0.508 | 0.417 |
| COMPARATIVE EXAMPLE 1 | | 405 | 56.4 | 62.1 | 562.0 | 0.390 | 0.499 |
| COMPARATIVE EXAMPLE 2 | | 405 | 20.9 | 22.2 | 527.5 | 0.332 | 0.496 |
| COMPARATIVE EXAMPLE 3 | | 405 | MEASUREMENT IMPOSSIBILITY | | | | | als, and each raw material was weighed in 0.970 mol of $SrCO_3$, 2.0 mol of AlN, 1.0 mol of $SiO_2$, and 0.030 mol of $CeO_2$, so that the molar ratio of each element was Sr:Al:Si:Ce=0.970:2.0:1.0:0.030, and mixed in the atmospheric air by using the mortar. As for the manufacturing method, the phosphor was manufactured in the same way as the example 1, except that the firing temperature was set at 1400° C.

Next, in the same way as the example 1, the emission spectrum of the phosphor of the comparative example 3 was measured, and it was found that the phosphor did not emit light when excited by the lights having the wavelength of 460 nm and 405 nm, thus making it impossible to measure. However, when the phosphor was irradiated with the excitation light having the wavelength of 254 nm and 366 nm, the light emission of blue color could be visually confirmed.

Further, when fired at the firing temperature of 1800° C., the raw material was melted.

Study on the Examples 1, 2, 3

And the Comparative Examples 1, 2, 3

As clearly shown in the composition formula of table 2, the phosphors of the example 1, example 2, and example 3 having new compositions are different from the comparative example 1 and include Al in the constituent element, have the composition formula different from that of the sialon phosphor of the comparative example 2 (sialon composition formula $M_x(Al,Si)_{12}(O,N)_{16}$, $0<x\leq1.5$), and are different from the comparative example 3 and take a larger molar ratio of nitrogen than that of oxygen.

As clearly shown from the result of table 2, FIG. 2 and FIG. 3, compared with the phosphors of the comparative examples 1 to 3, the phosphors of the example 1, example 2, and example 3 show not less than 3 times emission intensity and not less than 2.5 times luminance, when excited by the light having the wavelength of 460 nm, and when excited by the light having the wavelength of 405 nm, show not less than 1.5 times emission intensity and luminance. Thus, it was found that the aforementioned phosphors exhibited high efficient phosphors showing higher emission intensity and luminance compared with the conventional phosphor.

Example 4 to Example 13

Study on Ce Activation Amount

In the example 4 to the example 13, change in the emission intensity and luminance of the phosphor expressed by the composition formula $Sr_2Al_2Si_9O_2N_{14}$:Ce was measured when the concentration of the element Z(Ce), which is an activator, was changed. Here, in manufacturing a measurement sample, the mixing ratio of the raw materials was adjusted, so that the relation between Ce and Sr, which are activators, is m+z=1. Then, as explained in the example 1, the mixing ratio of each raw material of $SrCO_3$(3N), AlN(3N), $Si_3N_4$(3N), $CeO_2$(3N) was adjusted, and a phosphor sample was manufactured in the same way as the example 1, excepting that Ce-activated concentration was changed, and the emission intensity and luminance thus manufactured were measured. Wherein the Ce-activated concentration Ce/(Sr+Ce) was selected to be 0.001 (example 4), 0.005 (example 5), 0.010 (example 6), 0.020 (example 7), 0.025 (example 8), 0.030 (example 9), 0.035 (example 10), 0.040 (example 11), 0.050 (example 12), and 0.100 (example 13).

The result thus measured is shown in table 3 and FIG. 6. FIG. 6 is a graph in which the relative intensity of the emission intensity of each of the phosphor samples is taken on the ordinate axis, and the value of the mixing ratio Ce/(Sr+Ce) of Sr and Ce is taken on the abscissa axis. As for the emission intensity and luminance, the value of the emission intensity in the peak wavelength of Ce/(Sr+Ce)=0.040 (example 11) was set at 100%. The light having the wavelength of 460 nm was used as the excitation light.

As clearly shown in the result of table 3 and FIG. 6, in the region where the value of Ce/(Sr+Ce) is small, the emission intensity and luminance are increased in association with the increase in the value of Ce/(Sr+Ce). However, the emission intensity and luminance are decreased in association with the increase in the value of Ce/(Sr+Ce), with the vicinity of Ce/(Sr+Ce)=0.040 as a peak. This is because an activator element is insufficient in a part where the value is smaller than Ce/(Sr+Ce)=0.040, and concentration quenching due to the activator element is observed in a part where the value is larger than Ce/(Sr+Ce)=0.040.

Meanwhile, as clearly shown in the result of table 3, in association with the increase in the value of Ce/(Sr+Ce), it was confirmed that the value of the peak wavelength was shifted to the longer wavelength side, if the data of Ce/(Sr+Ce)=0.001 (example 4) was excepted.

Along with the measurement of the emission intensity and luminance, the chromaticity (x, y) of the emission spectrum was measured, and the result is shown in table 3.

The measurement result is shown in table 4 and FIG. 7. Here, FIG. 7 is a graph showing the relative intensity of the emission intensity of each phosphor sample taken on the ordinate axis, and the value of the blending ratio Eu/(Sr+Eu) of Sr and Eu taken on the abscissa axis. Wherein, as for the emission intensity and luminance, the value of the emission intensity in the peak wavelength of Eu/(Sr+Eu)=0.050 (example 22) was defined as 100%. In addition, the light having the wavelength of 460 nm was used as the excitation light.

As clearly shown in table 4 and FIG. 7, in the region where the value of Eu/(Sr+Eu) is small, the emission intensity and luminance are increased along with the increase of the value

TABLE 3

| | COMPOSITION FORMULA | $Z/(m + Z)$ | EMISSION INTENSITY (%) | LUMINANCE (%) | PEAK WAVELENGTH (nm) | CHROMATICITY x | y |
|---|---|---|---|---|---|---|---|
| EXAMPLE 4 | $Sr_2Al_2Si_9O_2N_{14}$:Ce | 0.001 | 24.5 | 25.7 | 564.9 | 0.417 | 0.530 |
| EXAMPLE 5 | | 0.005 | 60.1 | 61.8 | 557.7 | 0.406 | 0.545 |
| EXAMPLE 6 | | 0.010 | 77.4 | 79.0 | 559.2 | 0.408 | 0.546 |
| EXAMPLE 7 | | 0.020 | 93.2 | 94.3 | 559.2 | 0.413 | 0.546 |
| EXAMPLE 8 | | 0.025 | 93.7 | 94.9 | 559.7 | 0.414 | 0.546 |
| EXAMPLE 9 | | 0.030 | 97.2 | 98.2 | 559.7 | 0.416 | 0.545 |
| EXAMPLE 10 | | 0.035 | 99.4 | 100.4 | 561.4 | 0.416 | 0.542 |
| EXAMPLE 11 | | 0.040 | 100.0 | 100.0 | 561.2 | 0.423 | 0.543 |
| EXAMPLE 12 | | 0.050 | 95.6 | 95.6 | 561.6 | 0.427 | 0.540 |
| EXAMPLE 13 | | 0.100 | 38.1 | 38.9 | 564.8 | 0.441 | 0.528 |

Example 14 to Example 23

Study on the Amount of Activator Eu

In the examples 14 to example 23, the emission intensity and luminance when the concentration of the activator element Z(Eu) was changed was measured, in the phosphor expressed by the composition formula $Sr_2Al_2Si_9O_2N_{14}$:Eu. Here, in the manufacture of the measurement sample, in the same way as the examples 4 to 13, the mixing ratio of the raw materials was adjusted, so that the relation between Eu and Sr, which are activators, was m+z=1. Then, each raw material of $SrCO_3$(3N), AlN(3N), $Si_3N_4$(3N), $Eu_2O_3$(3N) explained in the example 3 was adjusted, and in the same way as the example 3, the phosphor sample was manufactured excepting that the Eu activator concentration was changed, and the emission intensity and luminance of the phosphor thus manufactured were measured. Wherein, the Eu activator concentration Eu/(Sr+Eu) was set at 0.001 (example 14), 0.005 (example 15), 0.010 (example 16), 0.020 (example 17), 0.025 (example 18), 0.030 (example 19), 0.035 (example 20), 0.040 (example 21), 0.050 (example 22), 0.100 (example 23).

of Eu/(Sr+Eu). However, the emission intensity and luminance are decreased, along with the increase of the value of Eu/(Sr+Eu), with a peak in the vicinity of Eu/(Sr+Eu)=0.050. This is because the activator element is insufficient in a part where the value of the Eu/(Sr+Eu) is smaller than Eu/(Sr+Eu)= 0.050, thereby causing the concentration quenching due to the activator element to occur in a part where the value of the Eu/(Sr+Eu) is larger than Eu/(Sr+Eu)=0.050. However, loose decrease of the emission intensity due to the concentration quenching is observed in a region where the activator concentration is high, compared with the case of the Ce activator concentration of the examples 4 to 13. It appears that this is caused by a difference of the ion radius and the difference of the valency between Eu and Ce.

Meanwhile, as clearly shown from the result of the table 4, it was confirmed that the value of the peak wavelength was shifted toward the longer wavelength side along with the increase of the value of Eu/(Sr+Eu), when the data of Eu/(Sr+Eu)=0.001 (example 14) and Eu/(Sr+Eu)=0.050 (example 22) were excepted.

In addition, in parallel to the measurement of the emission intensity and luminance, the chromaticity (x, y) of the emission spectrum was measured. The result is shown in table 4.

TABLE 4

| | COMPOSITION | | EMISSION INTENSITY | LUMINANCE | PEAK WAVELENGTH | CHROMATICITY | |
|---|---|---|---|---|---|---|---|
| | FORMULA | Z/(m + Z) | (%) | (%) | (nm) | x | y |
| EXAMPLE 14 | $Sr_2Al_2Si_9O_2N_{14}$:Eu | 0.001 | 31.0 | 44.3 | 588.3 | 0.485 | 0.475 |
| EXAMPLE 15 | | 0.005 | 70.2 | 85.1 | 604.6 | 0.526 | 0.456 |
| EXAMPLE 16 | | 0.010 | 79.8 | 93.6 | 605.2 | 0.534 | 0.451 |
| EXAMPLE 17 | | 0.020 | 93.2 | 99.0 | 611.3 | 0.551 | 0.438 |
| EXAMPLE 18 | | 0.025 | 95.5 | 100.4 | 611.1 | 0.554 | 0.437 |
| EXAMPLE 19 | | 0.030 | 97.2 | 96.7 | 615.2 | 0.561 | 0.430 |
| EXAMPLE 20 | | 0.035 | 99.6 | 96.6 | 615.2 | 0.566 | 0.426 |
| EXAMPLE 21 | | 0.040 | 99.7 | 94.2 | 615.3 | 0.569 | 0.423 |
| EXAMPLE 22 | | 0.050 | 100.0 | 100.0 | 610.7 | 0.562 | 0.430 |
| EXAMPLE 23 | | 0.100 | 94.7 | 69.9 | 626.5 | 0.599 | 0.395 |

Example 24 to Example 32

Change of Al/Sr Ratio

In the example 24 to example 32, in regards to the phosphor expressed by the composition formula $Sr_2Al_aSi_9O_oN_n$:Ce (Ce/(Sr+Ce)=0.030, n=2/3m+a+4/3b−2/3o, m=2.0, b=9.0, O≦2.0), the molar ratio of Sr, Si, O is fixed to 2, 9, 2, respectively, and the change of the emission intensity and luminance was measured when the a/m ratio (here, a/m and Al/Sr have the same meaning) was changed. Here, in the manufacture of the measurement sample, the phosphor sample was manufactured in the same way as the example 1, excepting that the mixing ratio of only AlN(3N) out of each raw material of $SrCO_3$(3N), AlN(3N), $Si_3N_4$(3N), $CeO_2$(3N) explained in the example 1 was adjusted, and the emission intensity and luminance of the phosphor thus manufactured were measured. Wherein, the blending ratio of Al and Sr thus adjusted was set at Al/Sr=0.50 (example 24), Al/Sr=0.75 (example 25), Al/Sr=0.90 (example 26), Al/Sr=1.00 (example 27), Al/Sr=1.10 (example 28), Al/Sr=1.25 (example 29), Al/Sr=1.50 (example 30), Al/Sr=2.00 (example 31), and Al/Sr=3.00 (example 32).

The measurement result is shown in table 5 and FIG. 8. Here, FIG. 8 is a graph showing the relative intensity of the emission intensity of each phosphor sample taken on the ordinate axis, and the value of the blending ratio Al/Sr of Sr and Al taken on the abscissa axis. In regards to the emission intensity and luminance, the value of the emission intensity in the peak wavelength of Al/Sr=1.0 (example 27) was defined as 100%. The value of Al/Sr was adjusted at 0.50 to 3.00, and the result is shown. The light having the wavelength of 460 nm was used as the excitation light.

As being clarified from the result of table 5 and FIG. 8, the emission intensity and luminance are increased along with the increase of the value in the region where the value of Al/Sr is small. However the emission intensity and luminance are decreased, with a peak in the vicinity of Al/Sr=1.0 (example 27).

This is because when the value of Al/Sr is largely deviated from Al/Sr=1.0, an unreacted raw material is remained in the phosphor after firing, the phase different from a light emitting phase is generated, and the crystallinity of the matrix structure of the phosphor is deteriorated because the X-ray diffraction peak intensity is reduced when Al/Sr is not less than 1.0, and further the structure suitable for light emission is collapsed, to generate the impurity phase not contributing to the light emission. Thus, when the value of Al/Sr is deviated from Al/Sr=1.0, the emission intensity and luminance are deteriorated. However, if such a deviation is small, the influence is also small, and when the Al/Sr is in the range of 0.75<Al/Sr<1.5, 80% or more value of the emission intensity and luminance of Al/Sr=1.0 is exhibited.

TABLE 5

| | COMPOSITION | | EMISSION INTENSITY | LUMINANCE | PEAK WAVELENGTH | CHROMATICITY | |
|---|---|---|---|---|---|---|---|
| | FORMULA | Al/Sr | (%) | (%) | (nm) | x | y |
| EXAMPLE 24 | $Sr_2Al_{1.0}Si_9O_2N_{13.0}$:Ce | 0.50 | 43.8 | 44.4 | 562.4 | 0.421 | 0.529 |
| EXAMPLE 25 | $Sr_2Al_{1.5}Si_9O_2N_{13.5}$:Ce | 0.75 | 82.9 | 83.3 | 562.1 | 0.421 | 0.537 |
| EXAMPLE 26 | $Sr_2Al_{1.8}Si_9O_2N_{13.8}$:Ce | 0.90 | 95.4 | 95.4 | 561.6 | 0.418 | 0.541 |
| EXAMPLE 27 | $Sr_2Al_{2.0}Si_9O_2N_{14.0}$:Ce | 1.00 | 100.0 | 100.0 | 559.3 | 0.416 | 0.543 |
| EXAMPLE 28 | $Sr_2Al_{2.2}Si_9O_2N_{14.2}$:Ce | 1.10 | 94.8 | 102.4 | 559.2 | 0.413 | 0.545 |
| EXAMPLE 29 | $Sr_2Al_{2.5}Si_9O_2N_{14.5}$:Ce | 1.25 | 87.2 | 94.6 | 559.2 | 0.411 | 0.545 |
| EXAMPLE 30 | $Sr_2Al_{3.0}Si_9O_2N_{15.0}$:Ce | 1.50 | 70.9 | 76.9 | 559.7 | 0.411 | 0.542 |
| EXAMPLE 31 | $Sr_2Al_{4.0}Si_9O_2N_{16.0}$:Ce | 2.00 | 61.0 | 66.3 | 559.7 | 0.411 | 0.540 |
| EXAMPLE 32 | $Sr_2Al_{6.0}Si_9O_2N_{18.0}$:Ce | 3.00 | 53.1 | 53.3 | 557.5 | 0.404 | 0.538 |

Examples 33 to 42

Change of Si/Sr

In the examples 33 to 42, the molar ratio of Sr, Al, is fixed to 2, 2, respectively in the phosphor expressed by the composition formula $Sr_2Al_2Si_bO_2N_n$:$Ce_{0.060}$(Ce/(Sr+Ce)=0.030, n=2/3m+a+4/3b−2/3o, wherein m=2.0, a=2.0), and the change of the emission intensity and luminance were measured when the b/m ratio (here, b/m and Si/Sr have the same meaning) was changed. Here, in the manufacture of the measurement sample, the phosphor sample was manufactured in the same way as the example 1, excepting that the mixing ratio of only $Si_3N_4$(3N) out of each raw material of $SrCO_3$ (3N), AlN(3N), $Si_3N_4$(3N), $CeO_2$(3N) explained in the example 1 was adjusted, and the emission intensity and luminance of the phosphor thus manufactured were measured. Wherein the blending ratio of Si and Sr was set at Si/Sr=1.0 (example 33), Si/Sr=1.5 (example 34), Si/Sr=2.0 (example 35), Si/Sr=3.0 (example 36), Si/Sr=4.0 (example 37), Si/Sr=4.5 (example 38), Si/Sr=5.0 (example 39), Si/Sr=5.5 (example 40), Si/Sr=6.0 (example 41), Si/Sr=7.0 (example 42).

The measurement result will be explained with reference to table 6 and FIG. 9. Here, FIG. 9 shows the relative intensity of the emission intensity of the phosphor sample taken on the ordinate axis, and the value of the blending ratio Si/Sr of Sr and Si taken on the abscissa axis. In regards to the emission intensity and luminance, the value of the emission intensity in the peak wavelength of Si/Sr=4.5 (example 38) was defined as 100%. The value of Si/Sr is adjusted to 1.0 to 7.0, and the result is shown. The light having the wavelength of 460 nm was used as the excitation light.

not contributing to the light emission is generated. However, if the deviation is small, the influence is also small, and when the value of Si/Sr is in the range of $3.5 \leq Si/Sr \leq 6.0$, 80% or more value of the emission intensity and luminance of Si/Sr=4.5 is exhibited.

Example 43 to Example 50

Change of Sr Molar Ratio

In regards to the phosphor expressed by the composition formula $Sr_mAl_2Si_9O_2N_n$:Ce (Ce/(Sr+Ce)=0.030, n=2/3m+a+4/3b−2/3o, wherein a=2.0, b=9.0, o=2.0), the molar ratio of Al, Si, is fixed to 2, 9, respectively, and the change of the emission intensity and luminance was measured when the molar ratio of Sr (here, a and Sr have the same meaning, i.e. a =Sr) was changed. Here, in the manufacture of the measurement sample, the phosphor sample was manufactured in the same way as the example 1, excepting that the mixing ratio was adjusted by adding $Al_2O_3$(3N) raw material to always obtain the value of 0 as $_o$=2.0 in addition to $SrCO_3$ (3N), AlN(3N), $Si_3N_4$(3N), and $CeO_2$(3N) explained in the

TABLE 6

| | COMPOSITION FORMULA | Si/Sr | EXCITATION WAVELENGTH (nm) | EMISSION INTENSITY (%) | LUMINANCE (%) | PEAK WAVELENGTH (nm) | CHROMATICITY x | y |
|---|---|---|---|---|---|---|---|---|
| EXAMPLE 33 | $Sr_2Al_2Si_2O_2N_{4.67}$:Ce | 1.00 | 460 | 12.2 | 13.2 | 568.1 | 0.413 | 0.495 |
| EXAMPLE 34 | $Sr_2Al_2Si_3O_2N_{6.00}$:Ce | 1.50 | 460 | 34.2 | 36.6 | 566.2 | 0.423 | 0.516 |
| EXAMPLE 35 | $Sr_2Al_2Si_4O_2N_{7.33}$:Ce | 2.00 | 460 | 45.8 | 49.4 | 564.8 | 0.416 | 0.524 |
| EXAMPLE 36 | $Sr_2Al_2Si_6O_2N_{10.00}$:Ce | 3.00 | 460 | 69.8 | 74.8 | 560.7 | 0.405 | 0.535 |
| EXAMPLE 37 | $Sr_2Al_2Si_8O_2N_{12.67}$:Ce | 4.00 | 460 | 94.7 | 96.2 | 559.0 | 0.409 | 0.543 |
| EXAMPLE 38 | $Sr_2Al_2Si_9O_2N_{14.00}$:Ce | 4.50 | 460 | 100.0 | 100.0 | 559.3 | 0.416 | 0.543 |
| EXAMPLE 39 | $Sr_2Al_2Si_{10}O_2N_{15.33}$:Ce | 5.00 | 460 | 96.3 | 95.7 | 559.2 | 0.417 | 0.543 |
| EXAMPLE 40 | $Sr_2Al_2Si_{11}O_2N_{16.67}$:Ce | 5.50 | 460 | 80.2 | 86.2 | 559.7 | 0.419 | 0.541 |
| EXAMPLE 41 | $Sr_2Al_2Si_{12}O_2N_{18.00}$:Ce | 6.00 | 460 | 61.6 | 61.0 | 562.3 | 0.424 | 0.534 |
| EXAMPLE 42 | $Sr_2Al_2Si_{14}O_2N_{20.67}$:Ce | 7.00 | 460 | MEASUREMENT IMPOSSIBILITY | | | | |

As being clarified from the result of FIG. 9, the emission intensity was increased along with the increase of the value of Si/Sr in the region where the value of Si/Sr was small, with a peak at Si/Sr=4.5 (example 38), and when the value of Si/Sr exceeds Si/Sr=4.5, the emission intensity was deteriorated. This is because, in the same way as explained for Al/Sr in the examples 24 to 32, when the value of Si/Sr is largely deviated from Si/Sr=4.5, an unreacted raw material is remained in the phosphor after firing, the impurity phase is generated, and the crystallinity of the matrix structure of the phosphor is deteriorated because the X-ray diffraction peak intensity is reduced, and further the structure suitable for light emission is collapsed. Particularly, when the value of Si/Sr is selected to be smaller than 4.5, the peak observed on the lower angle side disappears, and a new peak is confirmed to appear. Meanwhile, when the value of Si/Sr is selected to be larger than 4.5, the peak observed on the lower angle side is confirmed to disappear. This reveals that when the value of Si/Sr is largely deviated from the relation of Si/Sr=4.5, the impurity phase example 1, and the emission intensity and luminance of the phosphor thus manufactured were measured. Wherein, the molar ratio of Sr thus adjusted was set at Sr=0.50 (example 43), Sr=1.00 (example 44), Sr=1.50 (example 45), Sr=2.00 (example 46), Sr=2.50 (example 47), Sr=3.0 (example 48), Sr=4.0 (example 49), and Sr=6.0 (example 50).

The measurement result will be explained with reference to table 7 and FIG. 10. Here, FIG. 10 is a graph showing the relative intensity of the emission intensity of the phosphor sample taken on the ordinate axis, and the value of Sr molar ratio taken on the abscissa axis. In regards to the emission intensity and luminance, the value of the emission intensity in the peak wavelength of Sr=2.00 (example 46) was defined as 100%. The value of the Sr molar ratio is adjusted to 0.50 to 6.00, and the result is shown. The light having the wavelength of 460 nm was used as the excitation light.

TABLE 7

| | COMPOSITION FORMULA | Sr MOLAR RATIO | EXCITATION WAVELENGTH (nm) | EMISSION INTENSITY (%) | LUMINANCE (%) | PEAK WAVELENGTH (nm) | CHROMATICITY | |
|---|---|---|---|---|---|---|---|---|
| | | | | | | | x | y |
| EXAMPLE 43 | $Sr_{0.25}Al_2Si_9O_2N_{12.83}$:Ce | 0.50 | 460 | MEASUREMENT IMPOSSIBILITY | | | | |
| EXAMPLE 44 | $Sr_{0.50}Al_2Si_9O_2N_{13.00}$:Ce | 1.00 | 460 | MEASUREMENT IMPOSSIBILITY | | | | |
| EXAMPLE 45 | $Sr_{0.75}Al_2Si_9O_2N_{13.17}$:Ce | 1.50 | 460 | 64.1 | 63.7 | 559.1 | 0.411 | 0.538 |
| EXAMPLE 46 | $Sr_{1.00}Al_2Si_9O_2N_{13.33}$:Ce | 2.00 | 460 | 100.0 | 100.0 | 559.7 | 0.410 | 0.542 |
| EXAMPLE 47 | $Sr_{1.25}Al_2Si_9O_2N_{13.50}$:Ce | 2.50 | 460 | 96.5 | 98.7 | 561.6 | 0.407 | 0.536 |
| EXAMPLE 48 | $Sr_{1.50}Al_2Si_9O_2N_{13.67}$:Ce | 3.00 | 460 | 85.9 | 89.6 | 561.6 | 0.400 | 0.536 |
| EXAMPLE 49 | $Sr_{2.00}Al_2Si_9O_2N_{14.00}$:Ce | 4.00 | 460 | 68.5 | 72.6 | 561.6 | 0.398 | 0.532 |
| EXAMPLE 50 | $Sr_{3.00}Al_2Si_9O_2N_{14.67}$:Ce | 6.00 | 460 | 61.8 | 64.1 | 565.6 | 0.425 | 0.520 |

As being clarified from the result of FIG. 10, with smaller molar ratio of 0.50 (example 43) and 1.00 (example 44), the light emission was not obtained when the phosphor sample was irradiated with the light having the wavelength of 460 nm and 405 nm. Further, as an easy evaluation, when the phosphor sample was irradiated with the light of an ultraviolet lamp having the wavelength of 360 nm, blue emission color could be visually confirmed. This is because with smaller molar ratio of 0.50 and 1.00, the ratio of Sr to occupy the mixed powder of $SrCO_3$ is small, and the $SrCO_3$ does not excellently act as flux, not to generate the phase emitting yellow light but to generate other phase, thus exhibiting blue light emission under the excitation light of short wavelength. In addition, when the Sr molar ratio is gradually increased from 1.00, the emission intensity and luminance are increased along with the increase of the Sr molar ratio, with a peak at Sr=2.00 (example 46). However, the emission intensity is decreased when the value of Sr becomes beyond 2.00.

Example 51 to Example 60

Change of Oxygen Content

In the example 51 to example 60, in regards to the phosphor expressed by the composition formula $Sr_2Al_2Si_9O_oN_n$:Ce (Ce/(5r+Ce)=0.030, n=2/3m+a+4/3b−2/3o, m=2.0, a=2.0, b=9.0), the molar ratio of Sr, Al, Si is fixed to 2, 2, 9, respectively, and the change of the emission intensity and luminance was measured when the o/m ratio (oxygen content) was changed. Here, in the manufacture of the measurement sample, the phosphor sample was manufactured in the same way as the example 1, excepting that the oxygen content was changed by mixing each raw material of $Sr_3N_2$(2N), $SrCO_3$ (3N), AlN(3N), $Al_2O_3$(3N), $Si_3N_4$(3N), $SiO_2$(3N), and $CeO_2$ (3N) at a predetermined molar ratio, and the emission intensity and luminance were measured.

As for the example in which the adjusted o/m ratio is o/m=0.0 (example 51), o/m=0.2 (example 52), and o/m=0.50 (example 53), $Sr_3N_2$, $Al_2O_3$, AlN, $Si_3N_4$ were used as raw materials, and as for the example in which the adjusted o/m ratio was o/m=1.00 (example 54), o/m=1.25 (example 55), o/m=1.5 (example 56), o/m=2.0 (example 57), and o/m=3.0 (example 58), $SrCO_3$, $Al_2O_3$, AlN, $SiO_2$, and $Si_3N_4$ were used as the raw materials, and as for the example in which the adjusted o/m ratio was o/m=5.0 (example 59), o/m=10.0 (example 60), $Sr_3N_2$, $Al_2O_3$, $SiO_2$, and $Si_3N_4$ were used as the raw materials.

The measurement result will be explained with reference to table 8 and FIG. 11. Here, FIG. 11 is a graph showing the relative intensity of the emission intensity of the phosphor sample taken on the ordinate axis, and the value of the oxygen content (weight %) in the phosphor taken on the abscissa axis. In the emission intensity and luminance, the value of the emission intensity in the peak wavelength of o/m=1.0 (example 54) was defined as 100%. The light having the wavelength of 460 nm was used as the excitation light.

As being clarified from the result of table 8 and FIG. 11, the emission intensity and luminance of each phosphor are decreased in both cases of increasing or decreasing the oxygen content with a peak between 2.5 and 3.5 wt %. Further, when the oxygen content becomes not less than 10.0 wt o, each phosphor is melted and vitrified.

TABLE 8

| | COMPOSITION FORMULA | o/m | EMISSION INTENSITY (%) | LUMINANCE (%) | PEAK WAVELENGTH (nm) | CHROMATICITY | | O (wt %) | N (wt %) |
|---|---|---|---|---|---|---|---|---|---|
| | | | | | | x | y | | |
| EXAMPLE 51 | $Sr_2Al_2Si_9O_{0.00}N_{15.33}$:Ce | 0.00 | 63.7 | 60.5 | 561.7 | 0.424 | 0.532 | 1.44 | 29.1 |
| EXAMPLE 52 | $Sr_2Al_2Si_9O_{0.40}N_{15.07}$:Ce | 0.20 | 42.6 | 41.0 | 561.2 | 0.413 | 0.532 | 2.08 | 29.6 |
| EXAMPLE 53 | $Sr_2Al_2Si_9O_{1.00}N_{14.67}$:Ce | 0.50 | 47.6 | 45.8 | 561.2 | 0.411 | 0.530 | 2.10 | 28.1 |
| EXAMPLE 54 | $Sr_2Al_2Si_9O_{2.00}N_{14.00}$:Ce | 1.00 | 100.0 | 100.0 | 559.7 | 0.410 | 0.541 | 2.68 | 27.2 |
| EXAMPLE 55 | $Sr_2Al_2Si_9O_{2.50}N_{13.67}$:Ce | 1.25 | 96.3 | 96.4 | 558.1 | 0.404 | 0.542 | 3.56 | 26.9 |
| EXAMPLE 56 | $Sr_2Al_2Si_9O_{3.00}N_{13.33}$:Ce | 1.50 | 80.2 | 80.5 | 558.1 | 0.404 | 0.540 | 4.12 | 26.4 |
| EXAMPLE 57 | $Sr_2Al_2Si_9O_{4.00}N_{12.67}$:Ce | 2.00 | 53.8 | 53.9 | 559.1 | 0.394 | 0.532 | 5.22 | 25.1 |
| EXAMPLE 58 | $Sr_2Al_2Si_9O_{6.00}N_{11.33}$:Ce | 3.00 | 28.2 | 25.4 | 554.6 | 0.367 | 0.505 | 9.42 | 21.7 |
| EXAMPLE 59 | $Sr_2Al_2Si_9O_{10.0}N_{8.67}$:Ce | 5.00 | MEASUREMENT IMPOSSIBILITY | | | | | | |
| EXAMPLE 60 | $Sr_2Al_2Si_9O_{20.0}N_{2.00}$:Ce | 10.00 | MEASUREMENT IMPOSSIBILITY | | | | | | |

This is because when the oxygen content becomes not less than 4.0 wt %, the matrix structure of the phosphor begins to gradually vitrified, and completely vitrified at 10.0 wt % or more, thereby collapsing the crystal structure and deteriorating the crystallinity. Actually, when the X-ray diffraction measurement was performed for the sample having different oxygen content, it was confirmed that the peak intensity of diffraction was significantly lowered along with the increase of the oxygen content, and the half value width of the peak was gradually enlarged, and each phosphor was vitrified along with the increase of the oxygen content. When the matrix structure of the phosphor was vitrified, the structure around Ce ion as the center of light emission becomes irregular, to cause a variance in the space between each center of light emission, or efficient light emission is obtained at some place but no light emission is obtained at another place because an energy from the excitation light absorbed by the matrix body cannot be efficiently transferred to the center of the light emission, and therefore the emission intensity as an entire body of the phosphor is deteriorated. Accordingly, preferably 10 wt % or less of the oxygen content in the phosphor is preferable. When the emission characteristic and powder characteristics after firing are taken into consideration, 0.5 wt % or more and 8.1 wt % or less (in the range of 0.0<o/m 4.0 when defined in terms of molar ratio) is preferable. More preferably, when the oxygen content is in the range from 0.5 wt % to 5.0 wt % (in the range of 0.0<o/m 3.0), it appears that sufficient emission intensity and luminance can be obtained.

Next, in examples 61 to 82, a sample was manufactured by increasing amounts of Al and oxygen in the composition during mixing the raw materials and the emission characteristics and the temperature characteristics were compared.

Example 61

In the example 61, the phosphor having a target composition after firing expressed by $SrAl_{1.43}Si_{3.81}O_{0.59}N_{6.79}:Ce$ (wherein Ce/(Sr+Ce)=0.030) was manufactured.

The commercially available samples $SrCO_3$(3N), AlN (3N), $Al_2O_3$(3N), $Al_2O_3$(3N), $Si_3N_4$(3N), $CeO_2$(3N) were prepared as the raw materials, and each raw material was weighed in $SrCO_3$ of 0.970 mol, $Al_2O_3$ of (1.31−0.976)/3 mol, AlN of 1.3−((1.31−0.976)/3)×2 mol, $Si_3N_4$ of 4.5/3 mol, and 0.030 mol of $CeO_2$, so that the molar ratio of each element was Sr:Al:Si:O:Ce=0.970:1.3:4.5:1.31:0.030, and mixed in the atmospheric air by using the mortar. Note that the phosphor thus manufactured is expressed by a mixed composition formula of $SrAl_{1.3}Si_{4.5}O_{1.31}N_{7.1}:Ce$. The examples 61 to 82 are not shown by the mixed composition formula but shown by the target composition.

In the same way as the example 1, the raw material thus mixed was put in a BN crucible, then after vacuuming inside the furnace, temperature is increased to 1800° C. with an in-furnace pressure of 0.05 MPa set at 15° C./min, retained and fired at 1800° C. for three hours in a nitrogen atmosphere (flow state 20.01/min), and then cooled from 1800° C. to 50° C. for one hour and half. Thereafter, the firing sample thus fired was crushed to a proper particle size by using the mortar in the atmospheric air, and the phosphor of the example 61 of the composition formula expressed by $SrAl_{1.43}Si_{3.81}O_{0.59}N_{6.79}:Ce$ (where Ce/(Sr+Ce)=0.030) was obtained.

As a result of analysis of the obtained phosphor powder, the average particle size (D50) and the specific surface area (BET) are shown in table 9. Note that Si was measured by a weight method (an absorptiometry), the other elements were measured by ICP, the average particle size (D50) was measured by a laser diffraction scattering method, and the specific surface area was measured by a BET method. The obtained phosphor powder showed the average particle size (D50) of 24.40 μm and the specific surface area of 0.225 m²/g, and it was found that these values were in a range from 1.0 μm to 50.0 μm, which was a preferable size as the phosphor powder.

Next, the emission spectrum of the phosphor of the example 61 was measured. This measurement result is shown in table 10, and is further shown in FIG. 12. FIG. 12 is a graph showing the emission intensity of the phosphor taken on the ordinate axis as the relative intensity, and the wavelength of the light taken on the abscissa axis. Here, the emission spectrum is the spectrum of the light released from the phosphor, when the phosphor is irradiated with the light of a certain wavelength or energy. The spectrum of the light emitted from the phosphor is shown by solid line of FIG. 12, when the phosphor of the example is irradiated with the monochromatic light having the wavelength of 460 nm as the excitation light.

As is obvious from FIG. 12, the phosphor had the emission spectrum with a broad peak over the broad wavelength region from 470 nm to 750 nm, and the peak wavelength thereof was 556.0 nm. (the emission intensity at this time and the relative intensity of the luminance were set at 100%). In addition, the half value width obtained was 117.1 nm, and the chromaticity (x, y) of the emission spectrum obtained was x=0.4045, and y=0.5481. Powder had a yellow fluorescent color, and a yellow emission color could be visually confirmed. The phosphor of the example 61 had a peak with extremely broad half value width such as 100 nm or more over the broad wavelength region, and therefore when used as a white LED illuminating phosphor, the white LED illumination having excellent color rendering properties can be manufactured, compared with the phosphor having a sharp peak. In the case of the phosphor having the sharp peak, several kinds of phosphors are required to be mixed to improve the color rendering properties. However, the phosphor of the example 61 has a broad peak, and therefore the number of the kinds of the phosphors to be mixed can be decreased, and the white LED illumination can be manufactured at a low cost.

Further, when the phosphor of the example 61 is irradiated with the monochromatic light having the wavelength of 405 nm as the excitation light, the spectrum of the light emitted form the phosphor is shown in table 10, and is further shown by broken line in FIG. 12. When the phosphor is irradiated with Ex405 nm, the emission intensity is improved by about 20% as compared to a case of Ex460 nm. The peak wavelength was 531.5 nm and the half value width was 118.1 nm, and the half value width of the emission spectrum was 80 nm or more. The chromaticity (x, y) was x=0.3476, and y=0.5305.

Next, by using FIG. 13, the excitation spectrum of the phosphor of the example 61 will be explained. FIG. 13 is a graph showing the emission intensity of the phosphor taken on the ordinate axis, and the wavelength of the excitation light taken on the abscissa axis. Here, the excitation spectrum is obtained by measuring the emission intensity with a fixed wavelength emitted from the phosphor and measuring an excitation wavelength dependency of the emission intensity, when the phosphor to be measured is excited using the monochromatic light of various wavelengths as the excitation light. In this measurement, the phosphor of the example 61 was irradiated with the monochromatic light with the wavelength range from 250 nm to 550 nm, and the excitation dependency of the emission intensity of the light having the wavelength of 556.0 nm (green light) emitted form the phosphor was measured.

As is obvious from FIG. 13, it was found that green color emission with high intensity was shown by the excitation light in a broad wavelength range from about 300 nm to about 500 nm. Particularly, highest emission efficiency is shown by the excitation light in the wavelength range from 400 nm to 480 nm, and at present, the emission device having high luminance can be manufactured by combining the blue LED with the emission wavelength of 460 nm and the near-ultraviolet/ultraviolet LED having the wavelength of 405 nm used as the excitation light for the one-chip type white LED illumination.

Next, the temperature characteristics of the emission intensity of the phosphor obtained by the example 61 were measured. This measurement result is shown in table 10 and is further shown in FIG. 14.

The temperature of this phosphor was increased in such a way as 25° C., 50° C., 100° C., 150° C., 200° C., 250° C., 300° C., and after it reaches a measurement temperature, the temperature was retained for 5 minutes so that the temperature of an overall samples becomes uniform, and thereafter the emission intensity was measured. In addition, the emission intensity at each measurement temperature was measured as the relative intensity, with a value of the emission intensity at a room temperature (25° C.) before increasing the temperature set at 100%. Note that after measuring the emission intensity during increasing the temperature, the phosphor was cooled, and the emission intensity was measured again at 25° C. Further, the same measurement was performed when the phosphor was irradiated with the monochromatic light having the wavelength of 405 nm as the excitation light.

FIGS. 14-1 and 2 is a graph showing the relative emission intensity taken on the ordinate axis, with the emission intensity before increasing the temperature (25° C.) set at 100%, and showing a measurement temperature taken on the abscissa axis at which the emission intensity of the phosphor is measured, wherein FIGS. 14-1 shows a case that the phosphor is irradiated with the monochromatic light having the wavelength of 460 nm as the excitation light, and FIGS. 14-2 shows a case that the phosphor is irradiated with the monochromatic light having the wavelength of 405 nm as the excitation light. The measurement result of the phosphor of the example 61 is shown by a thick solid line in the FIGS. 14-1 and 2.

From the result of FIGS. 14-1, when the phosphor of the example 61 was irradiated with the monochromatic light having the wavelength of 460 nm as the excitation light, the emission intensity showed the values of 94.4% at the measurement temperature of 100° C., 85.8% at 200° C., and 73.4% at 300° C., when the value of the emission intensity at the room temperature (25° C.) before increasing the measurement temperature was set at 100%. After increasing the temperature, the phosphor was cooled, and the measurement at 25° C. again showed 98.8%, and almost no decrease of emission intensity was observed, and even if it was observed, it was within a measurement error.

When the phosphor of the example 61 was irradiated with the monochromatic light having the wavelength of 405 nm as the excitation light (25° C.), the emission intensity of 119.9% was shown, with the value of the emission intensity set at 100% when the phosphor of the example 61 was irradiated with the monochromatic light having the wavelength of 460 nm as the excitation light. Next, from the result of FIGS. 14-2, when the value of the emission intensity at the room temperature (25° C.) before increasing the measurement temperature was set at 100%, the emission intensity showed the values of 92.0% at the measurement temperature of 100° C., 80.9% at 200° C., 66.5% at 300° C. After increasing the temperature, the phosphor was cooled, and the emission intensity was measured again at 25° C., and it showed 98.9%. Almost no decrease of emission intensity was observed, and even if it was observed, it was within a measurement error.

Example 62

In an example 62, the phosphor having a target composition after firing expressed by $SrAl_{1.33}Si_{4.09}O_{0.65}N_{7.02}$:Ce (wherein Ce/(Sr+Ce)=0.030) was manufactured. The phosphor of the example 62 expressed by the composition formula $SrAl_{1.33}Si_{4.09}O_{0.65}N_{7.02}$:Ce (wherein Ce/(Sr+Ce)=0.030) was obtained in the same way as the example 61, other than that during mixing the raw materials, each raw material was weighed in $SrCO_3$ of 0.970 mol, $Al_2O_3$ of (1.31–0.976)/3 mol, AlN of 1.25–((1.31–0.976)/3)×2 mol, $Si_3N_4$ of 4.75/3 mol, and $CeO_2$ of 0.030 mol, so that the molar ratio of each element is Sr:Al:Si:O:Ce=0.970:1.25:4.75:1.31:0.030. As an analysis result of the obtained phosphor powder, the average particle size (D50) and the specific surface area (BET) are shown in table 9. The specific surface area of the obtained phosphor was 0.264 $m^2$/g. It was found that the average particle size (D50) was not less than 1.0 μm and not more than 50.0 μm which was preferable as the phosphor powder.

Next, in the same ways as the example 61, the emission spectrum of the phosphor of the example 62 was measured. The measurement result is shown in table 10. As shown in the table 10, when the phosphor was irradiated with the monochromatic light having the wavelength of 460 nm as the excitation light, the emission spectrum of this phosphor had a broad peak in a broad wavelength range from 470 nm to 750 nm in the same way as the phosphor of the example 61, and the broad peak wavelength was 555.6 nm. Also, the half value width was 115.6 nm and the chromaticity (x, y) of the emission spectrum was x=0.4040, y=0.5481. Note that the powder showed the fluorescent color of yellow, and a green emission color could be visually confirmed. When the relative intensity of the phosphor of the example 61 was set at 100%, the relative intensity of the emission intensity of the phosphor of the example 62 was 94.0%.

Next, as shown in table 10, when the phosphor was irradiated with the monochromatic light having the wavelength of 405 nm as the excitation light, the emission spectrum of this phosphor had a broad peak in a broad wavelength range from 470 nm to 750 nm in the same way as the phosphor of the example 61, and the peak wavelength was 533.5 nm. Also, the half value width was 116.2 nm and the chromaticity (x, y) of the emission spectrum was x=0.3508, y=0.5340. Note that the powder showed the fluorescent color of yellow and a green emission could be visually confirmed. When the relative intensity of the phosphor of the example 61 was set at 100%, the relative intensity of the emission intensity of the phosphor of the example 62 was 110.9%.

Next, when the phosphor of the example 62 was irradiated with the monochromatic light in the wavelength range from 250 nm to 550 nm, and the excitation dependency of the emission intensity having the wavelength of 555.6 nm emitted from this phosphor was measured, it was found that in the same way as the phosphor of the example 61, the excitation spectrum of this phosphor showed green color emission with high intensity by the excitation light in the wavelength range from about 300 nm to 500 nm.

Next, the temperature characteristics of the emission intensity of the obtained phosphor in the example 62 were measured in the same way as the example 61. This measurement result is shown in table 10, and further is shown in FIGS. 14-1 and 2 in the same way as the example 61 by using a thick one dot chain line.

From the result of FIGS. 14-1, when the phosphor of the example 62 was irradiated with the monochromatic light having the wavelength of 460 nm as the excitation light, the emission intensity showed 93.0% at the measurement temperature of 100° C., 83.8% at 200° C., and 70.8% at 300° C., when the value of the emission intensity at the room temperature (25° C.) before increasing the measurement temperature was set at 100% After increasing the temperature, the phosphor was cooled and the emission intensity was measured again at 25° C., it showed 98.4%, and almost no decrease of emission intensity was observed, and even if it was observed, it was within the measurement error.

From the result of FIGS. 14-2, when the phosphor of the example 62 was irradiated with the monochromatic light having the wavelength of 405 nm as the excitation light, the emission intensity showed 90.9% at the measurement temperature of 100° C., 78.8% at 200° C., and 64.6% at 300° C., when the value of the emission intensity at the room temperature (25° C.) before increasing the measurement temperature was set at 100%. After increasing the temperature, the phosphor was cooled and when the emission intensity was measured again at 25° C., it showed 98.6%, and almost no decrease of emission intensity could be observed, and even if it was observed, it was within the measurement error.

The phosphor of the example 62 has a slightly different molar ratio of Al, Si, N, O from the phosphor of the example 61, but showed excellent emission characteristics in the same way as the example 61.

Example 63

In the example 63, the phosphor having a target composition after firing expressed by $SrAl_{1.28}Si_{3.40}O_{0.72}N_{5.99}$:Ce (wherein Ce/(Sr+Ce)=0.030) was manufactured.

The phosphor of the example 63 expressed by the composition formula $SrAl_{1.28}Si_{3.40}O_{0.72}N_{5.99}$:Ce (wherein Ce/(Sr+Ce)=0.030) was obtained in the same way as the example 61, other than that each raw material was weighed in $SrCO_3$ of 0.970 mol, $Al_2O_3$ of (1.56−0.976)/3 mol, AlN of 1.25−((1.56−0.976)/3)×2 mol, $Si_3N_4$ of 4.25/3 mol, and $CeO_2$ of 0.030 mol, so that the molar ratio of each element becomes Sr:Al:Si:O:Ce 0.970:1.25:4.25:1.56:0.030. As the analysis result of the obtained phosphor powder, the average particle size (D50) and the specific surface area (BET) are shown in table 9. It was found that the specific surface area of the obtained phosphor was 0.231 m²/g and the average particle size (D50) was not less than 1.0 μm and not more than 50.0 μm which were preferable as the phosphor powder.

Next, in the same way as the example 61, the emission spectrum of the phosphor of the example 63 was measured. This measurement result was shown in table 10. As shown in table 10, the measurement result of the emission spectrum when the phosphor is irradiated with the monochromatic light having the wavelengths of 460 nmm and 405 nm, and when the phosphor was irradiated with the monochromatic light having the wavelength of 460 nm as the excitation light, this phosphor had a broad peak in a broad wavelength range form 470 nm to 750 nm in the same way as the phosphor of the example 61, and the peak wavelength was 555.6 nm. Also, the half value width was 116.0 nm, and the chromaticity (x, y) of the emission spectrum was x=0.3996, y=0.5498. Note that the powder showed the fluorescent color of yellow and the green emission color could be visually confirmed. Then, the relative intensity of the emission intensity of the phosphor according to the example 63 was 93.5%, when the relative intensity of the phosphor of the example 61 was set at 100%.

Next, as shown in table 10, when the phosphor was irradiated with the monochromatic light having the wavelength of 405 nm as the excitation light, the emission spectrum of this phosphor had a broad peak in a broad wavelength range form 470 nm to 750 nm in the same way as the phosphor of the example 61, and the peak wavelength was 530.4 nm. Also, the half value width was 115.9 nm and the chromaticity (x, y) of the emission spectrum was x=0.3434, y=0.5302. Note that the powder showed the fluorescent color of yellow, and the green emission color could be visually confirmed. When the relative intensity of the phosphor of the example 61 was set at 100%, the relative intensity of the emission intensity of the phosphor according to the example 62 was 111.4%.

Next, when the phosphor of the example 63 was irradiated with the monochromatic light in the wavelength range from 250 nm to 550 nm, and the excitation dependency of the emission intensity having the wavelength of 555.6 nm emitted from this phosphor was measured, it was found that, in the same way as the example 61, the excitation spectrum of this phosphor showed a green color emission with high intensity by the excitation light in a broad wavelength range from about 300 nm to 500 nm.

Next, the temperature characteristics of the emission intensity of the phosphor obtained by the example 63 were measured in the same way as the example 61. This measurement result is shown in table 10, and further is shown in the same way as the example 61 by using a two dot chain line in FIGS. 14-1 and 2.

From the result of FIGS. 14-1, when the phosphor of the example 63 was irradiated with the monochromatic light having the wavelength of 460 nm as the excitation light, it was found that the emission intensity showed 93.7% at the measurement temperature of 100° C., 84.1% at 200° C., and 69.6% at 300° C., when the value of the emission intensity at the room temperature (25° C.) before increasing the measurement temperature was set at 100%. After increasing the temperature, the phosphor was cooled, and the measurement at 25° C. again showed 97.1%, and almost no decrease of emission intensity was observed, and even if it was observed, it was within a measurement error.

From the result of FIGS. 14-2, when the phosphor of the example 63 was irradiated with the monochromatic light having the wavelength of 405 nm as the excitation light, the emission intensity showed 91.0% at the measurement temperature of 100° C., 77.9% at 200° C., and 62.3% at 300° C., when the value of the emission intensity at the room temperature (25° C.) before increasing the measurement temperature was set at 100%. After increasing the temperature, the phosphor was cooled, and the measurement at 25° C. again showed 97.5%, and almost no decrease of emission intensity was observed, and even if it was observed, it was within a measurement error.

In the phosphor of the example 63, the molar ratio of Al, Si, N, and O was slightly different from that of the phosphor of the examples 61 and 62. However, the phosphor of the example 63 showed the excellent emission characteristics in the same way as the phosphor of the example 61.

Example 64

In an example 64, the phosphor with a target composition after firing having the composition formula of $SrAl_{1.13}Si_{4.32}O_{0.64}N_{7.13}$:Ce (wherein Ce/(Sr+Ce)=0.030) was manufactured.

The phosphor of the example 64 having the composition formula expressed by $SrAl_{1.13}Si_{4.32}O_{0.64}N_{7.13}$:Ce (wherein Ce/)Sr+Ce)=0.030) was manufactured in the same way as the example 61, other than each raw material was weighed in $SrCO_3$ of 0.970 mol, $Al_2O_3$ of (1.06–0.976)/3 mol, AlN of 1.00−((1.06−0.976)/3)×2 mol, $Si_3N_4$ of 4.5/3 mol, and $CeO_2$ of 0.030 mol, so that the molar ratio of each element was Sr:Al:Si:O:Ce=0.970:1.0:4.5:1.06:0.030. As the analysis result of the manufactured phosphor, the average particle size (D50) and the specific surface area (BET) are shown in table 9. The specific surface area of the phosphor of the example 64 thus obtained was 0.254 m²/g. The average particle size (D50) was 24.08 μm. Note that although the example 64 had the same composition as that of the example 1, the example 64 has a mixing composition in which an oxygen amount is increased by 0.06 mol as compared to a mixing amount of the raw materials of the example 1.

Next, in the same way as the example 61, the emission spectrum of the phosphor of the example 64 was measured. This measurement result is shown in table 10. As shown in the table 10, when the phosphor was irradiated with the monochromatic light having the wavelength of 460 nm as the excitation light, the emission spectrum of this phosphor had a broad peak in a broad wavelength range from 470 nm to 750 nm in the same way as the phosphor of the example 61, and the peak wavelength was 559.2 nm. The half value width was 118.8 nm, and the chromaticity (x, y) of this emission spectrum was x=0.4125 and y=0.5431. Note that this phosphor powder had yellow fluorescent color and the green emission color could be visually confirmed. When the relative intensity of the emission intensity in the phosphor of the example 61 was set at 100%, the relative intensity of the phosphor of the example 64 was 94.6%.

Next, as shown in the table 10, when the phosphor was irradiated with the monochromatic light having the wavelength of 405 nm as the excitation light, this phosphor had a broad peak in a broad wavelength range from 470 nm to 750 nm in the same way as the phosphor of the example 61, and the peak wavelength was 551.0 nm. The half value width was 121.5 nm, and the chromaticity (x, y) of this emission spectrum was x=0.3699 and y=0.5343. Note that this phosphor powder had yellow fluorescent color, and the green emission color could be visually confirmed. When the relative intensity of the emission intensity in the phosphor of the example 61 was set at 100%, the relative intensity of the phosphor of the example 64 was 105.3%.

Next, the phosphor of the example 64 was irradiated with the monochromatic light in the wavelength range from 250 nm to 550 nm, and the excitation dependency of the emission intensity of the light having the wavelength of 559.2 nm emitted from this phosphor was measured. Then, it was found that in the same way as the phosphor of the example 61, the excitation spectrum of this phosphor also showed the green color emission with high intensity by the excitation light in a broad wavelength range form about 300 nm to 500 nm.

Next, in the same way as the example 61, the temperature characteristics of the emission intensity of the phosphor thus obtained in the example 64 were measured. This measurement result is shown in the table 10, and further shown in FIGS. 14-1 and 2 by using a broken line in the same way as the example 1.

From the result of FIGS. 14-1, when the phosphor of the example 64 was irradiated with the monochromatic light having the wavelength of 460 nm as the excitation light, the emission intensity showed 90.5% at the measurement temperature of 100° C., 75.0% at 200° C., and 54.3% at 300° C., when the value of the emission intensity at the room temperature (25° C.) before increasing the measurement temperature was set at 100%. After increasing the temperature, the phosphor was cooled, and the measurement at 25° C. again showed 81.8%, and the emission intensity was deteriorated by about 20%, as compared to an initial emission intensity.

From the result of FIGS. 14-2, when the phosphor of the example 64 was irradiated with the monochromatic light having the wavelength of 405 nm as the excitation light, the emission intensity showed 89.3% at the measurement temperature of 100° C., 72.3% at 200° C., and 51.9% at 300° C., when the value of the emission intensity at the room temperature (25° C.) before increasing the measurement temperature was set at 100%. After increasing the temperature, the phosphor was cooled, and the measurement at 25° C. again showed 84.6%, and the emission intensity was deteriorated by about 20%, as compared to an initial emission intensity.

Example 65

In an example 65, the phosphor having a target composition after firing expressed by $SrAl_{1.07}Si_{4.46}O_{0.70}N_{7.22}$:Ce (wherein Ce/(Sr+Ce)=0.030) was manufactured. The phosphor of the example 65 expressed by the composition formula $SrAl_{1.07}Si_{4.46}O_{0.70}N_{7.22}$:Ce(wherein Ce/(Sr+Ce)=0.030) was obtained in the same way as the example 61, other than that during mixing the raw materials, each raw material was weighed in $SrCO_3$ of 0.970 mol, $Al_2O_3$ of (1.06–0.976)/3 mol, AlN of 1.00−((1.06−0.976)/3)×2 mol, $Si_3N_4$ of 4.75/3 mol, and $CeO_2$ of 0.030 mol, so that the molar ratio of each element is Sr:Al:Si:O:Ce=0.970:1.0:4.75:1.06:0.030. As an analysis result of the obtained phosphor powder, the average particle size (D50) and the specific surface area (BET) are shown in table 9. The specific surface area of the obtained phosphor was 0.212 m²/g. The average particle size (D50) was 25.44 μm.

Next, in the same way as the example 61, the emission spectrum of the phosphor of the example 65 was measured. This measurement result is shown in the table 10. As shown in the table 10, when the phosphor was irradiated with the monochromatic light having the wavelength of 460 nm as the excitation light, the emission spectrum had a broad peak in a broad wavelength range from 470 nm to 750 nm in the same way as the example 61, and the peak wavelength was 558.1 nm. Also, the half value width was 117.2 nm, and the chromaticity (x, y) of the emission spectrum was x=0.4114 and y=0.5445. Note that this phosphor powder had yellow fluorescent color and the green emission color could be visually confirmed. When the relative intensity of the phosphor of the example 61 was set at 100%, the relative intensity of the emission intensity of the phosphor of the example 65 was 93.4%.

Next, as shown in the table 10, when the phosphor was irradiated with the monochromatic light having the wavelength of 405 nm as the excitation light, the emission spectrum had a broad peak in a broad wavelength range from 470 nm to 750 nm in the same way as the example 61, and the peak wavelength was 551.0 nm. Also, the half value width was 119.4 nm, and the chromaticity (x, y) of the emission spectrum was x=0.3728, and y=0.5384. Note that this phosphor powder had yellow fluorescent color and the green emission color could be visually confirmed. When the relative intensity of the phosphor of the example 61 was set at 100%, the relative intensity of the emission intensity of the phosphor of the example 65 was 104.6%.

Next, when the phosphor of the example 65 was irradiated with the monochromatic light in the wavelength range from 250 nm to 550 nm and the excitation dependency of the emission intensity of the light having the wavelength of 558.1 nm emitted from this phosphor was measured, it was found that in the same way as the example 61, the excitation spectrum of this phosphor also showed the green color emission with high intensity by the excitation light in a broad wavelength range from about 300 nm to 500 nm.

Next, the temperature characteristics of the emission intensity of the phosphor of the example 65 were measured in the same way as the example 61. This measurement result is shown in the table 10, and is further shown in FIGS. 14-1 and 2 by using a tin one dot chain line in the same way as the example 1.

From the result of FIGS. 14-1, when the phosphor of the example 65 was irradiated with the monochromatic light having the wavelength of 460 nm as the excitation light, the emission intensity showed 90.4% at the measurement temperature of 100° C., 73.4% at 200° C., and 51.7% at 300° C., when the value of the emission intensity at the room temperature (25° C.) before increasing the measurement temperature was set at 100%. After increasing the temperature, the phosphor was cooled, and the measurement at 25° C. again showed 81.9%, and the emission intensity was deteriorated by about 15%, as compared to the initial emission intensity.

From the result of FIGS. 14-2, when the phosphor of the example 65 was irradiated with the monochromatic light having the wavelength of 405 nm as the excitation light, the emission intensity showed 88.7% at the measurement temperature of 100° C., 70.4% at 200° C., and 48.9% at 300° C., when the value of the emission intensity at the room temperature (25° C.) before increasing the measurement temperature was set at 100%. After increasing the temperature, the phosphor was cooled, and the measurement at 25° C. again showed 85.4%, and the emission intensity was deteriorated by about 15%, as compared to the initial emission intensity.

Example 66

In an example 66, the phosphor having a target composition after firing expressed by $SrAl_{1.01}Si_{4.70}O_{0.65}N_{7.52}:Ce$ (wherein $Ce/(Sr+Ce)=0.030$) was manufactured. The phosphor of the example 66 expressed by the composition formula $SrAl_{1.01}Si_{4.70}O_{0.65}N_{7.52}:Ce$ (wherein $Ce/(Sr+Ce)=0.030$) was obtained in the same way as the example 61, other than that during mixing the raw materials, each raw material was weighed in $SrCO_3$ of 0.970 mol, $Al_2O_3$ of $(1.06-0.976)/3$ mol, AlN of $1.00-((1.06-0.976)/3) \times 2$ mol, $Si_3N_4$ of 5.00/3 mol, and $CeO_2$ of 0.030 mol, so that the molar ratio of each element is $Sr:Al:Si:O:Ce=0.970:1.0:5.00:1.06:0.030$. As the analysis result of the obtained phosphor powder, the average particle size (D50) and the specific surface area (BET) are shown in the table 9. The specific surface area of the obtained phosphor was 0.256 m²/g. The average particle size (D50) was 27.14 μm. Note that the example 66 shows the mixing composition in which an amount of oxygen is more increased by 0.06 mol than the mixing amount of the raw materials of the example 2 previously shown.

Next, in the same way as the example 61, the emission spectrum of the phosphor of the example 66 was measured. This measurement result is shown in the table 10. As shown in the table 10, when the phosphor was irradiated with the monochromatic light having the wavelength of 460 nm as the excitation light, the emission spectrum of this phosphor had a broad peak in a broad wavelength range from 470 nm to 750 nm in the same way as the phosphor of the example 61, and the peak wavelength was 559.2 nm. Also, the half value width was 116.6 nm and the chromaticity (x, y) of the emission spectrum was x=0.4141, y=0.5444. Note that the powder showed the fluorescent color of yellow, and the green emission color could be visually confirmed. When the relative intensity of the phosphor of the example 61 was set at 100%, the relative intensity of the emission intensity of the phosphor of the example 66 was 95.0%.

Next, as shown in the table 10, when the phosphor was irradiated with the monochromatic light having the wavelength of 405 nm as the excitation light, the emission spectrum had a broad peak in a broad wavelength range from 470 nm to 750 nm in the same way as the example 61, and the peak wavelength was 550.9 nm. Also, the half value width was 118.5 nm, and the chromaticity (x, y) of the emission spectrum was x=0.3753, and y=0.5396. Note that this phosphor powder had yellow fluorescent color and the green emission color could be visually confirmed. When the relative intensity of the phosphor of the example 61 was set at 100%, the relative intensity of the emission intensity of the phosphor of the example 66 was 105.3%.

Next, when the phosphor of the example 66 was irradiated with the monochromatic light in the wavelength range from 250 nm to 550 nm and the excitation dependency of the emission intensity of the light having the wavelength of 559.2 nm emitted from this phosphor was measured, it was found that, in the same way as the phosphor of the example 61, the excitation spectrum of this phosphor also showed green color emission with high intensity by the excitation light in a broad wavelength range from about 300 nm to 500 nm.

Next, the temperature characteristics of the emission intensity of the phosphor thus obtained in the example 66 was measured in the same way as the example 61. This measurement result is shown in the table 10, and is further shown in FIGS. 14-2 by using a thin two dot chain line in the same way as the example 61.

From the result of FIGS. 14-1, when the phosphor of the example 66 was irradiated with the monochromatic light having the wavelength of 460 nm as the excitation light, the emission intensity showed the values of 90.4% at the measurement temperature of 100° C., 76.9% at 200° C., and 60.1% at 300° C., when the value of the emission intensity at the room temperature (25° C.) before increasing the measurement temperature was set at 100%. After increasing the temperature, the phosphor was cooled, and the measurement at 25° C. again showed 98.2%, and almost no decrease of emission intensity was observed, and even if it was observed, it was within a measurement error.

From the result of FIGS. 14-2, when the phosphor of the example 66 was irradiated with the monochromatic light having the wavelength of 405 nm as the excitation light, the emission intensity showed 89.0% at the measurement temperature of 100° C., 73.2% at 200° C., and 55.5% at 300° C., when the value of the emission intensity at the room temperature (25° C.) before increasing the measurement temperature was set at 100%. After increasing the temperature, the phosphor was cooled, and the measurement at 25° C. again showed 98.6%, and almost no decrease of emission intensity was observed, and even if it was observed, it was within a measurement error.

Study on the Examples 61 to 66

As is obvious from the result of the table 10 and FIGS. 14-1 and 2, samples of the examples 61 to 63 with Al/Sr being in a range of $1.1<Al/Sr \leqq 2.0$ obtains excellent emission characteristics compared to the samples of the examples 64 to 66 with Al/Sr being 1.0. The example 61 had an excellent initial emission intensity by about 5.0% as compared to the samples of the examples 64 to 66, and particularly the temperature characteristics were significantly improved and the deterioration of the emission intensity could be more suppressed by about 4.0% at the measurement temperature of 100° C. and 10.0% at 300° C. than the samples of the examples 64 to 66, under the excitation wavelength of 460 nm. Further, when this phosphor was cooled after increasing the temperature and the emission intensity was measured again at 25° C., the emission intensity of the sample with Al/Sr being 1.0 out of the samples of the examples 64 to 65 was deteriorate by about 20% as compared to the emission intensity before increasing the temperature. Meanwhile, the emission intensity of the phosphor of the examples 61 to 63 was about 3.0%, and it was found that almost no deterioration was observed and the phosphor was excellent against heat. In the same way as the phosphor of the examples 61 to 63, the emission intensity of the phosphor of the example 66 after being cooled is hardly deteriorated. Meanwhile, the emission intensity during adding heat is significantly deteriorated, and in the same way as the phosphor of the example 64 and the example 65, the phosphor is deteriorated as compared to the samples of the examples 61 to 63, and the same thing can be said under the excitation wavelength of 405 nm. In the phosphors of the examples 61 to 63, optimization of Al concentration is performed over oxygen/nitrogen concentration of a production phase and therefore reduction of impurity phase is advanced and the emission characteristics and the temperature characteristics are improved, as compared to the phosphors of the examples 64 to 66.

TABLE 9

|  | Sr (wt %) | Al (wt %) | Si (wt %) | O (wt %) | N (wt %) | Ce (wt %) | OTHERS (wt %) | AVERAGE PARTICLE SIZE D50 (μm) | SPECIFIC SURFACE AREA (m²/g) |
|---|---|---|---|---|---|---|---|---|---|
| EXAMPLE 61 | 23.6 | 10.8 | 29.9 | 2.63 | 27.8 | 1.36 | 3.91 | 24.40 | 0.225 |
| EXAMPLE 62 | 22.8 | 9.66 | 30.9 | 2.79 | 29.8 | 1.21 | 2.84 | 24.21 | 0.264 |
| EXAMPLE 63 | 24.6 | 10.1 | 27.8 | 3.36 | 28.6 | 1.50 | 4.07 | 25.77 | 0.231 |
| EXAMPLE 64 | 22.6 | 8.06 | 32.2 | 2.72 | 28.8 | 1.04 | 4.58 | 24.08 | 0.254 |
| EXAMPLE 65 | 22.4 | 7.58 | 33.0 | 2.93 | 28.8 | 1.06 | 4.23 | 25.44 | 0.212 |
| EXAMPLE 66 | 21.7 | 6.98 | 33.8 | 2.64 | 29.8 | 1.14 | 3.94 | 27.14 | 0.256 |

TABLE 10

|  | EXCITATION WAVELENGTH (nm) | PEAK WAVELENGTH (nm) | CHROMATICITY x | CHROMATICITY y | RELATIVE EMISSION INTENSITY (25° C.) (%) | CHANGE RATE OF EMISSION INTENSITY AT EACH MEASUREMENT TEMPERATURE | | | | | | | (AFTER COOLING) |
|---|---|---|---|---|---|---|---|---|---|---|---|---|---|
|  |  |  |  |  |  | (TEMPERATURE INCREASING PROCESS) | | | | | | | |
|  |  |  |  |  |  | 25° C. | 50° C. | 100° C. | 150° C. | 200° C. | 250° C. | 300° C. | 25° C. |
| EXAMPLE 61 | 460 | 556.0 | 0.404 | 0.548 | 100.0 | 100.0 | 96.8 | 94.4 | 91.0 | 85.8 | 80.1 | 73.4 | 98.8 |
| EXAMPLE 62 | 460 | 555.6 | 0.404 | 0.548 | 94.0 | 100.0 | 96.3 | 93.0 | 89.0 | 83.8 | 77.7 | 70.8 | 98.4 |
| EXAMPLE 63 | 460 | 555.6 | 0.400 | 0.550 | 93.5 | 100.0 | 96.5 | 93.7 | 89.5 | 84.1 | 77.4 | 69.6 | 97.1 |
| EXAMPLE 64 | 460 | 559.2 | 0.412 | 0.543 | 94.6 | 100.0 | 95.8 | 90.5 | 83.5 | 75.0 | 65.0 | 54.3 | 81.0 |
| EXAMPLE 65 | 460 | 558.1 | 0.411 | 0.545 | 93.4 | 100.0 | 95.9 | 90.4 | 82.9 | 73.4 | 62.9 | 51.7 | 81.9 |
| EXAMPLE 66 | 460 | 559.2 | 0.414 | 0.544 | 95.0 | 100.0 | 95.6 | 90.4 | 84.0 | 76.9 | 68.4 | 60.1 | 98.2 |
| EXAMPLE 61 | 405 | 531.5 | 0.348 | 0.530 | 119.9 | 100.0 | 96.0 | 92.0 | 87.0 | 80.9 | 74.0 | 66.5 | 98.9 |
| EXAMPLE 62 | 405 | 533.5 | 0.351 | 0.534 | 110.9 | 100.0 | 95.7 | 90.9 | 85.4 | 78.8 | 72.0 | 64.6 | 98.6 |
| EXAMPLE 63 | 405 | 530.4 | 0.343 | 0.530 | 111.4 | 100.0 | 95.9 | 91.0 | 84.8 | 77.9 | 70.2 | 62.3 | 97.5 |
| EXAMPLE 64 | 405 | 551.0 | 0.370 | 0.534 | 105.3 | 100.0 | 95.5 | 89.3 | 81.5 | 72.3 | 62.4 | 51.9 | 84.6 |
| EXAMPLE 65 | 405 | 551.0 | 0.373 | 0.538 | 104.6 | 100.0 | 95.6 | 88.7 | 80.3 | 70.4 | 59.8 | 48.9 | 85.4 |
| EXAMPLE 66 | 405 | 550.9 | 0.375 | 0.540 | 105.3 | 100.0 | 95.5 | 89.0 | 81.4 | 73.2 | 64.3 | 55.5 | 98.6 |

(Powder X-Ray Diffraction Pattern)

In the examples 61 to 66, a diffraction pattern obtained by a powder X-ray method is shown in FIG. 15.

From the result shown in FIG. 15, a product phase contained in the phosphor of this example has characteristic peaks in a brag angle (2θ) range of 12.5 to 13.5°, 17.0 to 18.0°, 21.0 to 22.0°, 22.5 to 23.5°, 26.5 to 27.5°, 28.5 to 29.5°, 34.0 to 35.0°, 35.5 to 36.5°, 36.5 to 37.5°, 41.0 to 42.0°, 42.0 to 43.0°, 56.5 to 57.5°, 66.0 to 67.0°. From this diffraction pattern, a crystal system of a main product phase of this phosphor is considered to be an orthorhombic system or a monoclinic system.

In a case of a/m≦1.1 (examples 64 to 66), the intensity of a strongest diffraction peak observed in a Brag angle (2θ) range of 35.5° to 36.5° is deteriorated as compared to a case of 1.1<a/m≦2.0 (examples 61 to 63). Meanwhile, in a case of 1.1<a/m≦2.0, the intensity of the diffraction peak observed in a Bragg angle (2θ) range of 36.5° to 37.5°, 41.0° to 42.0°, and 42.0° to 43.0° is enhanced as compared to a case of a/m≦1.1. This reveals that by increasing an amount of substitution of Al of the Si site, orientation properties of a crystal is changed, and by reducing the impurity phase not contributing to light emission, an excellent emission efficiency can be exhibited even under a high temperature environment. Thus, the phosphor having the excellent emission efficiency and showing the excellent emission efficiency even under the high temperature environment can be obtained.

Here, the measurement method of the X-ray diffraction pattern by this powder method will be explained.

The phosphor to be measured was pulverized after firing up to a prescribed (preferably 1.0 μm to 50.0 μm) average particle size by using pulverizing means such as a mortar and a ball mill, and a holder of titanium was filled with the phosphor thus pulverized so that its surface becomes flat, and the X-ray diffraction pattern of the phosphor was measured by using an XRD device by RIGAKU DENKI INCO., (RINT 2000). Measurement conditions are as follows.

Measuring instrument: "RINT 2000" by RIGAKU DENKI INC.

X-ray bulb: CoKα

Tube voltage: 40 kV

Tube current: 30 mA

Scan method: 2θ/θ

Scan speed: 0.3°/min

Sampling interval: 0.01°

Start angle (2θ): 10°

Stop angle (2θ): 90°

The deviation of the Bragg angle (2θ) is possibly caused by a sample surface to be irradiated with X-ray is not flat, measurement conditions of X-ray, and particularly the difference in scan speed. Therefore, a slight deviation would be allowable in the range where a characteristic diffraction peak is observed. In order to suppress the deviation as much as possible, Si is mixed in the phosphor sample, with the scan speed set at 0.3°/min, and the deviation of Si peak is corrected after X-ray measurement, to thereby obtain the Bragg angle (2θ).

(Measurement of True Density)

Further, a true density measurement was performed for the samples of the examples 61 to 63, and it was found that all of the samples show the values in the vicinity of 3.45 g/cc such as 3.43 g/cc, 3.45 g/cc, and 3.46 g/cc. Note that an Ultrapycnometer 1000 by QUANTACHROME Inc., was used for measuring the true density. When the impurity phase in the product phase is increased, the true density is increased or decreased more or less than the aforementioned values, and therefore the true density of the phosphor of the present invention may be in a range of 3.45 g/cc±3% to obtain excellent emission characteristics and temperature characteristics.

Examples 67 to 72

In the examples 67 to 72, the samples (examples 67 to 72), with a/m ratio (here, a/m and Al/Sr have the same meaning) changed, were manufactured, in the phosphor having composition formula of a target composition after firing expressed by $SrAl_aSi_{3.81}O_{0.59}N_n$:Ce (Ce/(Sr+Ce)=0.030, n=2/3m+a+4/3b−2/3o, m=1.0, b=3.81, o=0.59), and the peak wavelength, the chromaticity (x, y), the relative emission intensity at 25° C., and the temperature characteristics were measured, as the emission characteristics in each sample.

Here, in the manufacture of the phosphors of the examples 67 to 72, each sample was manufactured in the same way as the example 61, other than that the mixing ratio of only AlN(3N) of each raw material of $SrCO_3$(3N), $Al_2O_3$(3N), AlN(3N), $Si_3N_4$(3N), $CeO_2$(3N), and the emission intensity and the temperature characteristics of each sample thus manufactured were measured. However, the blending ratio of Al and Sr adjusted was set at Al/Sr=1.10 (example 67), Al/Sr=1.21 (example 68), Al/Sr=1.38 (example 69), Al/Sr=1.43 (example 70), Al/Sr=1.66 (example 71), Al/Sr=2.21 (example 72).

The result of the emission characteristics and the temperature characteristics of each sample manufactured in the examples 67 to 72 is shown in table 11 and FIG. 16.

In the measurement of the emission intensity shown in the table 11, the values of the emission intensity of the samples (25° C.) of the examples 67 to 72 were shown by the relative emission intensity, when the value of the emission intensity at the time of irradiating the phosphor of the example 70 with the monochromatic light having the wavelength of 460 nm as the excitation light was set at 100%. Next, the value of the emission intensity at the room temperature (25° C.) before increasing the measurement temperature was standardized as 100% for each sample, and the measurement result of the change of the emission intensity at the time of increasing the measurement temperature from 25° C. to 300° C. was shown. In addition, the table 11 shows the value of the emission intensity when the sample is cooled again to 25° C. after increasing the temperature of the sample up to 300° C. Note that the light having the wavelength of 460 nm was used as the excitation light.

FIG. 16 shows the measurement result of the temperature characteristics, wherein the value of the relative emission intensity is taken on the ordinate axis, and the value of the measurement temperature, at which the measurement of the emission intensity is performed, is taken on the abscissa axis, and the example 67 is shown by a solid line, the example 68 is shown by a thick one dot chain line, the example 69 is shown by a thick two dot chain line, the example 70 is shown by a thin one dot chain line, the example 71 is shown by a short broken line, and the example 72 is shown by a long broken line.

As is obvious from the result of the table 11 and FIG. 16, the phosphor, with Al/Sr being 1.43, shows most excellent emission characteristics. Incidentally, the emission intensity was excellent by about 8.0% at 25° C. before increasing the temperature as compared to the case that Al/Sr was 1.10, and the deterioration of the emission intensity was small in all temperature regions even when the temperature was increased, and the excellent temperature characteristics were shown. At the measurement temperature of 100° C., the deterioration of the emission intensity could be suppressed by about 4.5% as compared to the case that Al/Sr was 1.10, and at the measurement temperature of 300° C., the deterioration of the emission intensity could be suppressed by about 20.0% as compared to the case that Al/Sr is 1.10.

In a region in which the value of Al/Sr is smaller than 1.43, the deterioration of the emission intensity during increasing the temperature can be suppressed with increase of this value. However, when the value of Al/Sr is made further larger, with a peak in the vicinity of Al/Sr=1.43 (example 70), the deterioration of the emission intensity becomes large again, such as $(P_{25}-P_{in})/P_{25} \times 100 > 10.0$ at the measurement temperature of 100° C., when the value of Al/Sr is Al/Sr=2.21 (example 72). In addition, in a region in which the value of Al/Sr is small, the emission intensity at 25° C. after increasing and cooling the temperature is significantly deteriorated after cooling as compared to before increasing the temperature. Meanwhile, in a region in which the value of Al/Sr is large, there is a problem that the initial emission intensity is low even before increasing the temperature. Accordingly, in order to obtain a sufficiently practical phosphor, the value of the Al/Sr is preferably in a range of $1.1 < a/m \leq 2.0$.

This is because the phosphor of the present invention is a nitride, oxynitride phosphor having a structure that Sr with large ion radius enters in a gap of an assembled network, being a structure in which a part of Si of a tetrahedron structure of $(SiN_4)$ is substituted with Al, and a part of N is substituted with O. Namely, the reason is that by having the network structure of $(SiN_4)$ different from a case of allowing Ca to enter, because Sr of the phosphor of the present invention has a larger ion radius than Ca of $Ca_x(Al,Si)_{12}(O,N)_{16}$:Eu (wherein $0 < x \leq 1.5$), having the same tetrahedron structure of $(SiN_4)$ as that of the phosphor of the present invention, and by having different Al substitution amount of Si and O substitution amount of N, the optimization is performed into a structure of the phosphor having the excellent emission characteristics. Then, it can be considered that by the optimization of the crystal structure, the activator can be regularly present in this phosphor, and transfer of excitation energy used for light emission is efficiently performed, and therefore the emission efficiency is improved. Further, this crystal structure is nitride and oxynitride having high temperature resistance, generated by reaction of AlN and $Si_3N_4$. Therefore, it can be considered that almost no structure change occurs even when the temperature is increased, and the deterioration of the emission intensity caused by the increase of the temperature of the phosphor itself is suppressed.

the composition formula of a target composition after firing expressed by $SrA_aSi_{4.09}O_{0.65}N_n$:Ce(Ce/(Sr+Ce)=0.030, n=2/3m+a+4/3b-2/3o, m=1.0, b=4.09, o=0.65), and the peak wavelength, the relative emission intensity at 25° C., the temperature characteristics and the chromaticity (x, y) were measured as the emission characteristics in each sample.

Here, in the manufacture of the phosphors of the examples 73 to 75, the phosphor sample was manufactured in the same way as the example 62, other than that, as was explained in the example 62, the mixing ratio of only AlN(3N) out of each raw material of $SrCO_3$(3N), $Al_2O_3$(3N), AlN(3N), $Si_3N_4$(3N), and $CeO_2$(3N), and the emission intensity and the temperature characteristics of each sample thus manufactured were measured. However, the mixing ratio of the adjusted Al and Sr was set at Al/Sr=1.07 (example 73), Al/Sr=1.33 (example 74), and Al/Sr=1.60 (example 75).

The emission characteristics and the temperature characteristics of each sample manufactured in the examples 73 to 75 are shown in table 12 and FIG. 17.

As shown in the table 12, the value of the emission intensity of the examples 73 to 75 (25° C.) is shown by the relative emission intensity, when the value of the emission intensity at the time of irradiating the phosphor of the example 75 with the monochromatic light having the wavelength of 460 nm as the excitation light. Next, the value of the emission intensity at the room temperature (25° C.) before increasing the measurement temperature is standardized as 100% for each sample, and the measurement result of the change of emission intensity at the time of increasing the measurement temperature from 25° C. to 300° C. is shown. In addition, the table 12 also shows the value of the emission intensity when the temperature of the sample is increased up to 300° C. and thereafter the sample is cooled again to 25° C. Note that the light having the wavelength of 460 nm was used as the excitation light.

FIG. 17 shows the measurement result of the temperature characteristics and shows the value of the measurement result obtained by measuring the temperature characteristics, with the relative emission intensity taken on the ordinate axis and the emission intensity taken on the abscissa axis, which are shown by solid line in the example 73, shown by one dot chain line in the example 74, and shown by two dot chain line in the example 75.

As is obvious from the result of the table 12 and FIG. 17, the phosphor exhibited most excellent emission characteris-

TABLE 11

| | | PEAK | | RELATIVE EMISSION | CHANGE RATE OF EMISSION INTENSITY AT EACH MEASUREMENT TEMPERATURE | | | | | | | |
|---|---|---|---|---|---|---|---|---|---|---|---|---|
| | | WAVE-LENGTH | CHROMA-TICITY | | INTENSITY (25° C.) | | | (TEMPERATURE INCREASING PROCESS) | | | | (AFTER COOLING) |
| | Al/Sr | (nm) | x | y | (%) | 25° C. | 50° C. | 100° C. | 150° C. | 200° C. | 250° C. | 300° C. | 25° C. |
| EXAMPLE 67 | 1.000 | 559.7 | 0.413 | 0.542 | 91.3 | 100.0 | 95.7 | 90.0 | 82.6 | 74.1 | 64.6 | 53.3 | 81.3 |
| EXAMPLE 68 | 1.100 | 558.2 | 0.410 | 0.545 | 94.3 | 100.0 | 96.2 | 91.5 | 85.8 | 79.0 | 71.2 | 62.6 | 92.7 |
| EXAMPLE 69 | 1.250 | 558.1 | 0.405 | 0.548 | 98.6 | 100.0 | 96.7 | 93.9 | 90.1 | 85.4 | 79.4 | 72.2 | 98.5 |
| EXAMPLE 70 | 1.300 | 556.0 | 0.404 | 0.548 | 100.0 | 100.0 | 96.8 | 94.4 | 91.0 | 85.8 | 80.1 | 73.4 | 98.8 |
| EXAMPLE 71 | 1.500 | 556.2 | 0.400 | 0.546 | 72.4 | 100.0 | 95.6 | 92.0 | 87.4 | 82.1 | 75.9 | 69.3 | 97.6 |
| EXAMPLE 72 | 2.000 | 558.1 | 0.405 | 0.543 | 64.9 | 100.0 | 93.9 | 87.9 | 81.2 | 74.6 | 67.5 | 60.6 | 96.8 |

Examples 73 to 75

In examples 73 to 75, samples of the example 73 to the example 75 were manufactured, with a/m ratio (here, a/m and Al/Sr have the same meaning) changed in the phosphor with tics, with Al/Sr being in the vicinity of 1.33 to 1.60. Incidentally, Al/Sr is more excellent than a case of 1.07 by about 9.0% at 25° C. before increasing the temperature, and even when the temperature is increased, the deterioration of the emission intensity is small in all of the temperature range at the time of increasing the temperature, thereby exhibiting the excellent temperature characteristics. At the measurement temperature of 100° C., the deterioration of the emission intensity could be suppressed by about 4.0%, compared to the case that Al/Sr is 1.07, and at the measurement temperature of 300° C., the deterioration of the emission intensity could be suppressed by about 20% compared to the case that Al/Sr is 1.07. Moreover, when Al/Sr is 1.07, the emission intensity at 25° C. after increasing/decreasing the temperature is more deteriorated by about 17% than a case before increasing the temperature. Meanwhile, almost no deterioration of the emission intensity occurs when Al/Sr is 1.33 and 1.60, and even if it occurs, it is within a level of measurement error.

As described above, in the same way as the examples 67 to 72, it was found that a sufficiently practicable phosphor could also be obtained in the examples 73 to 75, provided that Al/Sr was within a range of $1.1<a/m \leqq 2.0$. In the examples 73 to 75, since the molar ratio of Si is larger than that of the examples 67 to 72, optimal range of Al/Sr is slightly different.

dardized as 100% for each sample, and the measurement result of the change of the emission intensity at the time of increasing the measurement temperature from 25° C. to 300° C. is shown. In addition, the table 13 also shows the value of the emission intensity when the temperature of the sample is increased up to 300° C. and is cooled again down to 25° C. Note that the light having the wavelength of 460 nm was used as the excitation light.

FIGS. 18-1 shows the measurement result of the temperature characteristics, wherein the value of the relative emission intensity is taken on the ordinate axis, and the value of the measurement temperature, at which the measurement of the emission intensity is performed, is taken on the abscissa axis, and the example 76 is shown by a solid line, the example 77 is shown by one dot chain line, the example 78 is shown by two dot chain line, and the example 79 is shown by a broken line.

Also, FIGS. 18-2 is a graph showing a relation between oxygen content and the relative emission intensity in each

TABLE 12

| | PEAK WAVELENGTH | CHROMA-TICITY | | RELATIVE EMISSION INTENSITY (25° C.) | CHANGE RATE OF EMISSION INTENSITY AT EACH MEASUREMENT TEMPERATURE | | | | | | | (AFTER COOLING) |
|---|---|---|---|---|---|---|---|---|---|---|---|---|
| | | | | | (TEMPERATURE INCREASING PROCESS) | | | | | | | |
| | (nm) | x | y | (%) | 25° C. | 50° C. | 100° C. | 150° C. | 200° C. | 250° C. | 300° C. | 25° C. |
| EXAMPLE 73 | 558.2 | 0.412 | 0.544 | 91.0 | 100.0 | 95.3 | 89.3 | 81.7 | 72.0 | 61.5 | 50.7 | 82.6 |
| EXAMPLE 74 | 555.6 | 0.404 | 0.548 | 100.0 | 100.0 | 96.3 | 93.0 | 89.0 | 83.8 | 77.7 | 70.8 | 98.4 |
| EXAMPLE 75 | 555.8 | 0.398 | 0.549 | 97.2 | 100.0 | 96.0 | 93.2 | 89.9 | 85.5 | 79.9 | 73.2 | 96.5 |

Examples 76 to 79

In examples 76 to 79, samples of the example 76 to the example 79 were manufactured, with o/m ratio (here, o/m and O/Sr have the same meaning) changed in the phosphor with the composition formula of a target composition after firing expressed by $SrAl_{1.43}Si_{3.81}O_oN_n$:Ce(Ce/(Sr+Ce)=0.030, n=2/3m+a+4/3b−2/3o, m=1.0, a=1.43, b=3.81), and the peak wavelength, the relative emission intensity at 25° C., the temperature characteristics and the chromaticity (x, y) were measured as the emission characteristics in each sample.

Here, in the manufacture of the phosphors of the examples 76 to 79, the phosphor sample was manufactured in the same way as the example 61, other than that, as was explained in the example 61, the mixing ratio of $Al_2O_3(3N)$ and AlN(3N) out of each raw materials of $SrCO_3(3N)$, $Al_2O_3(3N)$, AlN(3N), $Si_3N_4(3N)$, and $CeO_2(3N)$ were adjusted and the emission intensity and the temperature characteristics of each sample thus manufactured were measured. However, the mixing ratio of the adjusted O and Sr was set at O/Sr=0.48 (example 76), O/Sr=0.59 (example 77), O/Sr=0.70 (example 78), and O/Sr=0.81 (example 79).

The result of the emission characteristics and the temperature characteristics of each sample manufactured in the examples 76 to 79 are shown in table 13 and FIG. 18-1.

In the measurement of the emission intensity shown in the table 13, the value of the emission intensity (25° C.) of the examples 76 to 79 was shown by the relative emission intensity, when the value of the emission intensity at 25° C. when the phosphor of the example 77 was irradiated with the monochromatic light having the wavelength of 460 nm. Next, the value of the emission intensity at the room temperature of 25° C. before increasing the measurement temperature was stansample, wherein the relative emission intensity is taken on the ordinate axis and the oxygen content in each sample is taken on the abscissa axis.

As is obvious from the result of the table 13, FIGS. 18-1, and FIGS. 18-2, the phosphor, with O/Sr being 0.59, shows most excellent emission characteristics. Incidentally, the emission intensity was excellent by about 17.0% at 25° C. before increasing the temperature as compared to the case that O/Sr is 0.48, and the deterioration of the emission intensity was small in all temperature regions even when the temperature was increased, and the excellent temperature characteristics were shown. At the measurement temperature of 100° C., the deterioration of the emission intensity could be suppressed by about 3.0% as compared to the case that O/Sr was 0.48, and at the measurement temperature of 300° C., the deterioration of the emission intensity could be suppressed by about 6.0% as compared to the case that O/Sr is 0.48.

Although in this example, the value of Al/Sr is set at 1.43 (best value in the examples 67 to 72), the temperature characteristics of the example 76 is slightly deteriorated compared to other samples. However, in a range of this example, an excellent result regarding the temperature characteristics of each sample is obtained, irrespective of the value of O/Sr. Meanwhile, the initial emission intensity is significantly affected by the value of O/Sr, and it was found that the initial emission intensity was improved by 10%, as compared to a case of other values, when the value of O/Sr is in the vicinity of O/Sr=0.59, being an optimal value. Then, when the value of O/Sr is within a range of $0.0<o/m \leqq 1.5$, more preferably within a range of $0.0<o/m \leqq 1.0$, a sufficiently practicable phosphor can be obtained.

The reason seems to be as follows. Although a part of Si of a tetrahedron structure of (SiN4) is substituted with Al, when only the Al substitution amount is changed, the crystal structure is deviated from the structure suitable for light emission because Al has a larger ion radius than that of Si, and further the valency of an entire body of a matrix structure is unstable because Si has the valency of IV while Al has the valency of III. However, when a part of site N is substituted with O having smaller ion radius than N, the crystal structure suitable for light emission can be taken, and further the excellent emission characteristics can be exhibited because the valency of the entire body of the matrix structure becomes zero.

increasing the temperature of the sample up to 300° C. Note that the light having the wavelength of 460 nm was used as the excitation light.

FIGS. 19-1 shows the measurement result of the temperature characteristics, wherein the value of the relative emission intensity is taken on the ordinate axis, and the value of the measurement temperature, at which the measurement of the emission intensity is performed, is taken on the abscissa axis,

TABLE 13

| | PEAK WAVE-LENGTH (nm) | CHROMA-TICITY x | CHROMA-TICITY y | RELATIVE EMISSION INTENSITY (25° C.) (%) | CHANGE RATE OF EMISSION INTENSITY AT EACH MEASUREMENT TEMPERATURE (TEMPERATURE INCREASING PROCESS) | | | | | | | (AFTER COOLING) 25° C. | O (wt %) | N (wt %) |
|---|---|---|---|---|---|---|---|---|---|---|---|---|---|---|
| | | | | | 25° C. | 50° C. | 100° C. | 150° C. | 200° C. | 250° C. | 300° C. | | | |
| EXAMPLE 76 | 558.2 | 0.408 | 0.545 | 82.8 | 100.0 | 95.5 | 91.4 | 86.2 | 80.4 | 74.2 | 67.4 | 98.3 | 2.46 | 29.0 |
| EXAMPLE 77 | 556.0 | 0.404 | 0.548 | 100.0 | 100.0 | 96.8 | 94.4 | 91.0 | 85.8 | 80.1 | 73.4 | 98.8 | 2.63 | 27.8 |
| EXAMPLE 78 | 555.6 | 0.399 | 0.549 | 87.8 | 100.0 | 96.7 | 94.0 | 90.2 | 85.3 | 79.4 | 72.6 | 97.6 | 3.61 | 26.8 |
| EXAMPLE 79 | 554.7 | 0.395 | 0.549 | 79.4 | 100.0 | 97.1 | 93.9 | 90.0 | 85.4 | 79.0 | 71.9 | 96.1 | 4.39 | 27.9 |

Examples 80 to 82

In the examples 80 to 82, the samples of examples 80 to 82, with o/m ratio (here, o/m and O/Sr have the same meaning) changed, were manufactured, in the phosphor having composition formula of a target composition after firing expressed by $SrAl_{1.33}Si_{4.09}O_oN_n$:Ce(Ce/(Sr+Ce)=0.030, n=2/3m+a+4/3b−2/3o, m=1.0, a=1.33), and the peak wavelength, the chromaticity (x, y), the relative emission intensity at 25° C., and the temperature characteristics were measured, as the emission characteristics in each sample.

Here, in the manufacture of the phosphors of the examples 80 to 82, each phosphor sample was manufactured in the same way as the example 62, other than that the mixing ratio of $Al_2O_3$(3N) and AlN(3N) of each raw material of $SrCO_3$(3N) $Al_2O_3$(3N) AlN(3N), $Si_3N_4$(3N), $CeO_2$(3N), and the emission intensity and the temperature characteristics of each sample thus manufactured were measured. However, the blending ratio of O and Sr adjusted was set at O/Sr=0.52 (example 80), O/Sr=0.65 (example 81), and O/Sr=0.77 (example 82).

The result of the emission characteristics and the temperature characteristics of each sample manufactured in the examples 80 to 82 is shown in table 14 and FIG. 19-1.

In the measurement of the emission intensity shown in the table 14, the values of the emission intensity of the samples (25° C.) of the examples 80 to 82 were shown by the relative emission intensity, when the value of the emission intensity at the time of irradiating the phosphor of the example 81 with the monochromatic light having the wavelength of 460 nm as the excitation light was set at 100%. Next, the value of the emission intensity at the room temperature (25° C.) before increasing the measurement temperature was standardized as 100% for each sample, and the measurement result of the change of the emission intensity at the time of increasing the measurement temperature from 25° C. to 300° C. was shown. In addition, the table 14 shows the value of the emission intensity when the sample is cooled again to 25° C. after and the example 80 is shown by a solid line, the example 81 is shown by one dot chain line, and the example 82 is shown by two dot chain line.

Also FIGS. 19-2 is a graph showing a relation between oxygen content and the relative emission intensity in each sample, wherein the relative emission intensity is taken on the ordinate axis and the oxygen content in each sample is taken on the abscissa axis.

As is obvious from the result of the table 14, FIGS. 19-1, and FIGS. 19-2, the phosphor of this example shows most excellent emission characteristics, when the value of O/Sr is 0.65. For example, the value of O/Sr is more excellent by about 5.0% than a case of 0.52 before increasing the temperature (25° C.), and even when the temperature is increased, the deterioration of the emission intensity is slightly smaller in an entire temperature region, thus exhibiting the excellent temperature characteristics. At the measurement temperature of 100° C., the deterioration of the emission intensity can be suppressed in a range of $(P_{25}-P_{100})/P_{25}\times 100 \leq 10.0$, and at the measurement temperature of 300° C., the deterioration of the emission intensity can be suppressed by about 3.4% as compared to a case that the value of O/Sr is 0.52.

Regarding the temperature characteristics of the phosphor of this example, since the value of Al/Sr is set at 1.33 (best value in the examples 73 to 75), an excellent result is obtained in a range of this example, irrespective of the value of O/Sr. However, the initial emission intensity is significantly affected by the value of O/Sr, and it was found that the initial emission intensity was largest at the time of O/Sr=0.65, being the optimum value, and for example, was larger by about 25.0% as compared to a case of O/Sr=0.77. Then, in the examples 80 to 82 also, in the same way as the case of the examples 76 to 79, when the value of O/Sr is within a range of 0.0<o/m≦1.5, more preferably within a range of 0.0<o/m≦1.0, a sufficiently practicable phosphor can be obtained.

Here, Al molar ratio and Si molar ratio are different between the examples 80 to 82 and the examples 76 to 79.

Therefore, an inclination of the optimal value of o/m in the examples 80 to 82 is slightly different from the examples 76 to 79. Particularly, difference is observed in the initial emission intensity in the vicinity of O/Sr=0.50, and in the examples 76 to 79, the initial emission intensity is deteriorated by about 17.0% as compared to the initial emission intensity under the optimal value of O/Sr=0.59. However, the initial emission intensity is deteriorated only by about 5.0% as compared to the optimal value of O/Sr=0.65. Accordingly, it is found that the optimal value of O/Sr is not determined independently, but is changed according to the Al substitution amount of the site Si.

the abscissa axis. Then, the emission spectrum of the white LED illumination of the example 83 is shown by a solid line.

This phosphor emitted light under excitation of blue light emitted by the light emission part, and emitted light of white light having the emission spectrum with a broad peak continuously in the wavelength range from 400 nm to 750 nm, and the white LED illumination was thereby obtained. When the color temperature, chromaticity, and color rendering properties of this light emission were measured, it was found that the color temperature was 6078K, x=0.317, and y=0.374. Moreover, an average color rendering index (Ra) of this white LED lamp was 73. Further, by suitably changing the blending

TABLE 14

| | PEAK WAVE-LENGTH (nm) | RELATIVE EMISSION CHROMA-TICITY | | RELATIVE EMISSION INTENSITY (25° C.) (%) | CHANGE RATE OF EMISSION INTENSITY AT EACH MEASUREMENT TEMPERATURE | | | | | | | | O (wt %) | N (wt %) |
|---|---|---|---|---|---|---|---|---|---|---|---|---|---|---|
| | | | | | (TEMPERATURE INCREASING PROCESS) | | | | | | | (AFTER COOLING) | | |
| | | x | y | | 25° C. | 50° C. | 100° C. | 150° C. | 200° C. | 250° C. | 300° C. | 25° C. | | |
| EXAMPLE 80 | 557.3 | 0.407 | 0.546 | 94.5 | 100.0 | 96.3 | 92.7 | 87.7 | 81.7 | 74.6 | 67.4 | 99.0 | 2.50 | 28.6 |
| EXAMPLE 81 | 555.6 | 0.404 | 0.548 | 100.0 | 100.0 | 96.3 | 93.0 | 89.0 | 83.8 | 77.7 | 70.8 | 98.4 | 2.79 | 29.8 |
| EXAMPLE 82 | 557.2 | 0.401 | 0.547 | 76.0 | 100.0 | 97.0 | 93.1 | 88.6 | 82.7 | 75.9 | 68.3 | 97.8 | 3.69 | 29.6 |

Hereunder, in the examples 83 to 92, evaluation was made for the phosphor mixture and the light emission device using the phosphors of the aforementioned examples 1 and example 61. In comparative examples 4 to 8, the evaluation was made for the phosphor mixture and the light emission device using a conventional green phosphor.

Example 83

In an example 83, by using the light emitting element (LED) emitting the light having the wavelength of 460 nm, the emission characteristics and the color rendering properties were evaluated when the phosphor sample $SrAlSi_{4.5}ON_7$:Ce (wherein Ce/(Sr+Ce)=0.030) of the example 1 of the present invention was excited. The emission wavelength of the light emitting element may be in an excitation band range from 300 nm to 500 nm where efficiency of this phosphor is excellent, and is not limited to the wavelength of 460 nm.

First, the LED element (emission wavelength of 467 nm) of blue light using a nitride semiconductor was prepared as a light emission part. Further, the phosphor prepared by the example 1, epoxy resin, and a dispersant were mixed to obtain a mixture. Note that regarding the resin, it is preferable to set the transmittance and the refractive index to be higher, and not only epoxy-based resin but also silicon-based resin may be satisfactory provided that the aforementioned condition is satisfied. Fine particles such as $SiO_2$ may be slightly mixed in the dispersant. Then, by sufficiently stirring this mixture, which was then applied on the LED light element, a white LED illumination (light emission device) was manufactured. Since the emission color and the emission efficiency are changed by the ratio of the phosphor and the resin in the aforementioned mixture and the condition may be adjusted in accordance with a target color temperature.

FIG. 20 shows the emission spectrum when power of 20 mA is fed to the manufactured white LED illumination. FIG. 20 is a graph showing the relative emission intensity taken on the ordinate axis and the emission wavelength (nm) taken on the abscissa axis. Then, the emission spectrum of the white LED illumination of the example 83 is shown by a solid line.

amount of the phosphor and the resin, the emission color with different color temperature could be obtained.

Example 84

In the example 84, in the same way as the example 83, by using the light emitting element (LED) emitting light having the wavelength of 460 nm, the emission characteristics and the color rendering properties of this phosphor were evaluated when the phosphor of $SrAl_{1.43}Si_{3.81}O_{0.59}N_{6.79}$:Ce of the example 61 of the present invention was excited.

The emission spectrum when the power of 20 mA is fed to the white LED illumination manufactured by the same manufacturing method as that of the example 83. FIG. 21 is a graph showing the relative emission intensity taken on the ordinate axis, and the emission wavelength (nm) taken on the abscissa axis. Then, the emission spectrum of the white LED illumination of the example 84 is shown by a solid line.

This phosphor was excited to emit light by the blue light emitted by the light emission part, and emitted white light having the emission spectrum with a broad peak continuously in the wavelength range from 400 nm to 750 nm, and the white LED illumination was thereby obtained. When the color temperature, chromaticity, and the color rendering properties of this light emission were measured, it was found that the color temperature was 6344K, the chromaticity was x=0.3115, y=0.3649, and the average color rendering index Ra was 72.

Examples 85 and 86

In an example 85 or an example 86, the phosphor mixture was manufactured, which emits light of correlated color temperature of 5000K (example 85) or 3000K (example 86), when the red phosphor was further added to the phosphor of the example 61 and was then excited by the light emitting element (LED) emitting light having the wavelength of 460 nm. Then, the emission characteristics and the color rendering properties of this phosphor mixture were evaluated. Note that in this embodiment, ICaAlSiN$_3$:Eu was used as the red phosphor, however the red phosphor having nitrogen such as Sr$_4$AlSi$_{11}$O$_2$N$_{17}$:Eu,(Ca,Sr)$_2$Si$_5$N$_8$:Eu or a sulfide-based red phosphor such as SrS:Eu,CaS:Eu can also be used.

1) Preparation of the Phosphor Sample

The green phosphor SrAl$_{1.43}$Si$_{3.81}$O$_{0.59}$N$_{6.79}$:Ce (phosphor of the example 61) was manufactured by the method explained in the example 61. Meanwhile, the red phosphor CaAlSiN$_3$:Eu was manufactured by a method described hereunder.

Commercially available Ca3N2(2N), AlN(3N), Si3N4(3N), and Eu2O3(3N) were prepared, and each raw material was weighed so that the molar ratio of each element was Ca:Al:Si:Ce=0.970:1.00:1.00:0.030, and was mixed by using a mortar in a nitrogen atmosphere. The temperature of mixed raw materials was increased at a temperature-rising rate of 15° C./min up to 1500° C. in a powder state under the nitrogen atmosphere. Then, the raw materials were retained/fired for 12 hours at 1500° C., and thereafter were cooled for 1 hour from 1500° C. down to 200° C., to thereby obtain the phosphor having the composition formula expressed by CaAlSiN$_3$:Eu. The sample thus obtained was pulverized, classified, and a red phosphor sample was prepared.

2) Adjustment of the Phosphor Mixture

The emission spectrum for two kinds of phosphor samples such as SrAl$_{1.43}$Si$_{3.81}$O$_{0.59}$N$_{6.79}$:Ce and CaAlSiN$_3$:Eu under excitation by excitation light having the wavelength of 460 nm was respectively measured, and from this emission spectrum, a relative mixing ratio to achieve 5000K (example 85) or 3000K (example 86) of the correlated color temperature of both phosphor mixtures was obtained by simulation. According to the result of this simulation, when the correlated color temperature was 5000K (example 85), the molar ratio was SrAl$_{1.43}$Si$_{3.81}$O$_{0.59}$N$_{6.79}$:Ce:CaAlSiN$_3$:Eu=98.0:2.0 (molar ratio), and when the correlated color temperature was 3000K (example 86), the molar ratio was SrAl$_{1.43}$Si$_{3.81}$O$_{0.59}$N$_{6.79}$:Ce:CaAlSiN$_3$:Eu=95.0:5.0 (molar ratio). Based on this result, each phosphor was weighed and the phosphor mixture was obtained.

However, by the emission wavelength (excitation wavelength of the phosphor mixture) of the light emission part and the emission efficiency of the phosphor to the excitation light, a preferable mixing ratio is sometimes deviated from this simulation result. In this case, the blending ratio of the phosphors is suitably adjusted, and an actual emission spectrum shape is arranged.

3) Evaluation by the Light Emitting Element

In the same way as the examples 83 and 84, the LED (having the emission wavelength of 460 nm) of blue light having the nitride semiconductor was prepared as the light emission part, and on this LED, the mixture of the aforementioned phosphor mixture and resin was set. Regarding the mixing ratio of the phosphor mixture and the resin, a suitable blending ratio of the phosphors were adjusted so as to obtain a daylight white color corresponding to the color temperature of 5000K and a bulb color corresponding to 3000K, based on the simulation result, which was then combined with the light emission part of the LED, and the white color LED illumination (light emission device) was thereby manufactured.

The aforementioned both phosphor mixtures were excited/emitted light by the blue light emitted by the light emission part, and the white LED illumination emitting white light having the emission spectrum with a broad peak in the wavelength range from 420 nm to 750 nm could be obtained. Here, the emission spectrum when the power of 20 mA was fed to the light emitting element of the manufactured white LED illumination is shown in FIG. 21. In FIG. 21, the emission spectrum of day light white color of the white LED illumination set to have the color temperature of 5000K is shown by one dot chain line, and the emission spectrum of bulb color of the white LED illumination set to have the color temperature of 3000K is shown by two dot chain line.

Here, list of measurement data such as luminance, chromaticity, color rendering index, and color temperature of the white LED illumination of the example 85 or the example 86 is shown in table 15.

When the color temperature, chromaticity, or color rendering properties of the light emission were measured, the white LED illumination of the example 85 set to have the color temperature of 5000K showed the color temperature of 4987K, x=0.3454, y=0.3512, the average color rendering index Ra of 90, and a special color rendering index R9 of 84, R13 of 91, and R15 of 91. The white color LED illumination of the example 86 set to have the color temperature of 3000K showed the color temperature of 2999K, x=0.4362, y=0.4024, the average color rendering index Ra of 95, and the special color rendering index R9 of 89, R13 of 99, and R15 of 97. Further, in these white LED illuminations, by suitably changing the blending amount of the phosphors to be mixed and the blending amount of resin, the emission color of different color temperature could also be obtained.

TABLE 15

| | COLOR TEMPERATURE | CHROMATICITY | | AVERAGE COLOR RENDERING INDEX | SPECIAL COLOR RENDERING INDEX | | | | | | |
|---|---|---|---|---|---|---|---|---|---|---|---|
| | Tcp (K) | x | y | Ra | R9 | R10 | R11 | R12 | R13 | R14 | R15 |
| EXAMPLE 85 | 4987 | 0.3454 | 0.3512 | 90 | 84 | 77 | 81 | 48 | 91 | 93 | 91 |
| EXAMPLE 86 | 2999 | 0.4362 | 0.4024 | 95 | 89 | 87 | 95 | 69 | 99 | 92 | 97 |

Next, examples 87 to 89 will be explained.

The phosphor mixture emitting light of the correlated color temperature of 6500K when excited by the light emitting element (LED) emitting light having the wavelength of 405 nm, and the emission characteristics and the color rendering properties of this phosphor mixture were evaluated. Further, in the example 89, two kinds of red phosphors were added, and excellent color rendering properties were obtained and the luminance was improved. Here, BAM:Eu(BaMgAl$_{10}$O$_{17}$:Eu) and (Sr,Ca,Ba,Mg)$_{10}$(PO$_4$)$_6$Cl$_2$:Eu were used as blue phosphors. However, the phosphors are not limited thereto, and the phosphors expressed by Sr$_5$(PO$_4$)$_3$Cl:Eu,SrAl$_x$Si$_{6-x}$O$_{1+x}$N$_{8-x}$:Eu (0≦x≦2), (Ba,Sr,Ca,Mg)$_2$SiO$_4$:Eu, (Ba,Sr,Ca)Si$_2$O$_2$N$_2$:Eu may be combined.

Example 87

1) Preparation of Phosphor

The green phosphor Sr$_2$Al$_2$Si$_{10}$ON$_{16}$:Ce was manufactured and prepared by a method as described hereunder.

Commercially available SrCO$_3$(2N), AlN(3N), Si$_3$N$_4$(3N) CeO$_2$(3N) were prepared. These raw materials were weighed and mixed to obtain the mixing ratio of the respective raw materials in $SrCO_3$ of 0.970 mol, AlN of 1.0 mol, $Si_3N_4$ of 5/3 mol, and $CeO_2$ of 0.030 mol, so that the molar ratio of each element becomes Sr:Al:Si:Ce=0.970:1:5:0.030. The raw materials thus mixed were set in the nitrogen atmosphere (flow state, 20.0 L/min) in a powder state, and the temperature was increased up to 1800° C. at a rate of 15° C./min, with an in-furnace pressure set at 0.05 MPa, which were then retained/fired at 1800° C. for 3 hours, and thereafter the temperature was decreased from 1800° C. down to 50° C. to cool the raw materials for one hour and half. Thereafter, fired samples were pulverized in an atmospheric air by using the mortar until the samples have a proper particle size, and the phosphor having a mixed composition formula expressed by $Sr_2Al_2Si_{10}ON_{16}$:Ce was prepared.

The red phosphor $CaAlSiN_3$:Eu was manufactured by the method explained in the example 85.

A commercially available blue phosphor BAM:Eu ($BaMgAl_{10}O_{17}$:Eu) was prepared.

2) Adjustment of Phosphor Mixture

The emission spectrum for three kinds of phosphor samples such as $Sr_2Al_2Si_{10}ON_{16}$:Ce, $CaAlSiN_3$:Eu, and BAM:Eu under excitation by excitation light having the wavelength of 405 nm was respectively measured, and from this emission spectrum, the relative mixing ratio to achieve 6500K of the correlated color temperature of the phosphor mixtures was obtained by simulation. According to the result of this simulation, the molar ratio was BAM:Eu:$Sr_2Al_2Si_{10}ON_{16}$:Ce:$CaAlSiN_3$:Eu=47.6:49.5:2.9, and therefore based on this result, each phosphor was weighed and the phosphor mixture was obtained.

Here, under the excitation by the excitation light having the wavelength of 405 nm, the half value width of the emission spectrum of BAM:Eu was 53.5 nm, the half value width of the emission spectrum of $Sr_2Al_2Si_{10}ON_{16}$:Ce was 118.0 nm, and the half value width of the emission spectrum of $CaAlSiN_3$:Eu was 86.7 nm, which were all 50 nm or more.

However, a preferable mixing ratio is sometimes deviated from the result of the simulation, depending on the emission wavelength of the light emission part (excitation wavelength of the phosphor mixture) and the emission efficiency of the phosphor with this emission wavelength. In this case, by suitably adjusting the blending ratio of the phosphors, an actual shape of the emission spectrum may be arranged.

3) Evaluation of the Emission Characteristics

The phosphor mixture thus obtained was irradiated with the light having the wavelength of 405 nm as the excitation light, and the correlated color temperature of the light emission of this phosphor mixture was measured. Then, it was found that the correlated color temperature was 6512K and this phosphor mixture had a target color temperature. Further, when the chromaticity of this light emission was measured, x=0.312 and y=0.331 was obtained. A value (Y) was obtained based on a calculation method in the XYZ color system defined by JISZ8701, and the luminance was set at 100.

It was found that the luminance of the phosphor mixture of the example 87 was increased by about 18%, as compared to the luminance of the phosphor mixture of the comparative example 4 as will be described later.

The emission spectrum is shown by a thick solid line in FIG. 22. FIG. 22 is a graph showing the relative emission intensity taken on the ordinate axis and the emission wavelength (nm) on the abscissa axis, with three or more emission peaks in the wavelength range from 420 nm to 680 nm and with a continuous spectrum without being interrupted in the wavelength range from 420 nm to 750 nm.

4) Evaluation of the Color Rendering Property

The evaluation of the color rendering property in the light emission of this phosphor mixture was performed based on the JISZ8726. Then, it was found that the average color rendering index Ra was 97 and the special color rendering index R9 was 93 and R15 was 95, and an extremely excellent color rendering property was exhibited.

A list of the measurement data of the luminance, chromaticity, color rendering index, and color temperature, etc, obtained from the example 87 and examples 88, 89 as will be described later, and comparative examples 4 to 6 is shown in a table 16.

Example 88

1) Preparation of the Phosphor $Sr_2Al_2Si_{10}ON_{16}$:Ce was prepared by the method explained in the example 87, as the green phosphor.

$CaAlSiN_3$:Eu was prepared by the method explained in the example 85, as the red phosphor.

Commercially available $(Sr,Ca,Ba,Mg)_{10}(PO_4)_6Cl_2$:Eu was prepared as the blue phosphor.

2) Adjustment of the Phosphor Mixture

Under the same simulation as the example 87, $(Sr,Ca,Ba,Mg)_{10}(PO_4)_6Cl_2$:Eu:$Sr_2Al_2Si_{10}ON_{16}$:Ce:$CaAlSiN_3$:Eu=64.5:33.1:2.4 was obtained, and based on this result, each phosphor was weighed and mixed to obtain the phosphor mixture.

Here, when the phosphor mixture was excited by the excitation light having the wavelength of 405 nm, the half value width of the emission spectrum of $(Sr, Ca,Ba,Mg)_{10}(PO_4)_6Cl_2$:Eu was 51.1 nm.

3) Evaluation of the Emission Characteristics

In the same way as the example 87, when the correlated color rendering temperature of the light emission of this phosphor mixture was measured, it was 6502K, thus exhibiting a target color temperature. Further, when the chromaticity of this light emission was measured, x=0.313 and y=0.327 was obtained. When the luminance was obtained from the obtained emission spectrum, it was found that the luminance of the phosphor mixture of this example was 101, with the luminance of the example 87 set at 100.

The luminance of the phosphor mixture of the example 88 was increased by about 16%, as compared to the luminance of the phosphor mixture of the comparative example 5 as will be described later.

The obtained emission spectrum is shown by a thick one dot chain line in FIG. 22.

In the same way as the example 87, this emission spectrum had three or more emission peaks in the wavelength range from 420 nm to 680 nm and a continuous spectrum without being interrupted in the wavelength range from 420 nm to 750 nm.

4) Evaluation of the Color Rendering Property

The evaluation of the color rendering property in the light emission of this phosphor mixture was performed based on the JISZ8726. Then, it was found that the average color rendering index Ra was 94, the special color rendering index R9 was 60, R15 was 89, and an extremely excellent color rendering property was exhibited.

Example 89

In an example 89, the phosphor mixture emitting light having the correlated color temperature of 6500K when excited by the light emitting element (LED) emitting the light having the wavelength of 405 nm was manufactured by a method of using two kinds of red phosphors having further improved luminance and color rendering properties, and the emission characteristics and color rendering properties of this phosphor mixture was evaluated.

1) Preparation of the Phosphor $Sr_2Al_2Si_{10}ON_{18}$:Ce was prepared by the method explained in the example 87, as the green phosphor.

$CaAlSiN_3$:Eu was prepared by the method explained in the example 85, as the red phosphor.

Commercially available BAM:Eu was prepared as the blue phosphor.

In addition, a second red phosphor $CaAl_2Si_4N_8$:Eu was manufactured by the following method.

Commercially available $Ca_3N_2$(2N), AlN(3N), $Si_3N_4$(3N), $Eu_2O_3$(3N) were prepared and each raw material was weighed, so that the molar ratio of each element was Ca:Al:Si:Eu=0.970:2:4:0.030, and mixed in the glove box under the nitrogen atmosphere by using the mortar. Then, the temperature was increased at a rate of 15° C./min up to 1700° C. in the nitrogen atmosphere, and the raw materials were retained and fired for 3 hours at 1700° C., and the temperature was decreased from 1700° C. to 200° C. for 1 hour, to obtain the phosphor having the composition formula expressed by $CaAl_2Si_4N_8$:Eu. Then, the raw materials were pulverized and classified.

2) Adjustment of the Phosphor Mixture

Under the same simulation as the example 87, BAM:Eu: $Sr_2Al_2Si_{10}ON_{18}$:Ce:$CaAl_2Si_4N_8$:Eu:$CaAlSiN_3$:Eu=48.7: 48.1:1.0:2.2 was obtained and based on this result, each phosphor was weighed and mixed to obtain the phosphor mixture.

3) Evaluation of the Emission Characteristics

In the same way as the example 87, when the correlated color temperature of the light emission of this phosphor mixture was measured, it was 6496K, thus exhibiting a target color temperature. Further, when the chromaticity of this light emission was measured, x=0.313, y=0.329 was obtained. When the luminance was obtained from the obtained emission spectrum, the luminance of the phosphor mixture of this example was 107, with the luminance of the example 87 set at 100.

The luminance of the phosphor mixture of the example 89 was increased by about 2%, as compared to the luminance of the phosphor mixture of a comparative example 6 as will be described later.

The obtained emission spectrum is shown by a thick two dot chain line in FIG. 22.

In the same way as the example 87, this emission spectrum had three or more emission peaks in the wavelength range from 420 nm to 680 nm and had a continuous spectrum without being interrupted in the wavelength range from 420 nm to 750 nm.

4) Evaluation of the Color Rendering Property

The evaluation of the color rendering property in the light emission of this phosphor mixture was performed based on the JISZ8726. The average color rendering index Ra was 95, the special color rendering index R9 was 92, R15 was 97, and it was found that an extremely excellent color rendering property was exhibited.

Next, the phosphor mixture manufactured by using an already known green phosphor is shown as a comparative example. In the comparative examples 4 to 6, the phosphor mixture emitting light having the correlated color temperature of 6500K when excited by the light emitting element (LED) emitting the light having the wavelength of 405 nm was manufactured, and the emission characteristics and the color rendering property of this phosphor mixture were evaluated. In the comparative example 6, two kinds of red phosphors were used, and the color rendering property and the luminance were improved, as compared to the example 89.

Comparative Example 4

1) Preparation of the Phosphor

Commercially available ZnS: Cu, Al was prepared as the green phosphor.

$CaAlSiN_3$:Eu was prepared by the method explained in the example 85, as the red phosphor.

Commercially available BAM:Eu was prepared as the blue phosphor.

2) Adjustment of the Phosphor Mixture

A correlated mixing ratio of BAM:Eu:ZnS:Cu,Al: $CaAlSiN_3$:Eu=61.1:27.4:11.5 was obtained, so that the correlated color temperature of the emission spectrum of the phosphor mixture under the excitation light having the wavelength of 405 nm was 6500K, and based on this result, each phosphor was weighed and mixed to obtain the phosphor mixture.

3) Evaluation of the Emission Characteristics

In the same way as the example 87, when the correlated color temperature of the light emission of this phosphor mixture was measured, it was 6518K, thus exhibiting a target color temperature. Further, when the chromaticity of this light emission was measured, x=0.311, y=0.337 was obtained. When the luminance was obtained from the obtained emission spectrum, it was found that the luminance of the phosphor mixture of this example was 82, with the luminance of the example 87 set at 100.

The obtained emission spectrum is shown by a thin broken line in FIG. 22.

This emission spectrum had three or more emission peaks in the wavelength range from 420 nm to 680 nm and a continuous spectrum without being interrupted in the wavelength range from 420 nm to 750 nm.

4) Evaluation of the Color Rendering Property

The evaluation of the color rendering property in the light emission of this phosphor mixture was performed based on the JISZ8726. Then, it was found that the average color rendering index Ra was 87, and the special color rendering index R9 was 6, R15 was 78.

Comparative Example 5

1) Preparation of the Phosphor

Commercially available ZnS:Cu,Al was prepared as the green phosphor.

$CaAlSiN_3$:Eu was prepared by the method explained in the example 85, as the red phosphor.

Commercially available $(Sr, Ca,Ba,Mg)_{10}(PO_4)_6Cl_2$:Eu was prepared as the blue phosphor.

2) Adjustment of the Phosphor Mixture

A correlated mixing ratio of $(Sr,Ca,Ba,Mg)_{10}(PO_4)_6Cl_2$: Eu:ZnS:Cu,Al:$CaAlSiN_3$:Eu=74.3:19.3:6.4 was obtained, so that the correlated color temperature of the emission spectrum of the phosphor mixture under the excitation light having the wavelength of 405 nm was 6500K, and based on this result, each phosphor was weighed and mixed to obtain the phosphor mixture.

3) Evaluation of the Emission Characteristics

In the same way as the example 87, when the correlated color temperature of the light emission of this phosphor mixture was measured, it was 6481K, thus exhibiting a target color temperature. Further, when the chromaticity of this light emission was measured, x=0.313, y=0.329 was obtained. When the luminance was obtained from the obtained emission spectrum, the luminance of the phosphor mixture of this example was 85, with the luminance of the example 87 set at 100. The obtained emission spectrum is shown by a thin one dot chain line in FIG. 22.

The obtained emission spectrum is shown by a thin two dot chain line in FIG. 22.

4) Evaluation of the Color Rendering Property

The evaluation of the color rendering property in the light emission of this phosphor mixture was performed based on the JISZ8726. Then, the average color rendering index Ra was 96, the special color rendering index R9 was 84, R15 was 92.

TABLE 16

| | LUMINANCE | COLOR TEMPERATURE | CHROMATICITY | | AVERAGE COLOR RENDERING INDEX | SPECIAL COLOR RENDERING INDEX | | | | | | |
|---|---|---|---|---|---|---|---|---|---|---|---|---|
| | (%) | Tcp (K) | x | y | Ra | R9 | R10 | R11 | R12 | R13 | R14 | R15 |
| EXAMPLE 87 | 100 | 6512 | 0.312 | 0.331 | 97 | 93 | 97 | 97 | 87 | 98 | 99 | 96 |
| EXAMPLE 88 | 101 | 6502 | 0.313 | 0.327 | 94 | 60 | 92 | 91 | 93 | 93 | 98 | 89 |
| EXAMPLE 89 | 107 | 6496 | 0.314 | 0.322 | 95 | 92 | 95 | 94 | 86 | 98 | 98 | 97 |
| COMPARATIVE EXAMPLE 4 | 82 | 6518 | 0.311 | 0.337 | 87 | 6 | 97 | 87 | 87 | 90 | 92 | 78 |
| COMPARATIVE EXAMPLE 5 | 85 | 6481 | 0.313 | 0.329 | 75 | −59 | 82 | 67 | 93 | 77 | 90 | 57 |
| COMPARATIVE EXAMPLE 6 | 105 | 6568 | 0.313 | 0.318 | 96 | 80 | 97 | 97 | 86 | 96 | 97 | 92 |

4) Evaluation of the Color Rendering Property

The evaluation of the color rendering property in the light emission of this phosphor mixture was performed based on the JIS8726. Then, it was found that the average color rendering index Ra was 75, the special color rendering index R9 was −59, R15 was 57.

Comparative Example 6

In the comparative example 6, the phosphor mixture having further improved luminance and color rendering properties emitting light having the correlated color temperature of 6500K when excited by the light emitting element (LED) emitting light having the wavelength of 405 nm, was manufactured by using the already known green phosphor, two kinds red phosphors, and the already known blue phosphor, and the emission characteristics and the color rendering properties of this phosphor mixture were evaluated.

1) Preparation of the Phosphor

Commercially available ZnS:Cu,Al was prepared as the green phosphor.

$CaAl_2Si_4N_8$:Eu and $CaAlSiN_3$:Eu were prepared by the method explained in the example 89, as the red phosphor.

Commercially available BAM:Eu was prepared as the blue phosphor.

2) Adjustment of the Phosphor Mixture

In the same way as the example 89, the correlated mixing ratio of BAM:Eu:ZnS:Cu,Al:$CaAl_2Si_4N_8$:Eu:$CaAlSiN_3$:Eu=60.19:30.50:4.65:4.65 was obtained, so that the correlated color temperature of the emission spectrum of the phosphor mixture under the excitation light having the wavelength of 405 nm was 6500K, and based on this result, each phosphor was weighed and mixed to obtain the phosphor mixture.

3) Evaluation of the Emission Characteristics

In the same way as the example 87, when the correlated color temperature of the light emission of this phosphor mixture was measured, it was 6568K, thus exhibiting a target color temperature. Further, when the chromaticity of this light emission was measured, x=0.314, y=0.322 was obtained. When the luminance was obtained from the obtained emission spectrum, the luminance of the phosphor mixture of this example was 105, with the luminance of the example 87 set at 100.

Next, in the examples 90 to 91, the phosphor mixture emitting light having the correlated color temperature of 4200K when excited by the light emitting element (LED) emitting the light having the wavelength of 405 nm, was manufactured and the emission characteristics and the color rendering properties of this phosphor mixture were evaluated. In the example 91, two kinds of red phosphors were used and the color rendering properties and luminance were improved.

Example 90

1) Preparation of the Phosphor

In the same way as the example 87, $Sr_2Al_2Si_{10}ON_{16}$:Ce was prepared as the green phosphor, and $CaAlSiN_3$:Eu was prepared as the red phosphor, and BAM:Eu was prepared as the blue phosphor.

2) Adjustment of the Phosphor Mixture

In the same way as the example 87, the emission spectrum when three kinds of phosphors such as BAM:Eu, $Sr_2Al_2Si_{10}ON_{16}$:Ce, and $CaAlSiN_3$:Eu were excited by the excitation light having the wavelength of 405 nm, was measured, and the correlated mixing ratio to achieve the correlated color temperature of 4200K of the phosphor mixture was obtained from this emission spectrum by simulation. A simulation result showed BAM:Eu:$Sr_2Al_2Si_{10}ON16$:Ce:$CaAlSiN_3$:Eu=33.2:40.8:6.0, and therefore based on this result, each phosphor was weighed and mixed to obtain the phosphor mixture.

3) Evaluation of the Emission Characteristics

In the same way as the example 87, the obtained phosphor mixture was irradiated with the light having the wavelength of 405 nm, and when the correlated color temperature of the light emission of this phosphor mixture was measured, it was 4205K, thus exhibiting a target color temperature. Further, when the chromaticity of this light emission was measured, x=0.373, y=0.376. The value of luminance (Y) is obtained based on a calculation method in the XYZ color system defined by JISZ8701, and the luminance was set at 100.

The luminance of the phosphor mixture of the example 90 was increased by about 5%, as compared to the luminance of the phosphor mixture of a comparative example 7 as will be described later.

This emission spectrum had three or more emission peaks in the wavelength range from 420 nm to 680 nm and had a continuous spectrum without being interrupted in the wavelength range from 420 nm to 750 nm.

The obtained emission spectrum is shown by a thick solid line in FIG. 23.

Note that in the same way as FIG. 22, FIG. 23 is a graph showing the relative emission intensity taken on the ordinate axis, and the emission wavelength (nm) taken on the abscissa axis.

4) Evaluation of the Color Rendering Property

The evaluation of the color rendering property in the light emission of this phosphor mixture was performed based on the JISZ8726. Then, it was found that the average color rendering index Ra was 95, the special color rendering index R9 was 73, R15 was 92, and an extremely excellent color rendering property was exhibited.

The list of the measurement data of the luminance, chromaticity, color rendering index, and color temperature, etc, of the example 90, an example 91 as will be described later, and comparative examples 7 and 8 are shown in table 17.

Example 91

In the example 91, the phosphor mixture emitting light having the correlated color temperature of 4200K when excited by the light emitting element (LED) emitting light having the wavelength of 405 nm, was manufactured by using two kinds of red phosphors having further improved luminance and color rendering properties, and the emission characteristics and color rendering properties of this phosphor mixture were evaluated.

1) Preparation of the Phosphor

The green phosphor $Sr_2Al_2Si_{10}ON_{16}$:Ce was manufactured by the method explained in the example 87.

The red phosphor $CaAlSiN_3$:Eu was manufactured by the method explained in the example 85. In addition, a second red phosphor $CaAl_2Si_4N_8$:Eu was manufactured by the method explained in the example 89.

Commercially available BAM:Eu was prepared as the blue phosphor.

2) Adjustment of the Phosphor Mixture

In the same way as the example 87, BAM:Eu: $Sr_2Al_2Si_{10}ON_{16}$:Ce:$CaAl_2Si_4N_8$:Eu:$CaAlSiN_3$:Eu=35.6: 57.4:2.7:4.3 were obtained by simulation, and based on this result, each phosphor was weighed and mixed to obtain the phosphor mixture.

3) Evaluation of the Emission Characteristics

In the same way as the example 87, when the correlated color temperature of the light emission of this phosphor mixture was measured, it was 4189K, thus having a target color temperature. Further, when the chromaticity of this light emission was measured, x=0.373, y=0.372 was obtained. When the luminance was obtained from the obtained emission spectrum, the luminance of the phosphor mixture of this example was: 107, with the luminance of the example 90 set at 100.

The luminance of the phosphor mixture of the example 91 was increased by about 5%, as compared to the luminance of the phosphor mixture of a comparative example 8 as will be described later.

The obtained emission spectrum is shown by a thick one dot chain line in FIG. 23.

This emission spectrum had three or more emission peaks in the wavelength range from 420 nm to 680 nm and had a continuous spectrum without being interrupted in the wavelength range from 420 nm to 750 nm.

4) Evaluation of the Color Rendering Property

The evaluation of the color rendering property in the light emission of this phosphor was performed based on the JISZ8726. The average color rendering index Ra was 95, the special color rendering index R9 was 80, R15 was 94, and an extremely excellent color rendering property was exhibited.

Next, the phosphor mixture using the already known green phosphor is shown as a comparative example.

The phosphor mixture emitting light of the correlated color temperature of 4200K when excited by the light emitting element (LED) emitting light having the wavelength of 405 nm, was manufactured and the emission characteristics and color rendering property of this phosphor mixture were evaluated. The comparative example 8 shows the comparative example corresponding to the example 91 wherein the color rendering property and the luminance were improved by adding two kinds of red phosphor.

Comparative Example 7

In the comparative example 7, the phosphor mixture emitting light having the correlated color temperature of 4200K was manufactured and the emission characteristics and color rendering properties of this phosphor mixture were evaluated.

1) Preparation of the Phosphor

Commercially available ZnS:Cu,Al was prepared as the green phosphor.

Commercially available $CaAlSiN_3$:Eu was prepared as the red phosphor.

Commercially available BAM:Eu was prepared as the blue phosphor.

2) Adjustment of the Phosphor Mixture

The correlated mixing ratio of BAM:Eu:ZnS:Cu,Al: $CaAlSiN_3$:Eu=39.6:43.7:16.7 was obtained, so that the correlated color temperature of the emission spectrum of the phosphor mixture under the excitation light having the wavelength of 405 nm was 4200K, and based on this result, each phosphor was weighed and mixed to obtain the phosphor mixture.

3) Evaluation of the Emission Characteristics

In the same way as the example 87, when the correlated color temperature of the light emission of this phosphor mixture was measured, it was 4193K, thus having a target color temperature. Further, when the chromaticity of this light emission was measured, x=0.374, y=0.378 was obtained. When the luminance was obtained from the obtained emission spectrum, the luminance of the phosphor mixture of this example was 95, with the luminance of the example 90 set at 100.

The obtained emission spectrum is shown by a thin broken line in FIG. 23.

This emission spectrum had three or more emission peaks in the wavelength range from 420 nm to 680 nm and had a continuous spectrum without being interrupted in the wavelength range from 420 nm to 750 nm.

4) Evaluation of the Color Rendering Property

The evaluation of the color rendering property in the light emission of this phosphor mixture was evaluated based on the JISZ8726. Then, it was found that the average color rendering index Ra was 70, and the special color rendering index R9 was −53, R15 was 54.

Comparative Example 8

In the comparative example 8, the phosphor mixture having further luminance and color rendering property emitting light having the correlated color temperature of 4200K when excited by the light emitting element (LED) emitting light having the wavelength of 405 nm, was manufactured by using two kinds of red phosphors and the blue phosphor, and the emission characteristics and color rendering properties of this phosphor mixture were evaluated, as a comparative example corresponding to the example 91.

1) Preparation of the Phosphor

Commercially available ZnS:Cu,Al was prepared as the green phosphor.

The red phosphor CaAlSiN$_3$:Eu was manufactured by the method explained in the example 85, as the red phosphor. In addition, the second red phosphor CaAl$_2$Si$_4$N$_8$:Eu was manufactured by the method explained in the example 89.

Commercially available BAM:Eu was prepared as the blue phosphor.

2) Adjustment of the Phosphor Mixture

The correlated mixing ratio of BAM:Eu:ZnS:Cu,Al: CaAl$_2$Si$_4$N$_8$:Eu:CaAlSiN$_3$:Eu=52.0:29.5:9.2:9.3 was obtained, so that the correlated color temperature of the emission spectrum of the phosphor mixture under the excitation light having the wavelength of 405 nm was 4200K, and based on this result, each phosphor was weighed and mixed to obtain the phosphor mixture.

3) Evaluation of the Emission Characteristics

In the same way as the example 87, when the correlated color temperature of the light emission of this phosphor mixture was measured, it was 4167K, thus having a target color temperature. Further, when the chromaticity of this light emission was measured, x=0.374, y=0.373 was obtained. When the luminance was obtained from the obtained emission spectrum, the luminance of the phosphor mixture of this example was 102, with the luminance of the example 90 set at 100.

The obtained emission spectrum is shown by a thin two dot chain line in FIG. 23.

4) Evaluation of the Color Rendering Property

The evaluation of the color rendering property in the light emission of this phosphor mixture was performed based on the JISZ8726. The average color rendering index Ra was 96, and the special color rendering index R9 was 92, and R15 was 97.

TABLE 17

| | LUMINANCE | COLOR TEMPERATURE | CHROMATICITY | | AVERAGE COLOR RENDERING INDEX | SPECIAL COLOR RENDERING INDEX | | | | | | |
|---|---|---|---|---|---|---|---|---|---|---|---|---|
| | (%) | Tcp (K) | x | y | Ra | R9 | R10 | R11 | R12 | R13 | R14 | R15 |
| EXAMPLE 90 | 100 | 4205 | 0.373 | 0.376 | 95 | 73 | 96 | 96 | 89 | 95 | 98 | 92 |
| EXAMPLE 91 | 107 | 4189 | 0.373 | 0.372 | 95 | 80 | 96 | 93 | 85 | 97 | 100 | 94 |
| COMPARATIVE EXAMPLE 7 | 95 | 4193 | 0.374 | 0.378 | 70 | −53 | 81 | 61 | 91 | 73 | 87 | 54 |
| COMPARATIVE EXAMPLE 8 | 102 | 4167 | 0.374 | 0.373 | 96 | 92 | 90 | 95 | 82 | 97 | 96 | 97 |

Example 92

Evaluation with Light Emitting Elements

The LED (having emission peak wavelength of 403.5 nm) of ultraviolet light having a nitride semiconductor was set as a light emission part, and a mixture of the phosphor sample obtained by the example 1 and resin was set. The mixing ratio of this phosphor and the resin was adjusted so as to obtain a day light color corresponding to the color temperature of 6500K based on the aforementioned result, and the white LED was manufactured by combining with the light emission part of this LED by a publicly known method. As a result, FIG. 24 shows the emission spectrum at the time of feeding power of 20 mA to the light emitting element of the white LED thus obtained.

Note that in the same way as FIG. 22, FIG. 24 is a graph showing the relative emission intensity taken on the ordinate axis and the emission wavelength (nm) taken on the abscissa axis.

This phosphor was excited to emit light by the ultraviolet light emitted by the light emission part, and color was mixed with the blue color emitted from the light emission part, thus making it possible to obtain the white LED emitting white light. When the color temperature or chromaticity of this light emission was measured, the color temperature was 6469K, and x=0.312, y=0.331. Moreover, the average color rendering index (Ra) of the white LED was 97, and the special color rendering index R9 was 90, and R15 was 96. Further, by suitably changing the blending amount of the phosphor to be mixed and the blending amount of the resin, the emission color of different color temperature could also be obtained.

The list of the measurement data of the luminance, chromaticity, color rendering index, and color temperature, etc, of the example 92 is shown in table 18.

TABLE 18

| | COLOR TEMPERATURE | CHROMATICITY | | AVERAGE COLOR RENDERING INDEX | SPECIAL COLOR RENDERING INDEX | | | | | | |
|---|---|---|---|---|---|---|---|---|---|---|---|
| | Tcp (K) | x | y | Ra | R9 | R10 | R11 | R12 | R13 | R14 | R15 |
| EXAMPLE 92 | 6469 | 0.312 | 0.331 | 97 | 90 | 98 | 98 | 89 | 98 | 99 | 96 |

Example 93

In the example 93, the phosphor sheet was manufactured by dispersing the phosphor mixture manufactured in the example 84 into the resin, and the white LED was manufactured by combining this phosphor sheet and the LED element.

First, by using the silicon-based resin as the resin, being a medium, 10 wt % of phosphor mixture of the example 58 was dispersed in the resin, and the phosphor sheet was manufactured. Next, as shown in the designation mark 1 of FIG. 26(C), the LED set on the LED element that emits light having the wavelength of 405 nm was manufactured. Then, when this LED is allowed to emit light, the white light can be emitted.

BRIEF DESCRIPTION OF THE DRAWINGS

FIGS. 14-1 is a graph showing a measurement result of temperature characteristics of the emission intensity, when the phosphors of examples 61 to 66 are excited by the light having the wavelength of 460 nm.

FIGS. 14-2 is a graph showing the measurement result of the temperature characteristic of the emission intensity, when the phosphors of the examples 61 to 66 are excited by the light having the wavelength of 405 nm.

FIGS. 18-1 is a graph showing the measurement result of the temperature characteristics of the emission intensity of the phosphors of examples 76 to 79.

FIGS. 18-2 is a graph showing a relation between the emission intensity and the oxygen content of the phosphors of the examples 76 to 79.

FIGS. 19-1 is a graph showing the measurement result of the temperature characteristics of the emission intensity of the phosphors of examples 80 to 82.

FIGS. 19-2 is a graph showing the relation between the emission intensity and the oxygen content of the phosphors of the examples 80 to 82.

Figure 1:
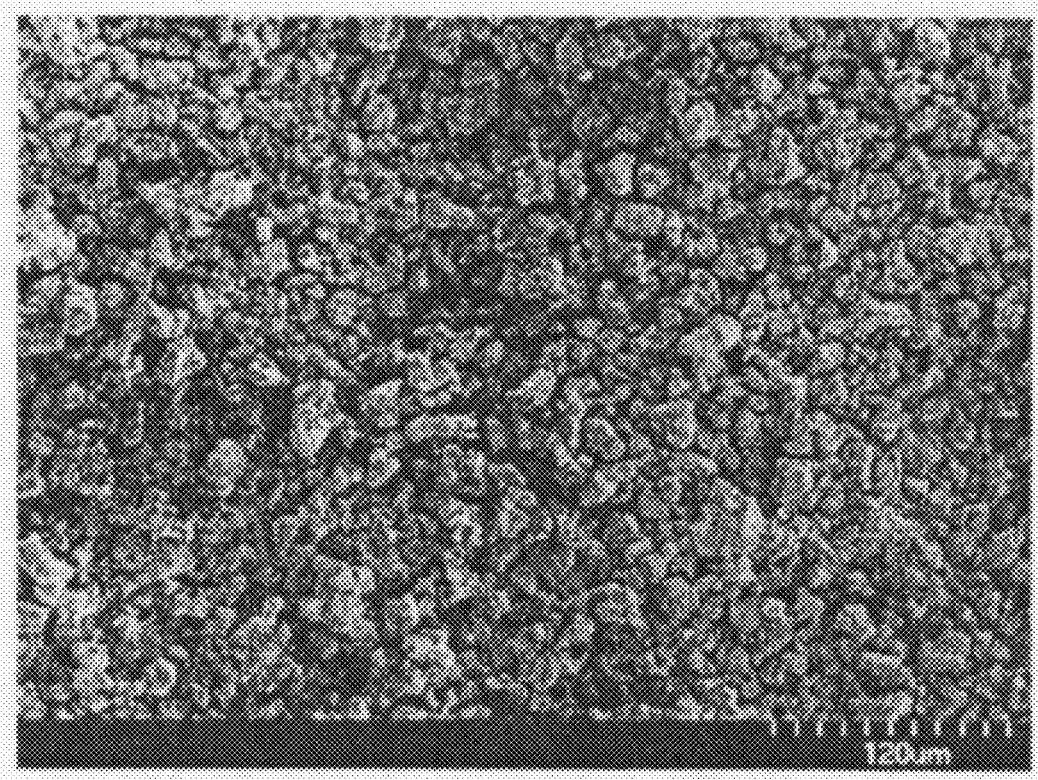
FIG. 1 is SEM photograph of phosphor powders of an example 1.

| Description of signs and numerals | |
|---|---|
| 1 | Phosphor mixture |
| 2 | LED light emitting element |
| 3 | Lead frame |
| 4 | Resin |
| 5 | Cup-shaped container |
| 8 | Reflective surface |
| 9 | Transparent mold material |

The invention claimed is:

1. A phosphor, which is given as a general composition formula expressed by MmAaBbOoNn:Z, (where element M is Sr, element A is Al, element B is Si, O is oxygen, N is nitrogen, and element Z is at least one of Ce or Eu), satisfying $4.0 < (a+b)/m < 7.0$, $b/a > 2.5$, $n > o$, $n = 2/3m + a + 4/3b - 2/3o$, $1.1 < a/m \leq 1.5$, $3.5 \leq b/m \leq 4.5$, and $0.48 \leq o/m \leq 0.81$ wherein when excited by light in a wavelength range from 300 nm to 500 nm, the phosphor has an emission spectrum with a peak wavelength in a range from 500 nm to 650 nm.

2. The phosphor according to claim 1, wherein when the general formula is expressed by MmAaBbOoNn:Zz, the value of $z/(m+z)$, which is a molar ratio of the element M to the element Z, is 0.0001 or more and 0.5 or less.

3. The phosphor according to claim 1, containing Sr of 19.5 to 29.5 wt %, Al of 5.0 to 16.8 wt %, O of 0.5 to 8.1 wt %, N of 22.6 to 32.0 wt %, and Ce of more than 0 to 3.5 wt %, wherein when the phosphor is irradiated with one or more kind of monochromatic light or continuous light in the wavelength range from 350 nm to 500 nm as an excitation light, a peak wavelength in the emission spectrum is in a range from 500 to 600 nm, and x of chromaticity (x, y) of the emission spectrum is in a range from 0.3000 to 0.4500, and y of the chromaticity (x, y) is in a range from 0.5000 to 0.6000.

4. The phosphor according to claim 1, containing Sr of 19.5 to 29.5 wt %, Al of 5.0 to 16.8 wt %, O of 0.5 to 8.1 wt %, N of 22.6 to 32.0 wt %, and Eu of more than 0 to 3.5 wt %, wherein when the phosphor is irradiated with one or more kind of monochromatic light or continuous light in a wavelength range from 350 nm to 500 nm as an excitation light, the peak wavelength of the emission spectrum is in a range from 550 to 650 nm, and x of the chromaticity of the emission spectrum (x, y) is in a range from 0.4500 to 0.6000, and y of the chromaticity of the emission spectrum (x, y) is in a range from 0.3500 to 0.5000.

5. The phosphor according to claim 4, wherein when the phosphor is irradiated with the monochromatic light having the wavelength range from 350 nm to 500 nm as an excitation light, the relation of $P_H$ and $P_L$, is given satisfying $(P_H - P_L)/P_H \times 100 \leq 20$, when a peak intensity of a maximum peak in a spectrum of light emission that occurs by absorbing the excitation light that makes it highest is defined as $P_H$, and the peak intensity of the maximum peak in the spectrum of light emission that occurs by absorbing the excitation light that makes it smallest is defined as $P_L$.

6. The phosphor according to claim 1, wherein when the value of relative intensity of the maximum peak in the emission spectrum is defined as $P_{25}$ when the phosphor is irradiated with a specified monochromatic light in the wavelength range from 300 nm to 500 nm at 25° C. as the excitation light, and the value of the relative intensity of the maximum peak is defined as $P_{200}$ when the phosphor is irradiated with the specified monochromatic light as the excitation light at 200° C., the relation of $P_{25}$ and $P_{200}$ is given satisfying $(P_{25} - P_{200})/P_{25} \times 100 \leq 35$.

7. The phosphor according to claim 1, containing a primary particle with particle size of 50 μm or less and aggregates in which the primary particle agglutinates, wherein an average particle size (D50) of the powdery phosphor containing the primary particle and the aggregates is 1.0 μm or more and 50.0 μm or less.

8. The phosphor according to claim 1, containing a primary particle with particle size of 20 μm or less and aggregates in which the primary particle agglutinates, wherein an average particle size (D50) of the powdery phosphor containing the primary particle and the aggregates is 1.0 gm or more and 20.0 μm or less.

9. A method of manufacturing the phosphor according to claim 1, wherein by using a crucible composed of nitride as a firing crucible, raw materials are fired at temperature of 1400° C. or more and 2000° C. or less in an atmosphere containing one or more kind of gas selected from nitrogen gas, rare gas, and ammonia gas.

10. The method of manufacturing the phosphor according to claim 9, wherein the raw materials are fired by setting pressure inside furnace at 0.001 MPa or more and 0.5 MPa or less.

11. The method of manufacturing the phosphor according to claim 9, wherein the crucible composed of nitride is a BN crucible.

12. The method of manufacturing the phosphor according to claim 9, wherein the raw materials are fired, with 0.1 ml/min or more gas containing one or more kind of gas selected from the nitrogen gas, rare gas, and the ammonia gas flowing inside the furnace.

13. The method of manufacturing the phosphor according to claim 12, wherein gas containing 80% or more of nitrogen gas is used as atmosphere gas in said firing furnace.

14. The method of manufacturing the phosphor according to claim 9, wherein the raw materials are fired in a powdery state, by using a raw material particle of 10 μm or less.

15. A phosphor mixture, containing:
the phosphors according to claim 1; and
one or more kind of blue phosphors having the emission spectrum with the maximum peak in the wavelength range from 420 nm to 500 nm, when excited by said excitation light in the wavelength range from 300 nm to 500 nm; or
red phosphors having the emission spectrum with the maximum peak in the wavelength range from 590 nm to 680 nm, when excited by said excitation light in the wavelength range from 300 nm to 500 nm.

16. A phosphor mixture, containing:
the phosphor according to claim 1; and
at least one of blue phosphors having the emission spectrum in the wavelength range from 420 nm to 500 nm, when excited by said excitation light in the wavelength range from 300 nm to 420 nm; and
one or more kind of red phosphor having the emission spectrum with the maximum peak in the wavelength range from 590 nm to 680 nm, when excited by said excitation light in the wavelength range from 300 nm to 420 nm.

17. The phosphor mixture according to claim 15, wherein when an emission intensity of each phosphor constituting a mixture at a temperature of 25° C. when this phosphor is excited by a prescribed excitation light in the wavelength range from 300 nm to 500 nm is defined as $P_{25}$, and the emission intensity at the temperature of 200° C. when this phosphor is irradiated with said prescribed excitation light is defined as $P_{200}$, the relation of $P_{25}$ and $P_{200}$ is given satisfying $(P_{25} - P_{200})/P_{25} \times 100 \leq 30$.

18. The phosphor mixture according to claim 15, wherein in the emission spectrum under excitation of the excitation light in the wavelength range from 300 nm to 420 nm, a correlated color temperature is in a range from 7000K to 2500K, with three or more emission peaks in the wavelength range from 420 nm to 750 nm and with a continuous spectrum without being interrupted in the wavelength range from 420 nm to 750 nm.

19. The phosphor mixture according to claim 15, wherein a red phosphor having the emission spectrum with a peak in the wavelength range from 590 nm to 680 nm is given as a general composition formula expressed by MmAaBbOoNn:

Z, (where the element M is the element B is and the element Z is at least one of Ce or Eu), satisfying $n=2/3m+a+4/3b-2/3o$, $m=1$, $a\geq 0$, $b\geq m$, $n>o$, $4.0<(a+b)/m<7.0$, $b/a>2.5$, $1.1<a/m\leq 1.5$, $3.5\leq b/m\leq 4.5$, and $0.48\leq o/m\leq 0.81$).

20. The phosphor mixture according to claim 15, wherein a blue phosphor having the emission spectrum with the maximum peak in the wavelength range from 420 nm to 500 nm is one or more kind of phosphor selected from BAM:Eu ($BaMgAl_{10}O_{17}$:Eu) and $(Sr,Ca,Ba,Mg)_{10}(PO_4)_6Cl_2$:Eu, wherein at least one of at least one of Sr, Ca, Ba, or Mg is included in the phosphor.

21. The phosphor mixture according to claim 15, wherein the phosphor mixture is composed of a phosphor having an average particle size (D50) of 1 μm or more and 50 μm or less.

22. A phosphor sheet, comprising:
 a phosphor, which is given as a general composition formula expressed by MmAaBbOoNn:Z, (where element M is Sr, element A is Al, element B is Si, O is oxygen, N is nitrogen, and element Z is at least one of Ce or Eu), satisfying $4.0<(a+b)/m<7.0$, $b/a>2.5$, $n>o$, $n=2/3\,m+a+4/3b-2/3o$, $1.1<a/m\leq 1.5$, $3.5\leq b/m\leq 4.5$, and $0.48\leq o/m\leq 0.81$, wherein when excited by light in a wavelength range from 300 nm to 500 nm, the phosphor has an emission spectrum with a peak wavelength in a range from 500 nm to 650 nm; or
 the phosphors, blue phosphors having the emission spectrum with the maximum peak in the wavelength range from 420 nm to 500 nm, when excited by said excitation light in the wavelength range from 300 nm to 500 nm; and red phosphors having the emission spectrum with the maximum peak in the wavelength range from 590 nm to 680 nm, when excited by said excitation light in the wavelength range from 300 nm to 500 nm, dispersed in resin or glass.

23. A light emission device, having the phosphor according to claim 1 and a light emission part for emitting light of a first wavelength, wherein the light of a different wavelength from the first wavelength is emitted from the phosphor, by using a part or an entire part of the light of the first wavelength as an excitation light.

24. The light emission device, having the phosphor mixture according to claim 15 and the light emission part for emitting light of the first wavelength, wherein the light of the different wavelength from the first wavelength is emitted from the phosphor, by using a part or an entire part of the light of the first wavelength as an excitation light.

25. A light emission device, having the phosphor sheet of claim 22 and the light emission part for emitting light of the first wavelength, wherein the light of the different wavelength from the first wavelength is emitted from the phosphor, by using a part or an entire part of the light of the first wavelength as an excitation light.

26. A light emission device according to claim 23, wherein the first wavelength is the wavelength of 350 nm to 500 nm.

27. The light emission device according to claim 23, wherein the correlated color temperature of the light emission device is in a range from 10000K to 2000K.

28. The light emission device according to claim 23, wherein the correlated color temperature of said light emission device is in a range from 7000K to 2500K.

29. The light emission device according to claim 23, wherein an average color rendering index Ra of the light emission device is 80 or more.

30. The light emission device according to claim 23, wherein a special color rendering index R15 of the light emission device is 80 or more.

31. The light emission device according to claim 23, wherein a special color rendering index R9 of the light emission device is 60 or more.

32. The light emission device according to claim 23, wherein the light emission part is a light emitting diode (LED).

* * * * *

UNITED STATES PATENT AND TRADEMARK OFFICE
CERTIFICATE OF CORRECTION

| | |
|---|---|
| PATENT NO. | : 7,887,718 B2 |
| APPLICATION NO. | : 11/885439 |
| DATED | : February 15, 2011 |
| INVENTOR(S) | : Akira Nagatomi et al. |

It is certified that error appears in the above-identified patent and that said Letters Patent is hereby corrected as shown below:

Column 1, line 8, reads "for a cathode-ray tube (CRT), a display such as a field emission" should read -- for a display such as a cathode-ray tube (CRT), a field emission --;

line 12, reads "a crystal liquid back light and a method of manufacturing there Fore, and" should read -- a liquid crystal back light, and to a method of manufacturing the phosphor, and --;

line 14, reads "in which a phosphor mixture, a phosphor sheet, a semiconductor" should read -- in which a semiconductor --;

line 23, reads "a high luminescence LED" should read -- a high luminance LED --;

line 45, reads "combining the high" should read -- combining a high --;

line 46, reads "color and the phosphor" should read -- color and a phosphor --;

line 52, reads "can be closer" should read -- can be made closer --;

line 60, reads "in which the LED and the phosphor" should read -- in which an LED and a phosphor --;

line 63, reads "in which the high" should read -- in which a high --;

line 64, reads "and the phosphor" should read -- and a phosphor --;

line 67, reads "example, the high" should read -- example, a high --.

Column 2, line 1, reads "and the yellow" should read -- and an yellow --;

line 5, reads "LED and yellow" should read -- LED and the yellow --;

line 6, reads "allowing fewer phosphors to" should read -- allowing less phosphor to --;

line 14, reads "the long-wavelength side" should read -- the longer-wavelength side --;

line 18, reads "thereby deteriorating in the color rendering properties." should read -- thereby the color rendering properties are insufficient. --;

line 19, reads "years, the phosphor" should read -- years, a nitrogen-containing phosphor --;

Signed and Sealed this
Seventh Day of May, 2013

Teresa Stanek Rea
*Acting Director of the United States Patent and Trademark Office*

CERTIFICATE OF CORRECTION (continued)
U.S. Pat. No. 7,887,718 B2 line 20, reads "peak in the wavelength" should read -- peak in a wavelength --;

line 25, reads "Also, the white color LED illumination in which white color is obtained by using a mixed state of colors of the lights" should read -- Also, another example of the one chip type white LED illumination obtains white color by using a mixed color of lights -- line 27, reads "color, and the" should read -- color, and lights of the --;

line 29, reads "(B) color obtained" should read -- (B) color, obtained --;

line 31, reads "the LED, is given as another example of the one chip type white LED illumination." should read -- the LED. --;

line 39, reads "of the light but by the relation of mixed state of colors" should read -- of the lights but by the relation of mixed colors --;

line 43, reads "for the red phosphor, ZnS:Cu,Al, SrAl$_2$O$_4$:Eu, BAM:Eu,Mn, Ba$_2$SiO$_4$:Eu for the green phosphor" should read -- for the red phosphor, ZnS:Cu,Al, CaGa$_2$S$_4$:Eu, SrGa$_2$S$_4$:Eu, BaGaS$_4$:Eu, SrAl$_2$O$_4$:Eu, BAM:Eu,Mn, (Ba,Sr,Ca,Mg)$_2$ SiO$_4$:Eu for the green phosphor --;

line 46, reads "the red phosphor out of the phosphors of three colors has a" should read -- the red phosphors out of the phosphors of three colors have a--;

line 57, reads "developing the phosphor" should read -- developing the nitrogen-containing phosphor --.

Column 3, line 2, reads "are given as examples. As" should read -- are given. As --;

line 4, reads "are given as examples, and the LED is largely" should read -- are given, and in the LED, are largely --;

line 8, reads "second color rendering" should read -- second factor, the color rendering line 15, reads "by an average color rendering index (Ra). This" should read by general color rendering index (Ra). This --;

line 17, reads "a difference between" should read -- a difference of colors between --;
line 18, reads "and a reference" should read -- and the reference --;

line 22, reads "Even if a color temperature of the light source is the" should read -- Even if color temperatures of the light sources are the --;

line 25, reads "a dull color or dark color is shown" should read -- a color is dull and appears dark. --;

line 31, reads "and the phosphor with" should read -- and the next problem is the phosphors with --;

line 32, reads "yellow color poses the next problem." should read -- yellow color. --;

line 45, reads "has a high efficient excitation" should read -- has a high-efficiency

CERTIFICATE OF CORRECTION (continued)
U.S. Pat. No. 7,887,718 B2 excitation --;

line 48, reads "with a peak at closest to the" should read -- with a peak near to the --;

line 56, reads "LED is changed due" should read -- LED changes due to --;

line 57, reads "LED when excited by the blue light of the blue LED, then if" should read -- LED, then if --;

line 59, reads "phosphor, disruption of balance" should read -- phosphor when excited by the blue light of the blue LED, disruption of balance --;

line 62, reads "obtained by synthesizing the blue" should read -- obtained by combining the blue --.

Figure 25:
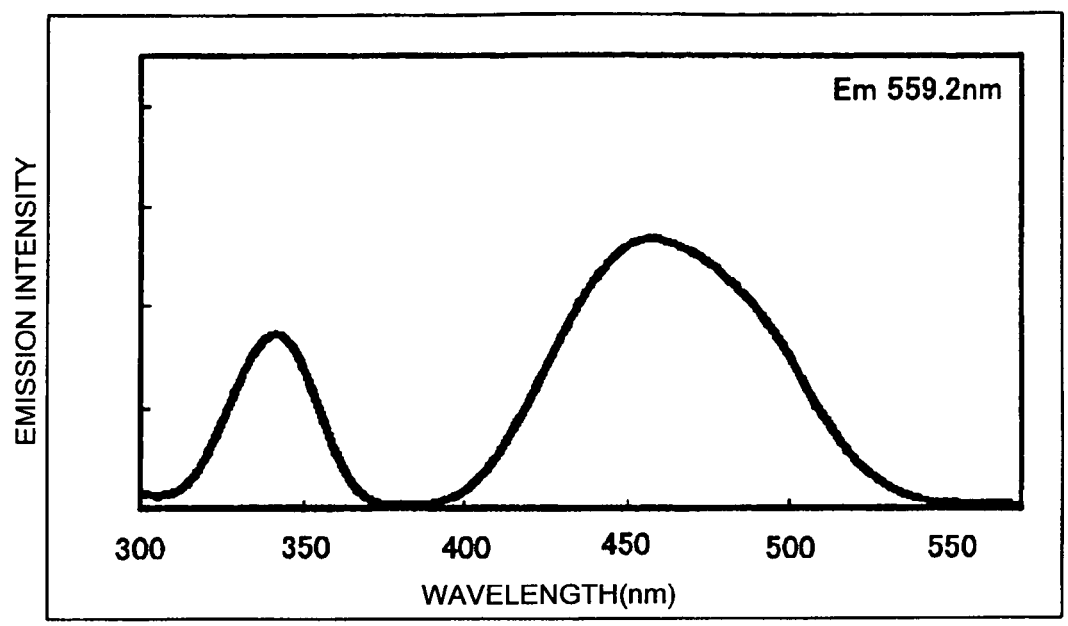
FIG. 25 is a graph showing an excitation spectrum of a conventional yellow phosphor YAG:Ce.
Figure 26:
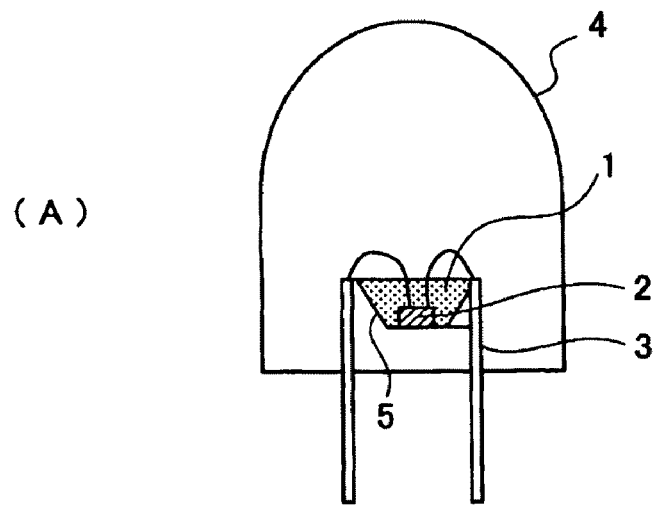
FIG. 26 is a sectional view of a bullet type LED of an example.
Figure 26:
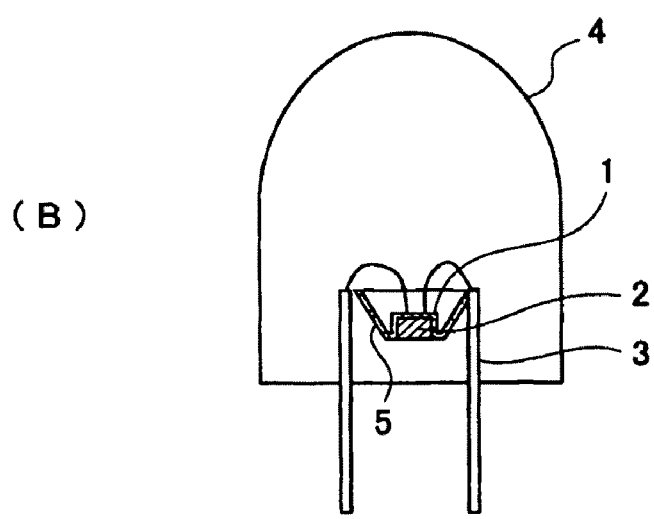
Figure 26:
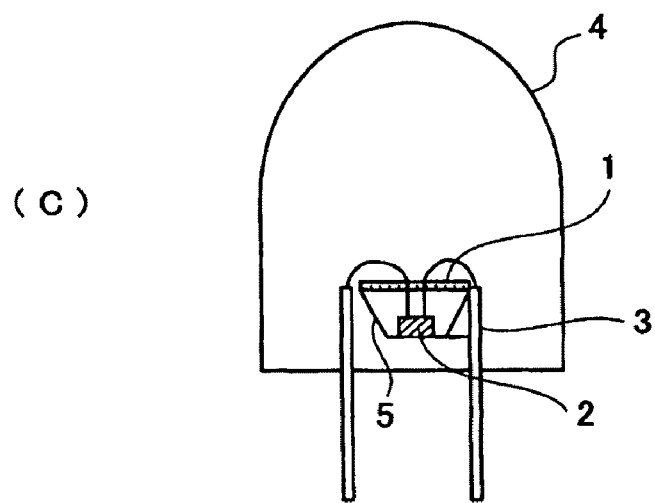
Figure 27:
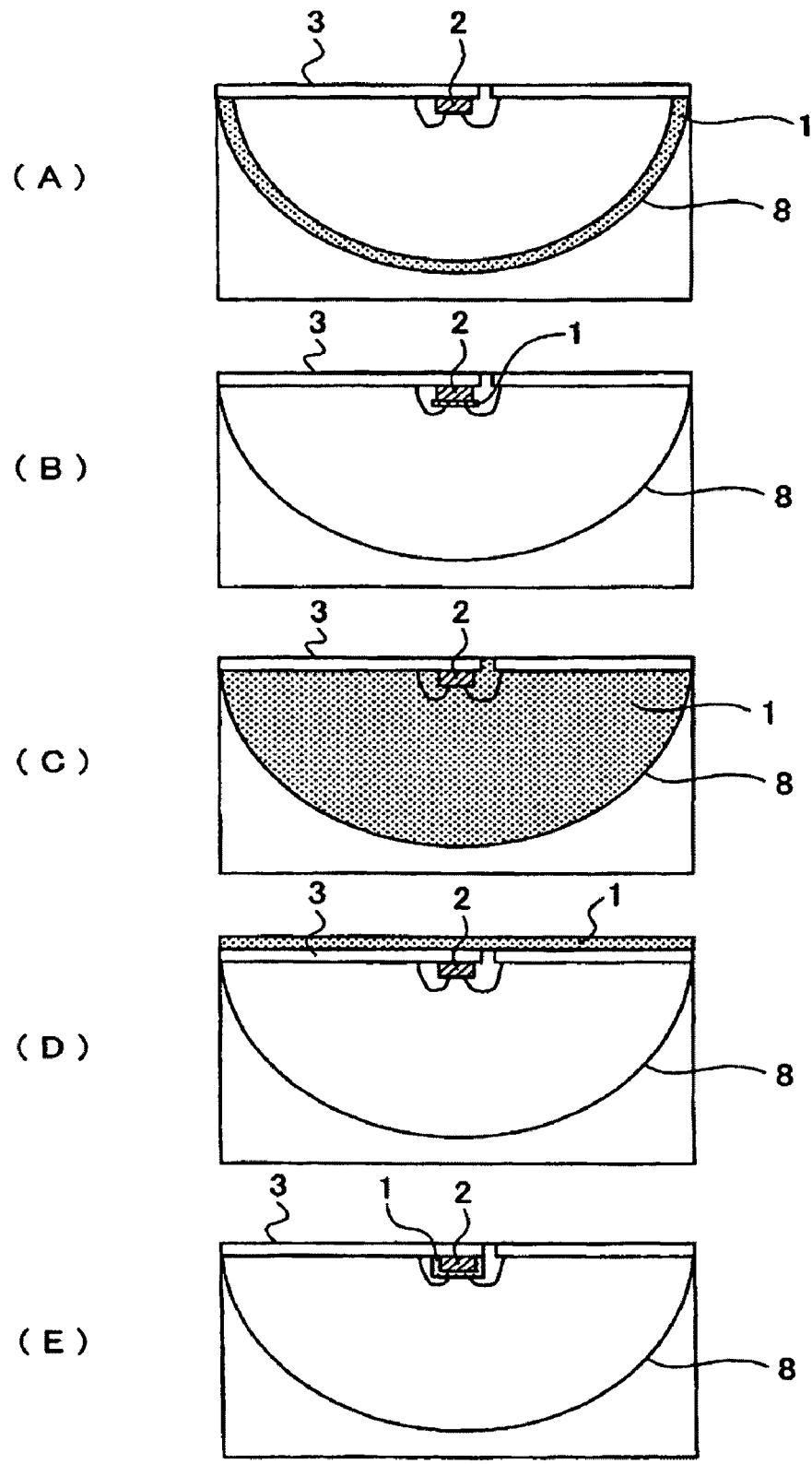
FIG. 27 is a sectional view of a reflective type LED of an example.

Column 4, line 4, reads "However, when emitted by the" should read -- However, when light-emitted by the --;

line 6, reads "phosphor has a low efficient excitation band in the emission wavelength of 380 to 410 nm or around of the near" should read -- phosphor has a low-efficiency excitation band in the emission wavelength (380 to 410 nm or around in FIG. 25) of the near line 13, reads "illumination using the light in a mixed state of the near ultraviolet/ultraviolet emitting LED and the red" should read -- illumination using the ne ultraviolet/ultraviolet emitting LED and the mixed colors of light of the red --;

line 18, reads "from the LED, at present, the green" should read -- from the LED, the green --;

line 19, reads "ZnS:Cu,Al, $SrAl_2O_4$:Eu, BAM:Eu,Mn, $Ba_2SiO_4$:Eu are used. Out of such phosphors, the problem is that" should read -- ZnS:Cu,Al, $SrAl_2O_4$:Eu, BAM:Eu,Mn, $(Ba,Sr,Ca,Mg)_2 SiO_4$:Eu are presently used. Among the phosphors, there is a problem that -- line 36, reads "on the new phosphor having a flat high efficient excitation" should read -- on a new phosphor having a flat high-efficiency excitation --;

line 37, reads "from the near" should read -- from near --;

line 40, reads "replacing the YAG:Ce phosphor and the ZnS:Cu,Al phosphor" should read -- replacing YAG:Ce phosphor and ZnS:Cu,Al phosphor --;

line 42, reads "demand, the green to yellow emitting phosphor is actively" should read -- demand, green to yellow emitting phosphors are actively --;

line 64, reads "from the near" should read -- from near --.

Column 5, line 5, reads "when the one chip type white" should read -- when the white --;

line 7, reads "LED and the blue LED" should read -- LED, the blue LED --;

line 18, reads "having a flat excitation band" should read -- having a flat and wide excitation band --;

CERTIFICATE OF CORRECTION (continued)
U.S. Pat. No. 7,887,718 B2 line 23, reads "such a phosphor." should read -- such a phosphor, which has an excellent emission efficiency, luminance and color rendering properties. --;

line 31, reads "combining the yellow to green phosphor" should read -- combining an yellow or green phosphor --;

line 35, reads "having the excitation band to the light of a broad wavelength from the ultraviolet to the visible light (such as blue light), and the phosphor" should read -- having an excitation band in the light of a broad wavelength from ultraviolet to visible light (such as blue light), and phosphor --;

line 39, reads "Namely, by creating the phosphor" should read -- Namely, it is found that by creating a phosphor --;

line 40, reads "phosphor, the red phosphor similarly having the excitation band to the light with a broad wavelength from the ultraviolet to the visible light (such as a blue light)" should read -- phosphor, red phosphor similarly having an excitation band in the light with a broad wavelength from ultraviolet to visible light (such as blue light) --;

line 44, reads "680nm, and/or the blue phosphor having the emission" should read -- 680nm, and/or blue phosphor having emission --;

line 47, reads "(such as the light source from the ultraviolet light to blue light)" should read -- (such as light source from ultraviolet light to blue light --;

line 48, reads "combined, it is found that the" should read --combined, the --;

line 50, reads "such as the white emission having the excellent" should read -- such as white emission having an excellent --;

line 53, reads "study on the already" should read -- study on already --;

line 54, reads "having the emission" should read -- having emission --;

line 58, reads "efficiency even if the blue" should read -- efficiency when the blue --;

line 60, reads "obtain the light" should read -- obtain light --;

line 65, reads "having a broad flat excitation" should read -- having a broad and flat excitation --.

Column 6, line 9, reads "developing the phosphor mixture obtained by mixing one or mole kinds of phosphor having the emission spectrum" should read -- developing a phosphor mixture obtained by mixing the green phosphor, one or more kinds of blue phosphor having an emission spectrum --;

line 12, reads "more kind of red phosphor having the emission spectrum" should read -- more kinds of red phosphors having an emission spectrum --;

line 14, reads "and further the emission" should read -- and further by developing an emission --;

line 17, reads "500nm. (paragraph break) In order to solve the above-described problems, the present invention takes several aspects as follows. (paragraph break) In" should

CERTIFICATE OF CORRECTION (continued)
U.S. Pat. No. 7,887,718 B2 read -- 500nm. (paragraph break) In --;

line 19, reads "In a first aspect, a phosphor" should read -- In a first aspect in order to solve the above-mentioned problems, a phosphor --;

line 25, reads "element Z is the element acting as the activator), satisfying" should read -- element Z is one or more kinds of activators.), satisfying --;

line 32, reads "satisfying $0.5 \geq a/m \geq 2.0$, $3.0<b/m<7.0$" should read -- satisfying $0.5<a/m<2.0$, $3.0<b/m<7.0$ --;

line 42, reads "element M is one or more kind of element selected" should read -- element M is one or more kinds of elements selected --;

line 44, reads "element A is one or more kind of element selected" should read -- element A is one or more kinds of elements selected --;

line 46, reads "element B is one or more kind of element selected" should read -- element B is one or more kinds of elements --;

line 48, reads "element Z is one or more kind of element selected" should read -- element Z is one or more kinds of elements selected --;

line 49, reads "and transitional metal" should read -- and transition metal --;

line 52, reads "element M is one or more kind of element selected" should read -- element M is one or more kinds of elements selected --;

line 54 reads "element A is one or more kind of element selected" should read -- element A is one or more kinds of elements selected --;

line 56 reads "element Z is one or more kind of element selected" should read -- element Z is one or more kinds of elements selected --.

Column 7, line 4, reads "Ce of 0 to 5.5 wt% wherein" should read -- Ce of more than 0 to 3.5 wt% or less, wherein --;

line 5, reads "with one or more kind of monochromatic light or continuous light having" should read -- with one or more kinds of monochromatic lights or continuous lights having --;

line 15, reads "and Eu of 0 to 3.5 wt% wherein" should read -- and Eu of more than 0 to 3.5 wt% or less, wherein --;

line 16, reads "with one or more kind of monochromatic lights or continuous lights having" should read -- with one or more kinds of monochromatic lights or continuous lights having --;

line 47, reads "containing a primary particle with" should read -- containing primary particles with --;

line 49, reads "which the primary particle agglutinates, wherein" should read -- which the primary particles agglutinate, wherein --;

CERTIFICATE OF CORRECTION (continued)
U.S. Pat. No. 7,887,718 B2 line 51, reads "primary particle and" should read -- primary particles and --;

line 55, reads "primary particle with" should read -- primary particles with --;

line 56, reads "which the primary particle agglutinates, wherein" should read -- which the primary particles agglutinate, wherein --;

line 58, reads "primary particle and" should read -- primary particles and --;

line 65, reads "containing one or more kind of gas selected" should read -- containing one or more kinds of gases selected - line 66, reads "and ammonium gas." should read -- and ammonia gas. --;

Column 8, line 12, reads "containing one or more kind of gas selected" should read containing one or more kinds of gases selected --;

line 13, reads "and the ammonium gas" should read -- and the ammonia gas --;

line 17, reads "wherein the gas" should read -- wherein a gas --;

line 21, reads "using a raw material particle of should read -- using raw material particles of --;

line 25, reads "aspects, one or more kind of blue phosphor having" should read -- aspects, one or more kinds of blue phosphors having--;

line 29, reads "and/or one or more kind of red phosphor having" should read -- and/or one or more kinds of red phosphors having --;

line 32, reads "range form 300nm" should read -- range from 300nm --;

line 36, reads "aspects, one or more kind of blue phosphor having" should read -- aspects, one or more kinds of blue phosphors having --;

line 40, reads "and one or more kind of read phosphor having" should read -- and one or more kinds of red phosphors having --;

line 48, reads "constituting a mixture" should read -- constituting the mixture --;

Column 9, line 7, reads "and transitional metal" should read -- and transition metal --;

line 8, reads "b ≥ m, n > 0, o ≥ 0)." should read -- b ≥ m, n > o, o ≥ 0). --;

line 29, reads "is one or more kind of phosphor selected" should read -- is one or more kinds of phosphors selected --;

line 21, reads "Eu. In addition, an expression of (Sr,Ca,Ba,Mg) means concluding at least one of Sr, Ca, Ba, or Mg, and this applies to a similar expression." should read -- Eu. --;

line 30, reads "wherein the phosphor" should read -- wherein the phosphor according to any one of the first to fourteenth aspects, or the phosphor --.

Column 10, line 1 reads "wherein an average color rendering index Ra of should read

CERTIFICATE OF CORRECTION (continued)
U.S. Pat. No. 7,887,718 B2

-- wherein a general color rendering index Ra of --;

line 21, reads "element Z is the element acting as the activator), satisfying" should read -- element Z is one or more kinds of activators.), satisfying --;

line 32, reads "element M is one or more kind of element selected" should read -- element M is one or more kinds of elements selected --;

line 34, reads "element A is one or more kind of element selected" should real -- element A is one or more kinds of elements selected --;

line 38, reads "element Z is one or more kind of element selected" should read -- element Z is one or more kinds of elements selected --;

line 40, reads "and transitional metal" should read -- and transition metal --;

line 43, reads "element M is one or more kind of element selected" -- element M is one or more kinds of elements selected --;

line 34, reads "element A is one or more kind of element selected" -- element A is one or more kinds of elements selected --;

line 38, reads "element Z is one or more kind of element selected" should read -- element Z is one or more kinds of elements selected --.

Column 11, line 9, reads "Ce of 0 to 3.5 wt%, wherein" should read -- Ce of more than 0 to 3.5 wt% or less, wherein --;

line 10, reads "is irradiated with one or more kind of monochromatic light or continuous light having" should read -- is irradiated with one or more kinds of monochromatic lights or continuous lights having --;

line 21, reads "Eu of 0 to 3.5 wt%, wherein" should read -- Eu of more than 0 to 3.5 wt% or less, wherein --;

line 22, reads "with one or more kind of monochromatic light or continuous light having" should read -- with one or more kinds of monochromatic lights or continuous lights having --;

line 37, reads "makes it highest" should read -- makes the peak intensity highest --;

line 39, reads "makes it smallest" should read -- makes the peak intensity smallest --;

line 63, reads "In a fifty-forty aspect," should read -- In a fifty-four aspect, --;

line 64, reads "containing a primary particle with" should read -- containing primary particles with --;

line 65, reads "which the primary particle agglutinates, wherein" should read -- which the primary particles agglutinate, wherein --.

Column 12, line 4, reads "a phosphor given" should read -- a green phosphor given --;

line 10, reads "element Z is the element acting as the activator)," should read

CERTIFICATE OF CORRECTION (continued)
U.S. Pat. No. 7,887,718 B2

-- element Z is an element acting as an activator), --;

line 16, reads "with one or more kind of monochromatic light or continuous light in the wavelength" should read -- with one or more kinds of monochromatic lights or continuous lights in the wavelength --;

line 19, reads "one or more kind of blue phosphor having the emission spectrum in a wavelength" should read -- one or more kinds of blue phosphors having an emission spectrum with a maximum peak in a wavelength --;

line 30, reads "580 nm is expressed by $0.5 \leq <a/m<2.0$," should read -- 580 nm satisfies $0.5 \leq a/m \leq 2.0$, --;

line 34, reads "element M is one or more kind of elements selected" -- element M is one or more kinds of elements selected --;

line 36, reads "element A is one or more kind of elements selected" should read -- element A is one or more kinds of elements selected --;

line 38, reads "element B is one or more kind of elements selected" should read -- element B is one or more kinds of elements selected --;

line 40, reads "element Z is one or more kind of elements selected" should read -- element Z is one or more kinds of elements selected --;

line 41, reads "and transitional metal" should read -- and transition metal --;

line 62, reads "wherein a red phosphor" should read -- wherein the red phosphor --;

line 65, reads "element M is one or more kind of elements selected" should read -- element M is one or more kinds of elements --;

line 67, reads "element A is one or more kind of elements selected" should read element A is one or more kinds of elements selected --.

Column 13, line 2, reads "element B is one or more kind of elements selected" should read element B is one or more kinds of elements selected --;

line 3, reads "element Z is one or more kind of elements selected" should read element Z is one or more kinds of elements selected --;

line 5, reads "and transitional metal" should read -- and transition metal --;

line 9, reads "wherein a red phosphor" should read -- wherein the red phosphor --;

line 15, reads "wherein a blue phosphor" should read -- wherein the blue phosphor --;

line 17, reads "500nm is one or more kind of phosphor" should read -- 500nm is one or more kinds of phosphor --;

line 21, reads "(D50) of the powdery phosphor" should read -- (D50) of each phosphor line 30, reads "element Z is the element acting as the activator.), satisfying" should

CERTIFICATE OF CORRECTION (continued)
U.S. Pat. No. 7,887,718 B2 read -- element Z is one or more kinds of activators.), satisfying --;

line 38, reads "element M is one or more kind of element selected" should read element M is one or more kinds of elements selected --;

line 39, reads "Sr, Ba, Zn, the element A is one or more kind of element selected" should read -- Sr, Ba, and Zn, the element A is one or more kinds of elements selected --;

line 41, reads "Al, Ga, In, the" should read -- Al, Ga, and In, the --;

line 42, reads "element Z is one or more kind of element selected" should read element Z is one or more kinds of elements selected --.

Column 14, line 1, reads "which the primary particle agglutinates, wherein" should read in which the primary particles agglutinate, wherein --;

line 16, reads "from 350nm to 550nm." should read -- from 350nm to 500nm. --;

line 28, reads "temperature at emitting," should read -- temperature at light emitting, line 40, reads "the coating application density to be" should read -- coating density to be --;

line 58, reads "a high efficient emission device" should read -- a high-efficiency light emission device --.

Column 15, line 9, reads "phosphor of the eleventh aspect has" should read -- phosphor of the fiftieth aspect has --;

line 14, reads "temperature at emitting, the" should read -- temperature at light emitting, the --;

line 25, reads "the coating application density" should read -- the coating density --;

line 39, reads "500 nm to 600 nm in which the luminance can be earned, and has" should read -- 500 nm to 600 nm which can gain the luminance, and has --;

line 55, reads "element M is one or more kind of element selected" should read element M is one or more kinds of elements selected --;

line 57, reads "Element A is one or more kind of element having tervalent valency, element B is one or more kind of element having tetravalent valency, 0 is" should read Element A is one or more kinds of elements having tervalent valency in the phosphor, element B is one or more kinds of elements having tetravalent valency in the phosphor, 0 is line 60, reads "element Z is the element acting as the activator in the phosphor and one or more kind of element selected from rare earth elements or transitional metal" should read -- element Z is an element acting as an activator in the phosphor and one or more kinds of elements selected from rare earth elements or transition metal --.

Column 16, line 1 reads "a wavelength from" should read -- a wavelength range of from --;

line 10, reads "obtaining a high efficient emission. Therefore, by mixing the

CERTIFICATE OF CORRECTION (continued)
U.S. Pat. No. 7,887,718 B2 phosphor" should read -- obtaining a high-efficiency emission. Therefore, by mixing a phosphor --;

line 14, reads "a high efficient emission having an" should read -- a high-efficiency light emission device having an --;

line 25, reads "same constitutional element" should read -- same constituent element line 30, reads "with small ion radius such" should read -- small ionic radius such --;
line 31, reads "with larger ion radius than" should read -- with larger ionic radius than line 36, reads "The excitation band has a" should read --The excitation band of the present invention has a --;

line 40, reads "has a high efficient excitation" should read -- has a high-efficiency excitation --;

line 46, reads "also with the near ultraviolet/ultraviolet emitting LED, using a mixed state of the red color, blue color, and other color phosphors. Particularly" should read -- also with the red color, blue color, and other color phosphors and combining with the near ultraviolet/ultraviolet emitting LED. Particularly --;

line 67, reads "470nm to 750nm, and when activated" should read -- 470nm to 750nm which is in the range of green color to yellow color, and when activated --.

Column 17, line 4 reads "phosphor presently used, or the ZnS:Cu, Al phosphors as phosphors" should read -- phosphor, or the ZnS:Cu, Al phosphors presently used as phosphors --;

line 20, reads "particularly exhibiting a low degree of water tolerance, and further, the emission intensity and luminance are largely deteriorated at a high temperature. Therefore" should read -- particularly being weak in water, and further, the luminance are largely deteriorated by exposure to ultraviolet. Therefore --;

line 32, reads "to the heat generated" should read -- to the heat or ultraviolet generated Column 18, line 18, reads "aforementioned structure of the phosphor, it can be considered that chemically stable composition can be obtained, therefore" should read -- aforementioned constituent of the phosphor, it can be considered that the phosphor has chemically stable composition, therefore --;

line 61, reads "performed, the oxygen and Si are not vitrified, and" should read performed, a vitrification does not occur, and --.

Column 19, line 1, reads "the emission intensity before increasing the temperature (25°C) up to" should read -- the emission intensity (25°C) before increasing the temperature up to --;

line 4, reads "again, an excellent heat resistance property that the emission intensity after cooling is not deteriorated as compared to a case of before increasing the temperature."
again are compared, an excellent heat resistance property, i.e., that the emission intensity after the cooling is not deteriorated as compared to an emission intensity of before increasing the temperature, is expressed. --;

CERTIFICATE OF CORRECTION (continued)
U.S. Pat. No. 7,887,718 B2 line 14, reads "with this structure, an" should read -- with this constituent, an --;

line 17, reads "value of "a" is larger than the value of "b", the firing is suppressed" should read -- value of "b" is larger than the value of "a", the sintering is suppressed --;

line 35, reads "because the ion radius of should read -- because the ionic radius of --;

line 38, reads "an N site is" should read -- and N sites is --;

line 49, reads "range of 0.5 wt% to 8.1 wt% relative" should read range of more than 0.5 wt% to less than 8.1 wt% relative --;

line 52, reads "range of 0.5 wt% to 5.0 wt%," should read -- range of more than 0.5 wt% to less than 5.0 wt%, --;

line 59, reads "the oxygen stuck to" should read -- the oxygen adsorbed to --;

line 61, reads "mixing, and baking the raw" should read -- mixing, and firing the raw line 62, reads "phosphor after baking, are" should read -- phosphor after firing, are --;

line 65, reads "and/or ammonium gas," should read -- and/or ammonia gas, --.

Column 20, line 2, reads "amount of oxygen and amount of nitrogen." should read -- amount of o and amount of n. --;

line 5, reads "having + bivalent valency," should read -- having + II valency, --;

line 7, reads "having + tervalent valency," should read -- having + III valency. --;

line 8, reads "having - tervalent valency," should read -- having - III valency. --;

line 18, reads "preferable structure. In" should read -- preferable constituent. In --;

line 21, reads "element M is one or more kind of element selected" should read element M is one or more kinds of elements selected --;

line 24, reads "preferably is one or more kind of element selected" should read preferably is one or more kinds of elements selected --;

line 26, reads "Further, 90% of Sr" should read -- Further, 90% or more of Sr --;

line 27, reads "part of the aforementioned other element may be replaced." should read -- part of the element M may be replaced by the aforementioned other elements. --;

line 29, reads "element A is one or more kind of element selected" should read element A is one or more kinds of elements selected --;

line 31, reads "preferably is one or more kind of element selected" should read preferably is one or more kinds of elements selected --;

line 33, reads "Further, 90% of Al" should read -- Further, 90% or more of Al --;

line 34, reads "part of the aforementioned other element may be replaced." should

CERTIFICATE OF CORRECTION (continued)
U.S. Pat. No. 7,887,718 B2 read -- part of the element A may be replaced by the aforementioned other elements. --;

line 36, reads "as a general thermoelectric material" should read -- as a general heat-transfer material --;

line 40, reads "element B is one or more kind of element selected" should read element B is one or more kinds of elements selected --;

line 43, reads "Further, 90% of Si" should read -- Further, 90% or more of Si --;

line 44, reads "part of the aforementioned other element may be replaced. In" should read -- part of the element B may be replaced by the aforementioned other element. In --;

line 46, reads "general thermoelectric material" should read -- general heat-transfer material --;

line 50, reads "element Z is one or more kind of element selected from the rare earth elements or the transitional elements" should read -- element Z is one or more kinds of elements selected from rare earth elements or transition elements --;

line 58, reads "element Z is one or more kind of element selected" should read element Z is one or more kinds of elements selected --;

line 63, reads "therefore the element Z is" should read -- therefore Ce is --.

Column 21, line 1, reads "heretofore emits light" should read -- heretofore emit light --;

line 2, reads "activating Ce, the" should read -- activating with Ce, the --;

line 19, reads "deteriorated, but instead showing the" should read -- deteriorated, showing the --;

line 23, reads "phosphor of this example can" should read -- phosphor of the ,present invention can --;

line 26, reads "by a sensitizing property, the" should read -- by a sensitization action, the --;

line 31, reads "phosphor of this example is expressed" should read -- phosphor of the present invention is expressed --;

line 42, reads "z/(m+z) is within the" should read -- z/(m+z) within the --;

line 48, reads "can be set by shifting, which" should read -- can be shifted and set, which --;

line 53, reads "element B, and EuCe was" should read -- element B, and Ce was --;

line 56, reads "was obtained, such as Sr" should read -- was obtained by elemental analysis, such as Sr --;

line 58, reads "and Ce of 0.0 to 3.5wt%. However," should read -- and Ce of more than 0.0 to 3.5 wt% or less. However, --;

CERTIFICATE OF CORRECTION (continued)
U.S. Pat. No. 7,887,718 B2 line 65, reads "irradiated with one or more kind of monochromatic light or mixed light of the monochromatic light having" should read -- irradiated with one or more kinds of monochromatic lights or mixed light of the monochromatic lights having --.

Column 22, line 2, reads "spectrum became in the rage from 550 to 600" should read spectrum was in the rage from 500 to 600 --;

line 12, reads "was obtained, such" should read -- was obtained by elemental analysis, such --;

line 14, reads "and Eu of 0.0 to 3.5 wt%. However," should read -- and Eu or more than 0.0 to 3.5 wt% or less. However, --;

line 21, reads "irradiated with one or more kind of monochromatic light or mixed light of the monochromatic light having" should read -- irradiated with one or more kinds of monochromatic lights or mixed light of the monochromatic lights having --;

line 24, reads "spectrum became in the" should read -- spectrum was in the --;

line 33, reads "phosphor of this example has characteristic peaks in a brag angle (2θ) range of should read -- phosphor of the present invention has characteristic peaks in a Bragg angle (2θ) ranges of --;

line 39, reads "of a rhombic crystal" should read -- of a orthorhombic crystal --;

line 43, reads "to be the crystal" should read -- to have the crystal --;

line 45, reads "phosphor of this example" should read -- phosphor of the present invention --;

line 47, reads "is used not only as the white LED illumination, but under high" should read -- is used, not only as the white LED illumination, under high --;

line 57, reads "light in the wavelength" should read -- light or mixed light of the monochromatic lights in the wavelength --;

line 60, reads "irradiated with the specified monochromatic light as the" should read irradiated with the --;

line 66, reads "is selected to be" should read -- is defined to be --.

Column 23, line 7, reads "the heat generated by sealing of the chip by resin and a lead frame structure was accumulated and" should read -- the generated heat was accumulated by sealing of the chip by resin and a lead frame structure, and --;

line 17, reads "of time." should read -- of time is accumulated. --;

line 19, reads "materials such as" should read -- materials, as a matrix, such as --;

line 20, reads, "excellent durability generated from AlN and $Si_3N_4$ as a matrix, and therefore a tetrahedral" should read -- excellent durability at high temperature generated from AlN and $Si_3N_4$, and a tetrahedral --;

line 31, reads "even if being" should read -- even when being --;

line 34, reads "since the phosphor of should read -- since the light emission device or line 37, reads "is increased can" should read -- is increased, can --;

line 40, reads "preferable as the white" should read -- preferable as phosphor for the white --;

line 44, reads "phosphor of this example provides" should read -- phosphor of the present invention provides --;

line 46, reads "intensity in any case such as the case" should read -- intensity even in case --;

line 50, reads "420 to 480nm) proposed as the one chip type white LED illumination and yellow light emission of the phosphor, or" should read -- 420 to 480nm) and yellow light emission of the phosphor proposed as the one chip type white LED illumination, or --;

line 66, reads "phosphor of this example in" should read -- phosphor of the present invention in --.

Column 24, line 3, reads "contains a primary particle with" should read -- contains primary particles with --;

line 4, reads "which the primary particle agglutinates, wherein" should read -- which the primary particles agglutinate, wherein --;

line 17, reads "and not less than" should read -- and more preferably not less than --;

line 21, reads "prevent irregular color and deterioration" should read -- prevent fluctuation of color and deterioration --;

line 25, reads "particle size was larger" should read -- particle size is larger --;

line 27, reads "of this example is" should read -- of the present invention is --;

line 31, reads "(laser diffraction dispersion)" should read -- (laser diffraction dispersion method) --;

line 37, reads "phosphor of this example, manufacture" should read -- phosphor of the present invention, manufacture --;

line 39, reads "that there is no difference between z/(m+z) and Ce/(Sr+Ce)." should read -- that the z/(m+z) and Ce/(Sr+Ce) are the same meaning. --;

line 42, reads "phosphor of this example can" should read -- phosphor of the present invention can --;

line 47, reads "and a basic carbonate." should read -- and basic carbonate --;

line 53, reads "form are changed" should read -- form of the phosphor obtained are changed --;

line 54, reads "form of the phosphor obtained." should read -- form of the raw material. --;

line 65, reads "Particularly, when the carbonate is used as the raw material of the element M, an effect of flux can be obtained without adding a compound composed" should read -- Particularly, using the carbonate as the raw material of the element M is preferable because an effect of flux (reaction accelerator) can be obtained without adding a compound as flux composed --.

Column 25, line 2, reads "of this embodiment, as flux (reaction accelerator)." should read -- of this embodiment. --;

line 16, reads "of each element is" should read -- of each element after firing in this case is --;

line 30, reads "are taken into consideration." should read -- are exemplified. --;

line 33, reads "the nitride in each raw material element is easy" should read -- the nitrides in each raw material element are easy --;

line 43, reads "and fired at 1400°C ore more" should read -- and fired, while distributing an atmosphere gas into a firing furnace at 1400°C. --;

line 45, reads "2000°C for more than 30 minutes. If" should read -- 2000°C for 30 minutes or more. If --;

line 57, reads "by keeping the temperature" should read -- by firing at the temperature line 58, reads "firing temperature allows" should read -- firing time allows --.

Column 26, line 2, reads "preferably 100PPM or less." should read -- preferably 100 PPM or less. --;

line 7, reads "preferably 100PPM or less." should read -- preferably 100 PPM or less.

line 9, reads "single use of the ammonium gas is also possible, the ammonium gas" should read -- single use of the ammonia gas is also possible, the ammonia gas --;

line 11, reads "needed in a device and" should read -- needed in devices and line 13, reads "used, the mixed gas of ammonia and nitrogen is prepared and the ammonia is preferably used at low concentration. For" should read -- used, the ammonia is preferably used at low concentration, for example, by using the mixed gas of ammonia and nitrogen. For --;

line 22, reads "accelerating the nitrogen reaction" should read -- accelerating t nitridation reaction --;

line 27, reads "because by flowing the atmosphere containing one or more kind of gas selected" should read -- because although during firing the raw material of phosphors, a gas generates from the raw material, by flowing the atmosphere containing one or more kinds of

CERTIFICATE OF CORRECTION (continued)
U.S. Pat. No. 7,887,718 B2 gases selected --;

line 29, reads "rare gas and ammonium gas, it is prevented" should read -- rare gas, ammonia gas, a mixed gas of ammonia gas and nitrogen, and a mixed gas of nitrogen and hydrogen, it is prevented --;

line 33, reads "when the carbonate" should read -- when the raw material decomposing to the oxide at high temperature such as the carbonate --;

line 38, reads "firing phosphor raw materials in manufacturing" should read -- firing raw materials of phosphor in manufacturing --;

line 44, reads "from the atmospheric air)," should read -- from the atmospheric pressure), --;

line 48, reads "particles is excessively" should read -- particles may be excessively --;

line 53, reads "crucible, $Si_3N_4$ crucible," should read -- crucible, a $Si_3N_4$ crucible, --;

line 57, reads "However, preferably when the BN crucible is used, intrusion" should read -- Preferably the BN crucible is used, since intrusion --;

line 59, reads "In this embodiment, preferably" should read -- In the present invention, preferably --;

line 65, reads "raw material. However," should read -- raw materials. However, --;

line 66, reads "phosphor of this example, the" should read -- phosphor of the present invention, the --.

Column 27, line 1, reads "the phosphor raw material of this invention is" should read -- the fired product is --;

line 2, reads "when the carbonate, the hydroxide, and the basic carbonate" should read -- when carbonate, hydroxide, and basic carbonate --;

line 5, reads "However, the raw material in a powder state would" should read However, in case of the raw material in a powder state, the gas would --;

line 8, reads "preferable structure." should read -- preferably constituent. --;

line 15 reads "subjected to cleaning, classifying and surface treatment, as needed. As a cleaning method, cleaning in an acidic solution using fluorinated acid," should read subjected to washing, classifying, surface treatment, and heat treatment as needed. As a washing method, washing in an acidic solution using hydrofluoric acid, --;

line 20, reads "state are melted. An" should read -- state are dissolved. An -- line 32, reads "green phosphor, one or more kind of blue" should read -- green phosphor, one or more kinds of blue --;

line 36, reads "being one or more kind of monochromatic light or continuous light having" should read -- being one or more kinds of monochromatic lights or continuous lights

CERTIFICATE OF CORRECTION (continued)
U.S. Pat. No. 7,887,718 B2 having --;

line 38, reads "and/or one or more kind of red" should read -- and/or one or more kinds of red --;

line 41, reads "being one or more kind of monochromatic light or continuous light having" should read -- being one or more kinds of monochromatic lights or continuous lights having --;

line 43, reads "this structure has" should read -- this constituent has --;

line 44, reads "visible light area, by" should read -- visible light region, by --;

line 67, reads "element M is one or more kind of elements selected" should read element M is one or more kinds of elements selected --.

Column 28, line 2, reads "element A is one or more kind of elements selected" should read element A is one or more kinds of elements selected --;

line 4, reads "element B is one or more kind of elements selected" should read element B is one or more kinds of elements selected --;

line 5, reads "element Z is one or more kind of elements selected" should read element Z is one or more kinds of elements selected --;

line 7, reads "elements and transitional metal" should read -- elements and transition metal --;

line 10, reads "disclosed in patent application" should read -- disclosed in JP patent application --;

line 58, reads "Therefore, according to the evaluation method of the present invention, when this phosphor mixture is irradiated with the excitation" should read -- Therefore, when this phosphor mixture is irradiated with any of the excitation --.

Column 29, line 19, reads "illumination can be earned, and" should read -- illumination can be gained, and --;

line 23, reads "invention without deteriorating the" should read -- invention without lowering the emission --;

line 26, reads "characteristics are preferably" should read -- characteristics by heating are preferably --;

line 36, reads "$(P_{25}-200)/P_{25} \times 100 \leq 30$. For" should read -- $(P_{25}-P_{200})/P_{25} \leq 30\%$. For -- line 38, reads "BAM:Eu,(Sr,Ca,Ba,Mg)$_{10}$(PO$_4$)$_6$Cl$_2$:Eu,BAM:Eu,Mn,ZnS:Cu,Al,CaAl$_2$Si$_4$N$_8$:Eu,CaAlSiN$_3$:Eu, etc, are" should read -- BAM:Eu,(Sr,Ca,Ba,Mg)$_{10}$(PO$_4$)$_6$Cl$_2$:Eu, BAM:Eu,Mn, ZnS:Cu,Al,CaAl$_2$Si$_4$N$_8$:Eu, CaAlSiN$_3$:Eu, etc, are --;

line 41, reads "can not be said when the" should read -- can not be limited as far as

CERTIFICATE OF CORRECTION (continued)
U.S. Pat. No. 7,887,718 B2 the--.

Column 30, line 1, reads "and irregular color and" should read -- and fluctuation of color and line 7, reads "sheet, each kind of should read -- sheet, various kinds of --;

line 8, reads "resin and silicon resin or glass can be taken into consideration. As" should read -- resin and silicone resin or glass can be exemplified. As --;

line 31, reads "fluorescent lamp, the illumination unit, and the backlight for" should read -- fluorescent lamp, an illumination unit, and a backlight for --;

line 67, reads "such as silicon and epoxy" should read -- such as silicone and epoxy --

Column 31, line 14, reads "emission form the LED" should read -- emission from the LED --.

Column 32, line 2, reads "when the average color rendering index Ra" should read -- when the general color rendering index Ra --;

line 41, reads "atmospheric air. The" should read -- atmospheric air so that the molar ratio of each element is set at SrAl:Si:Ce=0.970:1:4.5:0.030. The --;

line 42, reads "then temperature" should read -- then, under a nitrogen atmosphere (flow state), temperature --;

line 52, reads "phosphor (250 times) is" should read -- phosphor (magnification of 250 times) is --;

line 56, reads "molar ratio of a constitutive element. A" should read -- molar ratio of constituent elements. A --;

line 63, reads "measuring method, the D50 was 17.51μm, and it was found that the value of not less than 1.0 μm and not more than 20.0 μm which is preferable as the phosphor was obtained. The size of the primary particle observed by an SEM diameter was 13.0 μm, which" should read -- measuring method, it was found that the D50 was 17.5 μm, and the size of the primary particle observed by an SEM diameter was 13.0 μm, which --.

Figure 2:
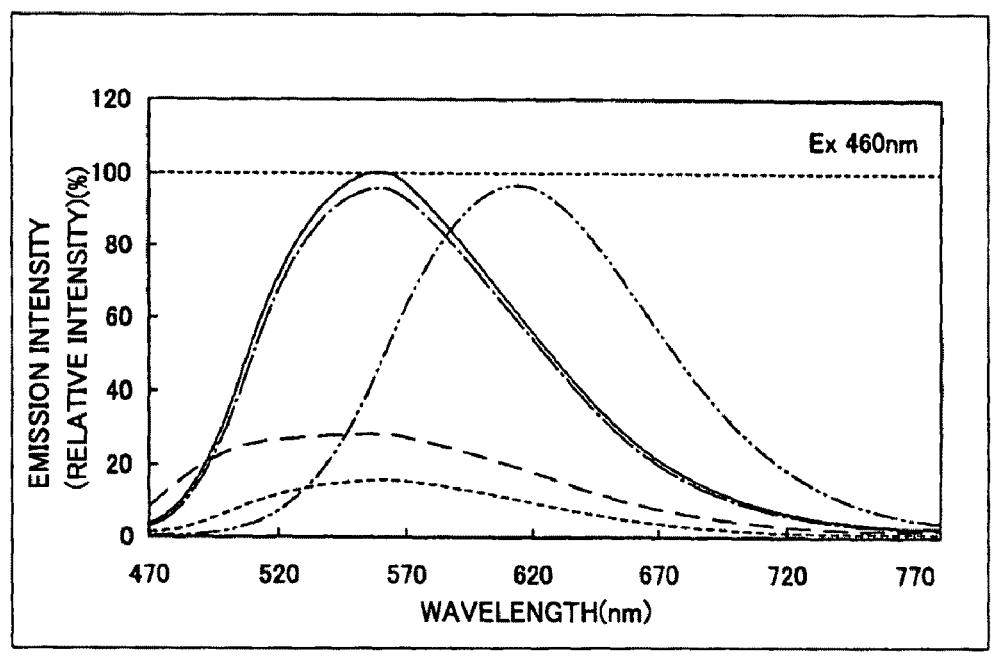
FIG. 2 is a graph showing an emission spectrum when phosphors of examples 1 to 3 and comparative examples 1 and 2 are irradiated with monochromatic light having the wavelength of 460 nm.

Column 33, line 1, reads "to 20.0 μm preferable as the phosphor, and the specific surface area was in a range from $0.05m^2/g$ to $5.0m^2/g$." should read -- to 20.0 μm and the specific surface area was in a range from $0.05m^2/g$ to $5.0m^2/g$, preferable as the phosphor. --;

line 11, reads "light or energy of some wavelength. FIG.2" should read -- light of a certain wavelength or energy. FIG.2 --;

line 26, reads "559.3nm. (the emission intensity at this time and the relative intensity of the luminance were set at" should read -- 559.3nm. (the relative intensity of the emission intensity and the luminance at this time were set at --;

line 30, reads "Powder had a yellow fluorescent color, and a yellow emission color could be visually checked. The" should read -- The powder had a yellow fluorescent color, and a yellow emission color could be visually confirmed. The --;

line 39, reads "peak, the spectrum close to solar light is realized, and therefore

CERTIFICATE OF CORRECTION (continued)
U.S. Pat. No. 7,887,718 B2 several" should read -- peak, in order to realize the spectrum close to solar light several --;

line 59, reads "be visually checked" should read -- be visually confirmed --;

line 64, reads "Here, by the excitation spectrum, the phosphor to be measured was excited by using he monochromatic" should read -- Here, the excitation spectrum is obtained by exciting the phosphor measured by using a monochromatic --;

line 66, reads "as the excitation light, the emission" should read -- as an excitation light, measuring the emission --.

Column 34, line 1, reads "phosphor was measured, and the dependency" should read phosphor, and measuring the dependency --;

line 39, reads "mixed in the atmosphere by using" should read -- mixed in an atmospheric air by using --;

line 40, reads "in the crucible," should read -- in a BN crucible --;

line 50, reads "An analysis result of the powdery phosphor thus obtained is shown" should read -- Analysis results of the powdery phosphor thus obtained are shown --;

line 54, reads "constituent element in" should read -- constituent elements in --;

line 58, reads "0.302 m$^2$/g, or the" should read -- 0.302 m$^2$/g, and the --;

line 62, reads "20.0 pm preferable as the phosphor, and the range of the surface area of not more than 0.05m$^2$/g and not less than 5.0m$^2$/g." should read -- 20.0 μm and the range of the surface area of not more than 0.05m$^2$/g and not less than 5.0m$^2$/g, which are preferable as the phosphor. --.

Column 35, line 10, reads "be visually checked." should read -- be visually confirmed. --;

line 21, reads "be visually checked." should read -- be visually confirmed. --.

line 64, reads "constituent element. The" should read -- constituent elements. The --

Column 36, line 11, reads "and two dot-line of should read -- and two dot-chain line of --;

line 27, reads "two dot-line of should read -- two dot-chain line of --;

line 67, reads "shows the same graph as that" should read -- shows the graph similar to that --.

Column 37, line 8, reads "intensity by excited by the" should read -- intensity by an excitation with the --;

line 13, reads "500 nm, the emission" should read -- 500 nm, when the emission --;

line 18, reads "$P_L$, satisfying $(P_H - P_L)/P_H \leq 0.10$. Namely," should read -- $P_L$, $(P_H - P_L)/P_H < 0.10$ was satisfied. Namely, --;

line 27, reads "by dispersion of should read -- by deviation of --;

CERTIFICATE OF CORRECTION (continued)
U.S. Pat. No. 7,887,718 B2 line 28, reads "the dispersion of should read -- the deviation of --;

line 49, reads "The comparative" should read -- The phosphor of the comparative --;

line 53, reads "raw material was measured in 1.94/3 mol" should read -- raw material, 1.94/3 mol --;

line 58, reads "hereunder, the firing temperature was set at 1600°C. Other than" should read -- hereunder, other than --.

Figure 3:
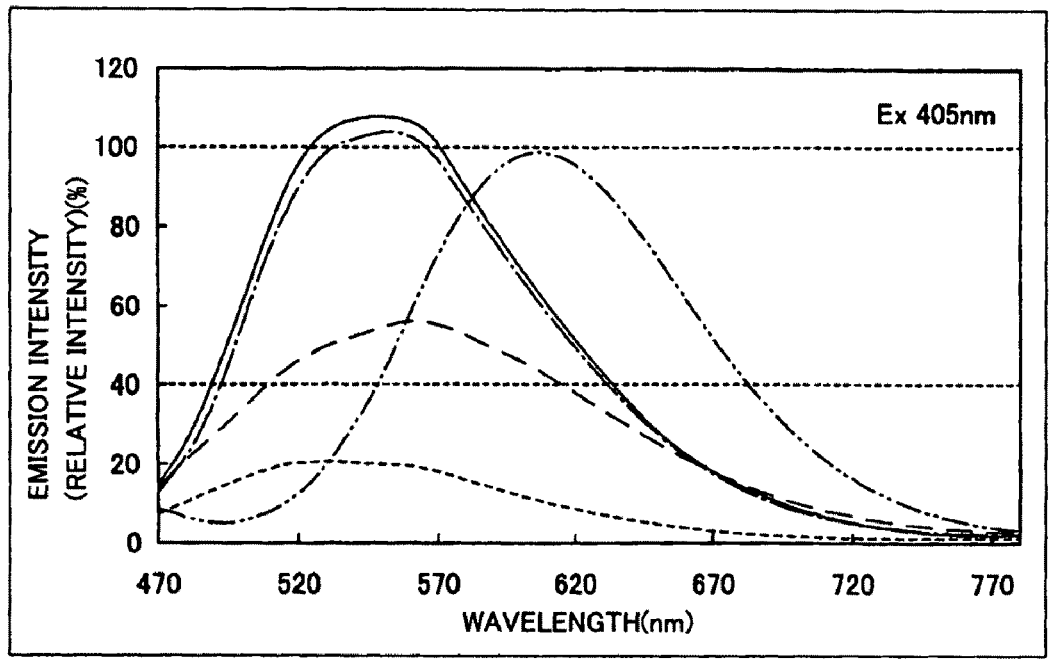
FIG. 3 is a graph showing the emission spectrum when the phosphors of the examples 1 to 3 and the comparative examples 1 and 2 are irradiated with the monochromatic light having the wavelength of 405 nm.
Figure 4:
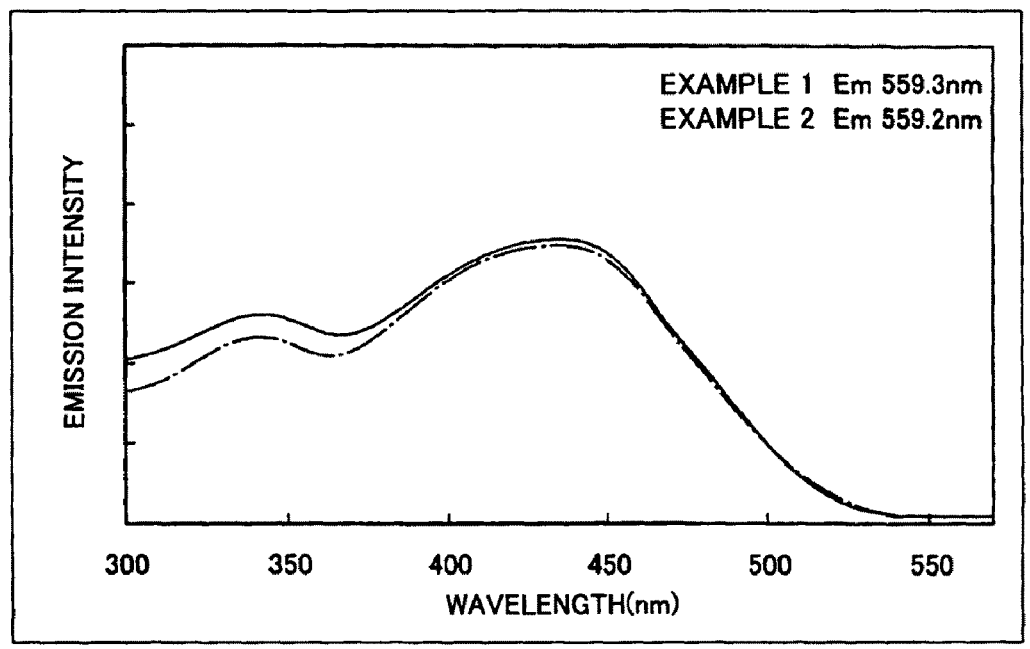
FIG. 4 is a graph showing an excitation spectrum of the phosphors of the examples 1 and 2.
Figure 5:
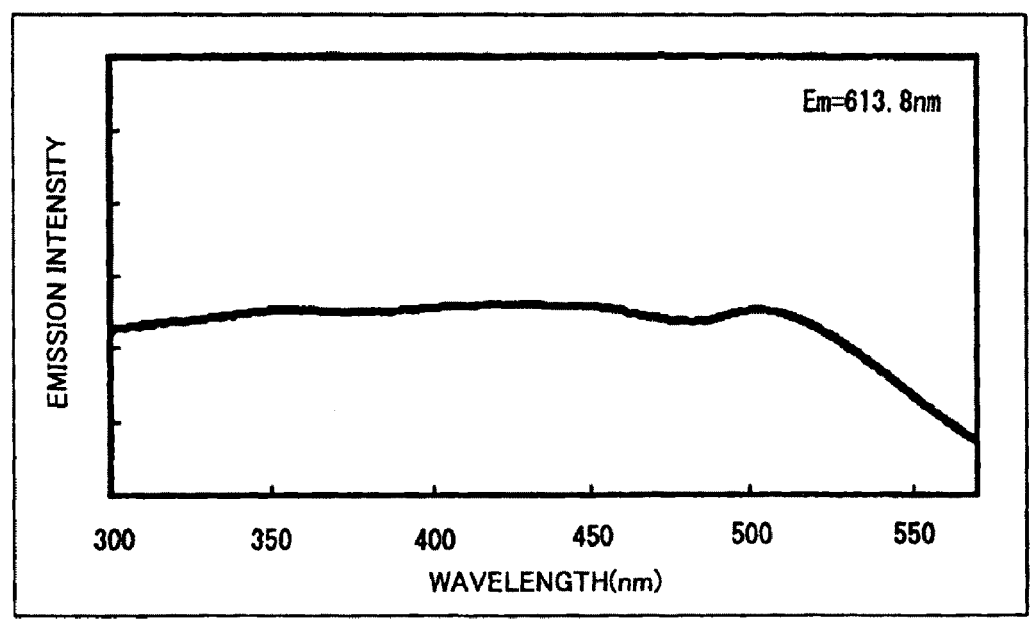
FIG. 5 is a graph showing the excitation spectrum of the phosphor of the example 3.
Figure 6:
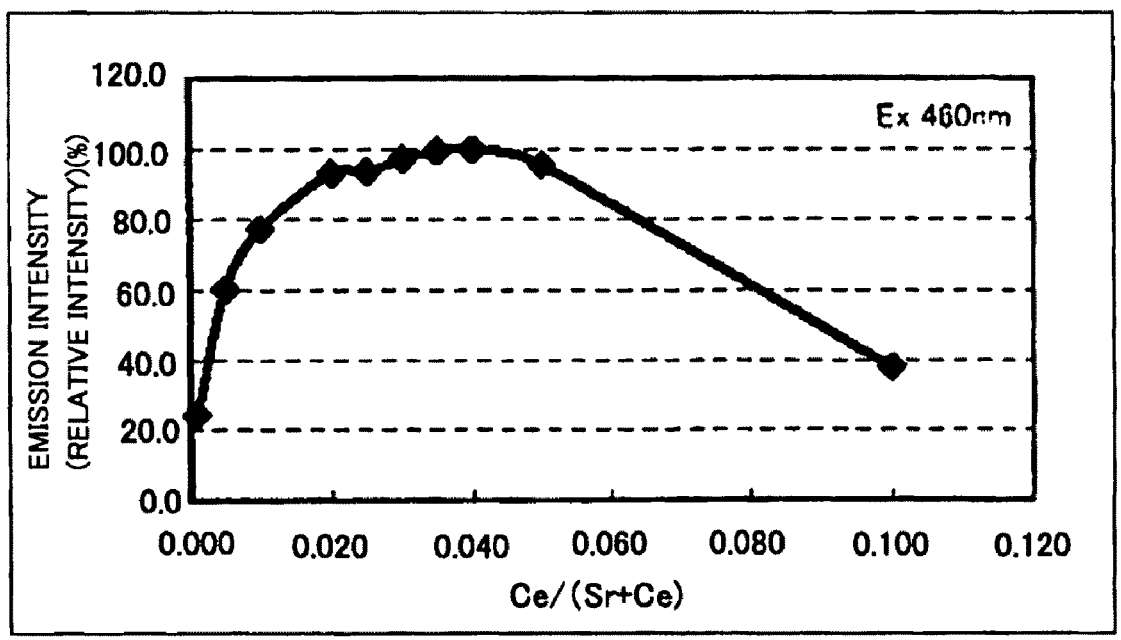
FIG. 6 is a graph showing a relation between a concentration of an activator Z(Ce) and an emission intensity, in the phosphors of examples 4 to 13.
Figure 7:
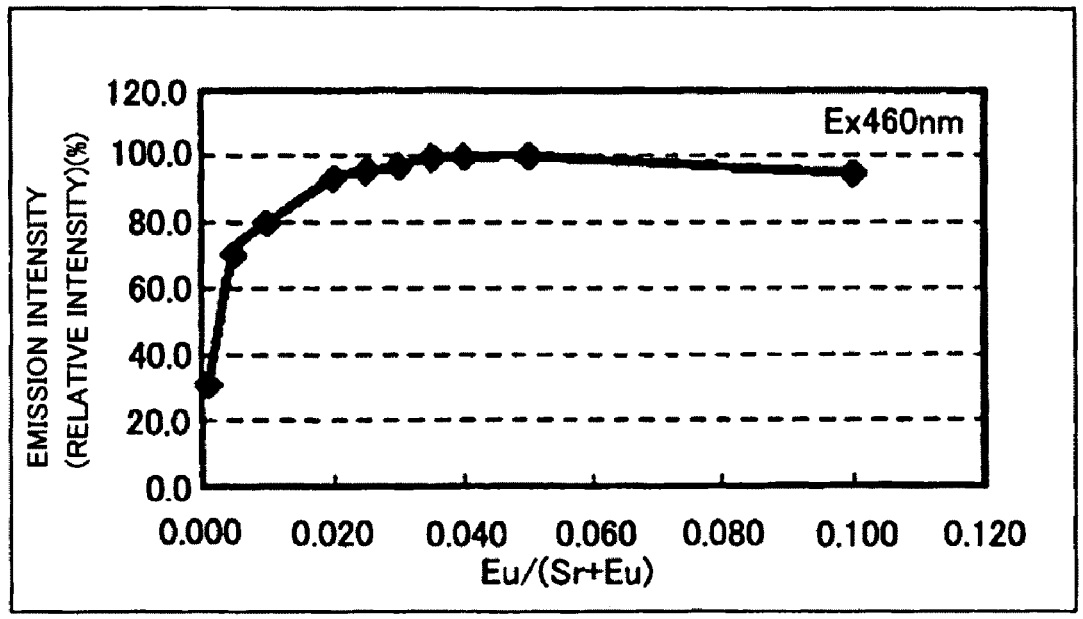
FIG. 7 is a graph showing the relation between the concentration of the activator Z(Eu) and the emission intensity, in the phosphors of examples 14 to 23.
Figure 8:
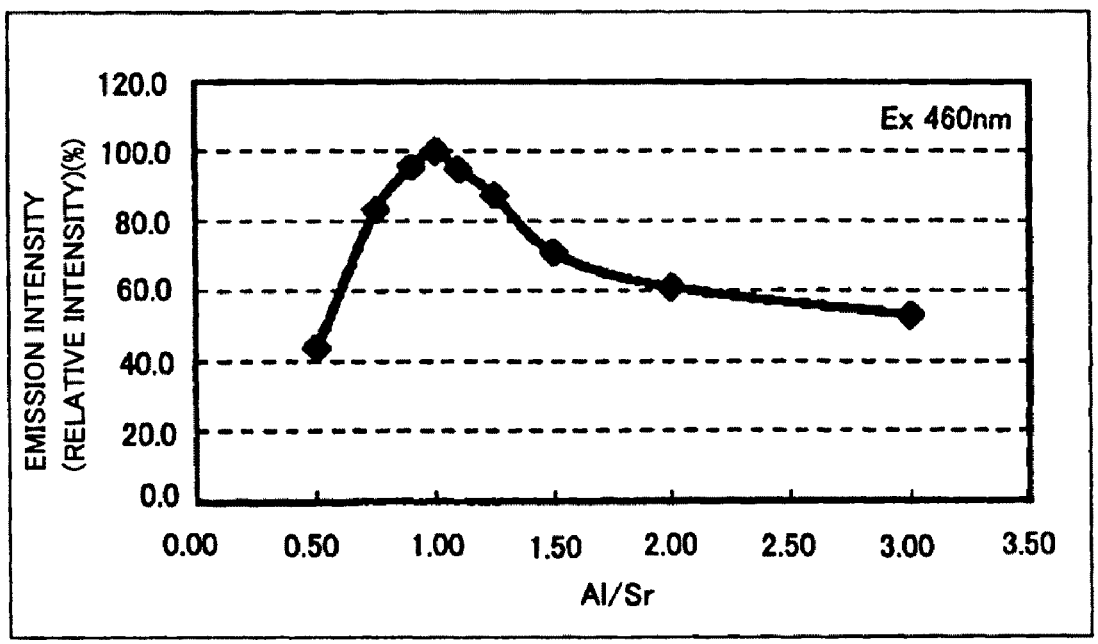
FIG. 8 is a graph showing the relation between Al/Sr ratio and the emission intensity, in the phosphors of examples 24 to 32.
Figure 9:
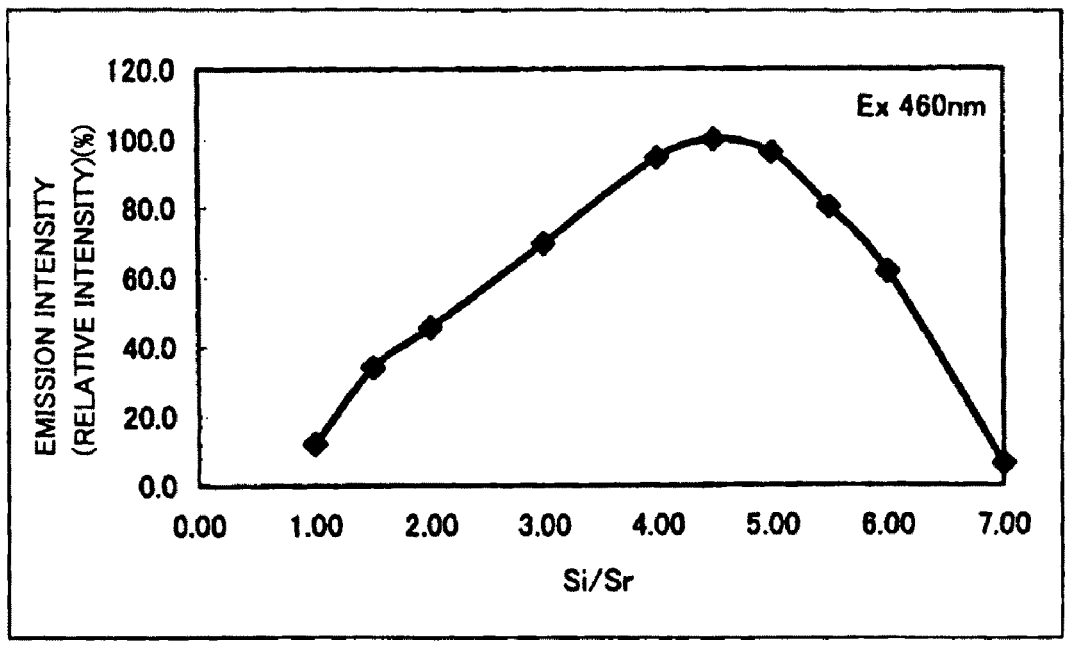
FIG. 9 is a graph showing the relation between Si/Sr ratio and the emission intensity, in the phosphors of examples 33 to 42.
Figure 10:
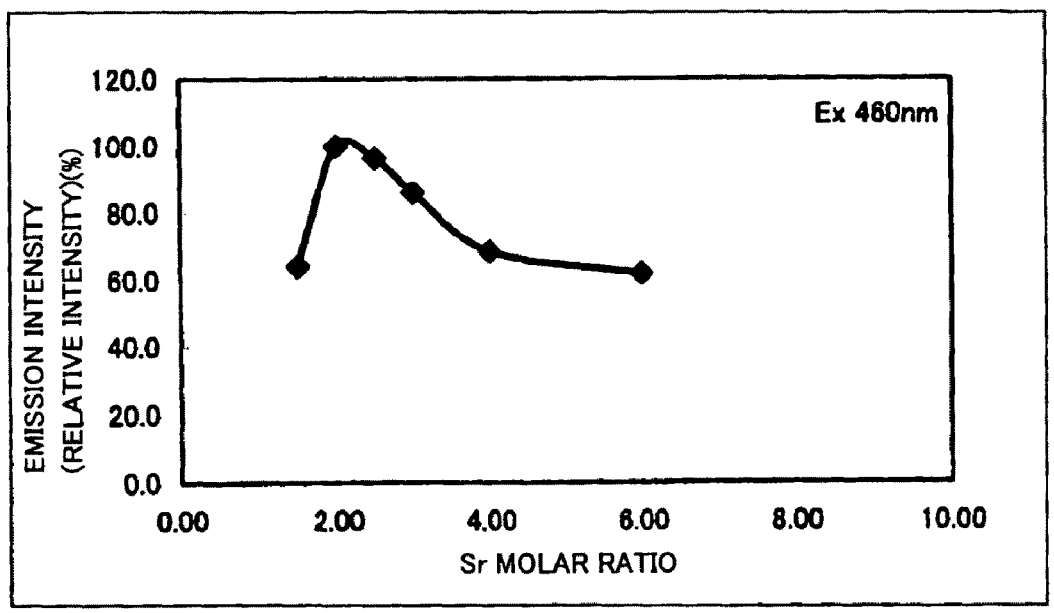
FIG. 10 is a graph showing the relation between Sr molar ratio and the emission intensity, in the phosphors of examples 43 to 50.
Figure 11:
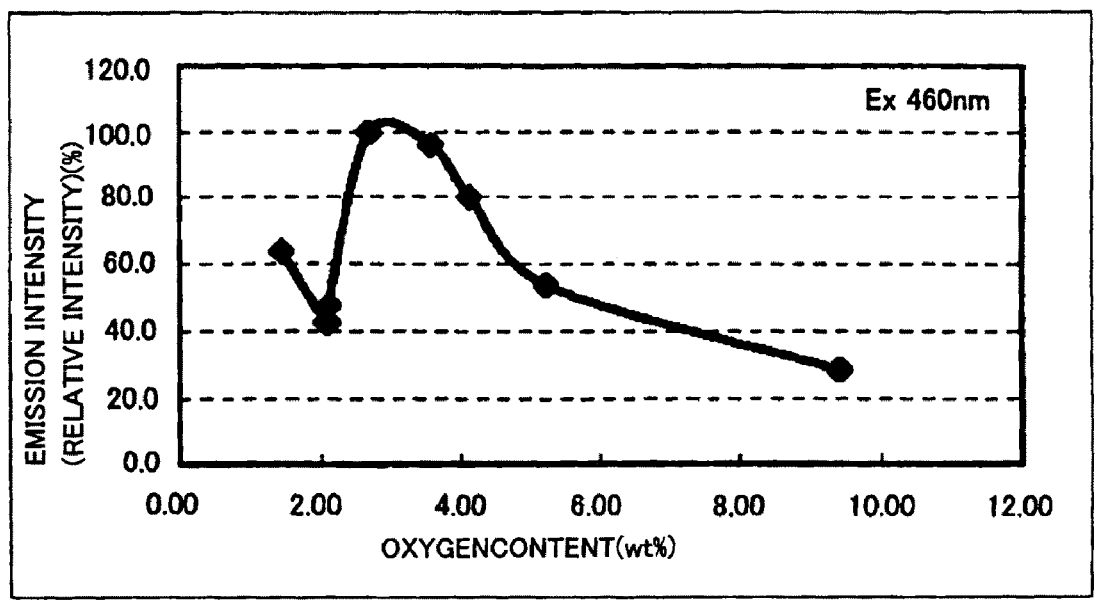
FIG. 11 is a graph showing the relation between oxygen content and the emission intensity, in the phosphors of examples 51 to 60.
Figure 12:
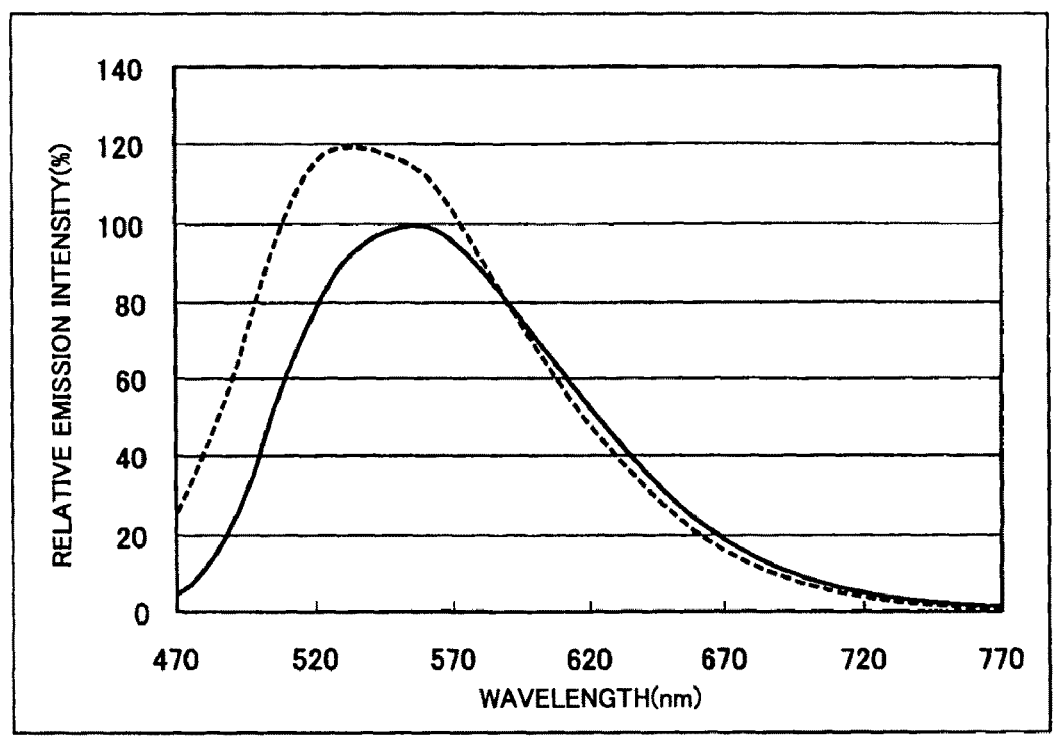
FIG. 12 is the emission spectrum of the phosphor of an example 61.
Figure 13:
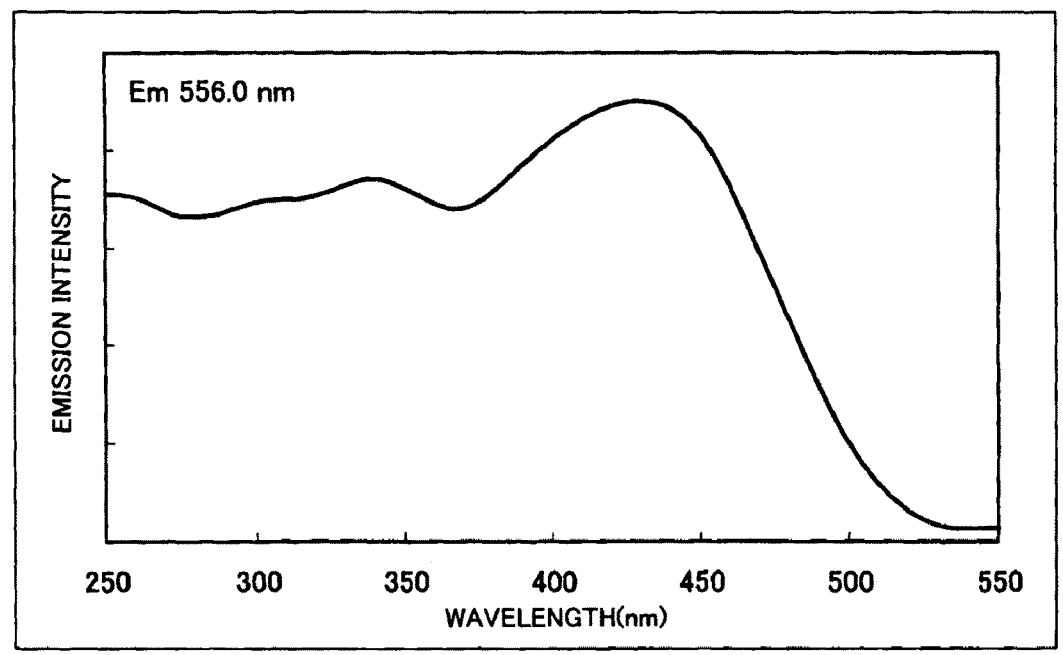
FIG. 13 is the excitation spectrum of the phosphor of the example 61.

Column 38, line 31, reads "mixed in the glove" should read -- mixed in a glove --; line 41, reads "shown by the short" should read -- shown by a short --;

line 49, reads "Further, as shown in table 2, and by a short broke line in FIG.2 and FIG.3," should read -- Further, as shown by a short broken line in FIG.3, --.

Column 40, line 2, reads "phosphors exhibited high efficient phosphors" should read phosphors were high-efficiency phosphors --;

line 4, reads "conventional phosphor." should read -- conventional phosphors --;

line 31, reads "Study on Ce Activation Amount" should read -- Study on amount of activator Ce --;

line 35, reads "$Sr_2Al_2Si_9O_2N_{14}$:Ce was measured" should read -- $Sr_2Al_2Si_9O_2N_{14}$:Ce were measured --;

line 44, reads "that Ce activated concentration was" should read -- that concentration of activator Ce was --;

line 46, reads "concentration Ce/(Sr+Ce)" should read -- concentration: Ce/(Sr–Ce) --;

line 51, reads "The result thus measured is shown" should read -- The results thus measured are shown --;

line 54, reads "mixing ratio Ce/(Sr+Ce)" should read mixing ratio: Ce/(Sr+Ce) --;

Column 41, line 8, reads "side, if the data of Ce/(Sr+Ce)=0.001 (example 4) was excepted." should read -- side, except for the data of Ce/(Sr+Ce)=0.001 (example 4). --;

line 60, reads "sample was manufactured" should read -- sample were manufactured Column 42, line 8, reads "In addition, the light" should read -- The light --;

line 53, reads "However, loose decrease" should read -- However, gradual decrease --;

line 57, reads "difference of the ion radius and" should read -- difference of the ionic radius and --;

line 62, reads "Eu/(Sr+Eu), when the" should read -- Eu/(Sr+Eu), except for the --;

line 64, reads "(example 22) were excepted." should read -- (example 22). --;

CERTIFICATE OF CORRECTION (continued)
U.S. Pat. No. 7,887,718 B2 line 66, reads "of the emission spectrum was measured. The result is shown" should read -- of the emission spectra were measured. The results are shown --.

Column 43, line 25, reads "ratio of Sr, Si, O is fixed to 2, 9, 2, respectively," should read -- ratio of Sr, Si is fixed to 2, respectively, --;

line 29, reads "measurement sample, the phosphor sample was manufactured" should read -- measurement samples, the phosphor samples were manufactured --;

line 58, reads "The measurement result is shown" should read -- The measurement results are shown --;

line 61, reads "blending ratio Al/Sr" should read -- blending ratio: Al/Sr --;

line 66 reads "the result is shown" should read -- the results are shown --.

Column 44, line 18 reads "clarified from the result of table" should read -- clarified from the results of table --;

line 20, reads "value in the region where the value of Al/Sr is small." should read -- value of Al/Sr in the region where the value is small. --;

line 30, reads "less than 1.0, and" should read -- less than 1.5, and --;

line 35, reads "However, if such" should read -- However, a suitable Al content changes a little depending upon deviation of Si and O composition, if such --.

Column 45, line 1, reads "measurement sample, the" should read -- measurement samples, the --;

line 6, reads "of the phosphor thus" should read -- of the phosphors thus --;

line 13, reads "measurement result will" should read -- measurement results will --;

line 15, reads "phosphor sample taken" should read -- phosphor samples taken --;

line 21, reads "the result is shown." should read -- the results are shown. --.

Column 46, line 18, reads "phosphor sample was manufactured" should read -- phosphor samples were manufactured --;

line 50, reads "molar ratio of Sr thus adjusted was set" should read -- molar ratios of Sr thus adjusted were set --;

line 62, reads "the result is shown." should read -- the results are shown. --.

Column 47, line 18, reads "phosphor sample was irradiated" should read -- phosphor samples were irradiated --;

line 21, reads "phosphor sample was irradiated" should read -- phosphor samples were irradiated --;

line 22, reads "wavelength of 360 nm, blue" should read -- wavelength of 366 nm, blue --;

line 24, reads "the ratio of Sr to occupy the mixed powder of $SrCO_3$ is small, and the" should read -- the proportion of $SrCO_3$ as a Sr raw material in the mixed powder is small, and the --;

line 41, reads "$Sr_2Al_2Si_9O_0Nn:Ce(Ce/(Sr+Ce)=0.030$," should read $Sr_2Al_2Si_0O_0Nn:Ce(Ce/(Sr+Ce)=0.030$, --;

line 46, reads "measurement sample, the phosphor sample was manufactured" should read -- measurement samples, the phosphor samples were manufactured --.

Column 48, line 22, reads "which the adjusted o/m ratio is" should read -- which the o/m ratio adjusted at weighing raw materials is --;

line 45, reads "3.5 wt%. Further," should read -- 3.5 wt%, and are extremely decreased in case of the oxygen content of 4.0 wt% or more. Further, --;

line 46, reads "becomes not less than 10.0 wt o, each" should read -- becomes 10.0 wt% or more, each --.

Column 49, line 6, reads "for the sample having" should read -- for the samples having --;

line 14, reads "in the space between" should read -- in the interval between --;

line 30, reads "61 to 82, a sample was manufactured" should read -- 61 to 82, samples were manufactured --;

line 42, reads "available samples $SrCO_3(3N)$," should read -- available $SrCO_3(3N)$, --;

line 42, reads "each raw material was weighed in $SrCO_3$" should read -- each raw material, $SrCO_3$ --;

line 45, reads "of $CeO_2$, so" should read -- of $CeO_2$, were weighed so --;

line 57, reads "(flow state 20.0 l /min)," should read -- (flow state 20.0 l/min). --;

line 64, reads "As a result of analysis, of the obtained phosphor powder, the" should read -- Result of analysis, the --;

line 66, reads "area (BET) are shown" should read -- area (BET) of the obtained phosphor powder, are shown --.

Column 50, line 24, reads "556.0nm. (the emission intensity at this time and the relative intensity of the luminance were set" should read -- 556.0nm. (relative intensity of the emission intensity at this time were set --;

line 29, reads "and a yellow emission color" should read -- and a yellow-green emission color --;

line 34, reads "having excellent color rendering" should read -- having excellent luminance and color rendering --;

line 35, reads "compared with the phosphor" should read -- compared with one using

CERTIFICATE OF CORRECTION (continued)
U.S. Pat. No. 7,887,718 B2 the phosphor --;

line 44, reads "emitted form the" should read -- emitted from the --.

Figures 1, 14:
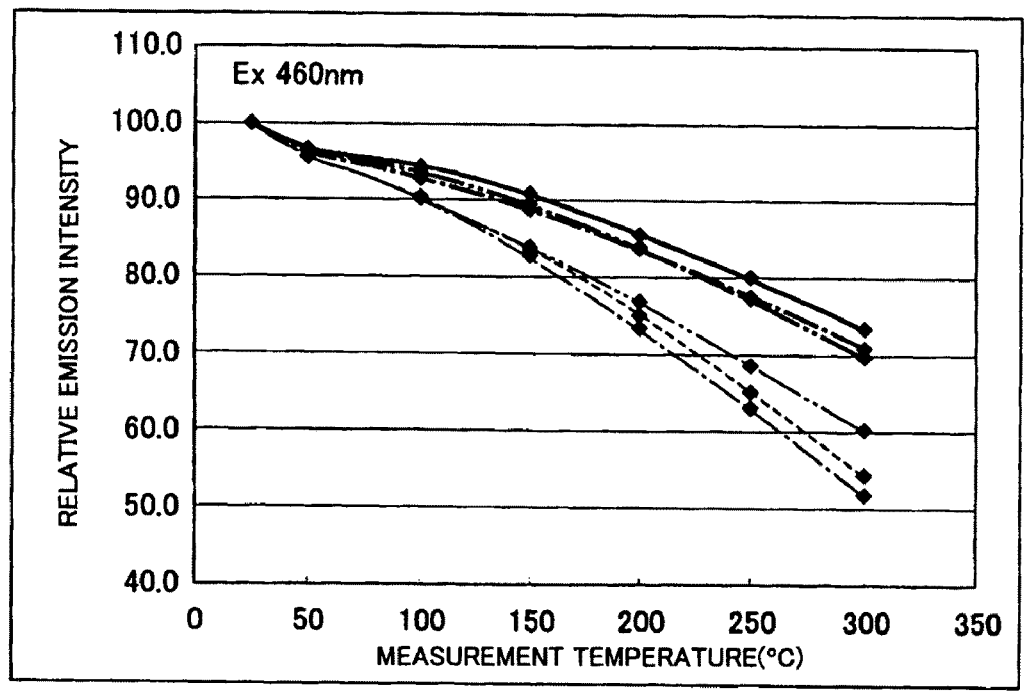
Figures 2, 14:
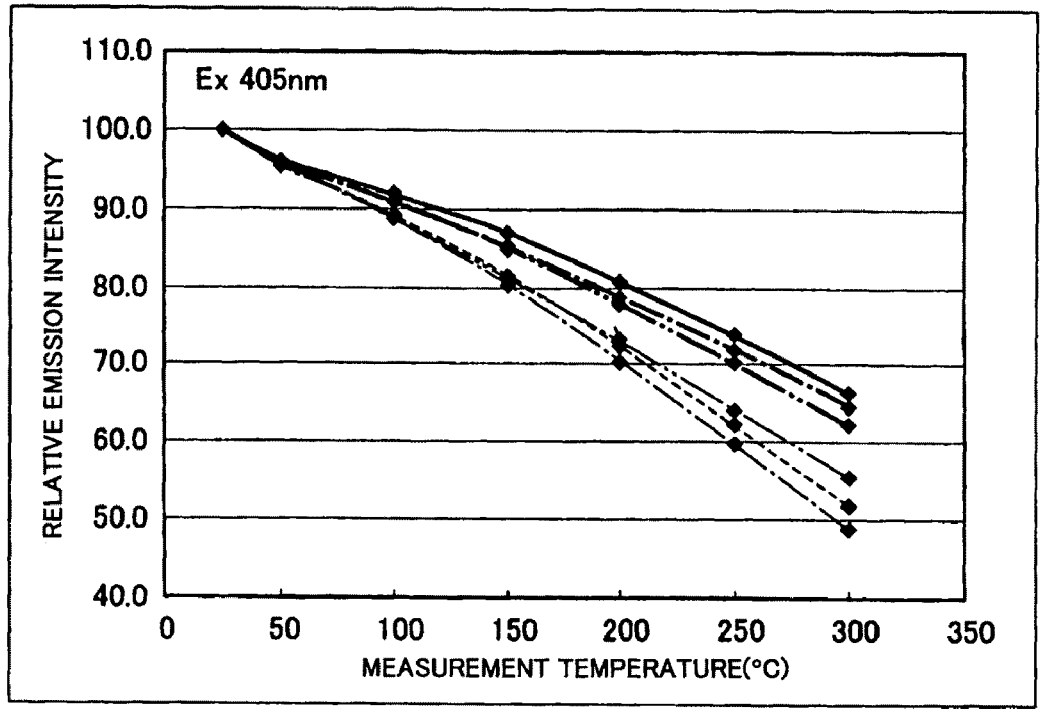

Column 51, line 10, reads "combining the blue" should read -- combining the phosphor with the blue --;

line 19, reads "increased in such a way as 25°C," should read -- increased to 25°C, --;

line 24, reads "In addition, the emission" should read -- Also, the emission --;

line 34, reads "FIGS. 14-1 and 2 is a graph showing the relative" should read -- FIGs. 14-1 and -2 are graphs showing the relative --;

line 45, reads "example 61 is shown by a thick solid line in the FIG.14-1 and 2." should read -- example 61 are shown by thick solid lines in the FIGs.14-1 and -2. --.

Column 52, line 21, reads "As an analysis result of the obtained phosphor powder, the average particle size (D50 and the specific surface area (BET) are shown" should read -- As analysis results, the average particle size (D50) and the specific surface area (BET) of the obtained phosphor powder are shown --;

line 36, reads "and the broad peak" should read -- and the peak --;

line 64, reads "excitation light in the wavelength" should read -- excitation light in a broad wavelength --.

Column 53, line 2, reads "shown in FIG.14-1 and 2 in" should read -- shown in FIGs.14-1 and -2 in --;

line 12, reads "was set at 100% After" should read -- was set at 100%. After --;

line 46, reads "As the analysis result of the obtained phosphor powder, the average particle size (D50) and the specific surface area (BET) are shown" should read -- As analysis results, the average particle size (D50) and the specific surface area (BET) of the obtained phosphor powder are shown --;

line 55, reads "result was shown in table 10. As shown in table 10, the measurement result of the emission spectrum when" should read -- result is shown in table 10. Table 10 shows the measurement results of the emission spectra when -- line 57, reads "monochromatic light having the wavelengths of 460nmm and 405nm, and when" should read -- monochromatic light having the wavelengths of 460nmm and 405nm. And when --.

Column 54, line 30, reads "using a two dot chain line in FIG.14-1 and 2." should read -- using a thick two dot chain line in FIGs. 14-1 and -2. --.

Column 55, line 3 "(wherein Ce/)Sr+Ce)=0.030) was" should read -- (wherein Ce/(Sr+Ce)=0.030) was --;

line 4, reads "raw material was weighed in SrCO₃" should read -- raw material, SrCO₃

CERTIFICATE OF CORRECTION (continued)
U.S. Pat. No. 7,887,718 B2 line 7 reads "0.030mol, so that" should read -- 0.030mol, were weighed so that --;

line 8, reads "As the analysis result of the manufactured phosphor, the average particle size (D50) and the specific surface area (BET) are shown" should read -- The analysis result, the average particle size (D50) and the specific surface area (BET) of the manufactured phosphor are shown --;

line 58, reads "This measurement result is shown in the table 10, and further shown in FIG.14-1 and 2 by using a broken line in the" should read -- These measurement results are shown in the table 10, and further shown in FIGs.14-1 and -2 by using broken lines in the --.

Column 56, line 20, reads "as compared to an initial" should read -- as compared to the initial line 30, reads "raw material was weighed in $SrCO_3$" should read -- raw material, $SrCO_3$ --;

line 33, reads "0.030mol, so that" should read -- 0.030mol, were weighed so that --;

line 34, reads "As an analysis result of the obtained phosphor powder, the average" should read -- An analysis result, the average --;

line 36, reads "area (BET) are shown" should read -- area (BET) of the obtained phosphor powder are shown --.

Column 57, line 16, reads "shown in FIG.14-1 and 2 by using a tin one" should read -- shown in FIGs.14-1 and -2 by using a thin one --;

line 50, reads "raw material was weighed in $SrCO_3$" should read -- raw material, $SrCO_3$ --;

line 53, reads "0.030mol, so" should read --0.030mol, were weighed so --;

line 54, reads "As the analysis result of the obtained phosphor powder the average" should read -- Analysis result, the average --;

line 56, reads "area (BET) are shown" should read -- area (BET) of the obtained phosphor powder are shown --;

line 60, reads "oxygen is more increased" should read -- oxygen is increased --.

Column 58, line 37, reads "shown in FIGS.14-2 by using a thin two dot chain line in" should read -- shown in FIGs.14-1 and -2 by using thin two dot chain lines in --.

Column 59, line 7, reads "and FIG.14-1 and 2, samples" should read -- and FIGs.14-1 and -2, samples --;

line 9, reads "1.1 < Al/Sr ≤ 2.0 obtains excellent" should read -- 1.1 < Al/Sr ≤ 2.0 have excellent --;

line 16, reads "temperature of 100°C. and 10.0% at 300°C" should read -- temperature of 100°C and 10.0% or more at 300°C --;

line 18, reads "Further, when this phosphor was cooled" should read -- Further, when these phosphors were cooled --;

line 21, reads "of the sample with Al/Sr being 1.0 out of the samples of the examples 64 to 65 was deteriorate by" should read -- of the samples of the examples 64 to 65 with Al/Sr being 1.0 were deteriorated by --.

Column 60, line 3, reads "Meanwhile, the emission intensity of the phosphor of the examples 61 to 63 was about" should read -- Meanwhile, the deterioration of emission intensities of the phosphors of the examples 61 to 63 were about --.

Figure 15:
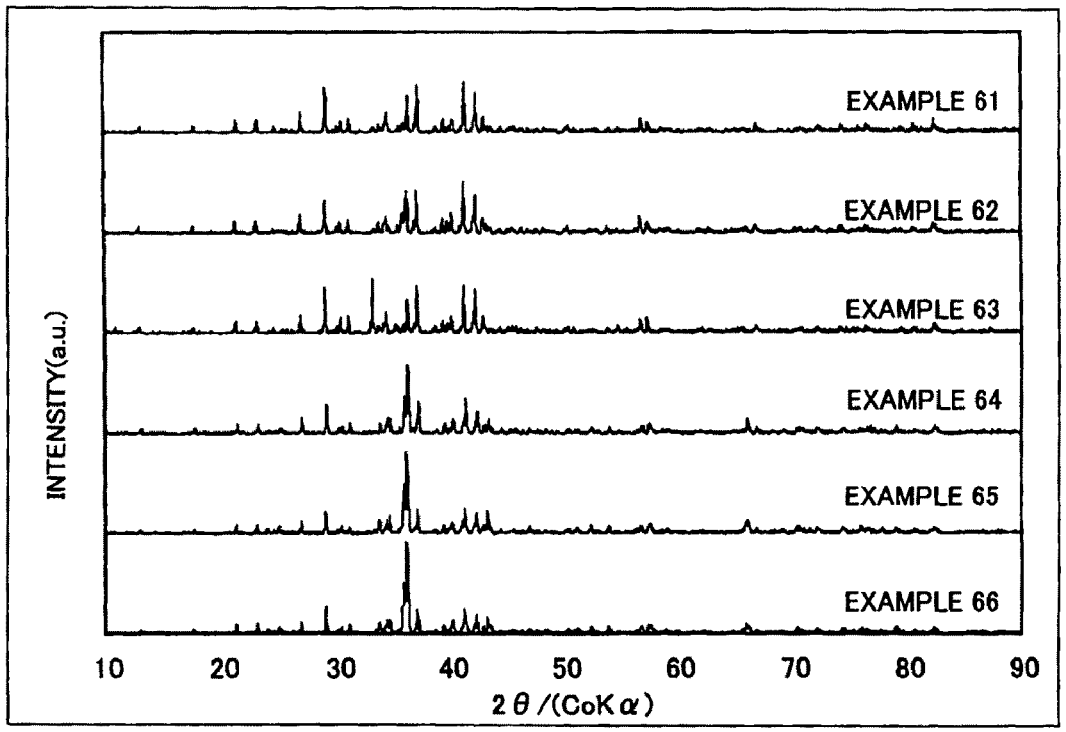
FIG. 15 shows an X-ray diffractive pattern of the phosphors of the examples 61 to 66.
Figure 16:
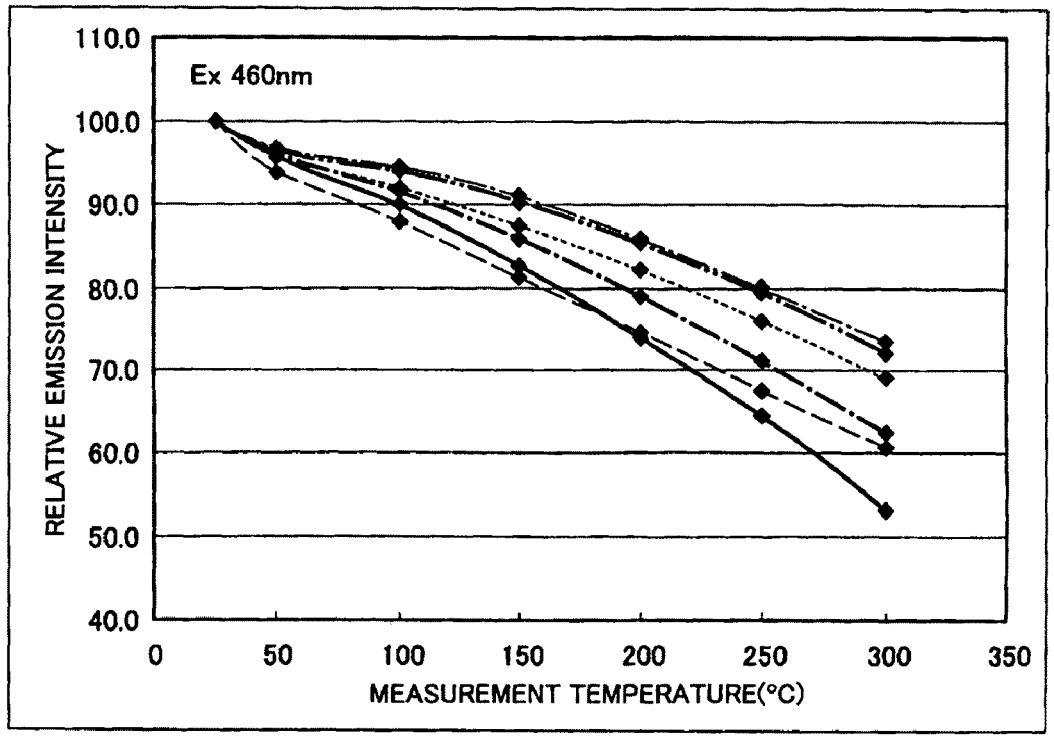
FIG. 16 is a graph showing the measurement result of the temperature characteristics of the emission intensity of the phosphors of examples 67 to 72.
Figure 17:
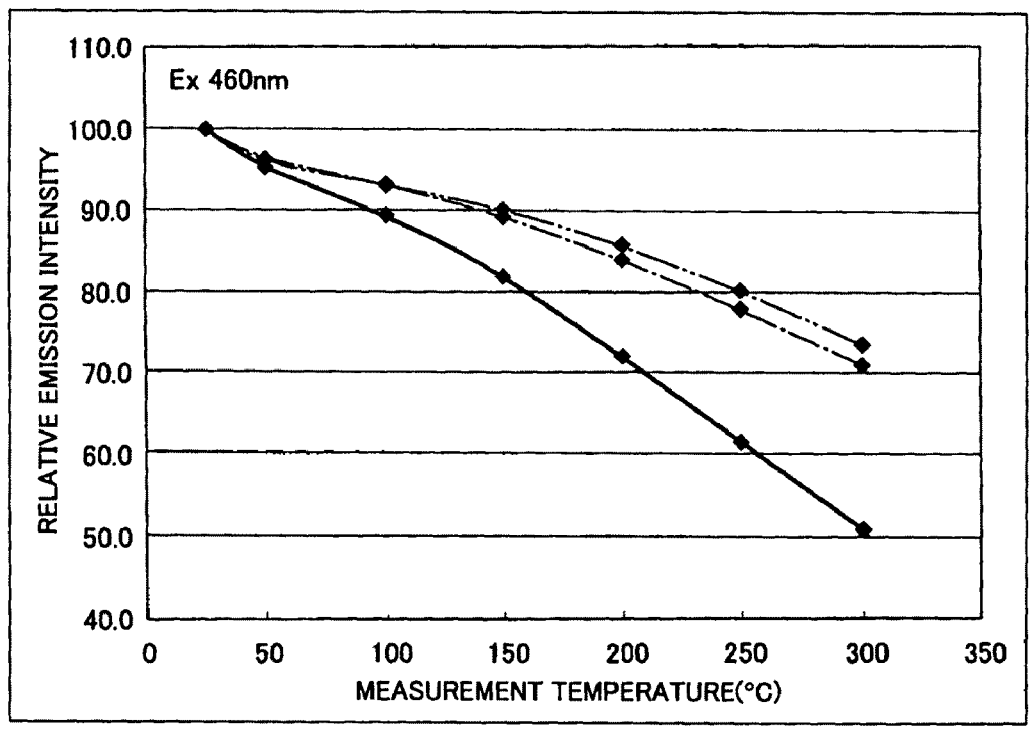
FIG. 17 is a graph showing the measurement result of the temperature characteristics of the emission intensity of the phosphors of examples 73 to 75.

Column 61, line 2, reads "61-66, a diffraction pattern obtained by a powder X-ray method is shown" should read -- 61-66, diffraction patterns obtained by a powder X-ray method are shown --;

line 4, reads "From the result shown in FIG.15, a product phase contained in the phosphor of this example has characteristic peaks in a brag angle (2θ) range of should read From the results shown in FIG.15, a product phase contained in the phosphor of the present invention has characteristic peaks in a Bragg angle (2θ) ranges of -- line 14, reads "observed in a Brag angle" should read -- observed in a Bragg angle --:

line 17, reads "the intensity of the diffraction peak observed in a Brag angle (2θ) range of should read -- the intensities of the diffraction peaks observed in a Bragg angle (2θ) ranges of --;

line 19, reads "to 43.0° is enhanced" should read -- to 43.0° are enhanced --;

line 21, reads "crystal is changed," should read -- crystal are changed, --;

line 36, reads "RIGAKU DENKI INCO., (RINT 2000). Measurement" should read RIGAKU DENKI INCO., "RINT 2000". Measurement --;

line 40, reads "X-ray bulb: CoKά should read -- X-ray tube: CoKά --;

line 49, reads "caused by sample surface to be irradiated with X-ray is not flat, measurement" should read -- caused by an uneven sample surface to be irradiated with X-ray, measurement --;

line 66, reads "decreased more or less than" should read -- decreased than --.

Column 62, line 19, reads "CeO₂(3N), and" should read -- CeO$_2$(3N) was adapted, and --;

line 21, reads "However, the blending" should read -- The blending --;

line 26, reads "The result of the emission characteristics and the temperature characteristics of each sample manufactured in the examples 67 to 72 is shown" should read -- The results of the emission characteristics and the temperature characteristics of each sample manufactured in the examples 67 to 72 are shown --;

line 38, reads "measurement result of" should read -- measurement results of --;

line 40, reads "300°C was shown." should read -- 300°C are shown. --;

line 41, reads "shows the value of the emission intensity when the sample is cooled"

should read -- shows the values of the emission intensities when the samples are cooled --;

line 43, reads "temperature of the sample up to" should read -- temperature of the samples up to --;

line 46, reads "measurement result of the" should read -- measurement results of the line 57, reads "from the result of the" should read -- from the results of the --.

Column 63, line 13, reads "after increasing and cooling the temperature is" should read after increasing the temperature and cooling is --;

line 22, reads "structure that Sr with large ion radius enters" should read -- structure Sr with large ionic radius enters --;

line 25, reads "part of N is substituted with O. Namely," should read -- part o f N thereof is substituted with O, which is different structure from conventional nitride and oxynitride phosphors. Namely, --;

line 29, reads "a larger ion radius than" should read -- a larger ionic radius than --;

line 40, reads "structure is nitride and oxynitride" should read -- structure is nitride or oxynitride --.

Column 64, line 8, reads "phosphor sample was manufactured" should read -- phosphor samples were manufactured --;

line 9, reads "other than that, as" should read -- other than adapting, as --;

line 14, reads "However, the mixing ratio" should read -- The mixing ratio -- line 20, reads "the value of the emission intensity of the examples 73 to 75 (25°C) is shown" should read -- the values of the emission intensities of the examples 73 to 75 (2°C) are shown --;

line 25, reads "excitation light. Next, the value of the emission intensity at" should read -- excitation light (25°C). Next, the values of the emission intensities at --;

line 27, reads "temperature is standardized" should read -- temperature are standardized --;

line 28, reads "measurement result of the change of emission intensity at" should read -- measurement results of the change of emission intensities at --;

line 30, reads "300°C is shown." should read -- 300°C are shown. --;

line 31, reads "shows the value of the emission intensity when the temperature of the sample is increased up to 300°C and thereafter the sample is cooled" should read -- shoves the values of the emission intensities when the temperature of the samples are increased up to 300°C and thereafter the samples are cooled --;

line 37, reads "characteristics and shows the value of the measurement result obtained by measuring the temperature characteristics, with the relative emission intensity taken on the

CERTIFICATE OF CORRECTION (continued)
U.S. Pat. No. 7,887,718 B2 ordinate axis and the emission intensity taken on the abscissa axis, which are shown by solid line in the example 73, shown by one dot chain line in the example 74, and shown by two dot chain line in the example 75." should read -- characteristics, wherein the value of the relative emission intensity is taken on the ordinate axis and the emission intensity is taken on the abscissa axis, and the example 73 is shown by solid line, the example 74 is shown by one dot chain line, and the example 75 is shown by two dot chain line. --.

Column 65, line 18, reads "molar ratio of Si is larger than that of" should read -- molar ratios of Si are larger than those of --;

line 40, reads "by $SrAl_{1.43}Si_{3.81}O_0N_n:Ce(Ce/(Sr+Ce)=0.030$," should read by $SrAl_{1.43}Si_{3.81}O_0N_n:Ce(Ce/(Sr+Ce)=0.030$, --;

line 47, reads "other than that, as" should read -- other than adapting, as --;

line 48, reads "the mixing ratio of" should read -- the mixing ratios of --;

line 52, reads "However, the mixing ratio" should read -- The mixing ratio --; line 56, reads "The result of" should read -- The results of --.

Figures 1, 18:
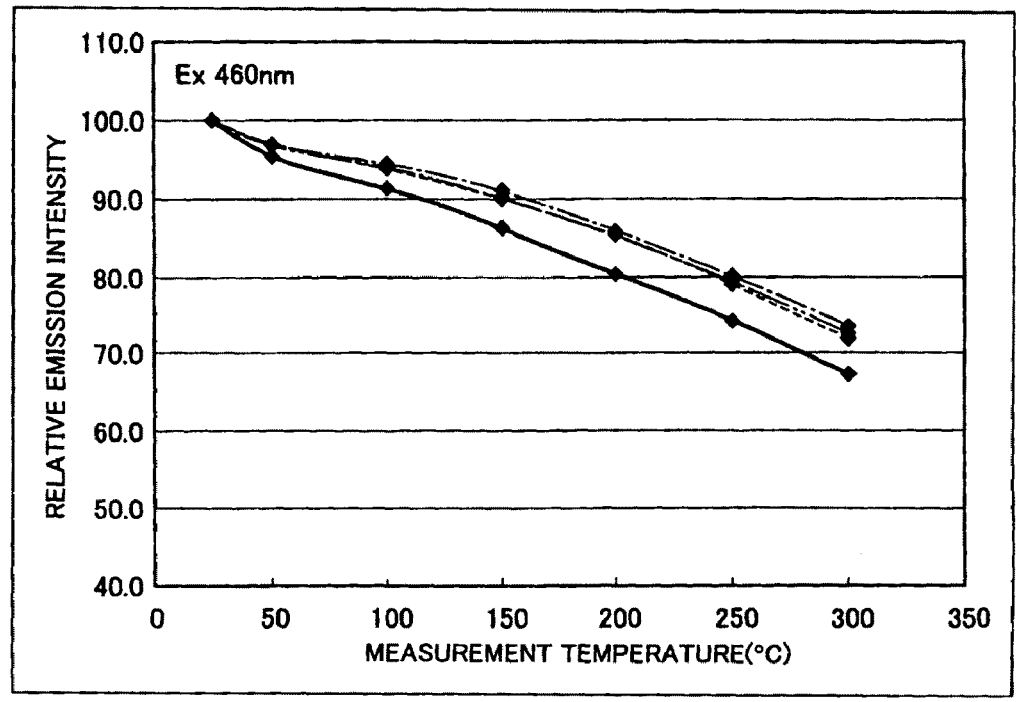
Figures 2, 18:
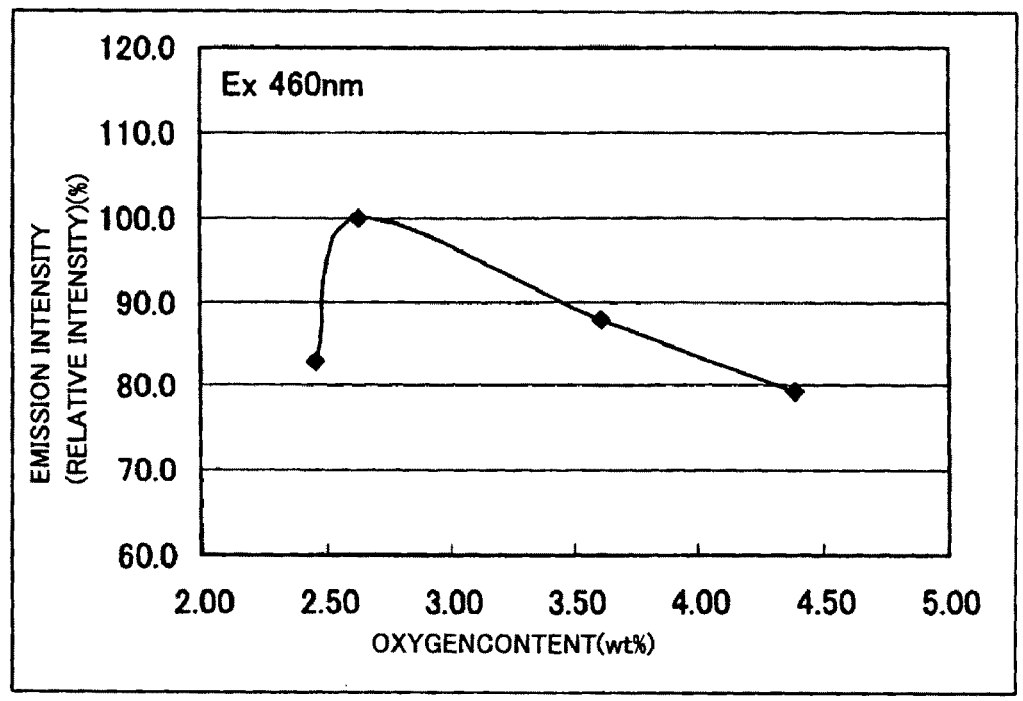
Figures 1, 19:
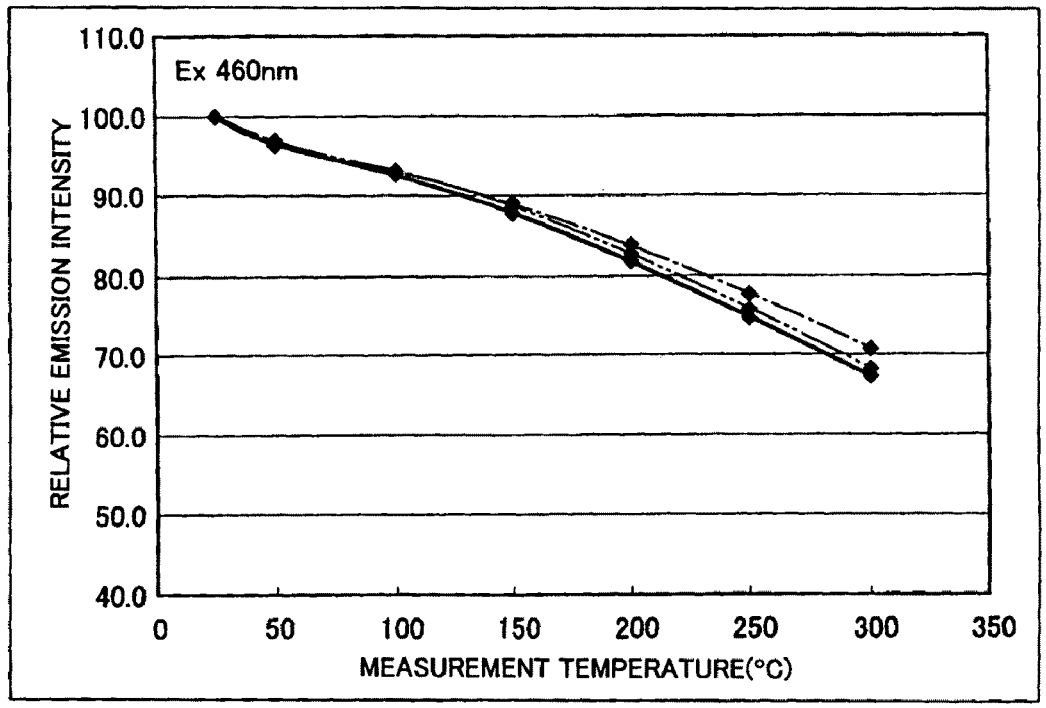
Figures 2, 19:
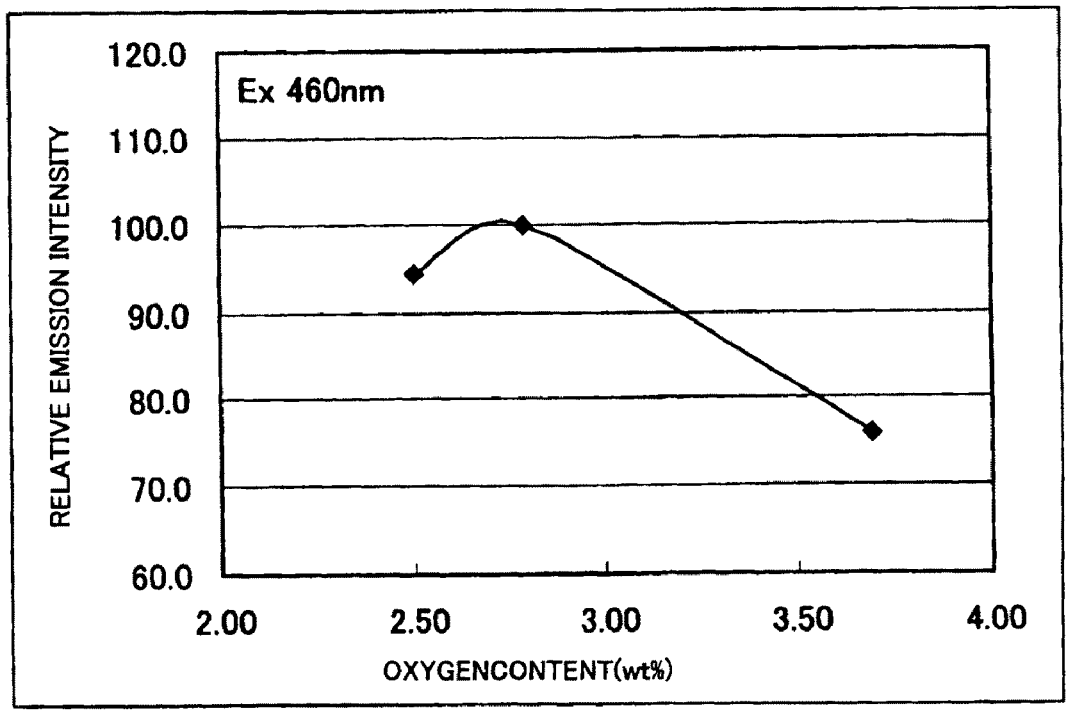
Figure 20:
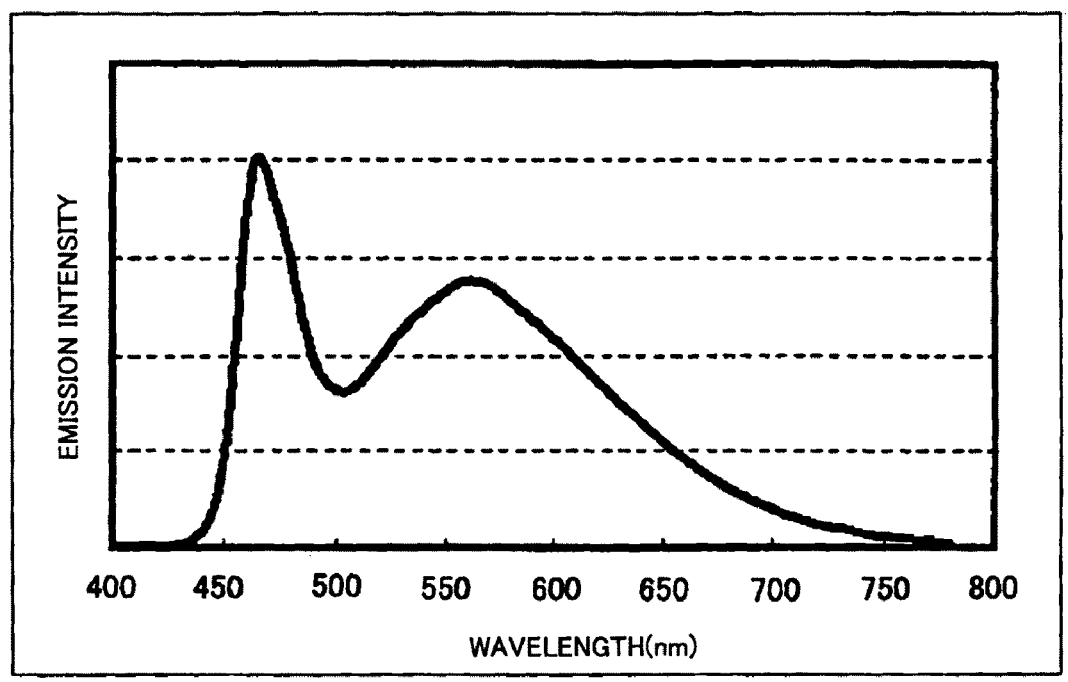
FIG. 20 shows the emission spectrum of a white LED illumination of an example 83.

Column 66, line 18, reads "Also, FIG.18-2 is a" should read -- FIG.18-2 is a --;

line 37, reads "from the result of the" should read -- from the results of the --;

line 65, reads "The reason seems" should read -- In the present invention, the reason seems --.

Column 67, line 3, reads "has a larger ion radius than" should read -- has a larger ionic radius than --;

line 7, reads "with 0 having smaller ion radius than N," should read -- with 0 having smaller ionic radius than N, --;

line 10, reads "structure becomes zero." should read -- structure becomes stable zero.

line 35, reads "by $SrAl_{1.22}Si_{4.09}O_0N_n:Ce(Ce(Sr+Ce)=0.030$," should read -- by $SrAl_{1.22}Si_{4.09}O_0N_n:Ce(Sr+Ce)=0.030$, --;

line 36, reads "a=1.33), and" should read -- a=1.33, b=4.09), and --;

line 42, reads "other than that the" should read -- other than adapting the --;

line 46, reads "However, the blending ratio" should read -- The blending ratio --;

line 59, reads "as the excitation light was set" should read -- as the excitation light (25°C) was set --;

Column 68, line 59, reads "largest at the time of" should read -- largest at the case of --.

Column 69, line 1, reads "Therefore, an inclination of the" should read -- Therefore, tendency of the --;

line 7, reads "However, the initial" should read -- However, in the examples 80-82,

CERTIFICATE OF CORRECTION (continued)
U.S. Pat. No. 7,887,718 B2 the initial --;

line 39, reads "In en example 83, by using the light emitting element (LED) emitting the light having the wavelength of 460nm, the emission" should read -- In an example 83, the emission --;

line 44, reads "was excited. The emission" should read -- was excited by using the light emitting element (LED) emitting the light having the wavelength of 460nm. However, the emission --;

line 54, reads "but also silicon-based resin" should read -- but also silicone-based resin --;

line 58, reads "light element, a white" should read -- light element by a conventional process, a white --;

line 62, reads "mixture and the condition" should read -- mixture and the thickness of coating, the condition --;

line 65, reads "20mA is fed to" should read -- 20mA is applied to --.

Figure 21:
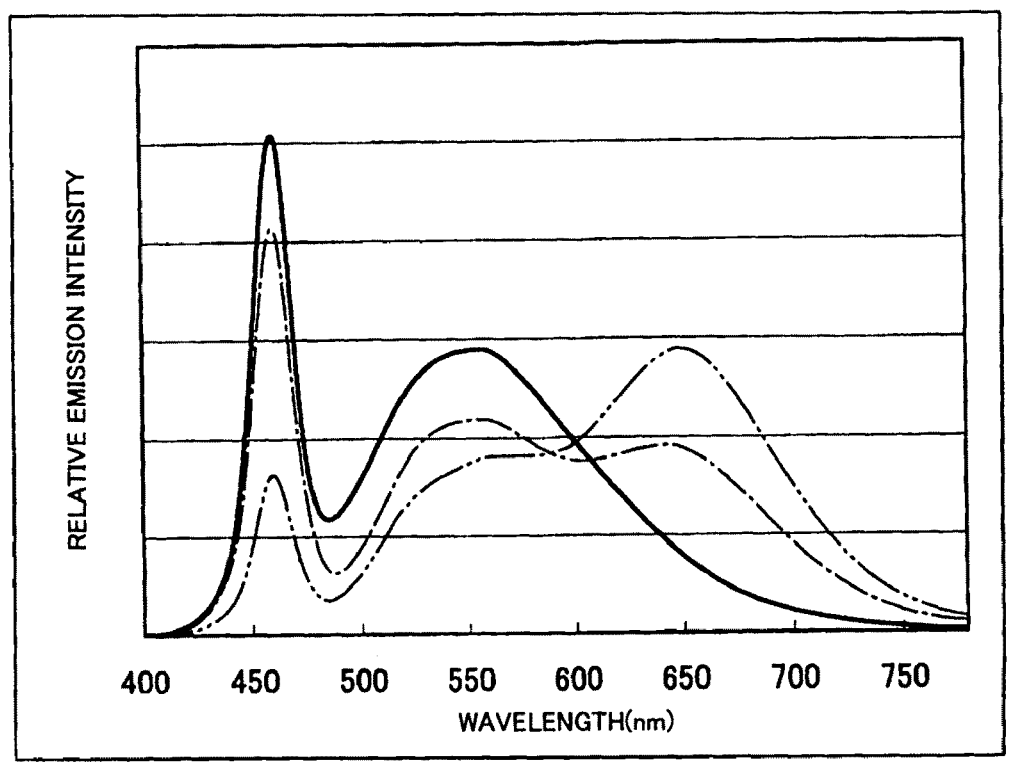
FIG. 21 shows the emission spectrum of the white LED illumination of examples 84 to 86.
Figure 22:
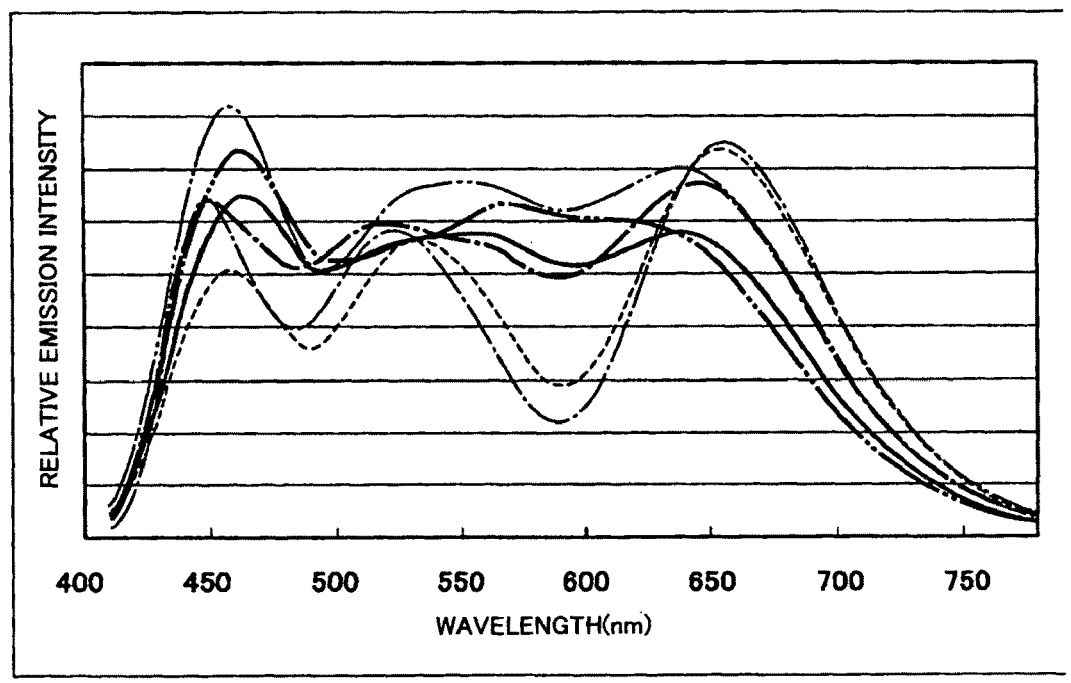
FIG. 22 shows an emission spectrum pattern when a correlated color temperature is set at 6500K, in a phosphor mixture of examples 87 to 89 and comparative examples 4 to 6.
Figure 23:
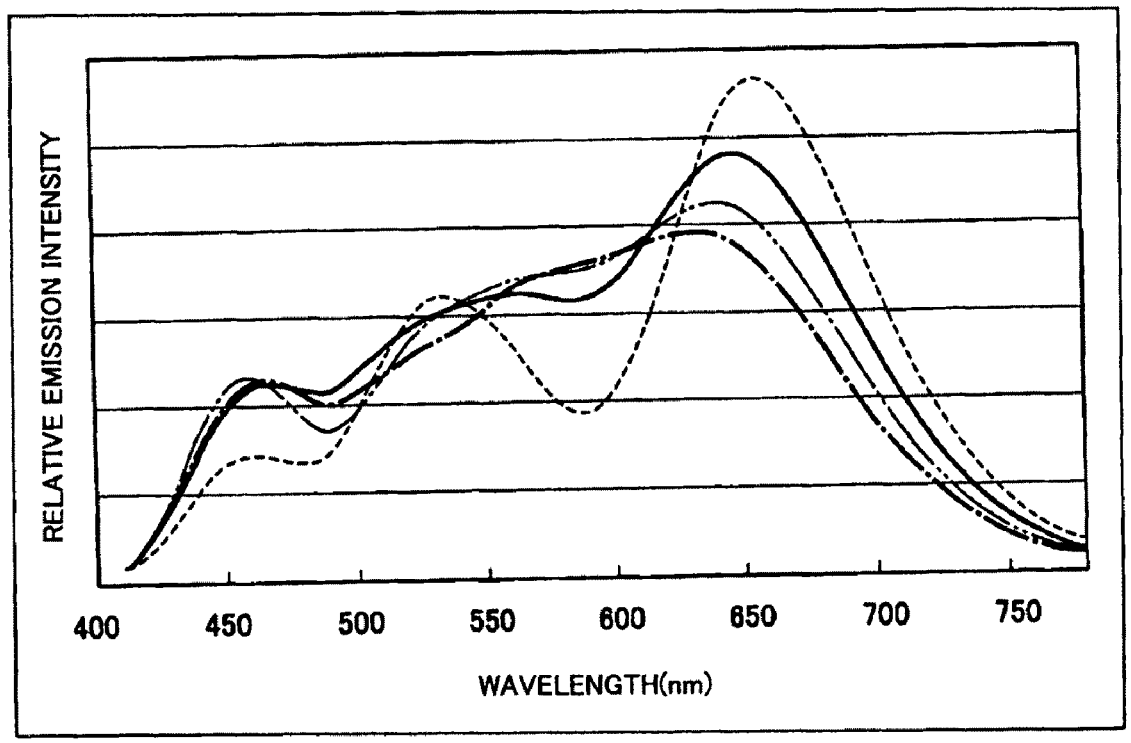
FIG. 23 is an emission spectrum pattern when the correlated color temperature is set at 4200K, in the phosphor mixture of examples 90, 91, and comparative examples 7 and 8.
Figure 24:
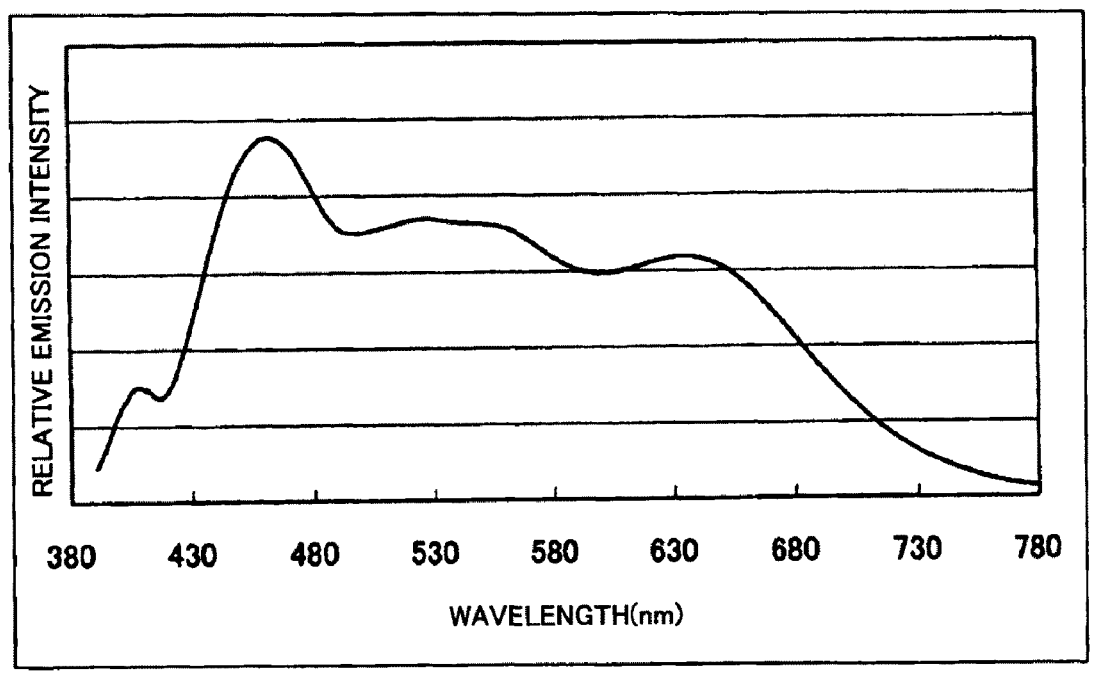
FIG. 24 is a spectrum pattern of the light emitting element when the correlated color temperature is set at 6500K, in the phosphor mixture of an example 92.

Column 70, line 11, reads "Moreover, an average color rendering index (Ra) of should read Moreover, an general color rendering index (Ra) of --;

line 35, reads "example 83, by using the light omitting element (LED) emitting light having the wavelength of 460nm, the emission" should read -- example 83, the emission --;

line 40, reads "was excited." should read -- was excited by using the light emitting element (LED) emitting light having the wavelength of 460nm. --;

line 41, reads "The emission spectrum when the power of 20m A is fed to" should read -- FIG.21 shows the emission spectrum when the power of 20m A is applied to --;

line 56, reads "and the average color rendering index Ra was 72." should rear -- and the general color rendering index Ra was 72. --;

line 64, reads "and was then" should read -- and the phosphor mixture was then --.

Column 71, line 1, reads "in this embodiment, OCaSiAlN$_3$:Eu was used" should read -- in this example CaSiAlN$_3$:Eu was used --;

line 9, reads "phosphor CaSiAlN$_3$:Eu was manufactured" should read -- phosphor CaSiAlN$_3$:Eu --;

line 14, reads "element was Ca:Al:Si:Ce=0.970:1.00:0.030, and" should read element was Ca:Al:Si:Ce=0.970:1.00:0.030, and --;

line 17, reads "state under the nitrogen" should read -- state under a nitrogen --;

line 21, reads "by CaSiAlN3:Eu. The" should read -- by CaSiAlN3:Eu. The --;

line 24, reads "2) Adjustment of the" should read -- 2) Manufacture of the --;

CERTIFICATE OF CORRECTION (continued)

U.S. Pat. No. 7,887,718 B2 line 26, reads "and CaAlSiN$_3$:Eu under" should read -- CaSiAlN$_3$:Eu under --;

line 28, reads "wavelength of 460nm was respectively measured, and from this emission spectrum, a relative mixing ratio to" should read -- wavelength of 460nm were respectively measured, and from the emission spectra, relative mixing ratios to --;

line 31, reads "phosphor mixtures was obtained" should read -- phosphor mixtures were obtained --;

line 32, reads "to the result of this" should read -- to the results of this --;

line 34, reads "CaAlSiN$_3$:Eu=98.0:2.0(molar ratio), and" should read CaAlSiN$_3$:Eu=98.0:2.0 (molar ratio), and --;

line 49, reads "was SrAl$_{1.43}$Si$_{3.81}$O$_{0.59}$N$_{6.79}$:Ce: CaAlSiN$_3$:Eu=95.0:5.0 (molar ratio). Based on this result, each phosphor was weighed and the phosphor mixture was obtained." should read -- was SrAl$_{1.43}$Si$_{3.81}$O$_{0.59}$N$_{6.79}$:Ce: CaAlSiN$_3$:Eu=95.0:5.0 (molar ratio). Based on these results, each phosphor was weighed and the phosphor mixtures were obtained. --;

line 52, reads "the emission wavelength (excitation wavelength of the phosphor mixture) of the light emission part and" should read -- the emission wavelength of the light emission part (excitation wavelength of the phosphor mixture) and --.

Column 72, line 1, reads "and a bulb color" should read -- and a warm color --;

line 4, reads "(light emission device) was thereby manufactured." should read -- (light emission device) were thereby manufactured, by a conventional process. --;

line 7, reads "LED illumination emitting" should read -- LED illuminations emitting line 8, reads "emission spectrum with" should read -- emission spectra with --;

line 10, reads "emission spectrum when" should read -- emission spectra when --;

line 12, reads "LED illumination is shown" should read -- LED illumination are shown --;

line 15, reads "spectrum of bulb color" should read -- spectrum of warm color --;

line 26, reads "the average color rendering index Ra of 90," should read -color rendering index Ra of 90, --;

line 31, reads "the average color rendering index Ra of 95," should read -- the general color rendering index Ra of 95, --;

line 49, reads "The phosphor mixture" should read -- In the examples 87 to 89, the phosphor mixture --;

line 52, reads "405nm, and the emission" should read -- 405nm, was manufactured and the emission --.

Column 73, line 5, reads "set in the nitrogen" should read -- set in a nitrogen --;

line 20, reads "2) Adjustment of phosphor" should read -- 2) Manufacture of phosphor line 21, reads "emission spectrum for three" should read -- emission spectra for three line 24, reads "405nm was respectively measured, and from this emission spectrum, the" should read -- 405nm were respectively measured, and from these emission spectra, the line 37, reads "86.7nm, which were all 50nm or more." should read -- 86.7nm., all of which were 50nm or more. --;

line 53, reads "A value (Y) was" should read -- A value of the luminance (Y) was --;

line 63, reads "abscissa axis, with three or more emission peaks in the wavelength range from 420 nm to 680 nm and with a continuous" should read -- abscissa axis. The emission spectrum has three emission peaks in the wavelength range from 420 nm to 680 nm and had a continuous --.

Column 74, line 4, reads "that the average color rendering index Ra was 97" should read that the general color rendering index Ra was 97 --;

line 10, reads "examples 88, 89 as will be described later, and comparative examples 4 to 6 is shown" should read -- examples 88, 89, and comparative examples 4 to 6 as will be described later is shown --;

line 23, reads "2) Adjustment of the" should read -- 2) Manufacture of the --;

line 29, reads "Here, when the phosphor mixture was excited by the excitation light having the wavelength of 405nm, the half" should read -- Here, the half --;

line 32, reads "was 51.1nm." should read -- was 51.1nm, when the phosphor was excited by the excitation light having the wavelength of 405nm. --;

line 34, reads "color rendering temperature" should read -- color temperature --;

line 41, reads "was 101, with the luminance of the example 87 set at 100." should read -- was 101, when the luminance of the example 87 was set at 100. --;

line 50, reads "had three or more emission" should read -- had three emission --;

line 57, reads "that the average color rendering index Ra was 94," should read -- that the general color rendering index Ra was 94, --.

Column 75, line 24, reads "Then, the raw materials were pulverized" should read -- Then, the phosphor was pulverized --;

line 26, reads "2) Adjustment of the" should read -- 2) Manufacture of the --;

line 48, reads "had three or more emission peaks" should read -- had three emission peaks --;

line 55, reads "JISZ8726. The average color rendering index Ra was 95," should read JISZ8726. The general color rendering index Ra was 95, --;

line 62, reads "the phosphor mixture emitting" should -- the phosphor mixtures emitting --;

line 65, reads "405nm was manufactured" should read -- 405nm were manufactured line 66, reads "rendering property of this phosphor" should read -- rendering properties of these phosphor --;

line 67, reads "evaluated. In the comparative example 6, two kinds" should read evaluated. The comparative example 6 used two kinds --.

Column 76, line 1, "phosphors were used, and the color rendering property and the luminance were improved, as compared to the example 89." should read -- phosphors, and was compared to the example 89 having the improved color rendering property and the luminance. --;

line 14, reads "2) Adjustment of the" should read -- 2) Manufacture of the --;

line 15, reads "A correlated mixing" should read -- The simulation similar to that of the example 87 was performed, and a relative mixing --;

line 35, reads "had three or more emission" should read -- had three emission --;

line 42, reads "found that the average color rendering index Ra was 87," should read -- found that the general color rendering index Ra was 87, --;

line 56, reads "2) Adjustment of the" should read -- 2) Manufacture of the --;

line 57, reads "A correlated mixing" should read -- The simulation similar to that of the example 87 was performed, and a relative mixing --.

Column 77, line 28, reads "that the average color rendering index Ra was 75," should read that the general color rendering index Ra was 75, --;

line 40, reads "two kinds red phosphors," should read -- two kinds of red phosphors -- line 47, reads "as the red phosphor." should read -- as the red phosphors. --; line 50, reads "2) Adjustment of the" should read -- 2) Manufacture of the --; line 51, reads "the correlated mixing" should read -- the relative mixing --.

Column 78, line 6, reads "Then, the average color rendering index Ra was 96," should read Then, the color rendering index Ra was 96, --;

line 25, reads "the phosphor mixture emitting" should read -- the phosphor mixtures emitting --;

line 27, reads "of 4200K when" should read -- of 4200K, when --;

line 28, reads "405nm, was manufactured" should read -- 405nm, were manufactured line 30, reads "properties of this phosphor mixture were" should read -- properties of

CERTIFICATE OF CORRECTION (continued)
U.S. Pat. No. 7,887,718 B2 these phosphor mixtures were --;

line 41, reads "2) Adjustment of the" should read -- 2) Manufacture of the --;

line 42, reads "the emission spectrum when" should read -- the emission spectra when line 45, reads "405nm, was measured, and the correlated mixing" should read 405nm, were measured, and the relative mixing --;

line 48, reads "obtained from this emission spectrum by" should read -- obtained from these emission spectra by --.

Column 79, line 1, reads "spectrum had three or more emission" should read -- spectrum had three emission --;

line 14, reads "found that the average color rendering index Ra was 95," should read -- found that the general color rendering index Ra was 95, --;

line 20, reads "example 90, an example 91 as will be described later, and comparative examples 7 and 8 are shown in table 17." should read -- example 90, and an example 91 and comparative examples 7 and 8 as will be described later, are shown in table 17. --;

line 44, reads "2) Adjustment of the" should read -- 2) Manufacture of the --.

Column 80, line 3, reads "This emission spectrum had three or more emission" should read In the same way as the example 87, this emission spectrum had three emission --;

line 10, reads "phosphor was performed" should read -- phosphor mixture was performed --;

line 11, reads "The average color rendering index Ra was 95," should read -- The general color rendering index Ra was 95, --;

line 14, reads "Next, the phosphor mixture using the already" should read -- Next, a phosphor mixture using an already --;

line 16, reads "The phosphor mixture emitting" should read -- In the comparative examples 7 and 8, the phosphor mixtures emitting --;

line 20, reads "405nm, was manufactured" should read -- 405nm, were manufactured line 21, reads "property of this phosphor mixture were" should read -- property of these phosphor mixtures were --;

line 22, reads "shows the comparative" should read -- shows a comparative --;

line 25, reads "of red phosphor." should read -- of red phosphors. --;

line 37, reads "Commercially available $CaAlSiN_3$:Eu was prepared" should read $CaAlSiN_3$:Eu was prepared --;

CERTIFICATE OF CORRECTION (continued)
U.S. Pat. No. 7,887,718 B2 line 41, reads "2) Adjustment of the" should read -- 2) Manufacture of the --;

line 42, reads "The correlated mixing" should read -- The relative mixing --;

line 64, reads "This emission spectrum had three or more emission" should read -- In the same was as in the example 87, this emission spectrum had three emission --.

Column 81, line 4, reads "that the average color rendering index Ra was 70," should read that the general color rendering index Ra was 70, --;

line 11, reads "having further luminance and" should read -- having further higher luminance and --;

line 36, reads "by using two kinds" should read -- by using an already known green phosphor, two kinds --;

line 49, reads "2) Adjustment of the" should read -- 2) Manufacture of the --;

line 50, reads "The correlated mixing" should read -- According to the simulation similar to that of the example 87, the relative mixing --.

Column 82, line 10, reads "The average color rendering index Ra was 96," should read -- The general color rendering index Ra was 96, --;

line 40, reads "was set. The" should read -- was set on the LED. The --;

line 42, reads "obtain a day light color" should read -- obtain a day-light color --;

line 43, reads "and the white LED was" should read -- and a white LED was --;

line 54, reads "and color was mixed" should read -- and the light color was mixed --;

line 59, reads "Moreover, the average color rendering index (Ra) of should read Moreover, the general color rendering index (Ra) of --.

Column 83, line 17, reads "using the silicon-based resin" should read -- using the silicone-based resin --;

line 21, reads "the LED set on" should read -- the LED in which the phosphor sheet was set on --;

line 27, reads "FIG.1 is SEM photograph" should read -- FIG.1 is a SEM photograph line 29, reads "a graph showing an emission spectrum when" should read -- a graph showing emission spectra when --;

line 33, reads "showing the emission spectrum when" should read -- showing emission spectra when --;

line 37, reads "graph showing an excitation spectrum of should read -- graph showing excitation spectra of --;

line 39, reads "showing the excitation spectrum" should read -- showing an excitation spectrum --;

line 44, reads "showing the relation between then concentration of the activator Z(Eu) and the emission" should read -- showing a relation between a concentration of an activator Z(Eu) and an emission --;

line 47, reads "showing the relation between Al/Sr ratio and the emission" should read -- showing a relation between Al/Sr ratio and an emission --;

line 50, reads "showing the relation between Si/Sr ratio and the emission" should read -- showing a relation between Si/Sr ratio and an emission --;

line 53, reads "graph showing the relation between Sr molar ratio and the emission" should read -- graph showing a relation between Sr molar ratio and an emission --;

line 56, reads "showing the relation between oxygen content and the emission" should read -- showing a relation between oxygen content and an emission --;

line 59, reads "is the emission spectrum of the phosphor of an example 61." should read -- is an emission spectrum of the phosphor of the example 61. --;

line 61, reads "is the excitation" should read -- is an excitation --;

line 63, reads "a graph showing a measurement result of should read -- a graph showing measurement results of --.

Column 84, line 11, reads "measurement result of should read -- measurement results of --;

line 15, reads "shows an X-ray diffractive pattern of should read -- shows X-ray diffraction patterns of --;

line 17, reads "measurement result of should read -- measurement results of --;

line 20, reads "measurement result of should read -- measurement results of --;

line 23, reads "measurement result of should read -- measurement results of --;

line 29, reads "measurement result of should read -- measurement results of --;

line 35, reads "shows the emission spectrum of a white LED illumination of an example" should read -- shows an emission spectrum of a white LED illumination of the example --;

line 37, reads "shows the emission spectrum of a white LED illumination of should read -- shows emission spectra of the white LED illuminations of --;

line 39, reads "shows an emission spectrum pattern " should read -- shows emission spectrum patterns --;

line 41, reads "phosphor mixture of should read -- phosphor mixtures of --;

line 43, reads "is an emission spectrum pattern when" should read -- is emission spectrum patterns when --;

CERTIFICATE OF CORRECTION (continued)

U.S. Pat. No. 7,887,718 B2 line 45, reads "phosphor mixture of should read -- phosphor mixtures of --; line 49, reads "mixture of an example" should read -- mixture of example --.

line 49, reads "mixture of an example" should read -- mixture of example --.